(12) United States Patent
Yamazaki et al.

(10) Patent No.: US 9,985,056 B2
(45) Date of Patent: May 29, 2018

(54) SEMICONDUCTOR DEVICE AND METHOD FOR MANUFACTURING SEMICONDUCTOR DEVICE

(71) Applicant: Semiconductor Energy Laboratory Co., Ltd., Kanagawa-ken (JP)

(72) Inventors: Shunpei Yamazaki, Tokyo (JP); Takahiro Sato, Tochigi (JP); Masami Jintyou, Tochigi (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days. days.

(21) Appl. No.: 15/289,621

(22) Filed: Oct. 10, 2016

(65) Prior Publication Data

US 2017/0104018 A1    Apr. 13, 2017

(30) Foreign Application Priority Data

Oct. 12, 2015  (JP) .................................. 2015-201654
Oct. 12, 2015  (JP) .................................. 2015-201656

(51) Int. Cl.
    *H01L 27/12*        (2006.01)
(52) U.S. Cl.
    CPC ........ *H01L 27/1288* (2013.01); *H01L 27/127* (2013.01); *H01L 27/1218* (2013.01); *H01L 27/1222* (2013.01); *H01L 27/1225* (2013.01)
(58) Field of Classification Search
    CPC .......... H01L 27/1214–27/1262; H01L 27/127; H01L 2224/03474;
    (Continued)

(56) References Cited

U.S. PATENT DOCUMENTS 6,855,969 B2   2/2005   Inoh
6,890,783 B2   5/2005   Kimura et al.
(Continued)

FOREIGN PATENT DOCUMENTS

JP    2003-282881 A    10/2003
JP    2006-165527 A     6/2006
(Continued)

OTHER PUBLICATIONS

Yang, J-Y et al., "A New Process and Structure for Oxide Semiconductor LCDs," SID Digest '14: SID International Symposium Digest of Technical Papers, Jun. 3, 2014, pp. 469-472.
(Continued)

*Primary Examiner* — Cuong B Nguyen
(74) *Attorney, Agent, or Firm* — Husch Blackwell LLP

(57) ABSTRACT

In a semiconductor device including an oxide semiconductor, a change in electrical characteristics is suppressed and reliability is improved. A miniaturized transistor including an oxide semiconductor is provided. A method for manufacturing a semiconductor device including an oxide semiconductor film includes the following steps: forming an oxide semiconductor film; forming an insulating film over the oxide semiconductor film; forming a conductive film over the insulating film; forming a first protective film over the conductive film; and forming a second protective film over the first protective film. The first protective film, the conductive film, and the insulating film are processed using the second protective film as a mask. After the second protective film is removed, the conductive film and the insulating film are processed using the first protective film as a mask to have a smaller area than that of the second protective film.

10 Claims, 56 Drawing Sheets

(58) Field of Classification Search
CPC ............ H01L 2224/03902–2224/03906; H01L 2224/11903
See application file for complete search history.

(56) References Cited

U.S. PATENT DOCUMENTS

| | | | |
|---|---|---|---|
| 7,157,323 B2 | 1/2007 | Gan et al. | |
| 7,238,557 B2 | 7/2007 | Hayakawa | |
| 7,576,394 B2 | 8/2009 | Furuta et al. | |
| 7,601,984 B2 | 10/2009 | Sano et al. | |
| 7,763,479 B2 * | 7/2010 | Chiu .................. | H01L 27/1288 257/59 |
| 7,791,072 B2 | 9/2010 | Kumomi et al. | |
| 7,791,074 B2 | 9/2010 | Iwasaki | |
| 7,863,600 B2 | 1/2011 | Nomoto | |
| 7,919,365 B2 | 4/2011 | Kim et al. | |
| 8,003,981 B2 | 8/2011 | Iwasaki et al. | |
| 8,164,090 B2 | 4/2012 | Iwasaki et al. | |
| 8,179,490 B2 | 5/2012 | Lin et al. | |
| 8,344,374 B2 | 1/2013 | Yamazaki et al. | |
| 8,384,076 B2 | 2/2013 | Park et al. | |
| 8,501,564 B2 | 8/2013 | Suzawa et al. | |
| 8,530,891 B2 | 9/2013 | Inoue et al. | |
| 8,624,240 B2 | 1/2014 | Sato et al. | |
| 8,704,230 B2 | 4/2014 | Miyairi | |
| 8,748,879 B2 | 6/2014 | Yano et al. | |
| 8,796,681 B2 | 8/2014 | Yamade et al. | |
| 8,835,918 B2 | 9/2014 | Yamazaki et al. | |
| 8,883,556 B2 | 11/2014 | Yamazaki | |
| 8,941,113 B2 | 1/2015 | Takeuchi et al. | |
| 2005/0056826 A1 | 3/2005 | Appenzeller et al. | |
| 2005/0199960 A1 | 9/2005 | Hoffman et al. | |
| 2010/0032665 A1 | 2/2010 | Yamazaki et al. | |
| 2010/0032668 A1 | 2/2010 | Yamazaki et al. | |
| 2010/0051949 A1 | 3/2010 | Yamazaki et al. | |
| 2010/0163874 A1 | 7/2010 | Koyama et al. | |
| 2011/0079778 A1 | 4/2011 | Yamazaki et al. | |
| 2011/0084267 A1 | 4/2011 | Yamazaki et al. | |
| 2011/0114943 A1 | 5/2011 | Yamazaki et al. | |
| 2011/0240998 A1 | 10/2011 | Morosawa et al. | |
| 2012/0315730 A1 | 12/2012 | Koezuka et al. | |
| 2012/0315735 A1 | 12/2012 | Koezuka et al. | |
| 2013/0069054 A1 | 3/2013 | Isobe et al. | |
| 2013/0069055 A1 | 3/2013 | Yamazaki et al. | |
| 2014/0001468 A1 | 1/2014 | Yamazaki et al. | |
| 2015/0162452 A1 | 6/2015 | Koezuka et al. | |
| 2015/0221774 A1 | 8/2015 | Yamazaki et al. | |
| 2015/0255612 A1 | 9/2015 | Yamazaki et al. | |
| 2016/0005873 A1 | 1/2016 | Jintyou et al. | |

FOREIGN PATENT DOCUMENTS

| | | |
|---|---|---|
| JP | 2006-165529 A | 6/2006 |
| JP | 2007-096055 A | 4/2007 |
| JP | 2007-220817 A | 8/2007 |
| JP | 2007-220818 A | 8/2007 |
| JP | 2009-278115 A | 11/2009 |
| JP | 2013-062529 A | 4/2013 |

OTHER PUBLICATIONS

Kusunoki, K. et al., "Transmissive OLED and Reflective LC Hybrid (TR-Hybrid) Display," SID Digest '16: SID International Symposium Digest of Technical Papers, May 22, 2016, vol. 47, pp. 57-60.

Sakuishi, T. et al., "Transmissive OLED and Reflective LC Hybrid (TR-Hybrid) Display with High Visibility and Low Power Consumption," SID Digest '16: SID International Symposium Digest of Technical Papers, May 22, 2016, vol. 47, pp. 735-738.

Ohide, T. et al., "Application of Transfer Technology to Manufacturing of Transmissive OLED and Reflective LC Hybrid (TR-Hybrid) Display," SID Digest '16: SID International Symposium Digest of Technical Papers, May 22, 2016, vol. 47, pp. 1002-1004.

* cited by examiner

FIG. 26A  out-of-plane method
CAAC-OS
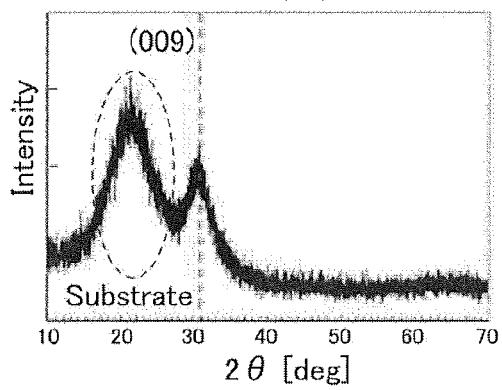
FIG. 26B
in-plane method φ scan
CAAC-OS
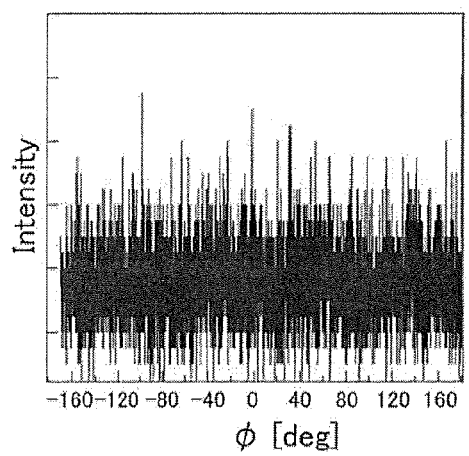
FIG. 26C
in-plane method φ scan
single crystal OS
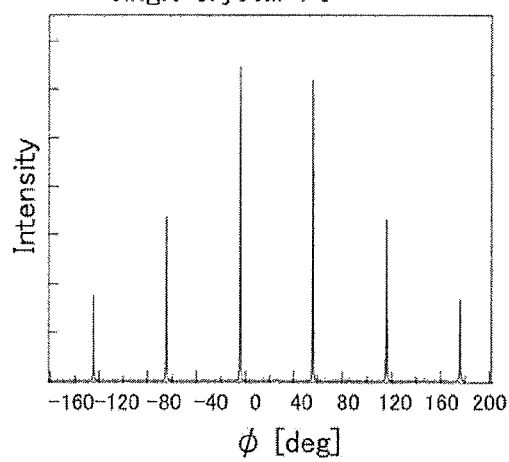
FIG. 26D
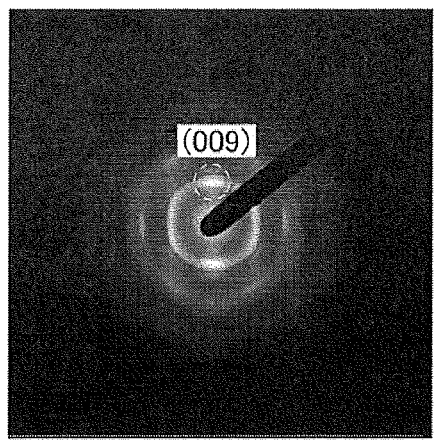
FIG. 26E
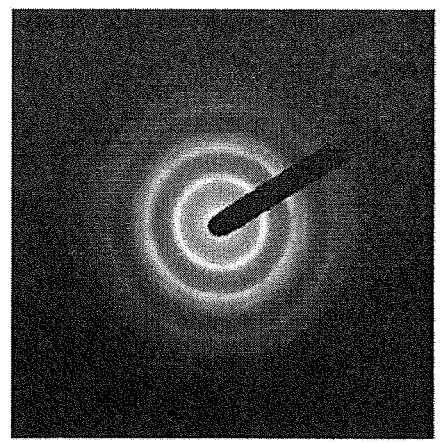

FIG. 29A
FIG. 29B
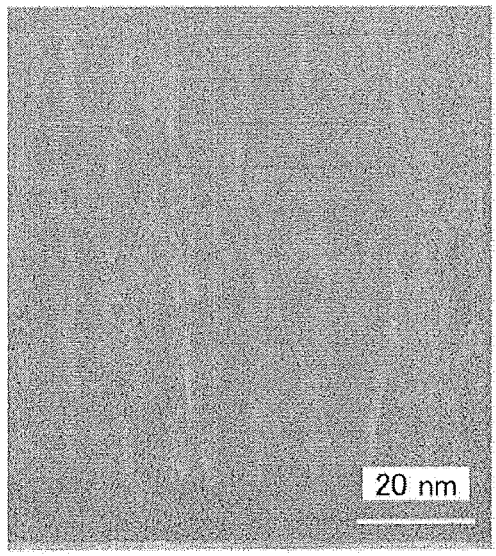
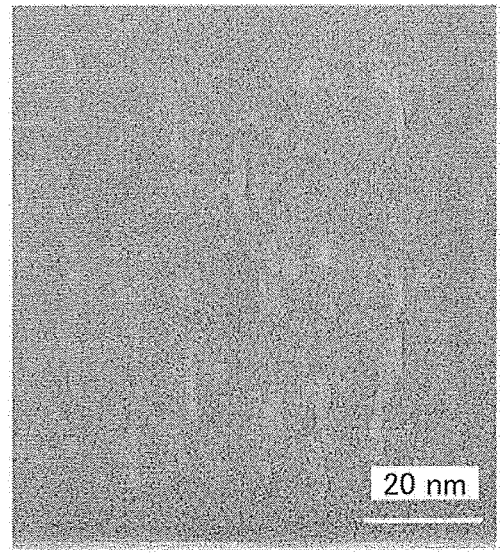

SEMICONDUCTOR DEVICE AND METHOD FOR MANUFACTURING SEMICONDUCTOR DEVICE

BACKGROUND OF THE INVENTION

1. Field of the Invention

One embodiment of the present invention relates to a semiconductor device and a method for manufacturing the semiconductor device.

Note that one embodiment of the present invention is not limited to the above technical field. The technical field of one embodiment of the invention disclosed in this specification and the like relates to an object, a method, or a manufacturing method. In addition, the present invention relates to a process, a machine, manufacture, or a composition of matter. In particular, one embodiment of the present invention relates to a semiconductor device, a display device, a light-emitting device, a power storage device, a memory device, a driving method thereof, or a manufacturing method thereof.

In this specification and the like, a semiconductor device generally means a device that can function by utilizing semiconductor characteristics. A semiconductor element such as a transistor, a semiconductor circuit, an arithmetic device, and a memory device are each one embodiment of a semiconductor device. An imaging device, a display device, a liquid crystal display device, a light-emitting device, an electro-optical device, a power generation device (including a thin film solar cell, an organic thin film solar cell, and the like), and an electronic device may each include a semiconductor device.

2. Description of the Related Art

Attention has been focused on a technique for forming a transistor using a semiconductor thin film formed over a substrate having an insulating surface (also referred to as a field-effect transistor (FET) or a thin film transistor (TFT)). Such transistors are used for a wide range of electronic devices such as an integrated circuit (IC) and an image display device (display device). A semiconductor material typified by silicon is widely known as a material for a semiconductor thin film that can be used for a transistor. As another material, an oxide semiconductor has been attracting attention.

For example, a technique for forming a transistor using an amorphous oxide containing In, Zn, Ga, Sn, and the like as an oxide semiconductor is disclosed (see Patent Document 1).

In addition, a technique for forming a self-aligned top-gate transistor using an oxide thin film is disclosed (see Patent Document 2). Furthermore, a technique for forming a top-gate semiconductor element including an oxide semiconductor that has a short channel length L and can be miniaturized is disclosed (see Patent Document 3).

The use of a semiconductor film that has a crystalline structure (typically, a polysilicon film, a microcrystalline silicon film, and the like) and is formed over an insulating surface for an active layer of a transistor has been developed actively. Transistors including polysilicon films can form various functional circuits because of its high field-effect mobility.

For example, in an active matrix liquid crystal display device, a pixel circuit for performing image display for each functional block and an integrated circuit including a shift register circuit, a level shifter circuit, a buffer circuit, a sampling circuit, and the like, which are based on a CMOS circuit, are formed over one substrate. In these circuits, a voltage is applied to liquid crystals to drive a pixel portion including a pixel transistor, which functions as a switching element, and a capacitor.

Furthermore, a display device used by being worn on the human body such as a display device worn on the head (a head-mounted display device or a glasses-type display device) or a display device worn on the arm (a watch-type display device or a wristband-type display device) has been proposed. As described above, a variety of display devices have been proposed; thus, users want a display device having a high display quality, that is, a high-resolution display device.

For example, in an active matrix liquid crystal display device, development of expanding an effective screen region in a pixel portion (also referred to as an aperture ratio) has been advanced. In order to make the area of an effective screen region larger, it is necessary to make the area occupied by pixel transistors arranged in a pixel portion as small as possible. In addition, in order to reduce manufacturing costs, developments for forming a driver circuit on the same substrate as that of a pixel portion have also been advanced.

In order to make an area occupied by a transistor as small as possible, some techniques for miniaturizing the line width of a gate electrode of the transistor have been proposed. For example, a method for forming a sidewall-shaped gate electrode that is formed at a step of a gate insulating film of the transistor has been proposed (see Patent Document 4).

REFERENCE

Patent Document

[Patent Document 1] Japanese Published Patent Application No. 2006-165529
[Patent Document 2] Japanese Published Patent Application No. 2009-278115
[Patent Document 3] Japanese Published Patent Application No. 2013-62529
[Patent Document 4] Japanese Published Patent Application No. 2003-282881

SUMMARY OF THE INVENTION

As examples of a transistor including an oxide semiconductor film, an inverted staggered transistor (also referred to as a bottom-gate transistor) and a staggered transistor (also referred to as a top-gate transistor) can be given. In the case where a transistor including an oxide semiconductor film is used for a display device, an inverted staggered transistor is used more often than a staggered transistor because its manufacturing process is relatively simple and its manufacturing cost is low. However, an increase in the screen size of a display device or an increase in the resolution of an image on a display device (e.g., a high-resolution display device typified by a 4 k×2 k display device (3840 pixels in the horizontal direction and 2160 pixels in the vertical direction) or an 8 k×4 k display device (7680 pixels in the horizontal direction and 4320 pixels in the vertical direction)) might cause parasitic capacitance between a gate electrode and source and drain electrodes in an inverted staggered transistor. Depending on the value of the parasitic capacitance, a signal delay or the like becomes more severe, leading to degradation of the display quality of the display device. Thus, regarding a staggered transistor including an oxide semiconductor film, a structure with stable semiconductor characteristics and high reliability is desired to be developed.

As the resolution of image quality of a display device is increased, a transistor including an oxide semiconductor film needs to be miniaturized. For the miniaturization of a transistor, the length of the channel length L is important. For example, in the case where patterning is performed using a lithography process in forming a transistor including an oxide semiconductor film, the lithography process has a limit on reduction of the channel length L depending on the resolution of the device or the sensitivity of a resist material that is used.

In view of the foregoing problems, an object of one embodiment of the present invention is to suppress a change in electrical characteristics and to improve reliability in a transistor including an oxide semiconductor. Another object of one embodiment of the present invention is to provide a staggered transistor including an oxide semiconductor. Another object of one embodiment of the present invention is to provide a transistor including an oxide semiconductor and having high on-state current. Another object of one embodiment of the present invention is to provide a transistor including an oxide semiconductor and having low off-state current. Another object of one embodiment of the present invention is to provide a semiconductor device with low power consumption. Another object of one embodiment of the present invention is to provide a miniaturized transistor including an oxide semiconductor. Another object of one embodiment of the present invention is to provide a novel semiconductor device.

Another object of one embodiment of the present invention is to make a pixel pitch small in order to obtain a high-resolution display device. Specifically, another object of one embodiment of the present invention is to provide a display device in which the pixel density is greater than 1000 pixels per inch (ppi). Another object of one embodiment of the present invention is to increase an aperture ratio in order to obtain the high image quality. Another object of one embodiment of the present invention is to form a wiring pattern having a small wiring width, specifically, a wiring pattern having a small wiring interval by forming a minute wiring having a line width of less than 1.5 µm in order to achieve high aperture ratio.

Another object is to provide a transistor with stable electrical characteristics. Another object is to provide a semiconductor device including the transistor. Another object is to provide a module including the semiconductor device. Another object is to provide an electronic device including the semiconductor device or the module. Another object is to provide a novel semiconductor device.

Note that the description of the above object does not disturb the existence of other objects. In one embodiment of the present invention, there is no need to achieve all the objects. Objects other than the above objects are apparent from and can be derived from the description of the specification and the like.

One embodiment of the present invention is a method for manufacturing a semiconductor device including an oxide semiconductor film, including the following steps: forming an oxide semiconductor film; forming an insulating film over the oxide semiconductor film; forming a conductive film over the insulating film; forming a first protective film over the conductive film; and forming a second protective film over the first protective film. The first protective film, the conductive film, and the insulating film are processed using the second protective film as a mask. After the second protective film is removed, the conductive film and the insulating film are processed using the first protective film as a mask to have a smaller area than the second protective film.

Another embodiment of the present invention is a method for manufacturing a semiconductor device including an oxide semiconductor film, including the following steps: forming an oxide semiconductor film; forming an insulating film over the oxide semiconductor film; forming a conductive film over the insulating film; forming a first protective film over the conductive film; and forming a second protective film over the first protective film. The first protective film, the conductive film, and the insulating film are processed using the second protective film as a mask. After the second protective film is removed, the conductive film and the insulating film are processed using the first protective film as a mask to have a smaller area than the second protective film. Plasma treatment is performed on the oxide semiconductor film from above the first protective film. The first protective film is removed, and then a nitride insulating film is formed over the conductive film and the oxide semiconductor film.

In the embodiment, the plasma treatment is preferably performed under one or both of an argon atmosphere and a nitrogen atmosphere.

In the embodiment, the area of the conductive film is preferably greater than or equal to 15% and less than or equal to 50% of the area of the second protective film.

In the embodiment, the first protective film is preferably formed using an inorganic material, and the second protective film is preferably formed using an organic material.

In the embodiment, the conductive film preferably includes a metal oxide film and a metal film over the metal oxide film.

Another embodiment of the present invention is a semiconductor device including a semiconductor film over a glass substrate; an insulating film over the semiconductor film; and a gate electrode that partly overlaps with the semiconductor film and is over the insulating film. The semiconductor film includes a pair of low-resistance regions and a channel region between the pair of low-resistance regions. In the channel length direction, the width of each of the low-resistance regions is greater than or equal to the channel length of the channel region.

In the embodiment, portions of the low-resistance regions preferably overlap with the gate electrode.

In the embodiment, the channel length is preferably less than 1.5 µm.

In the embodiment, the semiconductor film preferably has a crystalline structure. Moreover, in the embodiment, the semiconductor film is preferably a polycrystalline silicon film.

Another embodiment of the present invention is a display device including the above-described semiconductor device and a display element. Another embodiment of the present invention is a display module including the above-described display device and a touch sensor. Another embodiment of the present invention is an electronic device including the above-described semiconductor device, the above-described display device, or the above-described display module, and an operation key or a battery.

With one embodiment of the present invention, a change in electrical characteristics can be suppressed and reliability can be improved in a transistor including an oxide semiconductor. According to another embodiment of the present invention, a staggered transistor including an oxide semiconductor can be provided. According to another embodiment of the present invention, a transistor including an oxide semiconductor and having high on-state current can be provided. According to another embodiment of the present invention, a transistor including an oxide semiconductor and having low off-state current can be provided. Alternatively, according to one embodiment of the present invention, a semiconductor device with low power consumption can be provided. Alternatively, according to one embodiment of the present invention, a miniaturized transistor including an oxide semiconductor can be provided. According to one embodiment of the present invention, a novel semiconductor device can be provided.

According to another embodiment of the present invention, a display device in which the pixel density is greater than 1000 ppi can be provided. According to another embodiment of the present invention, a transistor having stable electrical characteristics can be provided. According to another embodiment of the present invention, a semiconductor device including the transistor can be provided. According to another embodiment of the present invention, a module including the semiconductor device can be provided. According to another embodiment of the present invention, an electronic device including the semiconductor device or the module can be provided. According to another embodiment of the present invention, a novel semiconductor device can be provided.

Note that the description of these effects does not disturb the existence of other effects. One embodiment of the present invention does not necessarily achieve all the effects listed above. Other effects are apparent from and can be derived from the description of the specification, the drawings, the claims, and the like.

BRIEF DESCRIPTION OF THE DRAWINGS

FIGS. 26A to 26E show structural analysis of a CAAC-OS and a single crystal oxide semiconductor by XRD and selected-area electron diffraction patterns of a CAAC-OS.

FIGS. 29A and 29B show cross-sectional TEM images of an a-like OS.

DETAILED DESCRIPTION OF THE INVENTION

Figure 1A:
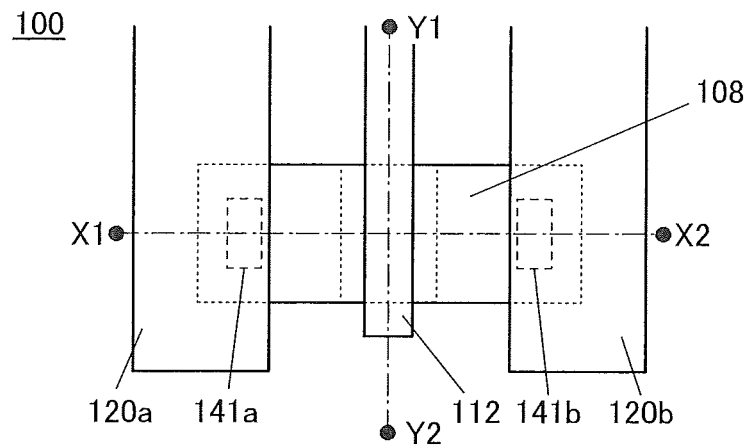
FIGS. 1A to 1C are a top view and cross-sectional views illustrating a semiconductor device.

Hereinafter, embodiments are described with reference to the drawings. Note that embodiments can be carried out in many different modes, and it is easily understood by those skilled in the art that modes and details can be modified in various ways without departing from the spirit and the scope of the present invention. Thus, the present invention should not be interpreted as being limited to the following description of the embodiments.

In the drawings, the size, the layer thickness, or the region is exaggerated for clarity in some cases. Thus, one embodiment of the present invention is not limited to such a scale. Note that the drawings schematically show ideal examples, and embodiments of the present invention are not limited to shapes or values shown in the drawings.

In this specification, ordinal numbers such as "first", "second", and "third" are used in order to avoid confusion among components, and the terms do not limit the components numerically.

In this specification, terms for explaining arrangement, such as "over" and "under," are used for convenience to describe the positional relation between components with reference to drawings. The positional relation between components is changed as appropriate in accordance with the direction in which the components are described. Thus, the positional relation is not limited by a term used in the specification and can be described with another term as appropriate depending on the situation.

In this specification and the like, a transistor is an element having at least three terminals: a gate, a drain, and a source. A channel region is formed between the drain (a drain terminal, a drain region, or a drain electrode) and the source (a source terminal, a source region, or a source electrode), and current can flow through the drain, the channel region, and the source. In this specification and the like, a channel region refers to a region through which current mainly flows.

Furthermore, functions of a source and a drain are sometimes replaced by each other when a transistor of opposite polarity is used or when the direction of current flow is changed in circuit operation, for example. Thus, the terms "source" and "drain" can be used to denote the drain and the source, respectively, in this specification and the like.

In this specification and the like, the expression "electrically connected" includes the case where components are connected through an "object having any electric function". There is no particular limitation on an object having any electric function as long as electric signals can be transmitted and received between components that are connected through the object. Examples of an "object having any electric function" are, in addition to an electrode and a wiring, a switching element such as a transistor, a resistor, an inductor, a capacitor, and elements with a variety of functions.

In this specification and the like, the term "parallel" indicates that the angle formed between two straight lines is greater than or equal to $-10°$ and less than or equal to $10°$, and accordingly also includes the case where the angle is greater than or equal to $-5°$ and less than or equal to 5. The term "perpendicular" indicates that the angle formed between two straight lines is greater than or equal to $80°$ and less than or equal to $100°$, and accordingly also includes the case where the angle is greater than or equal to $85°$ and less than or equal to $95°$.

In this specification and the like, the terms "film" and "layer" can be interchanged with each other. For example, in some cases, the term "conductive film" can be used instead of the term "conductive layer", and the term "insulating layer" can be used instead of the term "insulating film".

Unless otherwise specified, off-state current in this specification and the like refers to drain current of a transistor in an off state (also referred to as a non-conducting state and a cutoff state). Unless otherwise specified, the off state of an n-channel transistor means that the voltage between its gate and source ($V_{gs}$: gate-source voltage) is lower than the threshold voltage $V_{th}$, and the off state of a p-channel transistor means that the gate-source voltage $V_{gs}$ is higher than the threshold voltage $V_{th}$. For example, the off-state current of an n-channel transistor sometimes refers to drain current that flows when the gate-source voltage $V_{gs}$ is lower than the threshold voltage $V_{th}$.

The off-state current of a transistor depends on $V_{gs}$ in some cases. Thus, "the off-state current of a transistor is I or lower" may mean that the off-state current of the transistor is I or lower at a certain $V_{gs}$. The off-state current of a transistor may refer to off-state current at a given $V_{gs}$, at $V_{gs}$ in a given range, or at $V_{gs}$ at which sufficiently low off-state current is obtained, for example.

As an example, an assumption is made that an n-channel transistor has a threshold voltage $V_{th}$ of 0.5 V and a drain current of $1 \times 10^{-9}$ A at $V_{gs}$ of 0.5 V, $1 \times 10^{-13}$ A at $V_{gs}$ of 0.1 V, $1 \times 10^{-9}$ A at $V_{gs}$ of $-0.5$ V, and $1 \times 10^{-22}$ A at V, of $-0.8$ V. The drain current of the transistor is $1 \times 10^{-19}$ A or lower at $V_{gs}$ of $-0.5$ V or at $V_{gs}$ in the range of $-0.8$ V to $-0.5$ V; therefore, it may be said that the off-state current of the transistor is $1 \times 10^{-19}$ A or lower. Since the drain current of the transistor is $1 \times 10^{-22}$ A or lower at a certain $V_{gs}$, it may be said that the off-state current of the transistor is $1 \times 10^{-22}$ A or lower.

In this specification and the like, the off-state current of a transistor with a channel width W is sometimes represented by a current value per channel width W or by a current value per given channel width (e.g., 1 μm). In the latter case, the off-state current may be represented by current per length (e.g., A/μm).

The off-state current of a transistor depends on temperature in some cases. Unless otherwise specified, the off-state current in this specification may be off-state current at room temperature, $60°$ C., $85°$ C., $95°$ C., or $125°$ C. Alternatively, the off-state current may be off-state current at a temperature at which the reliability of a semiconductor device or the like including the transistor is ensured or a temperature at which the semiconductor device or the like including the transistor is used (e.g., a temperature in the range of $5°$ C. to $35°$ C.).

The state in which the off-state current of a transistor is I or lower may indicate that the off-state current of the transistor at room temperature, 60° C., 85° C., 95° C., 125° C., a temperature at which the reliability of a semiconductor device or the like including the transistor is ensured, or a temperature at which the semiconductor device or the like including the transistor is used (e.g., a temperature in the range of 5° C. to 35° C.) is I or lower at a certain $V_{gs}$.

The off-state current of a transistor depends on the voltage $V_{ds}$ between its drain and source in some cases. Unless otherwise specified, the off-state current in this specification may be off-state current at $V_{ds}$ of 0.1 V, 0.8 V, 1 V, 1.2 V, 1.8 V, 2.5 V, 3 V, 3.3 V, 10 V, 12 V, 16 V, or 20 V. Alternatively, the off-state current may be off-state current at $V_{ds}$ at which the reliability of a semiconductor device or the like including the transistor is ensured or at $V_{ds}$ used in the semiconductor device or the like including the transistor. The state in which the off-state current of a transistor is I or lower may indicate that the off-state current of the transistor at $V_{ds}$ of 0.1 V, 0.8 V, 1 V, 1.2 V, 1.8 V, 2.5 V, 3 V, 3.3 V, 10 V, 12 V, 16 V, or 20 V, at V at which the reliability of a semiconductor device or the like including the transistor is ensured, or at $V_{ds}$ used in the semiconductor device or the like including the transistor is I or lower at a certain $V_{gs}$.

In the above description of the off-state current, a drain may be replaced by a source. That is, the off-state current sometimes refers to current that flows through a source of a transistor in the off state.

In this specification and the like, the term "leakage current" sometimes expresses the same meaning as "off-state current". In this specification and the like, the off-state current sometimes refers to current that flows between a source and a drain of a transistor in the off state, for example.

In this specification and the like, a "semiconductor" includes characteristics of an "insulator" in some cases when the conductivity is sufficiently low, for example. Furthermore, a "semiconductor" and an "insulator" cannot be strictly distinguished from each other in some cases because a border between the "semiconductor" and the "insulator" is not clear. Accordingly, a "semiconductor" in this specification and the like can be called an "insulator" in some cases. Similarly, an "insulator" in this specification and the like can be called a "semiconductor" in some cases. Alternatively, an "insulator" in this specification and the like can be called a "semi-insulator" in some cases.

In this specification and the like, a "semiconductor" includes characteristics of a "conductor" in some cases when the conductivity is sufficiently high, for example. Furthermore, a "semiconductor" and a "conductor" cannot be strictly distinguished from each other in some cases because a border between the "semiconductor" and the "conductor" is not clear. Accordingly, a "semiconductor" in this specification and the like can be called a "conductor" in some cases. Similarly, a "conductor" in this specification and the like can be called a "semiconductor" in some cases.

In this specification and the like, an impurity in a semiconductor refers to an element that is not a main component of the semiconductor. For example, an element with a concentration lower than 0.1 atomic % is an impurity. If a semiconductor contains an impurity, the density of states (DOS) may be formed therein, the carrier mobility may be decreased, or the crystallinity may be decreased, for example. In the case where the semiconductor includes an oxide semiconductor, examples of an impurity that changes the characteristics of the semiconductor include Group 1 elements, Group 2 elements, Group 13 elements, Group 14 elements, Group 15 elements, and transition metals other than the main components; specific examples are hydrogen (included in water), lithium, sodium, silicon, boron, phosphorus, carbon, and nitrogen. In an oxide semiconductor, an oxygen vacancy may be formed by entry of an impurity such as hydrogen. Furthermore, in the case where the semiconductor includes silicon, examples of an impurity that changes the characteristics of the semiconductor include oxygen, Group 1 elements except hydrogen, Group 2 elements, Group 13 elements, and Group 15 elements.

Embodiment 1

In this embodiment, examples of a semiconductor device including an oxide semiconductor film and a method for manufacturing the semiconductor device are described with reference to FIGS. 1A to 1C, FIGS. 2A to 2D, FIGS. 3A to 3D, FIGS. 4A to 4D, FIGS. 5A to 5C, FIGS. 6A to 6D, FIGS. 7A to 7D, FIGS. 8A to 8D, FIGS. 9A and 9B, FIGS. 10A and 10B, FIGS. 11A and 11B, FIGS. 12A and 12B, FIGS. 13A and 13B, FIGS. 14A and 14B, and FIGS. 15A and 15B.

<1-1. Structure Example 1 of Semiconductor Device>

Figure 1B:
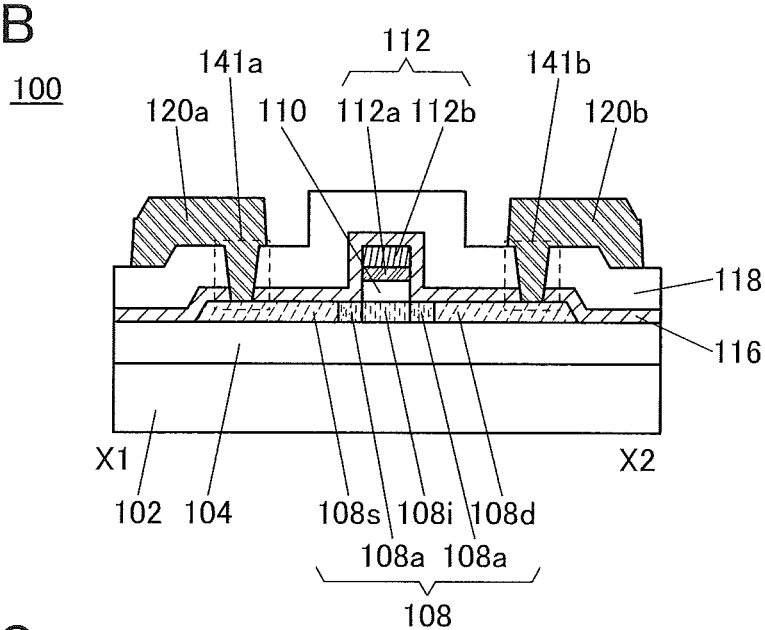
Figure 1C:
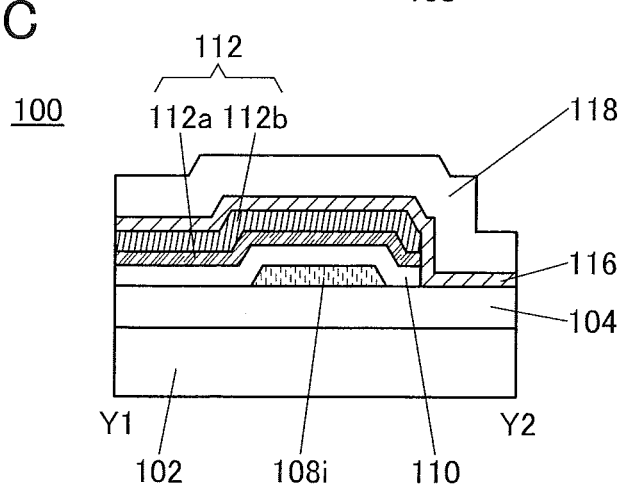

An example of a semiconductor device including an oxide semiconductor film is illustrated in FIGS. 1A to 1C. As an example of the semiconductor device, a transistor is shown here. Note that the transistor in FIGS. 1A to 1C has a staggered (top-gate) structure.

FIG. 1A is a top view of a transistor 100. FIG. 1B is a cross-sectional view taken along dashed-dotted line X1-X2 in FIG. 1A. FIG. 1C is a cross-sectional view taken along dashed-dotted line Y1-Y2 in FIG. 1A. For clarity, FIG. 1A does not illustrate some components such as an insulating film. As in FIG. 1A, some components are not illustrated in some cases in top views of transistors described below. Furthermore, the direction of dashed-dotted line X1-X2 may be referred to as a channel length (L) direction, and the direction of dashed-dotted line Y1-Y2 may be referred to as a channel width (W) direction.

Note that in the semiconductor device of one embodiment of the present invention, the channel length (L) of the transistor is preferably greater than or equal to 0.2 µm and less than 1.5 µm, further preferably greater than or equal to 0.5 µm and less than or equal to 1.0 µm. A display device including the transistor having the above channel length (L) can have high pixel density.

The transistor 100 illustrated in FIGS. 1A to 1C includes an insulating film 104 over a substrate 102; an oxide semiconductor film 108 over the insulating film 104; an insulating film 110 over the oxide semiconductor film 108; a conductive film 112 over the insulating film 110; and an insulating film 116 over the insulating film 104, the oxide semiconductor film 108, and the conductive film 112.

The oxide semiconductor film 108 includes a channel region 108i overlapping with the conductive film 112, a source region 108s in contact with the insulating film 116, and a drain region 108d in contact with the insulating film 116. Furthermore, the oxide semiconductor film 108 includes low-resistance regions 108a between the channel region 108i and the source region 108s and between the channel region 108i and the drain region 108d. Note that the channel region 108i might be formed inward from the conductive film 112. In this case, regions where the low-resistance regions 108a overlap with the conductive film 112 are formed. For example, by diffusing impurities (e.g., water) in the low-resistance region 108a to the channel region 108i side in a lateral direction, the channel region 108i is formed inward from the conductive film 112 in some cases. In this case, the length of the channel region 108i is shorter than that of the conductive film 112. That is, the effective channel length L of the transistor 100 becomes shorter in some cases. Moreover, since the low-resistance regions 108a overlap with the conductive film 112, what are called lightly doped drain (LDD) regions can be formed. By providing the LDD regions, the electric field of the drain region can be relaxed. Thus, change in the threshold voltage of the transistor due to the electric field of the drain region can be reduced.

Furthermore, the conductive film 112 includes a metal oxide film 112a over the insulating film 110 and a metal film 112b over the metal oxide film 112a. For example, when the metal oxide film 112a is formed in an oxygen atmosphere, oxygen can be added to the insulating film 110. When the metal film 112b is formed using a low-resistance metal film, the resistance of the conductive film 112 can be lowered. When the metal film 112b is formed using a light-blocking metal film, light incident on the channel region 108i from above can be blocked.

Furthermore, the insulating film 116 contains nitrogen or hydrogen. The insulating film 116 is in contact with the low-resistance regions 108a, the source region 108s, and the drain region 108d, so that nitrogen or hydrogen that is contained in the insulating film 116 is added to the low-resistance regions 108a, the source region 108s, and the drain region 108d. The low-resistance regions 108a, the source region 108s, and the drain region 108d each have a high carrier density when nitrogen or hydrogen is added thereto. The low-resistance regions 108a have a resistance that is lower than that of the channel region 108i and higher than that of the source region 108s and the drain region 108d. Note that the details of the low-resistance regions 108a are described later.

The transistor 100 may further include an insulating film 118 over the insulating film 116, a conductive film 120a electrically connected to the source region 108s through an opening 141a provided in the insulating films 116 and 118, and a conductive film 120b electrically connected to the drain region 108d through an opening 141b provided in the insulating films 116 and 118.

In this specification and the like, the insulating film 104 may be referred to as a first insulating film, the insulating film 110 may be referred to as a second insulating film, the insulating film 116 may be referred to as a third insulating film, and the insulating film 118 may be referred to as a fourth insulating film. The conductive film 112 functions as a gate electrode, the conductive film 120a functions as a source electrode, and the conductive film 120b functions as a drain electrode.

The insulating film 110 functions as a gate insulating film. The insulating film 110 includes an excess oxygen region. Since the insulating film 110 includes the excess oxygen region, excess oxygen can be supplied to the channel region 108i included in the oxide semiconductor film 108. As a result, oxygen vacancies that might be formed in the channel region 108i can be filled with excess oxygen, which can provide a highly reliable semiconductor device.

To supply excess oxygen to the oxide semiconductor film 108, excess oxygen may be supplied to the insulating film 104 that is formed under the oxide semiconductor film 108. However, in that case, excess oxygen contained in the insulating film 104 might also be supplied to the low-resistance regions 108a, the source region 108s, and the drain region 108d included in the oxide semiconductor film 108. When excess oxygen is supplied to the low-resistance regions 108a, the source region 108s, and the drain region 108d, the resistance of the low-resistance regions 108a, the source region 108s, and the drain region 108d might be increased.

In contrast, in the structure in which the insulating film 110 formed over the oxide semiconductor film 108 contains excess oxygen, excess oxygen can be selectively supplied only to the channel region 108i.

Furthermore, each of the low-resistance regions 108a, the source region 108s, and the drain region 108d included in the oxide semiconductor film 108 preferably contains an element that forms an oxygen vacancy or an element that is bonded to an oxygen vacancy. Examples of the element that forms an oxygen vacancy or the element that is bonded to an oxygen vacancy include nitrogen and hydrogen included in the insulating film 116. Other examples of the element that forms an oxygen vacancy or the element that is bonded to an oxygen vacancy include boron, carbon, fluorine, phosphorus, sulfur, chlorine, titanium, and a rare gas. Typical examples of the rare gas element are helium, neon, argon, krypton, and xenon.

The element that forms an oxygen vacancy or the element that is bonded to an oxygen vacancy is added to the low-resistance regions 108a, the source region 108s, and the drain region 108d by diffusion of the constituent element of the insulating film 116 into the low-resistance regions 108a, the source region 108s, and the drain region 108d or by impurity element addition treatment.

An impurity element added to the oxide semiconductor film cuts a bond between a metal element and oxygen in the oxide semiconductor film, so that an oxygen vacancy is formed. Alternatively, when the impurity element is added to the oxide semiconductor film, oxygen bonded to a metal element in the oxide semiconductor film is bonded to the impurity element, and the oxygen is released from the metal element, whereby an oxygen vacancy is formed. As a result, the oxide semiconductor film has a higher carrier density and thus the conductivity thereof becomes higher.

Note that when the transistor 100 illustrated in FIGS. 1A to 1C is used as one or both of a pixel transistor and a driving transistor of a display device, the resolution of the display device can be greater than or equal to 1000 ppi, greater than or equal to 2000 ppi, further preferably greater than or equal to 3000 ppi.

<1-2. Method 1 for Manufacturing Semiconductor Device>

Here, an example of a method for manufacturing the transistor 100 illustrated in FIGS. 1A to 1C is described with reference to FIGS. 2A to 2D, FIGS. 3A to 3D, and FIGS. 4A to 4D. Note that FIGS. 2A to 2D, FIGS. 3A to 3D, and FIGS. 4A to 4D are cross-sectional views in the channel length (L) direction and the channel width (W) direction and illustrate a method for manufacturing the transistor 100.

With the use of the manufacturing method described below, the channel length (L) of the transistor 100 can be greater than or equal to 0.2 μm and less than 1.5 μm, preferably greater than or equal to 0.5 μm and less than or equal to 1.0 μm. For example, when the minimum feature size of a light exposure apparatus used for lithography is 1.5 μm, the channel length (L) can be less than or equal to the minimum feature size of the light exposure apparatus in this embodiment.

[Step of Forming Oxide Semiconductor Film]

First, the insulating film 104 is formed over the substrate 102. Next, an oxide semiconductor film is formed over the insulating film 104. Then, the oxide semiconductor film is processed into an island shape, whereby an oxide semiconductor film 107 is formed (see FIG. 2A).

The insulating film 104 can be formed by a sputtering method, a CVD method, an evaporation method, a pulsed laser deposition (PLD) method, a printing method, a coating method, or the like as appropriate. In this embodiment, as the insulating film 104, a 400-nm-thick silicon nitride film and a 50-nm-thick silicon oxynitride film are formed with a plasma CVD apparatus. Note that the oxide semiconductor film 107 may be formed over the substrate 102 without forming the insulating film 104.

After the insulating film 104 is formed, oxygen may be added to the insulating film 104. As oxygen added to the insulating film 104, an oxygen radical, an oxygen atom, an oxygen atomic ion, an oxygen molecular ion, or the like may be used. Oxygen can be added by an ion doping method, an ion implantation method, a plasma treatment method, or the like. Alternatively, a film that suppresses oxygen release may be formed over the insulating film 104, and then, oxygen may be added to the insulating film 104 through the film.

The film that suppresses oxygen release can be formed using a conductive film or a semiconductor film containing one or more of indium, zinc, gallium, tin, aluminum, chromium, tantalum, titanium, molybdenum, nickel, iron, cobalt, and tungsten.

In the case where oxygen is added by plasma treatment in which oxygen is excited by a microwave to generate high-density oxygen plasma, the amount of oxygen added to the insulating film 104 can be increased.

The oxide semiconductor film 107 can be formed by a sputtering method, a coating method, a pulsed laser deposition method, a laser ablation method, a thermal CVD method, or the like. Note that processing into the oxide semiconductor film 107 can be performed in the following manner: a mask is formed over the oxide semiconductor film by a lithography process, and then, the oxide semiconductor film is partly etched using the mask. Alternatively, the isolated the oxide semiconductor film 107 may be directly formed by a printing method.

In the case of forming the oxide semiconductor film by a sputtering method, an RF power supply device, an AC power supply device, a DC power supply device, or the like can be used as appropriate as a power supply device for generating plasma. As a sputtering gas for forming the oxide semiconductor film, a rare gas (typically argon), oxygen, or a mixed gas of a rare gas and oxygen is used as appropriate. In the case of using the mixed gas of a rare gas and oxygen, the proportion of oxygen to a rare gas is preferably increased.

To increase the crystallinity of the oxide semiconductor film formed by a sputtering method, for example, the oxide semiconductor film is preferably formed at a substrate temperature higher than or equal to 150° C. and lower than or equal to 750° C., higher than or equal to 150° C. and lower than or equal to 450° C., or higher than or equal to 200° C. and lower than or equal to 350° C.

In this embodiment, as the oxide semiconductor film 107, a 35-nm-thick oxide semiconductor film is formed with a sputtering apparatus using an In—Ga—Zn metal oxide (In:Ga:Zn=4:2:4.1 [atomic ratio]) as a sputtering target.

After the oxide semiconductor film 107 is formed, heat treatment may be performed so that the oxide semiconductor film 107 is subjected to dehydrogenation or dehydration. The temperature of the heat treatment is typically higher than or equal to 150° C. and lower than the strain point of the substrate, higher than or equal to 250° C. and lower than or equal to 450° C., or higher than or equal to 300° C. and lower than or equal to 450° C.

The heat treatment can be performed in an inert gas atmosphere containing nitrogen or a rare gas such as helium, neon, argon, xenon, or krypton. Furthermore, the heat treatment may be performed in an inert gas atmosphere first, and then in an oxygen atmosphere. It is preferable that the above inert gas atmosphere and the above oxygen atmosphere do not contain hydrogen, water, and the like. The treatment time may be longer than or equal to 3 minutes and shorter than or equal to 24 hours.

An electric furnace, an RTA apparatus, or the like can be used for the heat treatment. The use of an RTA apparatus allows the heat treatment to be performed at a temperature higher than or equal to the strain point of the substrate if the heating time is short. Thus, the heat treatment time can be shortened.

By forming the oxide semiconductor film while it is heated or by performing heat treatment after the formation of the oxide semiconductor film, the hydrogen concentration in the oxide semiconductor film can be lowered.

[Step of Forming Insulating Film Over Oxide Semiconductor Film]

Figure 2A:
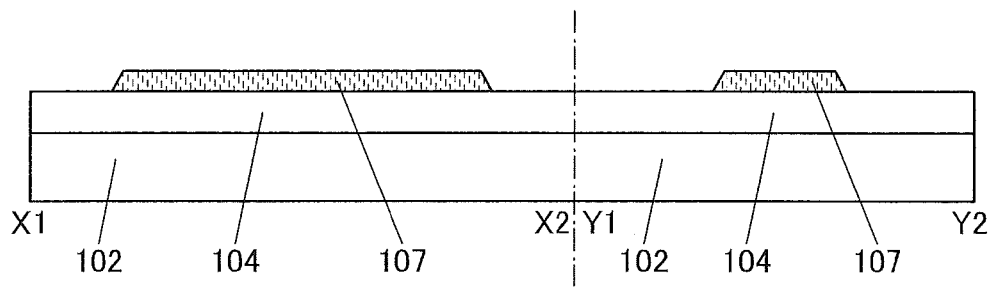
FIGS. 2A to 2D are cross-sectional views illustrating a method for manufacturing a semiconductor device.
Figure 2B:
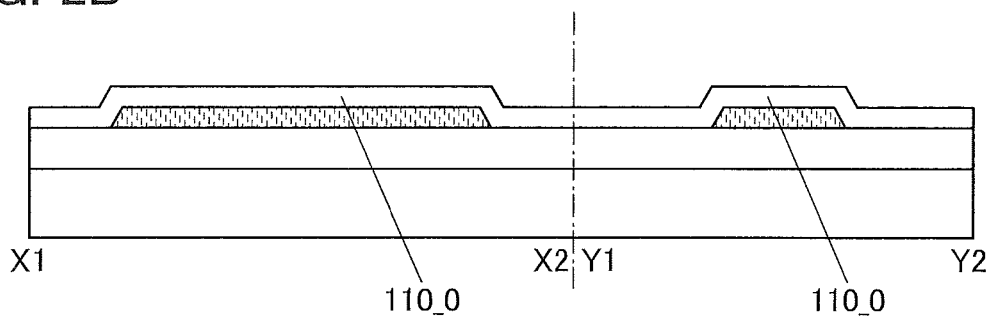

Next, an insulating film 110_0 is formed over the insulating film 104 and the oxide semiconductor film 107 (see FIG. 2B).

For the insulating film 110_0, a silicon oxide film or a silicon oxynitride film can be formed with a plasma-enhanced chemical vapor deposition apparatus (a PECVD apparatus or simply referred to as a plasma CVD apparatus). In this case, a deposition gas including silicon and an oxidizing gas are preferably used as a source gas. Typical examples of the deposition gas containing silicon include silane, disilane, trisilane, and silane fluoride. Examples of the oxidizing gas include oxygen, ozone, dinitrogen monoxide, and nitrogen dioxide.

A silicon oxynitride film having few defects can be formed as the insulating film 110_0 with the plasma CVD apparatus under the conditions that the flow rate of the oxidizing gas is more than 20 times and less than 100 times, or more than or equal to 40 times and less than or equal to 80 times the flow rate of the deposition gas and that the pressure in a treatment chamber is lower than 100 Pa or lower than or equal to 50 Pa.

As the insulating film 110_0, a dense silicon oxide film or a dense silicon oxynitride film can be formed under the following conditions: the substrate placed in a vacuum-evacuated treatment chamber of the plasma CVD apparatus is held at a temperature higher than or equal to 280° C. and lower than or equal to 400° C., the pressure in the treatment chamber into which a source gas is introduced is set to be higher than or equal to 20 Pa and lower than or equal to 250 Pa, preferably higher than or equal to 100 Pa and lower than or equal to 250 Pa, and a high-frequency power is supplied to an electrode provided in the treatment chamber.

The insulating film 110_0 may be formed by a plasma CVD apparatus using a microwave. A microwave refers to a wave in the frequency range of 300 MHz to 300 GHz. In a microwave, electron temperature and electron energy are low. Furthermore, in supplied power, the proportion of power used for acceleration of electrons is low, and therefore, power can be used for dissociation and ionization of more molecules. Thus, plasma with high density (high-density plasma) can be excited. This method causes little plasma damage to the deposition surface or a deposit, so that the insulating film 110_0 having few defects can be formed.

In this embodiment, as the insulating film 110_0, a 20-nm-thick silicon oxynitride film is formed with the plasma CVD apparatus.

[Step of Forming Conductive Film Over Insulating Film]

Next, a conductive film 112_0 is formed over the insulating film 110_0. Note that in this embodiment, as the conductive film 112_0, a metal oxide film 112a_0 and a metal film 112b_0 are formed (see FIG. 2C).

Figure 2C:
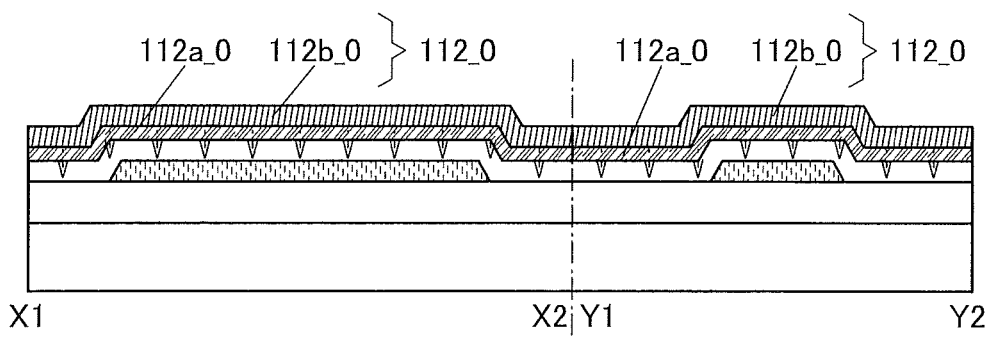

In the formation of the metal oxide film 112a_0, oxygen may be added from the metal oxide film 112a_0 to the insulating film 110_0. In FIG. 2C, oxygen added from the metal oxide film 112a_0 to the insulating film 110_0 is schematically shown by arrows.

The metal oxide film 112a_0 is preferably formed by a sputtering method in an atmosphere containing an oxygen gas. Formation of the metal oxide film 112a_0 in an atmosphere containing an oxygen gas allows suitable addition of oxygen to the insulating film 110_0. Note that a method for forming the metal oxide film 112a_0 is not limited to a sputtering method, and other methods such as an ALD method may be used.

In this embodiment, a 10-nm-thick IGZO film containing an In—Ga—Zn oxide (In:Ga:Zn=4:2:4.1 [atomic ratio]) is formed as the conductive film 112a_0 by a sputtering method. Note that oxygen addition treatment may be performed on the insulating film 110_0 before or after the formation of the conductive film 112a_0. The oxygen addition treatment can be performed similarly to the oxygen addition that can be performed after the formation of the insulating film 104.

The metal film 112b_0 may be formed by a sputtering method or an ALD method. In this embodiment, as the metal film 112b_0, a stack including a 50-nm-thick titanium nitride film and a 100-nm-thick titanium film is formed by a sputtering method.

[Step of Forming First Protective Film Over Conductive Film]

Figure 2D:
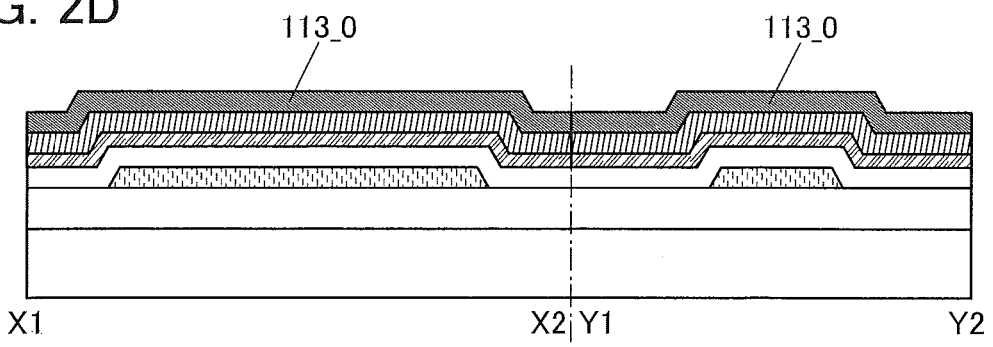

Next, a first protective film 113_0 is formed over the conductive film 112_0 (see FIG. 2D).

The first protective film 113_0 may be formed by a sputtering method or an ALD method. In this embodiment, a 100-nm-thick tungsten film is formed as the first protective film 113_0 by a sputtering method.

[Step of Forming Second Protective Film Over First Protective Film]

Figure 3A:
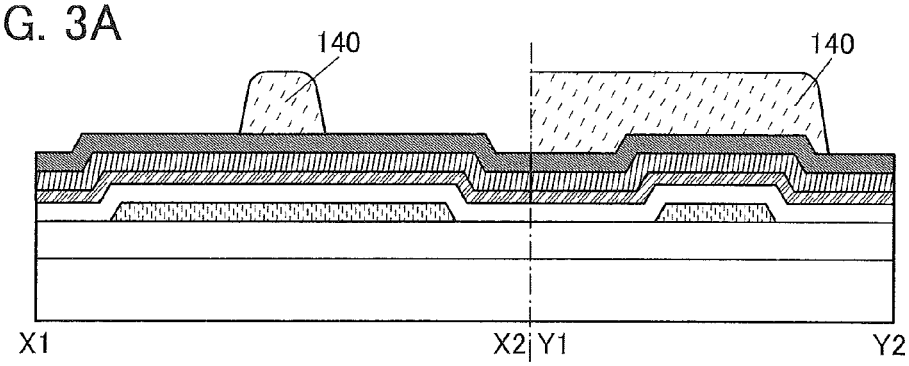
FIGS. 3A to 3D are cross-sectional views illustrating a method for manufacturing a semiconductor device.

Next, a second protective film 140 is formed over the first protective film 113_0 (see FIG. 3A).

The second protective film 140 may be formed by a resist application process and a lithography process. Note that in this embodiment, the second protective film 140 is formed so that the length of the second protective film 140 in the channel length (L) direction is 1.5 μm.

[Processing Using Second Protective Film]

Figure 3B:
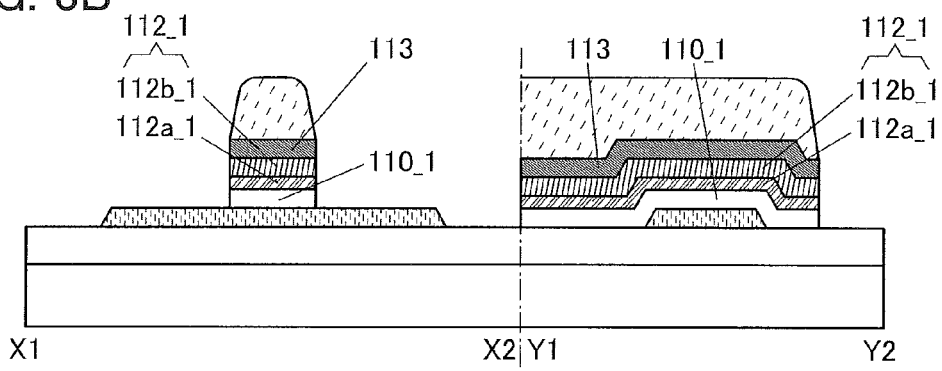

Next, the first protective film 113_0, the conductive film 112_0, and the insulating film 110_0 are processed using the second protective film 140 (see FIG. 3B).

The first protective film 113_0, the conductive film 112_0, and the insulating film 110_0 may be processed by a wet etching method and/or a dry etching method. In this embodiment, the first protective film 113_0, the conductive film 112_0, and the insulating film 110_0 are processed by a dry etching method.

In FIG. 3B, processing is performed using the second protective film 140, so that the first protective film 113_0 is processed into an island-shaped first protective film 113, the conductive film 112_0 is processed into an island-shaped conductive film 112_1, and the insulating film 110_0 is processed into an island-shaped insulating film 110_1. Note that the conductive film 112_1 includes the metal oxide film 112a_1 and the metal film 112b_1.

The side end portions of the first protective film 113, the conductive film 112_1, and the insulating film 110_1 are formed in substantially the same position as that of the second protective film 140. That is, the length of each of the first protective film 113, the conductive film 112_1, and the insulating film 110_1 in the channel length (L) direction is approximately 1.5 μm.

When the processing is performed using the second protective film 140, the thickness of the oxide semiconductor film 107 in a region not overlapping with the second protective film 140 might be reduced. When the processing is performed using the second protective film 140, an etchant or an etching gas (e.g., chlorine) might be added to the oxide semiconductor film 107 or the constituent element of the conductive film 112_1 or the insulating film 110_1 might be added to the oxide semiconductor film 107.

[Processing Using First Protective Film]

Figure 3C:
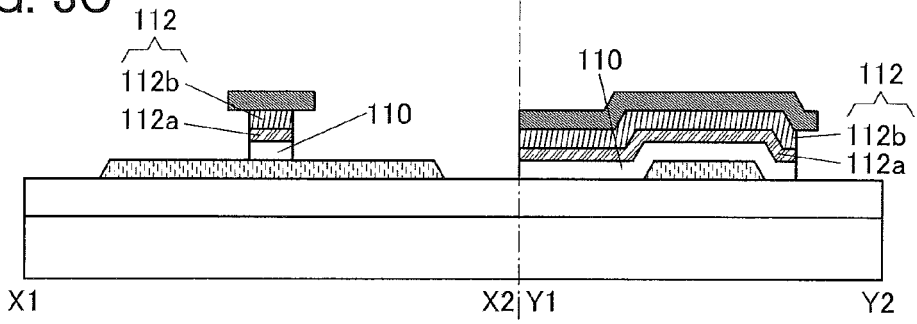

Next, the second protective film 140 is removed, and the conductive film 112_1 and the insulating film 110_1 are processed using the first protective film 113 (see FIG. 3C).

The second protective film 140 can be removed by a wet etching method and/or a dry etching method. In this embodiment, the second protective film 140 is removed by a wet etching method.

The conductive film 112_1 and the insulating film 110_1 can be processed by a wet etching method and/or a dry etching method.

In FIG. 3C, processing is performed using the first protective film 113, so that the conductive film 112_1 is processed into the conductive film 112, and the insulating film 110_1 is processed into the insulating film 110. Note that the conductive film 112 includes the metal oxide film 112a and the metal film 112b. The metal oxide film 112a, the metal film 112b, and the insulating film 110 are each processed to have an area less than that of the first protective film 113. In particular, the metal oxide film 112a and the metal film 112b are each preferably formed to have an area greater than or equal to 15% and less than or equal to 50% of the area of the first protective film 113.

For example, when the length of the second protective film 140 in the channel length (L) direction is 1.5 μm, the length of each of the metal oxide film 112a and the metal film 112b in the channel length (L) direction can be in the range from 0.225 μm to 0.75 μm. Note that the range is favorable because size variation in a substrate surface is increased when the processing is performed so that the length in the channel length (L) of each of the metal oxide film 112a and the metal film 112b is less than 15% of the length in the channel length (L) of the second protective film 140.

In this embodiment, the metal oxide film 112a, the metal film 112b, and the insulating film 110 are formed by performing side etching using the first protective film 113 as a mask by a wet etching method, so that the side end portions of the metal oxide film 112a, the metal film 112b, and the insulating film 110 can be positioned inward from the side end portion of the first protective film 113.

The etching by the wet etching method may be performed plural times using some kinds of etchants.

Note that a method for forming the conductive film 112 and the insulating film 110 using the first protective film 113 after the second protective film 140 is removed is described as an example in this embodiment; however, one embodiment of the present invention is not limited thereto. For example, the second protective film 140 is left without being removed, and the conductive film 112 and the insulating film 110 may be formed using the second protective film 140 and the first protective film 113. In this case, the second protective film 140 is removed after the conductive film 112 and the insulating film 110 are formed.

[Step of Performing Plasma Treatment]

Figure 3D:
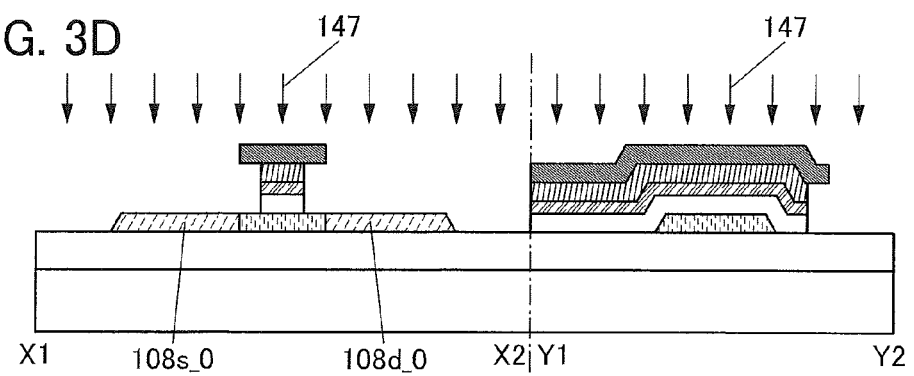

Next, plasma treatment is performed on the oxide semiconductor film 107 from above the first protective film 113 (see FIG. 3D).

The state of plasma treatment using plasma 147 is schematically shown in FIG. 3D. Note that by the plasma treatment, a source region 108s_0 and a drain region 108d_0 are formed in the oxide semiconductor film 107. The source region 108s_0 and the drain region 108d_0 are formed in regions of the oxide semiconductor film 107 that do not overlap with the first protective film 113.

The plasma treatment using the plasma 147 is preferably performed under an atmosphere of argon and/or an atmosphere of nitrogen. In particular, a mixed atmosphere of argon and nitrogen is further preferable. For example, when the flow rate of nitrogen is greater than or equal to 5 times and less than or equal to 20 times, preferably greater than or equal to 8 times and less than or equal to 10 times the flow rate of argon, the planarity of a surface of the source region 108s_0 and the drain region 108d_0 can be improved.

For example, the plasma treatment may be performed under the following conditions: an etching apparatus is used; an argon gas at a flow rate of 100 sccm and a nitrogen gas at a flow rate of 1000 sccm are introduced into a chamber in the etching apparatus; the pressure in the chamber is 40 Pa; and a power of 1000 W is supplied to an RF power source with a frequency of 27.12 MHz.

The above-described plasma treatment is performed by generating plasma in a gas atmosphere containing an impurity element to be added, so that the impurity element can be added to the oxide semiconductor film. An ashing apparatus, a plasma CVD apparatus, a high-density plasma CVD apparatus, or the like may be used as well as the above-described etching apparatus to generate plasma.

Note that a method in which plasma treatment is performed on the oxide semiconductor film 107 from above the first protective film 113 is described in this embodiment as an example; however, one embodiment of the present invention is not limited thereto. For example, instead of the plasma treatment, an impurity element may be added by an ion doping method, an ion implantation method, or the like.

As a source gas of the impurity element, at least one of $B_2H_6$, $PH_3$, $CH_4$, $N_2$, $NH_3$, $AlH_3$, $AlCl_3$, $SiH_4$, $Si_2H_6$, $F_2$, HF, $H_2$, and a rare gas can be used. Alternatively, at least one of $B_2H_6$, $PH_3$, $N_2$, $NH_3$, $AlH_3$, $AlCl_3$, $F_2$, HF, and $H_2$ that are diluted with a rare gas can be used. Typical examples of the rare gas element include helium, neon, argon, krypton, and xenon.

Alternatively, after a rare gas is added to the oxide semiconductor film 107, at least one of $B_2H_6$, $PH_3$, $CH_4$, $N_2$, $NH_3$, $AlH_3$, $AlCl_3$, $SiH_4$, $Si_2H_6$, $F_2$, HF, and $H_2$ may be added thereto. Further alternatively, after at least one of $B_2H_6$, $PH_3$, $CH_4$, $N_2$, $NH_3$, $AlH_3$, $AlCl_3$, $SiH_4$, $Si_2H_6$, $F_2$, HF, and $H_2$ is added to the oxide semiconductor film 107, a rare gas may be added thereto.

[Step of Forming Nitride Insulating Film]

Figure 4A:
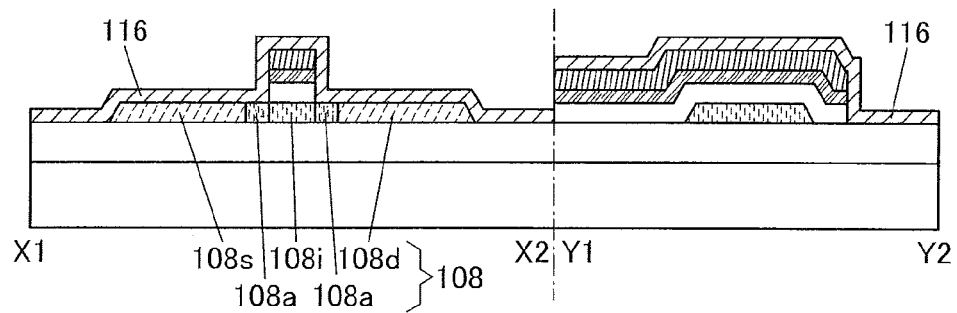
FIGS. 4A to 4D are cross-sectional views illustrating a method for manufacturing a semiconductor device.

Next, the first protective film 113 is removed, and the insulating film 116 is formed over the insulating film 104, the oxide semiconductor film 107, and the conductive film 112 (see FIG. 4A).

In FIG. 4A, by forming the insulating film 116, the oxide semiconductor film 107 is processed into the oxide semiconductor film 108 including the channel region 108i, the low-resistance regions 108a, the source region 108s, and the drain region 108d.

Note that the channel region 108i is formed in a region in contact with the insulating film 110, and the source region 108s and the drain region 108d are formed in regions in contact with the insulating film 116. Furthermore, the low-resistance regions 108a are formed in regions that overlap with the first protective film 113 and do not overlap with the insulating film 110.

Since the channel region 108i is covered with the first protective film 113 and the like during the plasma treatment, the channel region 108i is not exposed to the plasma 147. In addition, the channel region 108i is a substantially i-type region because the channel region 108i is in contact with the insulating film 110 and thus is not in contact with the insulating film 116. In contrast, the source region 108s and the drain region 108d are substantially n-type regions because the source region 108s and the drain region 108d are exposed to the plasma 147 and in contact with the insulating film 116. Moreover, the low-resistance regions 108a are substantially n-type regions because the low-resistance regions 108a are in contact with the insulating film 116 although the low-resistance regions 108a are not exposed to the plasma 147. Note that since the low-resistance regions 108a are not exposed to the plasma 147, the resistance of the low-resistance regions 108a is higher than that of the source region 108s and the drain region 108d.

Note that the low-resistance regions 108a function as lightly doped drain (LDD) regions. By providing the LDD regions in the oxide semiconductor film 108, the electric field of the drain region can be relaxed. Thus, change in the threshold voltage of the transistor due to the electric field of the drain region can be reduced.

The first protective film 113 can be removed by a wet etching method and/or a dry etching method. In this embodiment, the first protective film 113 is removed by a dry etching method.

In this embodiment, as the insulating film 116, a 100-nm-thick silicon nitride oxide film is formed with a plasma CVD apparatus. The silicon nitride oxide film may be formed under the following conditions: a plasma CVD apparatus is used; the substrate temperature is 220° C.; a silane gas at a flow rate of 50 sccm, a nitrogen gas at a flow rate of 5000 sccm, and an ammonia gas at a flow rate of 100 sccm are introduced into a chamber in the plasma CVD apparatus; the pressure in the chamber is 100 Pa; and a power of 1000 W is supplied to an RF power source with a frequency of 27.12 MHz.

With the use of a silicon nitride oxide film as the insulating film 116, nitrogen or hydrogen in the silicon nitride oxide film can be supplied to the low-resistance regions 108a, the source region 108s, and the drain region 108d in contact with the insulating film 116. In addition, when the formation temperature of the insulating film 116 is the above temperature, release of excess oxygen contained in the insulating film 110 to the outside can be suppressed.

[Step of Forming Oxide Insulating Film]

Figure 4B:
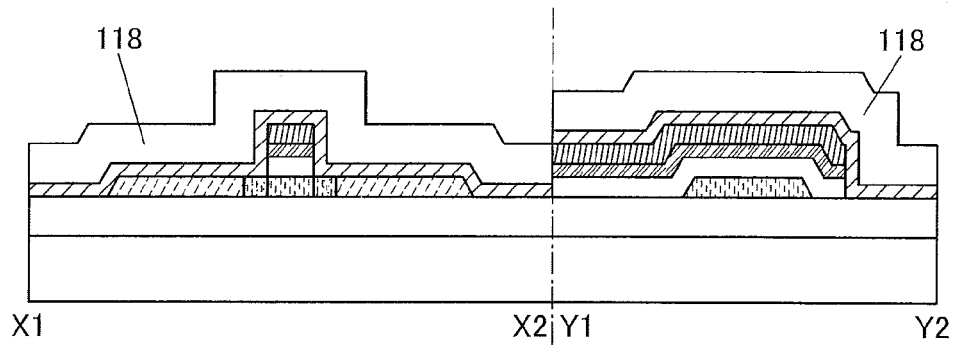

Next, the insulating film 118 is formed over the insulating film 116 (see FIG. 4B).

In this embodiment, as the insulating film 118, a 300-nm-thick silicon oxynitride film is formed with a plasma CVD apparatus.

[Formation of Openings]

Figure 4C:
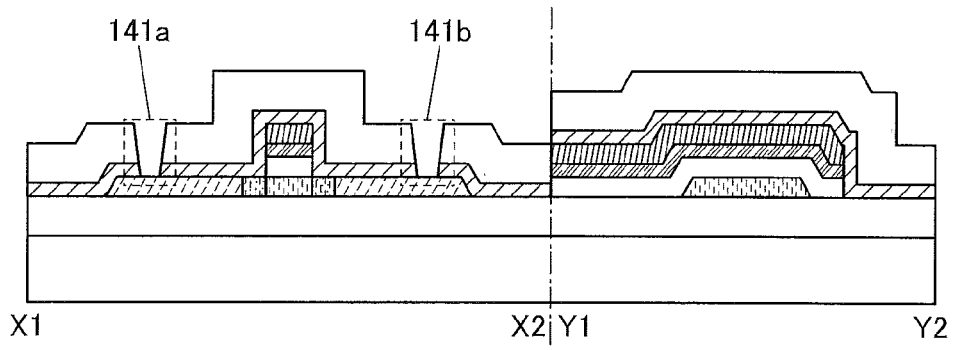

Subsequently, a mask is formed by lithography in a desired position over the insulating film 118, and then, the insulating film 118 and the insulating film 116 are partly etched, so that the opening 141a reaching the source region 108s and the opening 141b reaching the drain region 108d are formed (see FIG. 4C).

To etch the insulating film 118 and the insulating film 116, a wet etching method and/or a dry etching method can be used. In this embodiment, the insulating film 118 and the insulating film 116 are processed by a dry etching method.

Figure 4D:
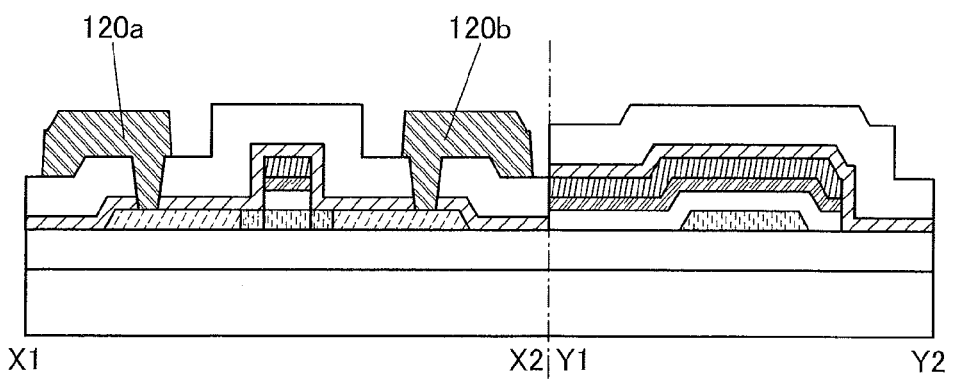

Next, a conductive film is formed over the source region 108s, the drain region 108d, and the insulating film 118 so as to cover the openings 141a and 141b and the conductive film is processed into a desired shape, whereby the conductive films 120a and 120b are formed (see FIG. 4D).

In this embodiment, for the conductive films 120a and 120b, a stack including a 50-nm-thick tungsten film and a 400-nm-thick copper film is formed with a sputtering apparatus.

To process the conductive film to be the conductive films 120a and 120b, a wet etching method and/or a dry etching method can be used. In this embodiment, in the processing of the conductive film into the conductive films 120a and 120b, the copper film is etched by a wet etching method and then the tungsten film is etched by a dry etching method.

Through the above process, the transistor 100 in FIGS. 1A to 1C can be fabricated.

Note that the films included in the transistor 100 (the insulating film, the metal oxide film, the metal film, the oxide semiconductor film, the conductive film, and the like) can be formed by, other than the above methods, a sputtering method, a chemical vapor deposition (CVD) method, a vacuum evaporation method, a pulsed laser deposition (PLD) method, or an ALD method. Alternatively, a coating method or a printing method can be used. Although the sputtering method and a plasma-enhanced chemical vapor deposition (PECVD) method are typical examples of the film formation method, a thermal CVD method may be used. As an example of a thermal CVD method, a metal organic chemical vapor deposition (MOCVD) method can be given.

Deposition by a thermal CVD method may be performed in such a manner that the pressure in a chamber is set to an atmospheric pressure or a reduced pressure, and a source gas and an oxidizer are supplied to the chamber at a time and react with each other in the vicinity of the substrate or over the substrate. Thus, no plasma is generated in the deposition; therefore, a thermal CVD method has an advantage that no defect due to plasma damage is caused.

The films such as the conductive films, the insulating films, the oxide semiconductor films, and the metal oxide films that are described above can be formed by a thermal CVD method such as an MOCVD method. For example, in the case where an In—Ga—Zn—O film is formed, trimethylindium (In(CH$_3$)$_3$), trimethylgallium (Ga(CH$_3$)$_3$), and dimethylzinc (Zn(CH$_3$)$_2$) are used. Without limitation to the above combination, triethylgallium (Ga(C$_2$H$_5$)$_3$) can be used instead of trimethylgallium and diethylzinc (Zn(C$_2$H$_5$)$_2$) can be used instead of dimethylzinc.

In the case where a hafnium oxide film is formed with a deposition apparatus employing an ALD method, two kinds of gases are used, namely, ozone (O$_3$) as an oxidizer and a source gas that is obtained by vaporizing liquid containing a solvent and a hafnium precursor (hafnium alkoxide or hafnium amide such as tetrakis(dimethylamide)hafnium (TDMAH, Hf[N(CH$_3$)$_2$]$_4$) or tetrakis(ethylmethylamide) hafnium).

In the case where an aluminum oxide film is formed with a deposition apparatus employing an ALD method, two kinds of gases are used, namely, H$_2$O as an oxidizer and a source gas that is obtained by vaporizing liquid containing a solvent and an aluminum precursor (e.g., trimethylaluminum (TMA, Al(CH$_3$)$_3$)). Examples of another material include tris(dimethylamide)aluminum, triisobutylaluminum, and aluminum tris(2,2,6,6-tetramethyl-3,5-heptanedionate).

In the case where a silicon oxide film is formed with a deposition apparatus employing an ALD method, hexachlorodisilane is adsorbed on a surface on which a film is to be formed, and radicals of an oxidizing gas (O$_2$ or dinitrogen monoxide) are supplied to react with the adsorbate.

In the case where a tungsten film is formed with a deposition apparatus employing an ALD method, a WF$_6$ gas and a B$_2$H$_6$ gas are sequentially introduced to form an initial tungsten film, and then, a WF$_6$ gas and an H$_2$ gas are used to form a tungsten film. Note that an SiH$_4$ gas may be used instead of a B$_2$H$_6$ gas.

In the case where an oxide semiconductor film such as an In—Ga—Zn—O film is formed with a deposition apparatus employing an ALD method, an In(CH$_3$)$_3$ gas and an O$_3$ gas are used to form an In—O layer, a Ga(CH$_3$)$_3$ gas and an O$_3$ gas are used to form a Ga—O layer, and then, a Zn(CH$_3$)$_2$ gas and an O$_3$ gas are used to form a Zn—O layer. Note that the order of these layers is not limited to this example. A mixed compound layer such as an In—Ga—O layer, an In—Zn—O layer, or a Ga—Zn—O layer may be formed by using these gases. Note that although an H$_2$O gas that is obtained by bubbling water with an inert gas such as Ar may be used instead of an O$_3$ gas, it is preferable to use an O$_3$ gas, which does not contain H.

<1-3. Components of Semiconductor Device>

Next, details of the components of the semiconductor device in FIGS. 1A to 1C are described.

[Substrate]

As the substrate 102, a variety of substrates can be used without particular limitation. Examples of the substrate include a semiconductor substrate (e.g., a single-crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper containing a fibrous material, and a base material film. As examples of the glass substrate, a barium borosilicate glass substrate, an aluminoborosilicate glass substrate, and a soda lime glass substrate can be given. Examples of materials of the flexible substrate, the attachment film, the base film, and the like are plastics typified by polyethylene terephthalate (PET), polyethylene naphthalate (PEN), and polyether sulfone (PES). Another example is a synthetic resin such as acrylic. Furthermore, polypropylene, polyester, polyvinyl fluoride, and polyvinyl chloride can be given as examples. Other examples are polyamide, polyimide, aramid, epoxy, an inorganic vapor deposition film, and paper. In particular, a transistor formed using a semiconductor substrate, a single-crystal substrate, an SOI substrate, or the like can have little variation in characteristics, size, shape, or the like, high current capability, and a small size. Such a transistor can achieve lower power consumption or higher integration of a circuit.

Alternatively, a flexible substrate may be used as the substrate 102, and the transistor may be formed directly on the flexible substrate. Alternatively, a separation layer may be provided between the substrate 102 and the transistor. The separation layer can be used when part or the whole of a semiconductor device formed over the separation layer is separated from the substrate 102 and transferred to another substrate. In such a case, the transistor can be transferred to even a substrate having low heat resistance or a flexible substrate. For example, the above separation layer can be an organic resin film of polyimide or the like formed over the substrate or a stack including inorganic films (e.g., a tungsten film and a silicon oxide film).

Examples of a substrate to which a transistor is transferred include, in addition to the above substrates over which the transistor can be formed, a paper substrate, a cellophane substrate, an aramid film substrate, a polyimide film substrate, a stone substrate, a wood substrate, a cloth substrate (including a natural fiber (silk, cotton, or hemp), a synthetic fiber (nylon, polyurethane, or polyester), a regenerated fiber (acetate, cupra, rayon, or regenerated polyester), and the like), a leather substrate, and a rubber substrate. When such a substrate is used, a transistor with excellent characteristics or a transistor with low power consumption can be formed, a device with high durability can be manufactured, high heat resistance can be provided, or a reduction in weight or thickness can be achieved.

[First Insulating Film]

The insulating film 104 can be formed by a sputtering method, a CVD method, an evaporation method, a pulsed laser deposition (PLD) method, a printing method, a coating method, or the like as appropriate. For example, the insulating film 104 can be formed to have a single-layer structure or stacked-layer structure of an oxide insulating film and/or a nitride insulating film. To improve the properties of the interface with the oxide semiconductor film 108, at least a region of the insulating film 104 that is in contact with the oxide semiconductor film 108 is preferably formed using an oxide insulating film. When the insulating film 104 is formed using an oxide insulating film from which oxygen is released by heating, oxygen contained in the insulating film 104 can be moved to the oxide semiconductor film 108 by heat treatment.

The thickness of the insulating film 104 can be greater than or equal to 50 nm, greater than or equal to 100 nm and less than or equal to 3000 nm, or greater than or equal to 200 nm and less than or equal to 1000 nm. By increasing the thickness of the insulating film 104, the amount of oxygen released from the insulating film 104 can be increased, and interface states at the interface between the insulating film 104 and the oxide semiconductor film 108 and oxygen vacancies included in the channel region 108i of the oxide semiconductor film 108 can be reduced.

For example, the insulating film 104 can be formed to have a single-layer structure or stacked-layer structure of silicon oxide, silicon oxynitride, silicon nitride oxide, silicon nitride, aluminum oxide, hafnium oxide, gallium oxide, a Ga—Zn oxide, or the like. In this embodiment, the insulating film 104 has a stacked-layer structure of a silicon nitride film and a silicon oxynitride film. With the insulating film 104 having such a stacked-layer structure including a silicon nitride film as a lower layer and a silicon oxynitride film as an upper layer, oxygen can be efficiently introduced into the oxide semiconductor film 108.

[Oxide Semiconductor Film]

Note that the oxide semiconductor film 108 is described in detail in Embodiment 2.

[Second Insulating Film]

The insulating film 110 functions as a gate insulating film of the transistor 100. In addition, the insulating film 110 has a function of supplying oxygen to the oxide semiconductor film 108, particularly to the channel region 108i. The insulating film 110 can be formed to have a single-layer structure or a stacked-layer structure of an oxide insulating film or a nitride insulating film, for example. To improve the interface properties with the oxide semiconductor film 108, a region that is in the insulating film 110 and in contact with the oxide semiconductor film 108 is preferably formed using at least an oxide insulating film. For example, silicon oxide, silicon oxynitride, silicon nitride oxide, or silicon nitride may be used for the insulating film 110.

The thickness of the insulating film 110 can be greater than or equal to 5 nm and less than or equal to 400 nm, greater than or equal to 5 nm and less than or equal to 300 nm, or greater than or equal to 10 nm and less than or equal to 250 nm.

It is preferable that the insulating film 110 have few defects and typically have as few signals observed by electron spin resonance (ESR) spectroscopy as possible. Examples of the signals include a signal due to an E' center observed at a g-factor of 2.001. Note that the E' center is due to the dangling bond of silicon. As the insulating film 110, a silicon oxide film or a silicon oxynitride film whose spin density due to the E' center is lower than or equal to $3 \times 10^{17}$ spins/cm$^3$ and preferably lower than or equal to $5 \times 10^{16}$ spins/cm$^3$ may be used.

In addition to the above-described signal, a signal due to nitrogen dioxide ($NO_2$) might be observed in the insulating film 110. The signal is divided into three signals according to the N nuclear spin; a first signal, a second signal, and a third signal. The first signal is observed at a g-factor of greater than or equal to 2.037 and less than or equal to 2.039. The second signal is observed at a g-factor of greater than or equal to 2.001 and less than or equal to 2.003. The third signal is observed at a g-factor of greater than or equal to 1.964 and less than or equal to 1.966.

It is suitable to use an insulating film whose spin density due to nitrogen dioxide ($NO_2$) is higher than or equal to $1 \times 10^{17}$ spins/cm$^3$ and lower than $1 \times 10^{18}$ spins/cm$^3$ as the insulating film 110, for example.

Note that a nitrogen oxide ($NO_x$) such as a nitrogen dioxide ($NO_2$) forms a level in the insulating film 110. The level is positioned in the energy gap of the oxide semiconductor film 108. Thus, when nitrogen oxide ($NO_x$) is diffused to the interface between the insulating film 110 and the oxide semiconductor film 108, an electron might be trapped by the level on the insulating film 110 side. As a result, the trapped electron remains in the vicinity of the interface between the insulating film 110 and the oxide semiconductor film 108; thus, the threshold voltage of the transistor is shifted in the positive direction. Accordingly, the use of a film with a low nitrogen oxide content as the insulating film 110 can reduce a shift of the threshold voltage of the transistor.

As an insulating film that releases a small amount of nitrogen oxide ($NO_x$), for example, a silicon oxynitride film can be used. The silicon oxynitride film releases more ammonia than nitrogen oxide ($NO_x$) in thermal desorption spectroscopy (TDS); the typical released amount of ammonia is greater than or equal to $1 \times 10^{18}$ molecules/cm$^3$ and less than or equal to $5 \times 10^{19}$ molecules/cm$^3$. Note that the released amount of ammonia is the total amount of ammonia released by heat treatment in a range from 50° C. to 650° C. or a range from 50° C. to 550° C. in TDS.

Since nitrogen oxide ($NO_x$) reacts with ammonia and oxygen in heat treatment, the use of an insulating film that releases a large amount of ammonia reduces nitrogen oxide ($NO_x$).

Note that in the case where the insulating film 110 is analyzed by SIMS, nitrogen concentration in the film is preferably lower than or equal to $6 \times 10^{20}$ atoms/cm$^3$.

The insulating film 110 may be formed using a high-k material such as hafnium silicate ($HfSiO_x$), hafnium silicate to which nitrogen is added (HfSi$_x$O$_y$N$_z$), hafnium aluminate to which nitrogen is added (HfAl$_x$O$_y$N$_z$), or hafnium oxide. The use of such a high-k material enables a reduction in gate leakage current of a transistor.

The insulating film 110 may be formed by a CVD method using an organosilane gas. As the organosilane gas, any of the following silicon-containing compound can be used: tetraethoxysilane (TEOS) (chemical formula: Si(OC$_2$H$_5$)$_4$); tetramethylsilane (TMS) (chemical formula: Si(CH$_3$)$_4$); tetramethylcyclotetrasiloxane (TMCTS); octamethylcyclotetrasiloxane (OMCTS); hexamethyldisilazane (HMDS); triethoxysilane (SiH(OC$_2$H$_5$)$_3$); trisdimethylaminosilane (SiH(N(CH$_3$)$_2$)$_3$); or the like. The insulating film 110 having high coverage can be formed by a CVD method using an organosilane gas.

[Third Insulating Film]

The insulating film 116 contains nitrogen or hydrogen. The insulating film 116 may contain fluorine. The insulating film 116 is a nitride insulating film, for example. The nitride insulating film can be formed using silicon nitride, silicon nitride oxide, silicon oxynitride, silicon nitride fluoride, silicon fluoronitride, or the like. The hydrogen concentration in the insulating film 116 is preferably higher than or equal to 1×10$^{22}$ atoms/cm$^3$. Furthermore, the insulating film 116 is in contact with the low-resistance regions 108a, the source region 108s, and the drain region 108d of the oxide semiconductor film 108. Thus, the concentration of an impurity (nitrogen or hydrogen) in the low-resistance regions 108a, the source region 108s, and the drain region 108d in contact with the insulating film 116 is increased, leading to an increase in the carrier density of the source region 108s and the drain region 108d.

[Fourth Insulating Film]

As the insulating film 118, an oxide insulating film can be used. Alternatively, a stack including an oxide insulating film and a nitride insulating film can be used as the insulating film 118. The insulating film 118 can be formed using, for example, silicon oxide, silicon oxynitride, silicon nitride oxide, aluminum oxide, hafnium oxide, gallium oxide, or Ga—Zn oxide.

Furthermore, the insulating film 118 preferably functions as a barrier film against hydrogen, water, and the like from the outside.

The thickness of the insulating film 118 can be greater than or equal to 30 nm and less than or equal to 500 nm, or greater than or equal to 100 nm and less than or equal to 400 nm.

[Conductive Film]

The conductive films 112, 120a, and 120b can be formed by a sputtering method, a vacuum evaporation method, a pulsed laser deposition (PLD) method, a thermal CVD method, or the like. The conductive films 112, 120a, and 120b can be formed using, for example, a metal element selected from aluminum, chromium, copper, tantalum, titanium, molybdenum, nickel, iron, cobalt, and tungsten, an alloy containing the metal element as a component, or an alloy containing any of the metal elements in combination. Furthermore, one or more metal elements selected from manganese or zirconium may be used. In addition, the conductive films 112, 120a, and 120b may have a single-layer structure or a stacked-layer structure of two or more layers. For example, the following structure may be used: a single-layer structure of an aluminum film containing silicon; a single-layer structure of a copper film containing manganese; a two-layer structure in which a titanium film is stacked over an aluminum film; a two-layer structure in which a titanium film is stacked over a titanium nitride film; a two-layer structure in which a tungsten film is stacked over a titanium nitride film; a two-layer structure in which a tungsten film is stacked over a tantalum nitride film or a tungsten nitride film; a two-layer structure in which a copper film is stacked over a copper film containing manganese; a two-layer structure in which a copper film is stacked over a titanium film; a three-layer structure in which a titanium film, an aluminum film, and a titanium film are stacked in this order, or a three-layer structure in which a copper film containing manganese, a copper film, and a copper film containing manganese are stacked in this order. Alternatively, an alloy film or a nitride film in which aluminum and one or more elements selected from titanium, tantalum, tungsten, molybdenum, chromium, neodymium, and scandium are combined may be used.

It is particularly suitable to use a material containing copper for the conductive films 112, 120a, and 120b. The use of a material containing copper for the conductive films 112, 120a, and 120b can reduce the resistance. A signal delay or the like can be suppressed even in the case of using a large-sized substrate as the substrate 102, for example.

The conductive films 112, 120a, and 120b can also be formed using a light-transmitting conductive material such as indium tin oxide (ITO), indium oxide containing tungsten oxide, indium zinc oxide containing tungsten oxide, indium oxide containing titanium oxide, indium tin oxide containing titanium oxide, indium zinc oxide, or indium tin oxide containing silicon (also referred to as an In—Sn—Si oxide or ITSO). A stacked-layer structure formed using the above light-transmitting conductive material and the above metal element can also be employed.

Note that an oxide semiconductor typified by an In—Ga—Zn oxide may be used for the conductive film 112. The oxide semiconductor can have a high carrier density when nitrogen or hydrogen is supplied from the insulating film 116. In other words, the oxide semiconductor functions as an oxide conductor (OC). Accordingly, the oxide semiconductor can be used for a gate electrode.

The conductive film 112 can have, for example, a single-layer structure of an oxide conductor (OC), a single-layer structure of a metal film, or a stacked-layer structure of an oxide conductor (OC) and a metal film.

Note that it is suitable that the conductive film 112 has a single-layer structure of a light-blocking metal film or a stacked-layer structure of an oxide conductor (OC) and a light-blocking metal film because the channel region 108i formed under the conductive film 112 can be shielded from light. In the case where the conductive film 112 has a stacked-layer structure of an oxide semiconductor or an oxide conductor (OC) and a light-blocking metal film, formation of a metal film (e.g., a titanium film or a tungsten film) over the oxide semiconductor or the oxide conductor (OC) produces any of the following effects: the resistance of the oxide semiconductor or the oxide conductor (OC) is reduced by the diffusion of the constituent element of the metal film to the oxide semiconductor or oxide conductor (OC) side, the resistance is reduced by damage (e.g., sputtering damage) during the deposition of the metal film, and the resistance is reduced when oxygen vacancies are formed by the diffusion of oxygen in the oxide semiconductor or the oxide conductor (OC) to the metal film.

When the conductive film 112 has a structure including the metal oxide film 112a and the metal film 112b as described in this embodiment, the metal oxide film 112a may be formed using the above oxide conductor (OC) and the metal film 112b may be formed using the above metal film.

The thickness of the conductive films 112, 120a, and 120b can be greater than or equal to 30 nm and less than or equal to 500 nm, or greater than or equal to 100 nm and less than or equal to 400 nm.

[First Protective Film]

The first protective film 113 serves as what is called a hard mask. The first protective film 113 can be formed by a sputtering method, a vacuum evaporation method, a pulsed laser deposition (PLD) method, a thermal CVD method, or the like. The first protective film 113 is preferably formed with an inorganic insulating material. When the first protective film 113 is formed using an inorganic material, the insulating film 110 and the conductive film 112 can be favorably processed. For the first protective film 113, for example, the materials for the above-described conductive film and the first to fourth insulating films may be used. It is preferable that one or more of a titanium film, a titanium nitride film, a tungsten film, a tungsten nitride film, a molybdenum film, a molybdenum nitride film, a copper film, a silicon oxide film, a silicon oxynitride film, a silicon nitride oxide film, and a silicon nitride film be used for the first protective film 113. Alternatively, the first protective film 113 can be a stack including the materials for the above-described conductive film and the first to fourth insulating films.

The conductive films 112, 120a, and 120b may be formed using a nanoimprint apparatus without using a deposition apparatus or a light exposure apparatus.

[Second Protective Film]

The second protective film 140 is preferably formed using an organic material. This is because when the second protective film 140 is formed using an organic material, it can be easily processed into a desired shape. For the second protective film 140, for example, a photosensitive organic resin or the like may be used. Typically, a resist or the like can be given as an example. Note that as the resist, positive and negative resists can be used.

<1-4. Structural Example 2 of Semiconductor Device>

Next, a structure of a semiconductor device, which is different from that of the semiconductor device illustrated in FIGS. 1A to 1C, is described with reference to FIGS. 5A to 5C.

Figure 5A:
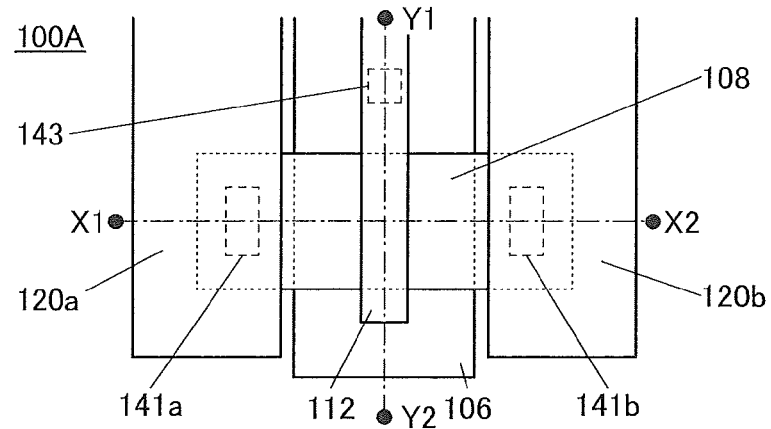
FIGS. 5A to 5C are a top view and cross-sectional views illustrating a semiconductor device.

FIG. 5A is a top view of a transistor 100A. FIG. 5B is a cross-sectional view taken along dashed-dotted line X1-X2 in FIG. 5A. FIG. 5C is a cross-sectional view taken along dashed-dotted line Y1-Y2 in FIG. 5A.

Figure 5B:
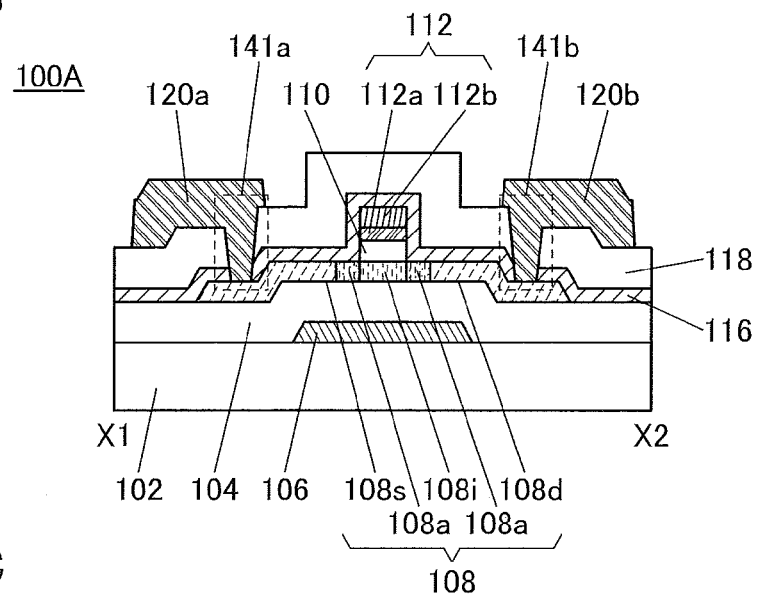
Figure 5C:
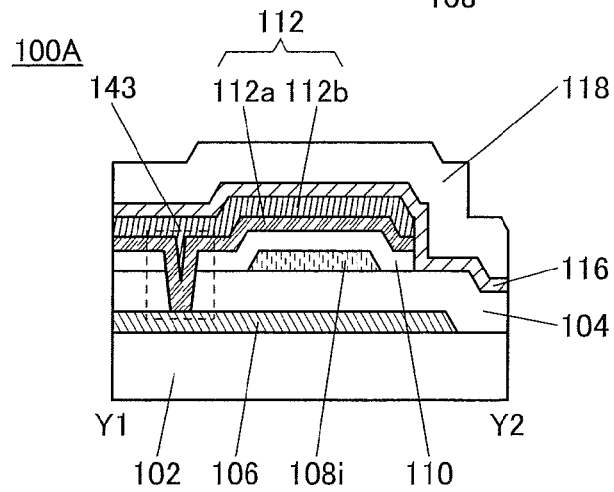

The transistor 100A illustrated in FIGS. 5A to 5C includes a conductive film 106 over the substrate 102; the insulating film 104 over the conductive film 106; the oxide semiconductor film 108 over the insulating film 104; the insulating film 110 over the oxide semiconductor film 108; the conductive film 112 over the insulating film 110; and the insulating film 116 over the insulating film 104, the oxide semiconductor film 108, and the conductive film 112.

The oxide semiconductor film 108 includes the channel region 108i overlapping with the conductive film 112, the source region 108s in contact with the insulating film 116, and the drain region 108d in contact with the insulating film 116. Furthermore, the oxide semiconductor film 108 includes the low-resistance regions 108a between the channel region 108i and the source region 108s and between the channel region 108i and the drain region 108d.

Furthermore, the conductive film 112 includes the metal oxide film 112a over the insulating film 110 and the metal film 112b over the metal oxide film 112a.

The transistor 100A includes the conductive film 106 and an opening 143 in addition to the components of the transistor 100 described above.

Note that the opening 143 is provided in the insulating films 104 and 110. The conductive film 106 is electrically connected to the conductive film 112 through the opening 143. Thus, the same potential is applied to the conductive film 106 and the conductive film 112. Note that different potentials may be applied to the conductive film 106 and the conductive film 112 without providing the opening 143. Alternatively, the conductive film 106 may be used as a light-blocking film without providing the opening 143. When the conductive film 106 is formed using a light-blocking material, for example, light with which the channel region 108i is irradiated from the bottom can be reduced.

In the case of the structure of the transistor 100A, the conductive film 106 functions as a first gate electrode (also referred to as a bottom-gate electrode), the conductive film 112 functions as a second gate electrode (also referred to as a top-gate electrode), the insulating film 104 functions as a first gate insulating film, and the insulating film 110 functions as a second gate insulating film.

The conductive film 106 can be formed using a material similar to the above-described materials of the conductive films 112, 120a, and 120b. It is particularly suitable to use a material containing copper for the conductive film 106 because the resistance can be reduced. It is suitable that, for example, each of the conductive films 106, 120a, and 120b has a stacked-layer structure in which a copper film is over a titanium nitride film, a tantalum nitride film, or a tungsten film. In that case, when the transistor 100A is used as a pixel transistor and/or a driving transistor of a display device, parasitic capacitance generated between the conductive films 106 and 120a and between the conductive films 106 and 120b can be reduced. Thus, the conductive films 106, 120a, and 120b can be used not only as the first gate electrode, the source electrode, and the drain electrode of the transistor 100A, but also as power source supply wirings, signal supply wirings, connection wirings, or the like of the display device.

In this manner, unlike the transistor 100 described above, the transistor 100A in FIGS. 5A to 5C has a structure in which a conductive film functioning as a gate electrode is provided over and under the oxide semiconductor film 108. As in the transistor 100A, a semiconductor device of one embodiment of the present invention may have a plurality of gate electrodes.

As illustrated in FIG. 5C, the oxide semiconductor film 108 faces the conductive film 106 functioning as a first gate electrode and the conductive film 112 functioning as a second gate electrode and is positioned between the two conductive films functioning as the gate electrodes.

Furthermore, the length of the conductive film 112 in the channel width direction is larger than the length of the oxide semiconductor film 108 in the channel width direction. In the channel width direction, the whole oxide semiconductor film 108 is covered with the conductive film 112 with the insulating film 110 placed therebetween. Since the conductive film 112 is connected to the conductive film 106 through the opening 143 provided in the insulating films 104 and 110, a side surface of the oxide semiconductor film 108 in the channel width direction faces the conductive film 112 with the insulating film 110 placed therebetween.

In other words, in the channel width direction of the transistor 100A, the conductive films 106 and 112 are connected to each other through the opening 143 provided in the insulating films 104 and 110, and the conductive films 106 and 112 surround the oxide semiconductor film 108 with the insulating films 104 and 110 placed therebetween.

Such a structure enables the oxide semiconductor film 108 included in the transistor 100A to be electrically surrounded by electric fields of the conductive film 106 functioning as a first gate electrode and the conductive film 112 functioning as a second gate electrode. A device structure of a transistor, like that of the transistor 100A, in which electric fields of a first gate electrode and a second gate electrode electrically surround an oxide semiconductor film in which a channel region is formed can be referred to as a surrounded channel (S-channel) structure.

Since the transistor 100A has the S-channel structure, an electric field for inducing a channel can be effectively applied to the oxide semiconductor film 108 by the conductive film 106 or the conductive film 112; thus, the current drive capability of the transistor 100A can be improved and high on-state current characteristics can be obtained. As a result of the high on-state current, it is possible to reduce the size of the transistor 100A. Furthermore, since the transistor 100A has a structure in which the oxide semiconductor film 108 is surrounded by the conductive film 106 and the conductive film 112, the mechanical strength of the transistor 100A can be increased.

When seen in the channel width direction of the transistor 100A, an opening different from the opening 143 may be formed on the side of the oxide semiconductor film 108 on which the opening 143 is not formed.

When a transistor has a pair of gate electrodes between which a semiconductor film is positioned as in the transistor 100A, one of the gate electrodes may be supplied with a signal A, and the other gate electrode may be supplied with a fixed potential $V_b$. Alternatively, one of the gate electrodes may be supplied with the signal A, and the other gate electrode may be supplied with a signal B. Alternatively, one of the gate electrodes may be supplied with a fixed potential $V_a$, and the other gate electrode may be supplied with the fixed potential $V_b$.

The signal A is, for example, a signal for controlling the on/off state. The signal A may be a digital signal with two kinds of potentials, a potential $V_1$ and a potential $V_2$ ($V_1 > V_2$). For example, the potential $V_1$ can be a high power supply potential, and the potential $V_2$ can be a low power supply potential. The signal A may be an analog signal.

The fixed potential $V_b$ is, for example, a potential for controlling a threshold voltage $V_b$ of the transistor. The fixed potential $V_b$ may be the potential $V_1$ or the potential $V_2$. In that case, a potential generator circuit for generating the fixed potential $V_b$ is not necessary, which is preferable. The fixed potential $V_b$ may be different from the potential $V_1$ or the potential $V_2$. When the fixed potential $V_b$ is low, the threshold voltage $V_{thA}$ can be high in some cases. As a result, the drain current flowing when the gate-source voltage $V_{gs}$ is 0 V can be reduced, and leakage current in a circuit including the transistor can be reduced in some cases. The fixed potential $V_b$ may be, for example, lower than the low power supply potential. Meanwhile, a high fixed potential $V_b$ can lower the threshold voltage $V_{thA}$ in some cases. As a result, the drain current flowing when the gate-source voltage $V_{gs}$ is a high power supply potential and the operating speed of the circuit including the transistor can be increased in some cases. The fixed potential $V_b$ may be, for example, higher than the low power supply potential.

The signal B is, for example, a signal for controlling the on/off state. The signal B may be a digital signal with two kinds of potentials, a potential $V_3$ and a potential $V_4$ ($V_3 > V_4$). For example, the potential $V_3$ can be a high power supply potential, and the potential $V_4$ can be a low power supply potential. The signal B may be an analog signal.

When both the signal A and the signal B are digital signals, the signal B may have the same digital value as the signal A. In this case, it may be possible to increase the on-state current of the transistor and the operating speed of the circuit including the transistor. Here, the potential $V_1$ and the potential $V_2$ of the signal A may be different from the potential $V_3$ and the potential $V_4$ of the signal B. For example, if a gate insulating film for the gate to which the signal B is input is thicker than a gate insulating film for the gate to which the signal A is input, the potential amplitude of the signal B ($V_3 - V_4$) may be larger than the potential amplitude of the signal A ($V_1 - V_2$). In this manner, the influence of the signal A and that of the signal B on the on/off state of the transistor can be substantially the same in some cases.

When both the signal A and the signal B are digital signals, the signal B may have a digital value different from that of the signal A. In this case, the signal A and the signal B can separately control the transistor, and thus, higher performance can be achieved. The transistor that is, for example, an n-channel transistor can function by itself as a NAND circuit, a NOR circuit, or the like in the following case: the transistor is turned on only when the signal A has the potential $V_1$ and the signal B has the potential $V_3$, or the transistor is turned off only when the signal A has the potential $V_2$ and the signal B has the potential $V_4$. The signal B may be a signal for controlling the threshold voltage $V_{thA}$. For example, the potential of the signal B in a period in which the circuit including the transistor operates may be different from the potential of the signal B in a period in which the circuit does not operate. The potential of the signal B may vary depending on the operation mode of the circuit. In this case, the potential of the signal B is not changed as frequently as the potential of the signal A in some cases.

When both the signal A and the signal B are analog signals, the signal B may be an analog signal having the same potential as the signal A, an analog signal whose potential is a constant times the potential of the signal A, an analog signal whose potential is higher or lower than the potential of the signal A by a constant, or the like. In this case, it may be possible to increase the on-state current of the transistor and the operating speed of the circuit including the transistor. The signal B may be an analog signal different from the signal A. In this case, the signal A and the signal B can separately control the transistor, and thus, higher performance can be achieved.

The signal A may be a digital signal, and the signal B may be an analog signal. Alternatively, the signal A may be an analog signal, and the signal B may be a digital signal.

When both of the gate electrodes of the transistor are supplied with the fixed potentials, the transistor can function as an element equivalent to a resistor in some cases. For example, in the case where the transistor is an n-channel transistor, the effective resistance of the transistor can be sometimes low (high) when the fixed potential $V_a$ or the fixed potential $V_b$ is high (low). When both the fixed potential $V_a$ and the fixed potential $V_b$ are high (low), the effective resistance can be lower (higher) than that of a transistor with only one gate in some cases.

Except for the above-mentioned points, the transistor 100A has a structure and an effect similar to those of the transistor 100 described above.

<1-5. Method 2 for Manufacturing Semiconductor Device>

Here, an example of a method for manufacturing the transistor 100A illustrated in FIGS. 5A to 5C is described with reference to FIGS. 6A to 6D, FIGS. 7A to 7D, and FIGS. 8A to 8D. Note that FIGS. 6A to 6D, FIGS. 7A to 7D, and FIGS. 8A to 8D are cross-sectional views in the channel length (L) direction and the channel width (W) direction and illustrate a method for manufacturing the transistor 100A. With the use of the manufacturing method described below, the channel length (L) of the transistor 100A can be greater than or equal to 0.2 μm and less than 1.5 μm, preferably greater than or equal to 0.5 μm and less than or equal to 1.0 μm.

[Step of Forming Oxide Semiconductor Film]

First, the conductive film 106 is formed over the substrate 102. After that, the insulating film 104 is formed over the substrate 102 and the conductive film 106. Subsequently, an oxide semiconductor film is formed over the insulating film 104. Then, the oxide semiconductor film is processed into an island shape, whereby the oxide semiconductor film 107 is formed (see FIG. 6A).

In this embodiment, for the conductive film 106, a stack including a 10-nm-thick titanium film and a 100-nm-thick copper film is formed with a sputtering apparatus. As the insulating film 104, a 400-nm-thick silicon nitride film and a 50-nm-thick silicon oxynitride film are formed with a plasma CVD apparatus. As the oxide semiconductor film 107, a 35-nm-thick oxide semiconductor film is formed with a sputtering apparatus using an In—Ga—Zn metal oxide (In:Ga:Zn=4:2:4.1 [atomic ratio]) as a sputtering target.

[Step of Forming Insulating Film Over Oxide Semiconductor Film]

Figure 6A:
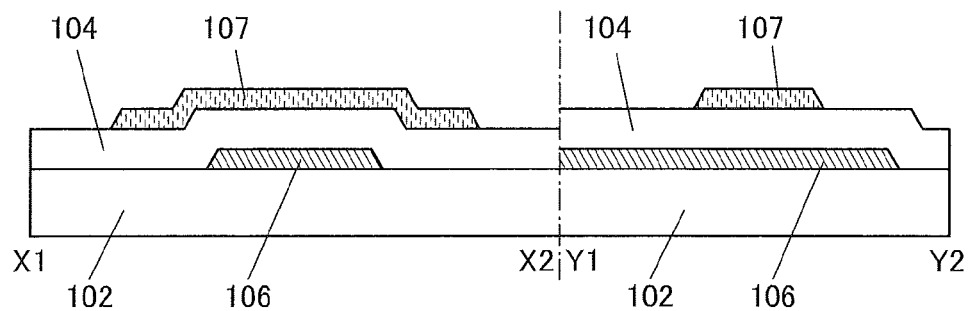
FIGS. 6A to 6D are cross-sectional views illustrating a method for manufacturing a semiconductor device.
Figure 6B:
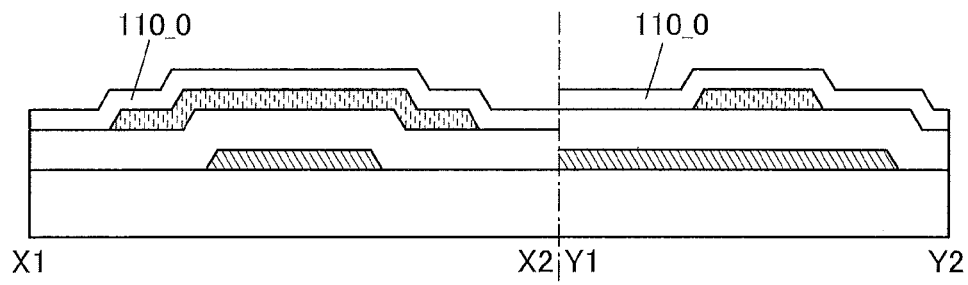

Next, the insulating film 110_0 is formed over the insulating film 104 and the oxide semiconductor film 107 (see FIG. 6B).

In this embodiment, as the insulating film 110_0, a 20-nm-thick silicon oxynitride film is formed with the plasma CVD apparatus.

[Formation of Opening]

Figure 6C:
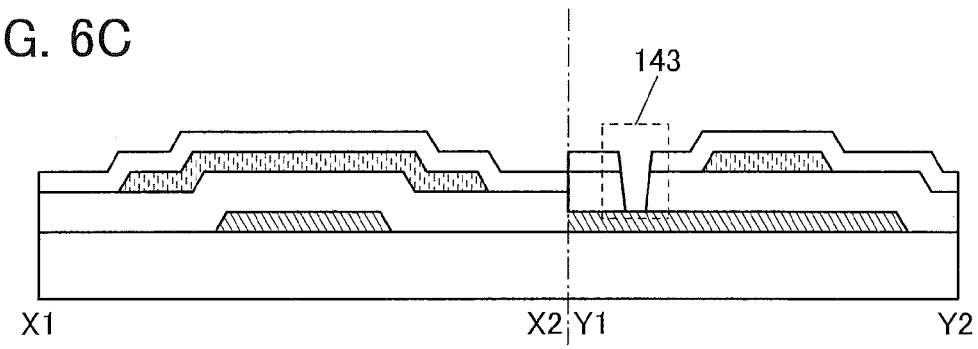

Next, a mask is formed in a desired position over the insulating film 110_0 by lithography, and then the insulating films 110_0 and 104 are partly etched, whereby the opening 143 that reaches the conductive film 106 is formed (see FIG. 6C).

The opening 143 can be formed using a wet etching apparatus and/or a dry etching apparatus.

[Step of Forming Conductive Film Over Insulating Film]

Next, the conductive film 112_0 is formed over the insulating film 110_0. Note that in this embodiment, as the conductive film 112_0, the metal oxide film 112a_0 and the metal film 112b_0 are formed (see FIG. 6D).

Figure 6D:
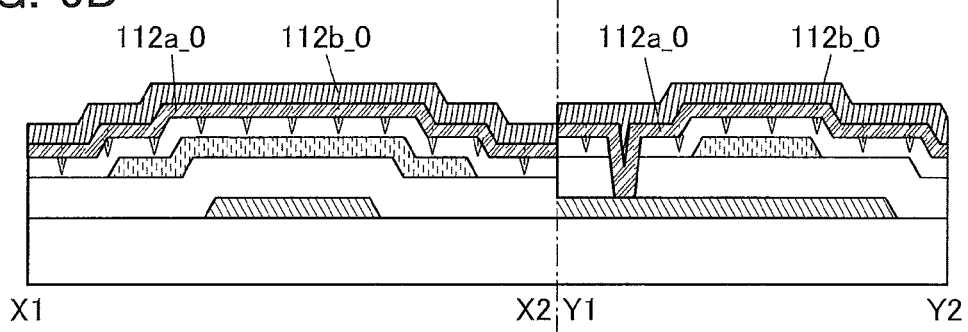

In the formation of the metal oxide film 112a_0, oxygen is added in some cases from the metal oxide film 112a_0 to the insulating film 110_0. In FIG. 6D, oxygen added from the metal oxide film 112a_0 to the insulating film 110_0 is schematically shown by arrows.

In this embodiment, a 10-nm-thick IGZO film containing an In—Ga—Zn oxide (In:Ga:Zn=4:2:4.1 [atomic ratio]) is formed as the conductive film 112a_0 by a sputtering method. As the metal film 112b_0, a stack including a 50-nm-thick titanium nitride film and a 100-nm-thick titanium film is formed by a sputtering method.

Note that the conductive film 112_0 is electrically connected to the conductive film 106 through the opening 143.

[Step of Forming First Protective Film Over Conductive Film]

Figure 7A:
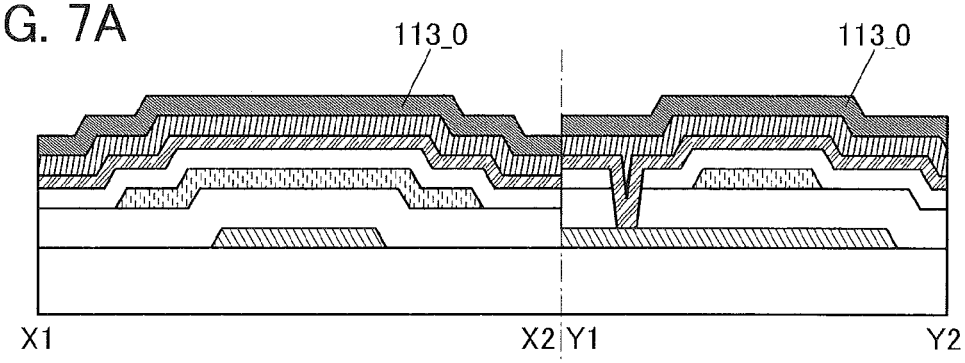
FIGS. 7A to 7D are cross-sectional views illustrating a method for manufacturing a semiconductor device.

Next, the first protective film 113_0 is formed over the conductive film 112_0 (see FIG. 7A).

In this embodiment, a 100-nm-thick titanium film is formed as the first protective film 113_0 by a sputtering method.

[Step of Forming Second Protective Film Over First Protective Film]

Figure 7B:
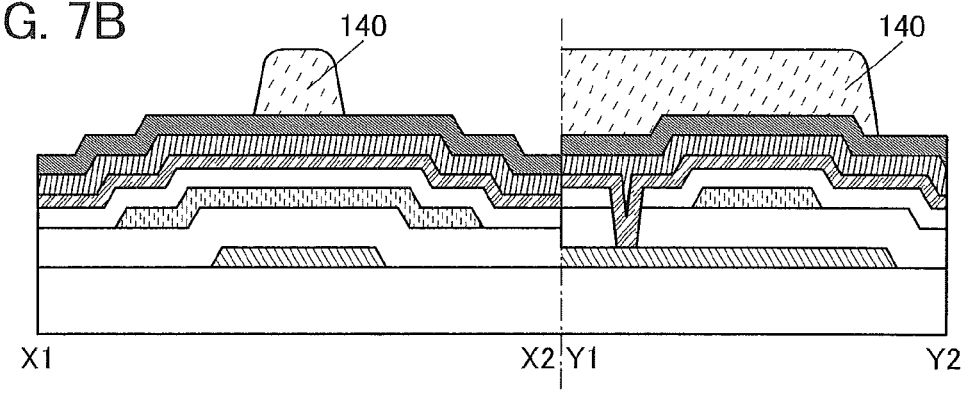

Next, the second protective film 140 is formed over the first protective film 113_0 (see FIG. 7B).

The second protective film 140 may be formed by a resist application process and a lithography process. Note that in this embodiment, the second protective film 140 is formed so that the length of the second protective film 140 in the channel length (L) direction is 1.5 μm.

[Processing Using Second Protective Film]

Figure 7C:
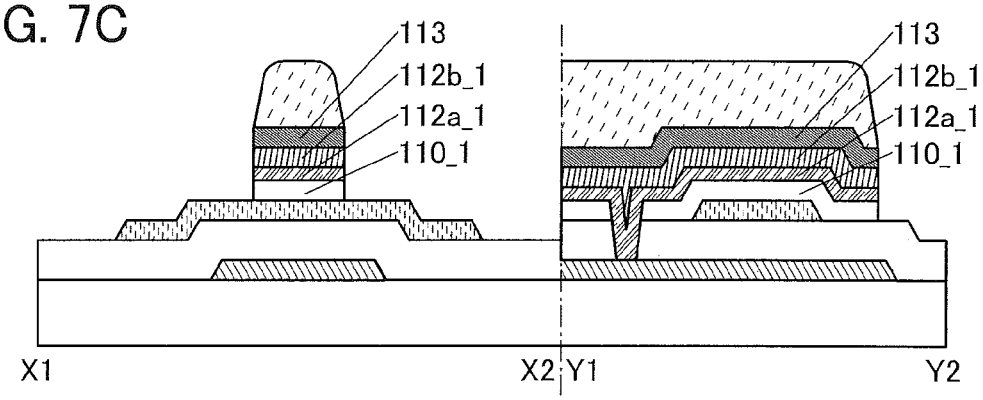

Next, the first protective film 113_0, the conductive film 112_0, and the insulating film 110_0 are processed using the second protective film 140 (see FIG. 7C).

In FIG. 7C, processing is performed using the second protective film 140, so that the first protective film 113_0 is processed into an island-shaped first protective film 113, the conductive film 112_0 is processed into an island-shaped conductive film 112_1, and the insulating film 110_0 is processed into an island-shaped insulating film 110_1. Note that the conductive film 112_1 includes a metal oxide film 112a_1 and a metal film 112b_1.

The side end portions of the first protective film 113, the conductive film 112_1, and the insulating film 110_1 are formed in substantially the same position as that of the second protective film 140. That is, the length of each of the first protective film 113, the conductive film 112_1, and the insulating film 110_1 in the channel length (L) direction is approximately 1.5 μm.

[Processing Using First Protective Film]

Figure 7D:
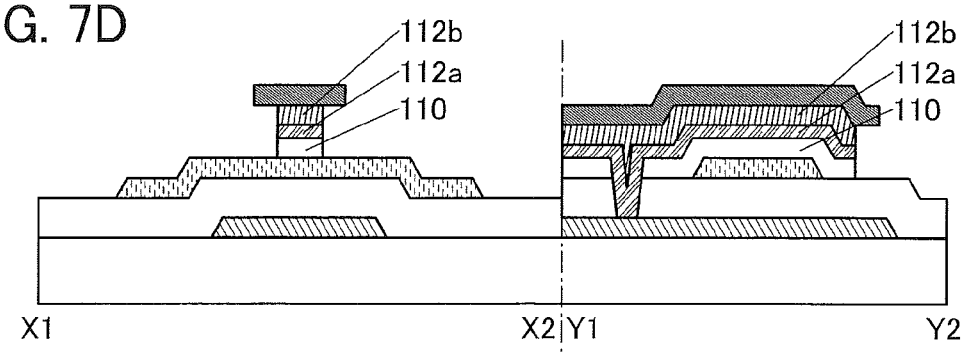

Next, the second protective film 140 is removed, and the conductive film 112_1 and the insulating film 110_1 are processed using the first protective film 113 (see FIG. 7D).

In FIG. 7D, processing is performed using the first protective film 113, so that the conductive film 112_1 is processed into the conductive film 112, and the insulating film 110_1 is processed into the insulating film 110. Note that the conductive film 112 includes the metal oxide film 112a and the metal film 112b. The metal oxide film 112a, the metal film 112b, and the insulating film 110 are each processed to have an area less than that of the first protective film 113. In particular, the metal oxide film 112a and the metal film 112b are each preferably formed to have an area greater than or equal to 15% and less than or equal to 50% of the area of the first protective film 113.

[Step of Performing Plasma Treatment]

Figure 8A:
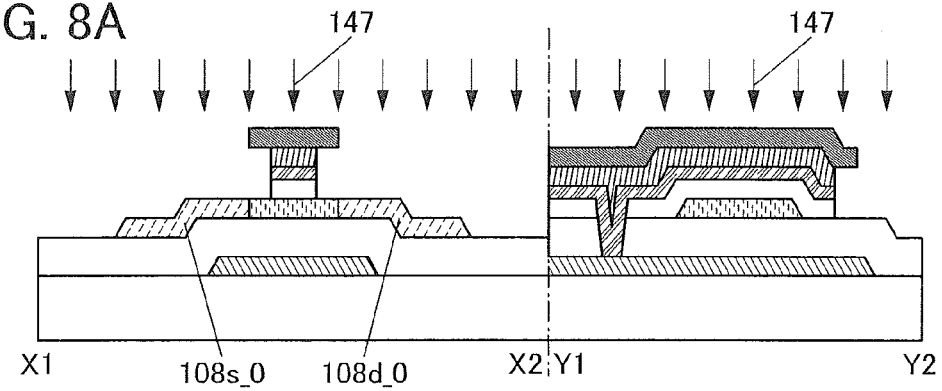
FIGS. 8A to 8D are cross-sectional views illustrating a method for manufacturing a semiconductor device.

Next, plasma treatment is performed on the oxide semiconductor film 107 from above the first protective film 113 (see FIG. 8A).

The state of plasma treatment using plasma 147 is schematically shown in FIG. 8A. Note that the source region 108s_0 and the drain region 108d_0 are formed in the oxide semiconductor film 107 by performing the plasma treatment. The source region 108s_0 and the drain region 108d_0 are formed in a region of the oxide semiconductor film 107 that does not overlap with the first protective film 113.

[Step of Forming Nitride Insulating Film]

Figure 8B:
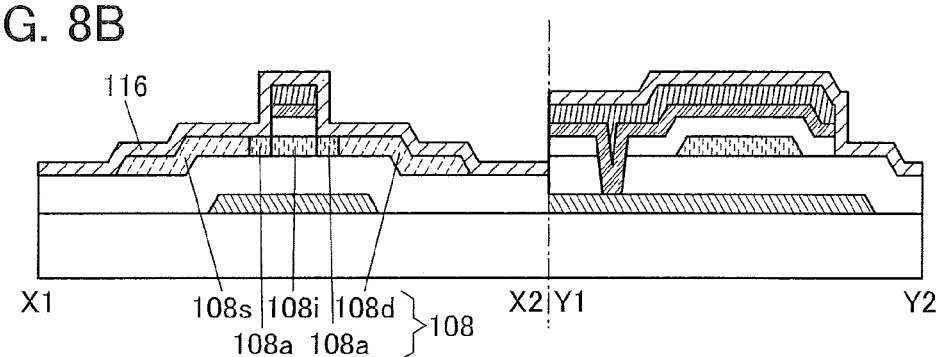

Next, the first protective film 113 is removed, and the insulating film 116 is formed over the insulating film 104, the oxide semiconductor film 107, and the conductive film 112 (see FIG. 8B).

In FIG. 8B, by forming the insulating film 116, the oxide semiconductor film 107 is processed into the oxide semiconductor film 108 including the channel region 108i, the low-resistance regions 108a, the source region 108s, and the drain region 108d.

Note that the channel region 108i is formed in a region in contact with the insulating film 110, and the source region 108s and the drain region 108d are formed in regions in contact with the insulating film 116. Furthermore, the low-resistance regions 108a are formed in regions that overlap with the first protective film 113 and do not overlap with the insulating film 110.

In this embodiment, as the insulating film 116, a 100-nm-thick silicon nitride oxide film is formed with a plasma CVD apparatus.

[Step of Forming Oxide Insulating Film]

Figure 8C:
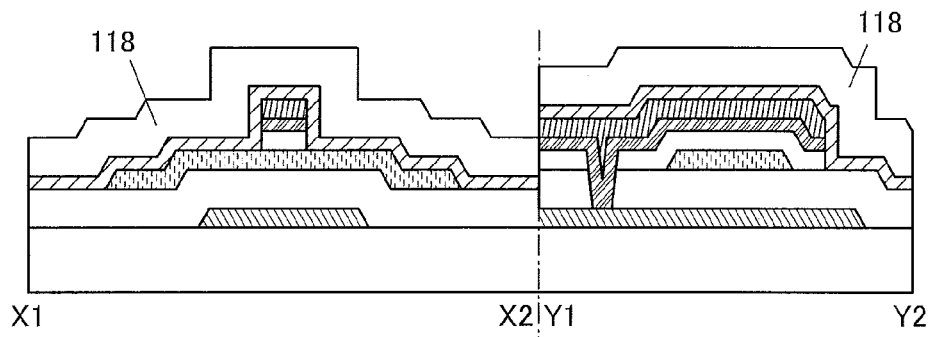
Figure 8D:
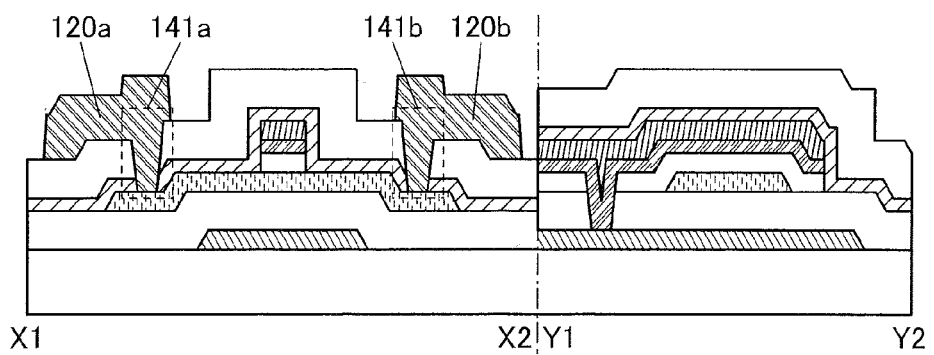

Next, the insulating film 118 is formed over the insulating film 116 (see FIG. 8C).

In this embodiment, as the insulating film 118, a 300-nm-thick silicon oxynitride film is formed with a plasma CVD apparatus.

[Formation of Openings]

Subsequently, a mask is formed by lithography in a desired position over the insulating film 118, and then, the insulating film 118 and the insulating film 116 are partly etched, so that the opening 141a reaching the source region 108s and the opening 141b reaching the drain region 108d are formed. Then, a conductive film is formed over the source region 108s, the drain region 108d, and the insulating film 118 so as to cover the openings 141a and 141b and the conductive film is processed into a desired shape, whereby the conductive films 120a and 120b are formed (see FIG. 8D).

In this embodiment, for the conductive films 120a and 120b, a stack including a 50-nm-thick tungsten film and a 400-nm-thick copper film is formed with a sputtering apparatus.

Through the above process, the transistor 100A in FIGS. 5A to 5C can be fabricated.

<1-6. Structural Example 3 of Semiconductor Device>

Next, structures of a semiconductor device different from that of the semiconductor device illustrated in FIGS. 5A to 5C are described with reference to FIGS. 9A and 9B, FIGS. 10A and 10B, FIGS. 11A and 11B, FIGS. 12A and 12B, FIGS. 13A and 13B, FIGS. 14A and 14B and FIGS. 15A and 15B.

Figure 9A:
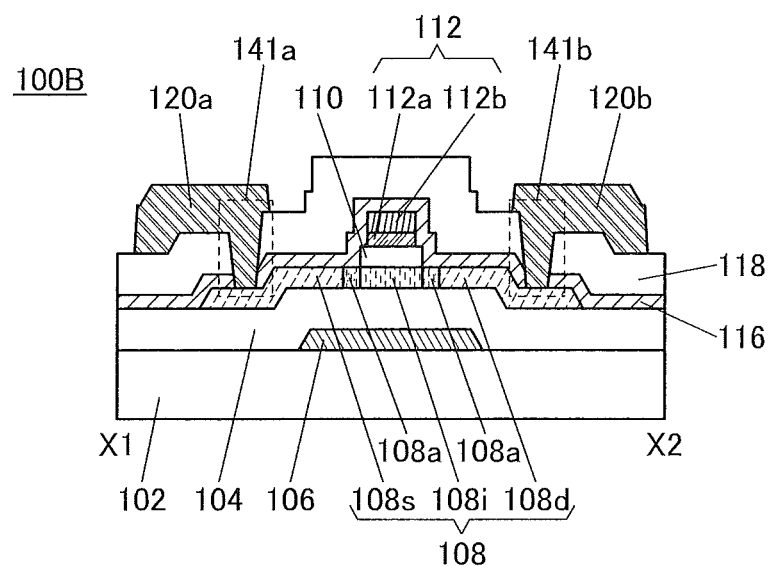
FIGS. 9A and 9B are cross-sectional views illustrating a semiconductor device.
Figure 9B:
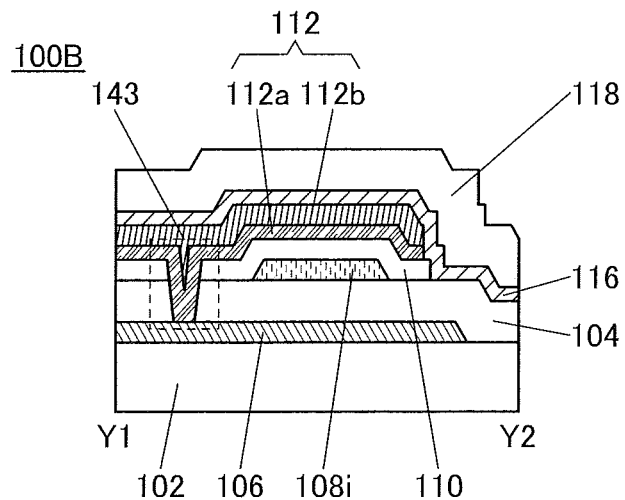

A transistor 100B illustrated in FIGS. 9A and 9B is different from the above-described transistor 100A in the shape of the conductive film 112 and the insulating film 110. Specifically, in the cross section of the transistor 100B in the channel length (L) direction, a lower end portion of the conductive film 112 is not aligned with an upper end portion of the insulating film 110. The lower end portion of the conductive film 112 is located inward from the upper end portion of the insulating film 110.

For example, the structure of the transistor 100B can be formed by processing the conductive film 112 and the insulating film 110 using some kinds of etchants.

Figure 10A:
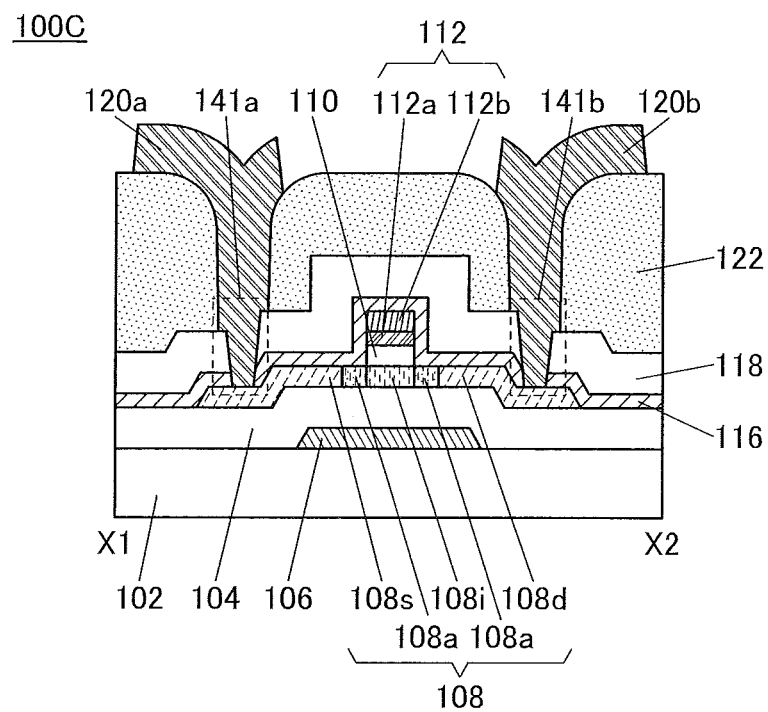
FIGS. 10A and 10B are cross-sectional views illustrating a semiconductor device.
Figure 10B:
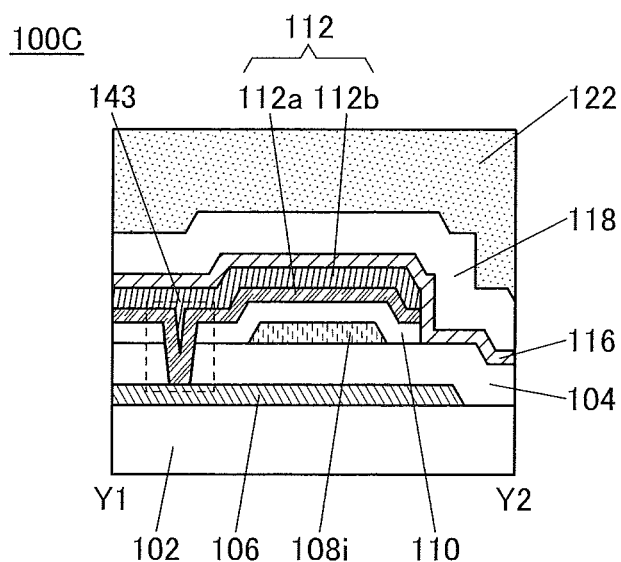

A transistor 100C illustrated in FIGS. 10A and 10B is different from the above-described transistor 100A in that an insulating film 122 functioning as a planarization film is provided over the insulating film 118. Note that the other components of the transistor 100C are similar to those of the transistor 100A described above, and an effect similar to that of the transistor 100A can be obtained.

The insulating film 122 has a function of covering unevenness and the like caused by the transistor or the like. The insulating film 122 has an insulating property and is formed using an inorganic material or an organic material. Examples of the inorganic material include a silicon oxide film, a silicon oxynitride film, a silicon nitride oxide film, a silicon nitride film, an aluminum oxide film, and an aluminum nitride film. Examples of the organic material include photosensitive resin materials such as an acrylic resin and a polyimide resin.

Note that the size of each opening in the insulating film 122 is not limited to that in FIGS. 10A and 10B, in which the openings are larger than the openings 141a and 141b, and may be smaller than or equal to the size of each of the openings 141a and 141b, for example.

In addition, the structure is not limited to the example in FIGS. 10A and 10B, in which the conductive films 120a and 120b are provided over the insulating film 122; for example, the insulating film 122 may be provided over the conductive films 120a and 120b formed over the insulating film 118.

Figure 11A:
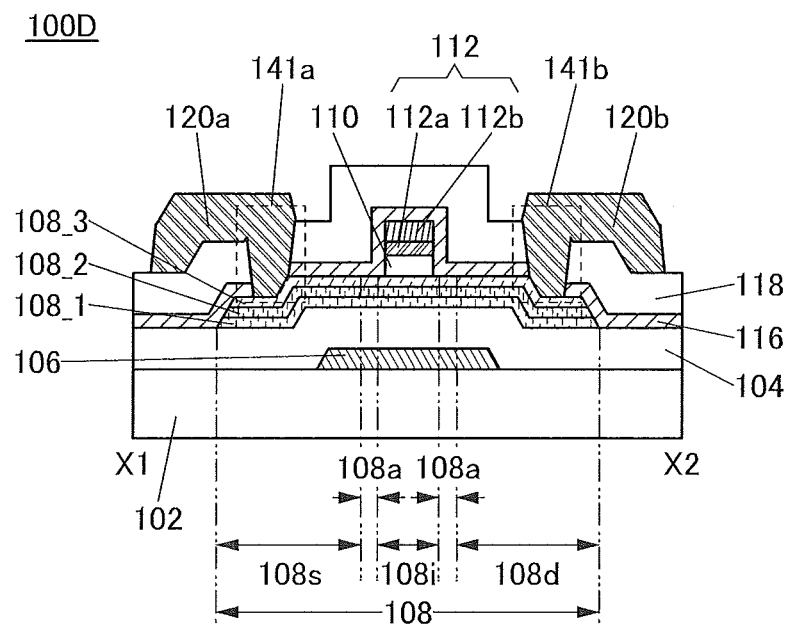
FIGS. 11A and 11B are cross-sectional views illustrating a semiconductor device.
Figure 11B:
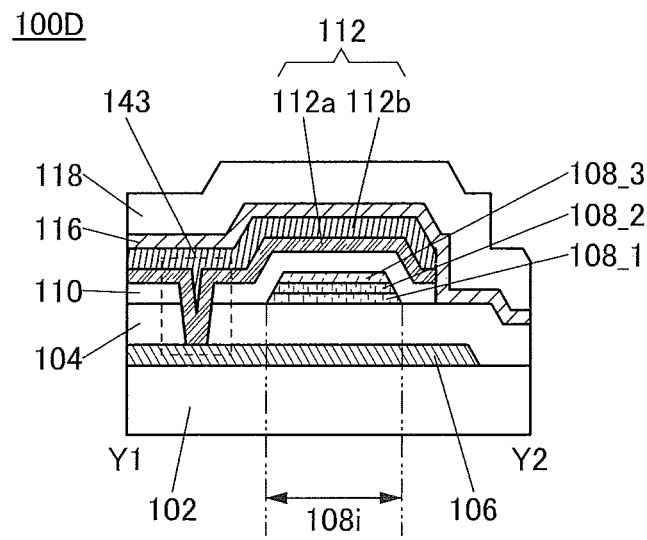
Figure 12A:
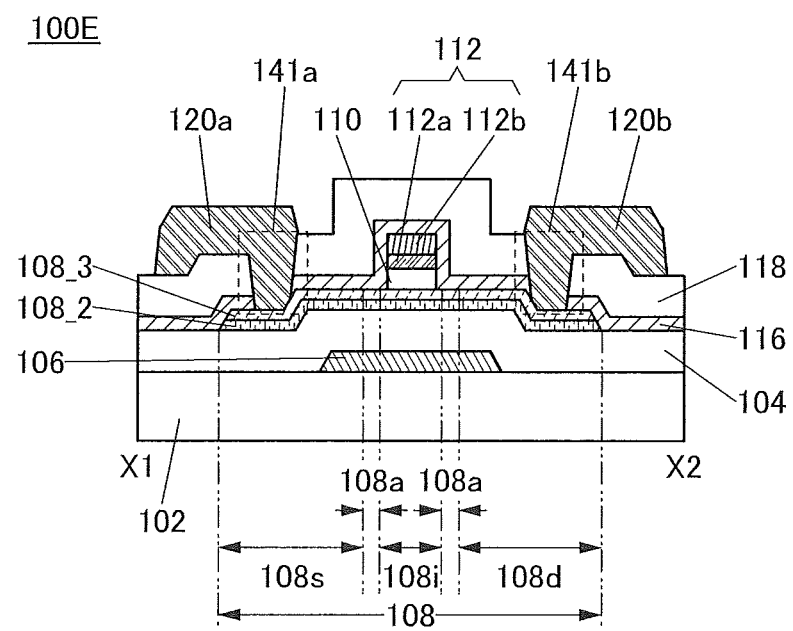
FIGS. 12A and 12B are cross-sectional views illustrating a semiconductor device.
Figure 12B:
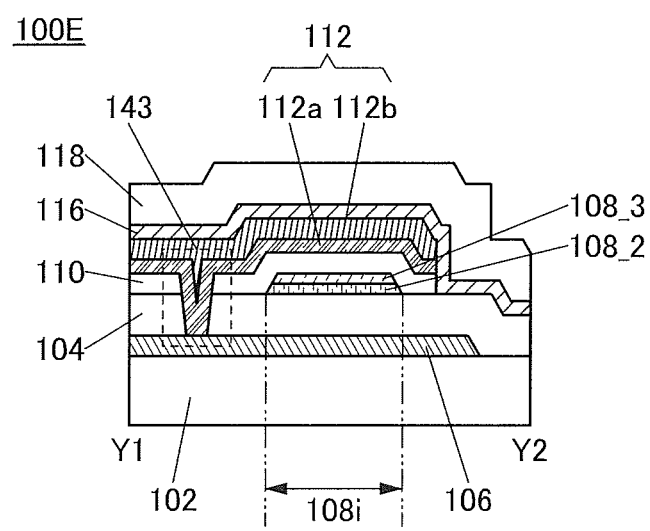
Figure 13A:
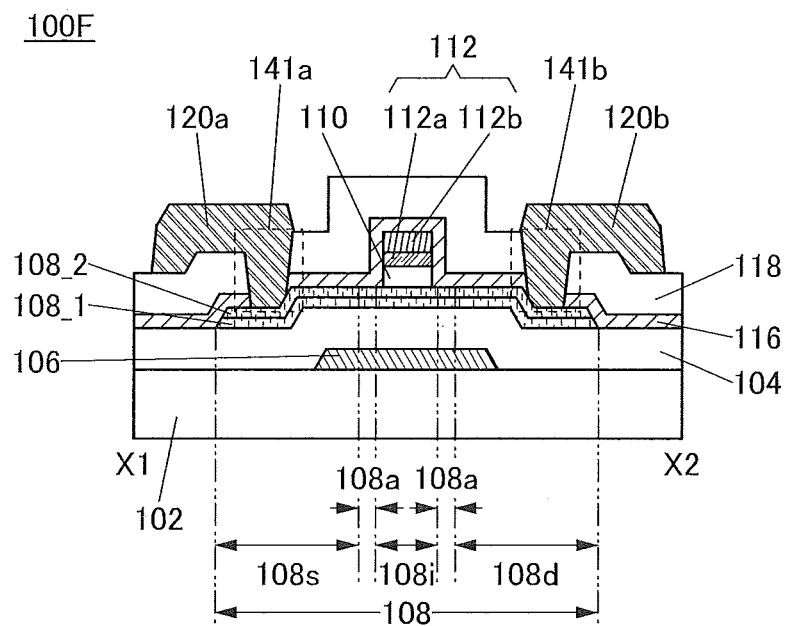
FIGS. 13A and 13B are cross-sectional views illustrating a semiconductor device.
Figure 13B:
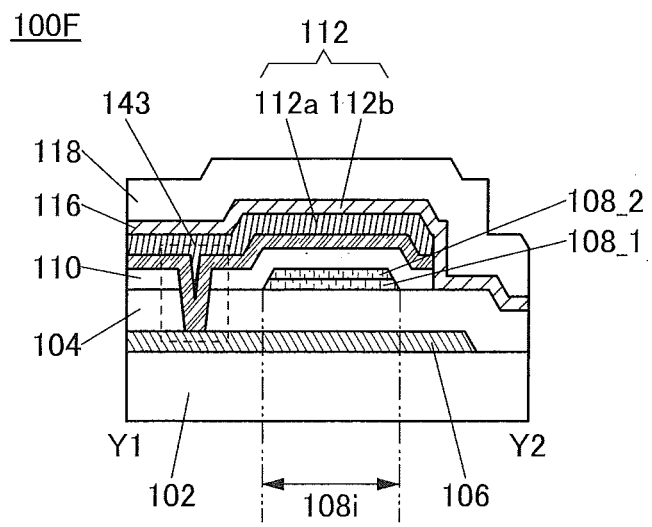
Figure 14A:
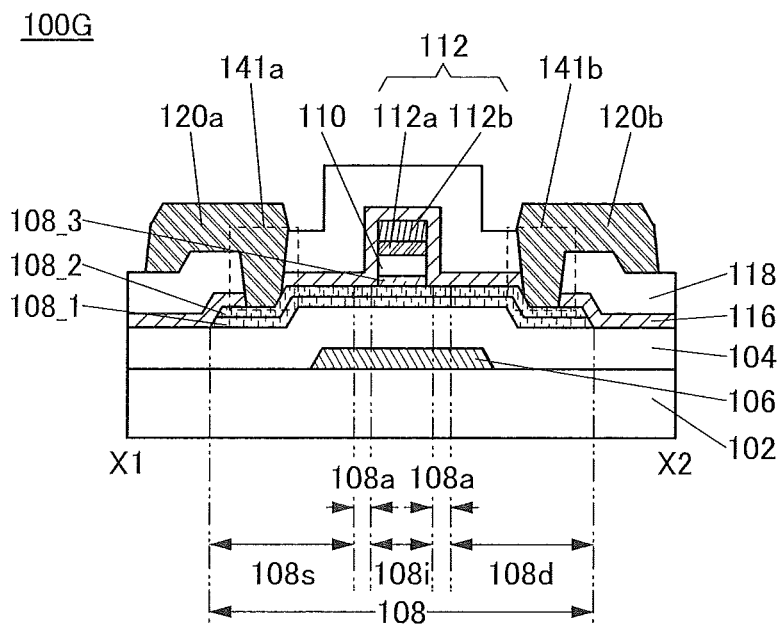
FIGS. 14A and 14B are cross-sectional views illustrating a semiconductor device.
Figure 14B:
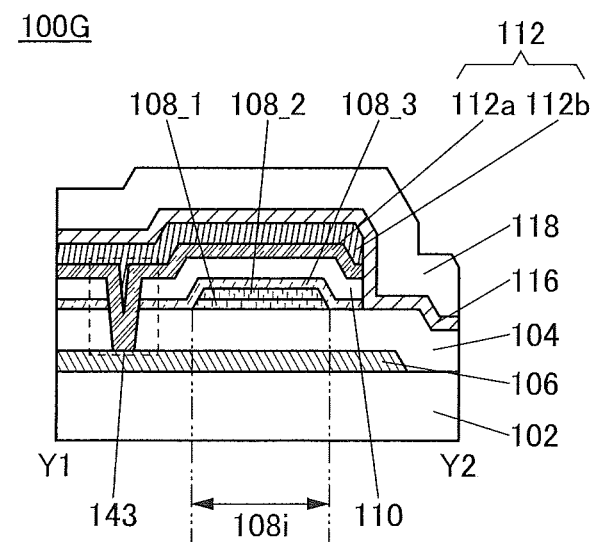
Figure 15A:
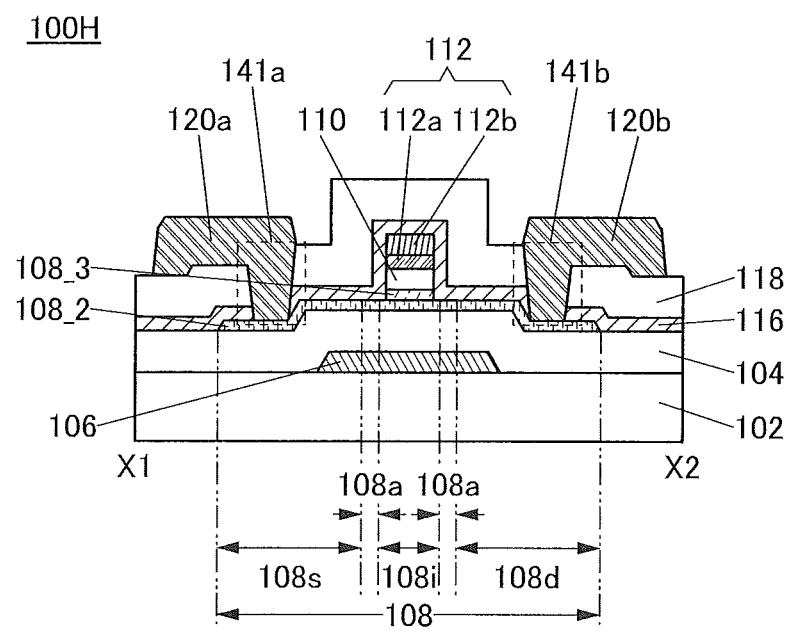
FIGS. 15A and 15B are cross-sectional views illustrating a semiconductor device.
Figure 15B:
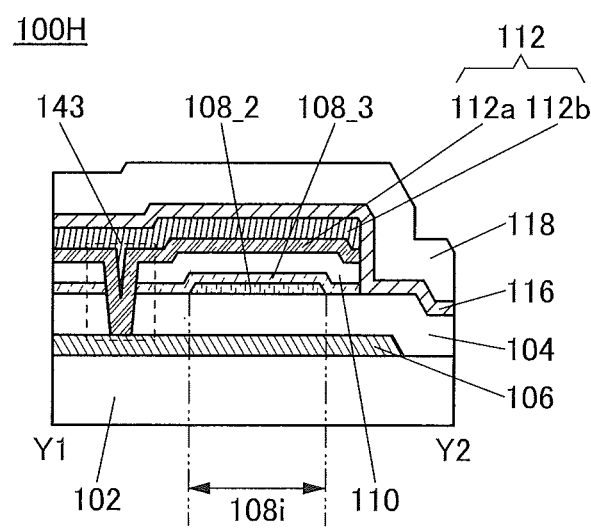

FIGS. 11A and 11B are cross-sectional views of a transistor 100D. FIGS. 12A and 12B are cross-sectional views of a transistor 100E. FIGS. 13A and 13B are cross-sectional views of a transistor 100F. FIGS. 14A and 14B are cross-sectional views of a transistor 100G. FIGS. 15A and 15B are cross-sectional views of a transistor 100H. Note that top views of the transistors 100D, 100E, 100F, 100G, and 100H are similar to that of the transistor 100A illustrated in FIG. 5A and thus are not described here.

The transistors 100D, 100E, 100F, 100G, and 100H are different from the transistor 100A in the structure of the oxide semiconductor film 108. Note that the other components are similar to those of the transistor 100A described above, and an effect similar to that of the transistor 100A can be obtained.

The oxide semiconductor film 108 of the transistor 100D illustrated in FIGS. 11A and 11B includes an oxide semiconductor film 108_1 over the insulating film 104, an oxide semiconductor film 108_2 over the oxide semiconductor film 108_1, and an oxide semiconductor film 108_3 over the oxide semiconductor film 108_2. The channel region 108i, the low-resistance regions 108a, the source region 108s, and the drain region 108d each have a three-layer structure of the oxide semiconductor film 108_1, the oxide semiconductor film 108_2, and the oxide semiconductor film 108_3.

The oxide semiconductor film 108 of the transistor 100E illustrated in FIGS. 12A and 12B includes the oxide semiconductor film 108_2 over the insulating film 104, and the oxide semiconductor film 108_3 over the oxide semiconductor film 108_2. The channel region 108i, the low-resistance regions 108a, the source region 108s, and the drain region 108d each have a two-layer structure of the oxide semiconductor film 108_2 and the oxide semiconductor film 108_3.

The oxide semiconductor film 108 of the transistor 100F illustrated in FIGS. 13A and 13B includes the oxide semiconductor film 108_1 over the insulating film 104 and the oxide semiconductor film 108_2 over the oxide semiconductor film 108_1. The channel region 108i, the low-resistance regions 108a, the source region 108s, and the drain region 108d each have a two-layer structure of the oxide semiconductor film 108_1 and the oxide semiconductor film 108_2.

The oxide semiconductor film 108 of the transistor 100G illustrated in FIGS. 14A and 14B includes the oxide semiconductor film 108_1 over the insulating film 104, the oxide semiconductor film 108_2 over the oxide semiconductor film 108_1, and the oxide semiconductor film 108_3 over the oxide semiconductor film 108_2. The channel region 108i has a three-layer structure of the oxide semiconductor film 108_1, the oxide semiconductor film 108_2, and the oxide semiconductor film 108_3. The low-resistance regions 108a, the source region 108s, and the drain region 108d each have a two-layer structure of the oxide semiconductor film 108_1 and the oxide semiconductor film 108_2. Note that in the cross section of the transistor 100G in the channel width (W) direction, the oxide semiconductor film 108_3 covers side surfaces of the oxide semiconductor film 108_1 and the oxide semiconductor film 108_2.

The oxide semiconductor film 108 of the transistor 100H illustrated in FIGS. 15A and 15B includes the oxide semiconductor film 108_2 over the insulating film 104, and the oxide semiconductor film 108_3 over the oxide semiconductor film 108_2. The channel region 108i has a two-layer structure of the oxide semiconductor film 108_2 and the oxide semiconductor film 108_3. The low-resistance regions 108a, the source region 108s, and the drain region 108d each have a single-layer structure of the oxide semiconductor film 108_2. Note that in the cross section of the transistor 100H in the channel width (W) direction, the oxide semiconductor film 108_3 covers a side surface of the oxide semiconductor film 108_2.

A side surface of the channel region 108i in the channel width (W) direction or a region in the vicinity of the side surface is easily damaged by processing, resulting in a defect (e.g., oxygen vacancy), or easily contaminated by an impurity attached thereto. Thus, even when the channel region 108i is substantially intrinsic, stress such as an electric field applied thereto activates the side surface of the channel region 108i in the channel width (W) direction or the region in the vicinity of the side surface and turns it into a low-resistance (n-type) region easily. Moreover, if the side surface of the channel region 108i in the channel width (W) direction or the region in the vicinity of the side surface is an n-type region, a parasitic channel may be formed because the n-type region serves as a carrier path.

Thus, in the transistor 100G and the transistor 100H, the channel region 108i has a stacked-layer structure and side surfaces of the channel region 108i in the channel width (W) direction are covered with one layer of the stacked layers. With such a structure, defects on the side surfaces of the channel region 108i or in the vicinity of the side surfaces can be suppressed or adhesion of an impurity to the side surfaces of the channel region 108i or to regions in the vicinity of the side surfaces can be reduced.

Note that the band structures of the stacked oxide semiconductor films of the transistors 100D, 100E, 100F, 100G, and 100H are described in detail in Embodiment 2.

Note that the structure described in this embodiment can be implemented by being combined as appropriate with any other structure described in the other embodiments.

Embodiment 2

In this embodiment, examples of a semiconductor device including a silicon film and a method for manufacturing the semiconductor device are described with reference to FIGS. 16A to 16C, FIGS. 17A to 17D, FIGS. 18A to 18D, FIGS. 19A to 19D, FIGS. 20A to 20C, FIGS. 21A to 21C, and FIGS. 22A and 22B. Note that a structure in which n-channel low-temperature polycrystalline silicon (low-temperature polysilicon) is used for a silicon film is described as an example in this embodiment.

<2-1. Structure Example 1 of Semiconductor Device>

Figure 16A:
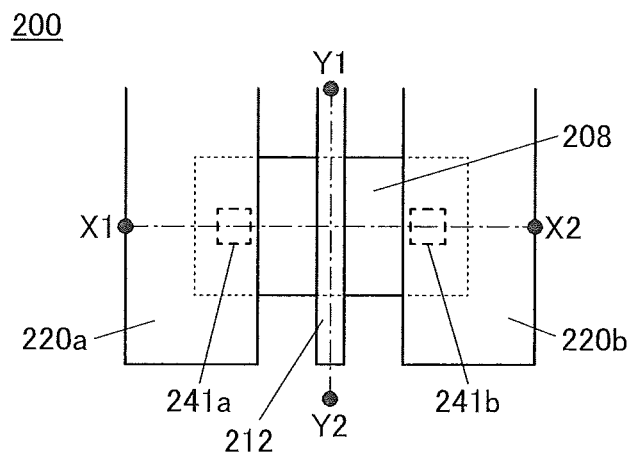
FIGS. 16A to 16C are a top view and cross-sectional views illustrating a semiconductor device.
Figure 16B:
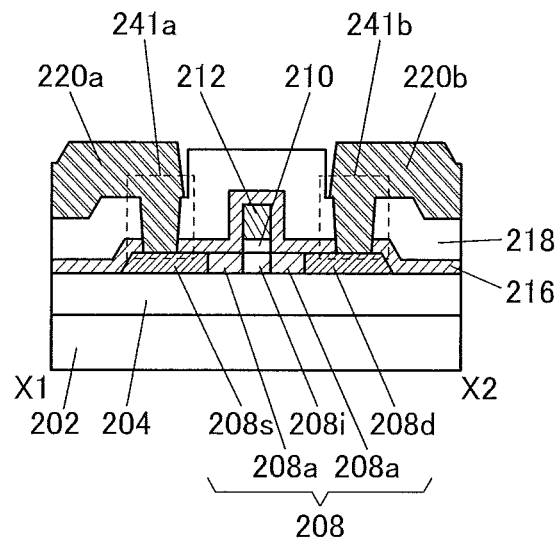
Figure 16C:
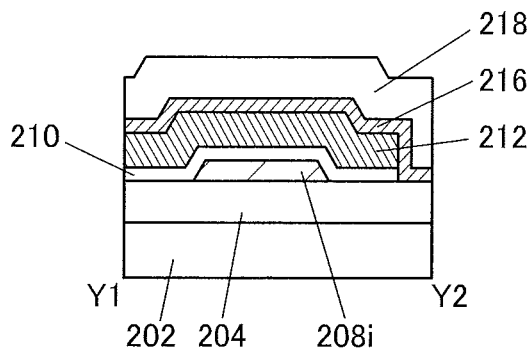

An example of a semiconductor device including an oxide semiconductor film is illustrated in FIGS. 16A to 16C. As an example of the semiconductor device, a transistor is shown here. Note that the transistor in FIGS. 16A to 16C has a staggered (top-gate) structure.

FIG. 16A is a top view of a transistor 200. FIG. 16B is a cross-sectional view taken along dashed-dotted line X1-X2 in FIG. 16A. FIG. 16C is a cross-sectional view taken along dashed-dotted line Y1-Y2 in FIG. 16A. For clarity, FIG. 16A does not illustrate some components such as an insulating film. As in FIG. 16A, some components are not illustrated in some cases in top views of transistors described below. Furthermore, the direction of dashed-dotted line X1-X2 may be referred to as a channel length (L) direction, and the direction of dashed-dotted line Y1-Y2 may be referred to as a channel width (W) direction.

Note that in the semiconductor device of one embodiment of the present invention, the channel length (L) of the transistor is preferably greater than or equal to 0.2 μm and less than 1.5 μm, further preferably greater than or equal to 0.5 μm and less than or equal to 1.0 μm. A display device including the transistor having the above channel length (L) can have high pixel density.

The transistor 200 illustrated in FIGS. 16A to 16C includes an insulating film 204 over a substrate 202, a semiconductor film 208 over the insulating film 204, an insulating film 210 over the semiconductor film 208, and a conductive film 212 that partly overlaps with the semiconductor film 208 and is over the insulating film 210. Furthermore, an insulating film 216 and an insulating film 218 are provided over the insulating film 204, the semiconductor film 208, and the conductive film 212.

The semiconductor film 208 includes a silicon film. The silicon film has a crystalline structure. For example, the silicon film can be crystallized by a variety of methods. As examples of a method for crystallizing a silicon film, a laser crystallization method using a laser beam, a crystallization method using a metal catalyst element, and a thermal crystallization method using heat treatment can be given. It is also possible to conduct crystallization by a combination of these crystallization methods.

In this embodiment, an amorphous silicon film is irradiated with a laser beam to be a polycrystalline silicon film, and the polycrystalline silicon film is used as the semiconductor film 208.

The semiconductor film 208 includes a channel region 208i overlapping with the conductive film 212, a source region 208s in contact with the insulating film 216, and a drain region 208d in contact with the insulating film 216. Furthermore, the semiconductor film 208 includes low-resistance regions 208a between the channel region 208i and the source region 208s and between the channel region 208i and the drain region 208d.

Note that the low-resistance regions 208a function as lightly doped drain (LDD) regions. Moreover, an impurity element imparting n-type conductivity to the semiconductor film 208 such as phosphorus (P) and arsenic (As) is added to the low-resistance regions 208a, the source region 208s, and the drain region 208d.

As illustrated in FIG. 16B, the width of each of the low-resistance regions 208a in the channel length (L) direction is greater than the channel length of the channel region 208i. Alternatively, the width of the low-resistance regions 208a may be the same as the channel length of the channel region 208i.

With the structure, when the transistor has a small channel length (L), e.g., less than 1.5 μm, degradation due to carriers accelerated by a voltage applied to the drain region 208d (also referred to as hot-carrier degradation) can be favorably suppressed since the width of each of the low-resistance regions 208a is greater than the channel length. Thus, a highly reliable semiconductor device can be provided.

In one embodiment of the present invention, the low-resistance regions 208a, the source region 208s, and the drain region 208d can be formed in a self-aligned manner. The method for forming the low-resistance regions 208a, the source region 208s, and the drain region 208d are described later.

The transistor 200 may further include a conductive film 220a electrically connected to the source region 208s through an opening 241a provided in the insulating films 216 and 218, and a conductive film 220b electrically connected to the drain region 208d through an opening 241b provided in the insulating films 216 and 218.

In this specification and the like, the insulating film 204 may be referred to as a first insulating film, the insulating film 210 may be referred to as a second insulating film, the insulating film 216 may be referred to as a third insulating film, and the insulating film 218 may be referred to as a fourth insulating film. The insulating film 210 functions as a gate insulating film, the conductive film 212 functions as a gate electrode, the conductive film 220a functions as a source electrode, and the conductive film 220b functions as a drain electrode.

In this embodiment, an n-channel transistor is described as an example; however, one embodiment of the present invention is not limited thereto. For example, instead of an impurity element imparting n-type conductivity to the semiconductor film 208, an impurity element imparting p-type conductivity is used, so that a p-channel transistor may be formed. Examples of the impurity element imparting p-type conductivity include boron B, aluminum (Al), and gallium (Ga). The impurity element imparting p-type conductivity may be slightly added to the channel region 208i of the transistor 200 illustrated in FIGS. 16A to 16C.

When the transistor 200 illustrated in FIGS. 16A to 16C is used as one or both of a pixel transistor and a driving transistor of a display device, the resolution of the display device can be greater than or equal to 1000 ppi, greater than or equal to 2000 ppi, further preferably greater than or equal to 3000 ppi.

<2-2. Method 1 for Manufacturing Semiconductor Device>

Here, an example of a method for manufacturing the transistor 200 illustrated in FIGS. 16A to 16C is described with reference to FIGS. 17A to 17D, FIGS. 18A to 18D, FIGS. 19A to 19D, and FIGS. 20A to 20C. Note that FIGS. 17A to 17D, FIGS. 18A to 18D, FIGS. 19A to 19D, and FIGS. 20A to 20C are cross-sectional views in the channel length (L) direction and illustrate a method for manufacturing the n-channel transistor 200 illustrated in FIGS. 16A to 16C and a p-channel transistor 250 formed over the same substrate where the n-channel the transistor 200 is formed.

In the following description, when a component of the transistor 200 and a component of the transistor 250 are not clearly distinguished from each other, the components may be denoted by the same reference numeral.

With the use of the manufacturing method described below, the channel length (L) of each of the transistors 200 and 250 can be greater than or equal to 0.2 μm and less than 1.5 μm, preferably greater than or equal to 0.5 μm and less than or equal to 1.0 μm. For example, when the minimum feature size of a light exposure apparatus used for lithography is 1.5 μm, the channel length (L) can be less than or equal to the minimum feature size of the light exposure apparatus in this embodiment.

[Step of Forming Semiconductor Film]

First, the insulating film 204 is formed over the substrate 202. Next, an semiconductor film 208_0 is formed over the insulating film 204 (see FIG. 17A).

A glass substrate is used as the substrate 202. The insulating film 204 can be formed by a sputtering method, a CVD method, an evaporation method, a pulsed laser deposition (PLD) method, a printing method, a coating method, or the like as appropriate. In this embodiment, as the insulating film 204, a 300-nm-thick silicon nitride film and a 50-nm-thick silicon oxynitride film are formed with a plasma CVD apparatus.

The semiconductor film 208_0 can be formed by a sputtering method or a CVD method. In this embodiment, as the semiconductor film 208_0, a 50-nm-thick amorphous silicon film is formed with a plasma CVD apparatus.

Note that in the case where the amount of hydrogen contained in the amorphous silicon film is large, heat treatment, typically, treatment for releasing hydrogen from the amorphous silicon film by heat at higher than or equal to 400° C. and lower than or equal to 550° C. (also referred to as dehydrogenation treatment) may be performed. For example, when the amount of hydrogen contained in the amorphous silicon film is smaller than or equal to 5 atomic %, manufacturing yield in the crystallization step can be improved.

The insulating film 204 and the semiconductor film 208_0 are preferably formed successively in vacuum. With such a formation method, contamination of the interface between the insulating film 204 and the semiconductor film 208_0 can be reduced.

[Step of Crystallizing Semiconductor Film]

Figure 17A:
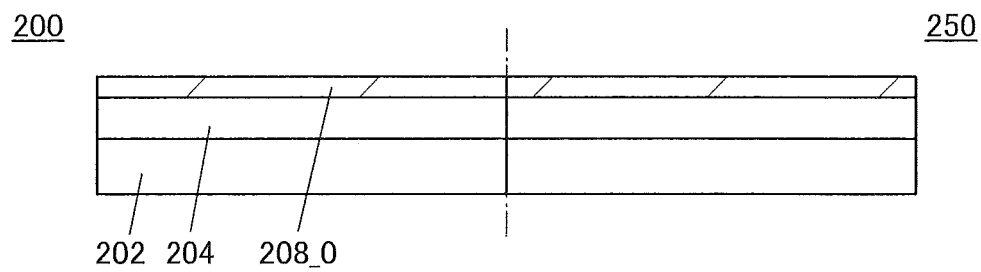
FIGS. 17A to 17D are cross-sectional views illustrating a method for manufacturing a semiconductor device.
Figure 17B:
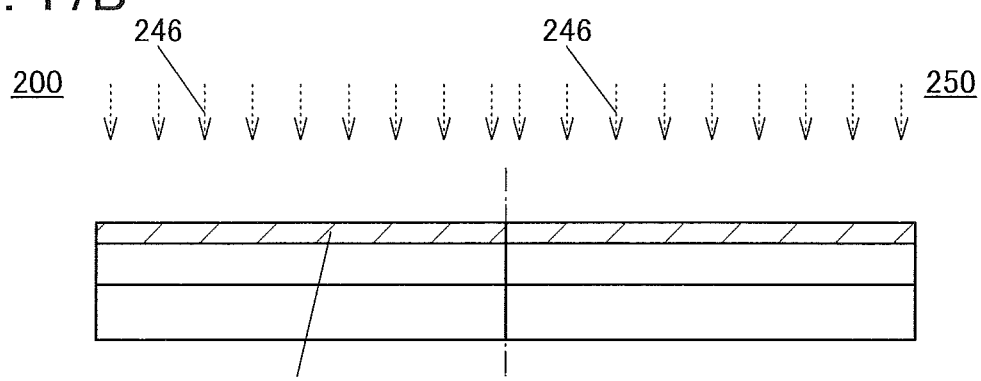

Next, the semiconductor film 208_0 is crystallized to form a semiconductor film 208_1 having a crystalline structure (see FIG. 17B).

The semiconductor film 208_0 can be crystallized by irradiation of a laser beam 246 from above the semiconductor film 208_1 as illustrated in FIG. 17B. The laser beam 246 may have a wavelength of 193 nm, 248 nm, 308 nm, or 351 nm, for example. In this embodiment, the crystallization of the semiconductor film 208_0 is performed using an excimer laser apparatus.

Note that although not illustrated in FIG. 17B, a crystallization step using a metal catalyst element may be performed.

[Step of Processing Semiconductor Film into Island Shape]

Figure 17C:
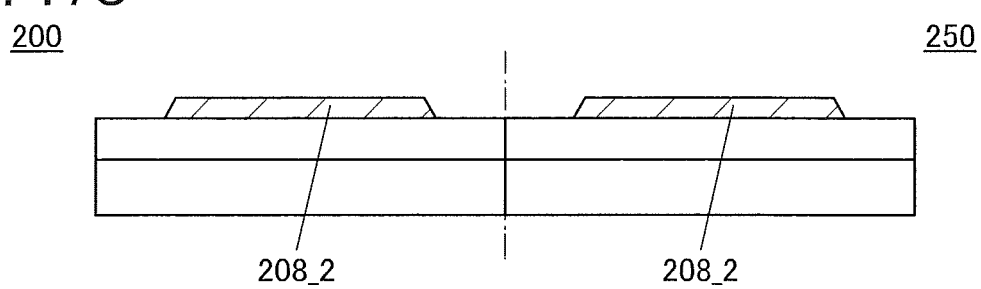

Next, the semiconductor film 208_1 is processed to form an island-shaped semiconductor film 208_2 (see FIG. 17C).

The semiconductor film 208_1 can be processed by a wet etching method and/or a dry etching method. In this embodiment, the semiconductor film 208_1 is processed by a dry etching method.

[Step of Forming Insulating Film and Conductive Film Over Semiconductor Film]

Figure 17D:
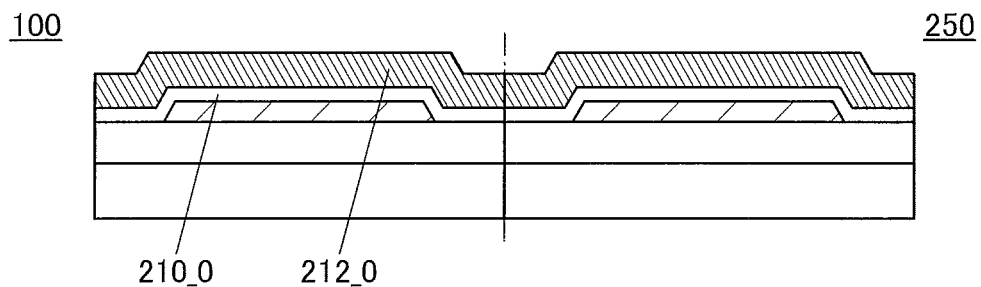

Next, an insulating film 210_0 and a conductive film 212_0 are formed over the insulating film 204 and the semiconductor film 208_2 (see FIG. 17D).

For the insulating film 210_0, a silicon oxide film or a silicon oxynitride film can be formed with a plasma-enhanced chemical vapor deposition apparatus (a PECVD apparatus or simply referred to as a plasma CVD apparatus). In this case, a deposition gas including silicon and an oxidizing gas are preferably used as a source gas. Typical examples of the deposition gas containing silicon include silane, disilane, trisilane, and silane fluoride. Examples of the oxidizing gas include oxygen, ozone, dinitrogen monoxide, and nitrogen dioxide.

A silicon oxynitride film having few defects can be formed as the insulating film 210_0 with the plasma CVD apparatus under the conditions that the flow rate of the oxidizing gas is more than 20 times and less than 100 times, or more than or equal to 40 times and less than or equal to 80 times the flow rate of the deposition gas and that the pressure in a treatment chamber is lower than 100 Pa or lower than or equal to 50 Pa.

As the insulating film 210_0, a dense silicon oxide film or a dense silicon oxynitride film can be formed under the following conditions: the substrate placed in a vacuum-evacuated treatment chamber of the plasma CVD apparatus is held at a temperature higher than or equal to 280° C. and lower than or equal to 400° C., the pressure in the treatment chamber into which a source gas is introduced is set to be higher than or equal to 20 Pa and lower than or equal to 250 Pa, preferably higher than or equal to 100 Pa and lower than or equal to 250 Pa, and a high-frequency power is supplied to an electrode provided in the treatment chamber.

The insulating film 210_0 may be formed by a plasma CVD apparatus using a microwave. A microwave refers to a wave in the frequency range of 300 MHz to 300 GHz. In a microwave, electron temperature and electron energy are low. Furthermore, in supplied power, the proportion of power used for acceleration of electrons is low, and therefore, power can be used for dissociation and ionization of more molecules. Thus, plasma with high density (high-density plasma) can be excited. This method causes little plasma damage to the deposition surface or a deposit, so that the insulating film 210_0 having few defects can be formed.

In this embodiment, as the insulating film 210_0, a 20-nm-thick silicon oxynitride film is formed with a plasma CVD apparatus.

The conductive film 212_0 may be formed with a sputtering apparatus or an ALD apparatus. In this embodiment, as the conductive film 212_0, a two-layer stack including a tantalum nitride film and a tungsten film is formed with a sputtering apparatus. Although the structure in which the conductive film 212_0 includes the two-layer stack is described in this embodiment, the present invention is not limited thereto. For example, a single layer or a stack including three or more layers may be used as the conductive film 212_0.

[Step of Forming First Protective Film Over Conductive Film]

Figure 18A:
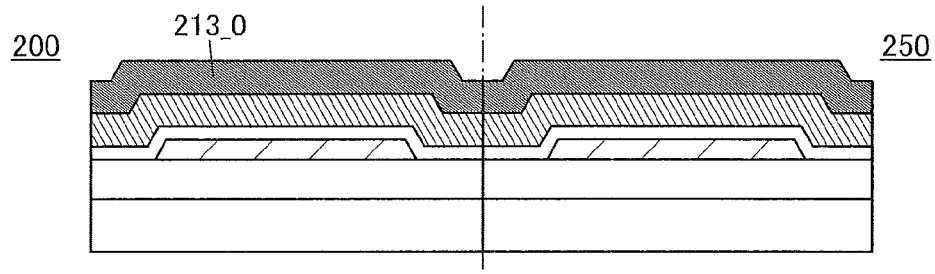
FIGS. 18A to 18D are cross-sectional views illustrating a method for manufacturing a semiconductor device.

Next, a first protective film 213_0 is formed over the conductive film 212_0 (see FIG. 18A).

The first protective film 213_0 may be formed by a sputtering method or an ALD method. In this embodiment, a 100-nm-thick titanium film is formed as the first protective film 213_0 by a sputtering method.

[Step of Forming Second Protective Film Over First Protective Film]

Figure 18B:
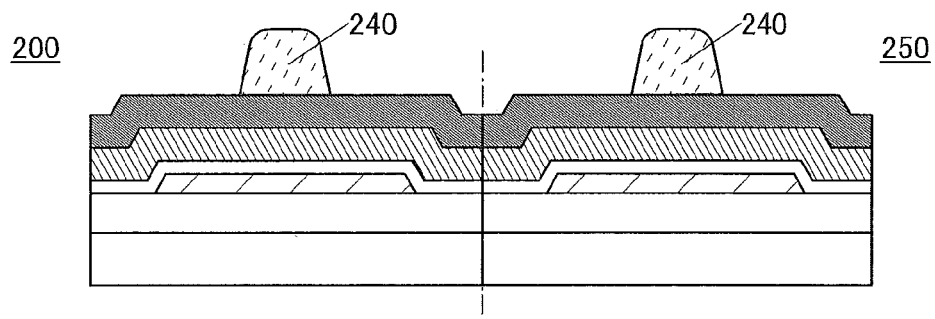

Next, a second protective film 240 is formed over the first protective film 213_0 (see FIG. 18B).

The second protective film 240 may be formed by a resist application process and a lithography process. Note that in this embodiment, the second protective film 240 is formed so that the length of the second protective film 240 in the channel length (L) direction is 1.5 μm.

[Processing Using Second Protective Film]

Figure 18C:
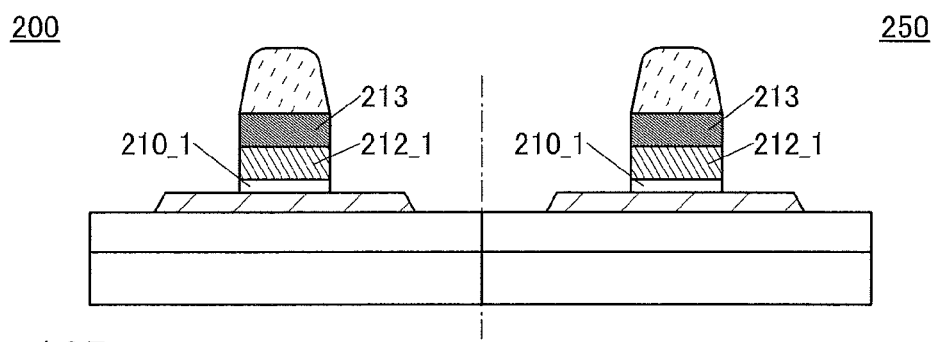

Next, the first protective film 213_0, the conductive film 212_0, and the insulating film 210_0 are processed using the second protective film 240 (see FIG. 18C).

The first protective film 213_0, the conductive film 212_0, and the insulating film 210_0 can be processed by a wet etching method and/or a dry etching method. In this embodiment, the first protective film 213_0, the conductive film 212_0, and the insulating film 210_0 are processed by a dry etching method.

In FIG. 18C, processing is performed using the second protective film 240, so that the first protective film 213_0 is processed into an island-shaped first protective film 213, the conductive film 212_0 is processed into an island-shaped conductive film 212_1, and the insulating film 210_0 is processed into an island-shaped insulating film 210_1.

The side end portions of the first protective film 213, the conductive film 212_1, and the insulating film 210_1 are formed in substantially the same position as that of the second protective film 240. That is, the length of each of the first protective film 213, the conductive film 212_1, and the insulating film 210_1 in the channel length (L) direction is approximately 1.5 μm.

When the processing is performed using the second protective film 240, the thickness of the semiconductor film 208 in a region not overlapping with the second protective film 240 might be reduced. When the processing is performed using the second protective film 240, an etchant or an etching gas (e.g., chlorine) might be added to the semiconductor film 208 or the constituent element of the conductive film 212_1 or the insulating film 210_1 might be added to the semiconductor film 208.

[First Impurity Element Addition Treatment]

Figure 18D:
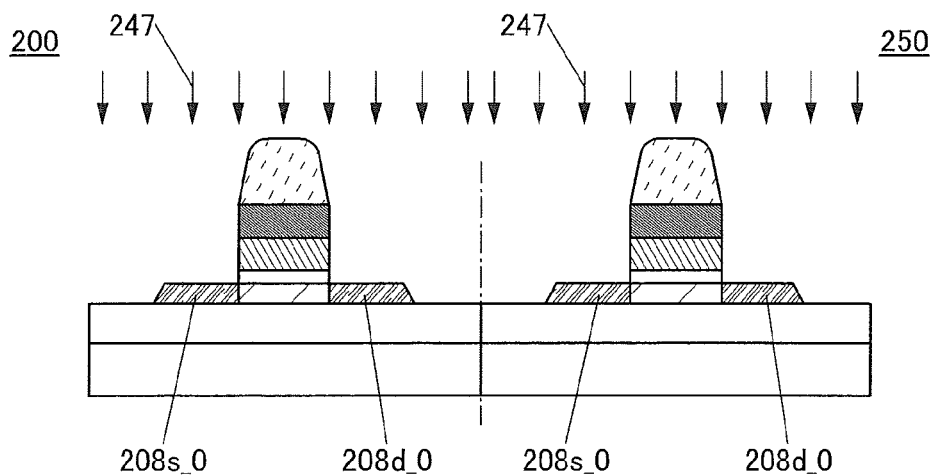

Next, an impurity element 247 is added to the semiconductor film 208 using the second protective film 240 as a mask (see FIG. 18D).

As the impurity element 247, an impurity element imparting n-type conductivity to the semiconductor film 208 is used.

In this embodiment, the impurity element 247 is implanted into the semiconductor film 208 by an ion implantation method. Implantation by the ion implantation method is performed under the following conditions: P elements are used; the dosage is higher than or equal to $1 \times 10^{13}$ atoms/cm$^2$ and lower than or equal to $5 \times 10^{14}$ atoms/cm$^2$; and the accelerating voltage is higher than or equal to 40 kV and lower than or equal to 80 kV. Note that P elements are used here as the impurity element 247; however, the impurity element 247 is not limited to this, and may be, for example, an element such as As, Sb, S, Te, or Se.

By the first impurity element addition treatment, an impurity region 208s_0 and an impurity region 208d_0 are formed in a self-aligned manner in the semiconductor film 208. The concentration of an impurity element imparting n-type conductivity that is added to the impurity region 208s_0 and the impurity region 208d_0 is greater than or equal to $1 \times 10^{18}$ atoms/cm$^3$ and less than or equal to $1 \times 10^{20}$ atoms/cm$^3$.

[Processing Using First Protective Film]

Figure 19A:
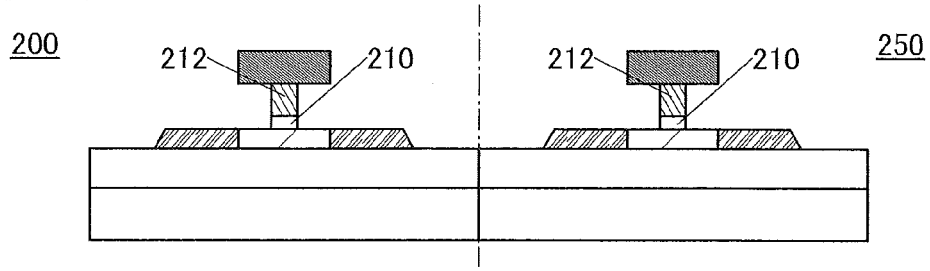
FIGS. 19A to 19D are cross-sectional views illustrating a method for manufacturing a semiconductor device.

Next, the second protective film 240 is removed, and the conductive film 212_1 and the insulating film 210_1 are processed using the first protective film 213 (see FIG. 19A).

The second protective film 240 can be removed by a wet etching method and/or a dry etching method. In this embodiment, the second protective film 240 is removed by a wet etching method.

The conductive film 212_1 and the insulating film 210_1 can be processed by a wet etching method and/or a dry etching method.

In FIG. 19A, processing is performed using the first protective film 213, so that the conductive film 212_1 is processed into the conductive film 212, and the insulating film 210_1 is processed into the insulating film 210. Note that the conductive film 212 and the insulating film 210 are each processed to have an area less than that of the first protective film 213. In particular, the conductive film 212 is preferably formed to have an area greater than or equal to 15% and less than or equal to 50% of the area of the first protective film 213.

For example, when the length of the second protective film 240 in the channel length (L) direction is 1.5 µm, the length of the conductive film 212 in the channel length (L) direction can be in the range from 0.225 µm to 0.75 µm. Note that the range is favorable because size variation in a substrate surface is increased when the processing is performed so that the length in the channel length (L) of the conductive film 212 is less than 15% of the length in the channel length (L) of the second protective film 240.

[Second Impurity Element Addition Treatment]

Figure 19B:
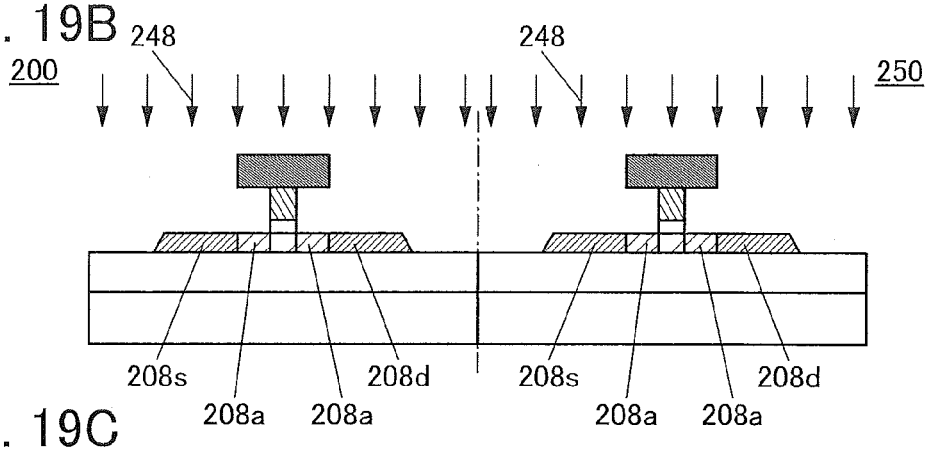

Next, an impurity element 248 is added to the semiconductor film 208 using the first protective film 213 as a mask (see FIG. 19B).

As the impurity element 248, an impurity element imparting n-type conductivity to the semiconductor film 208 is used.

In this embodiment, the impurity element 248 is implanted twice by ion implantation methods. Implantation by a first ion implantation method is performed under the following conditions: P elements are used; the dosage is higher than or equal to $1\times10^{13}$ atoms/cm$^2$ and lower than or equal to $1\times10^{15}$ atoms/cm$^2$; and the accelerating voltage is higher than or equal to 60 kV and lower than or equal to 120 kV. Note that the accelerating voltage in the first ion implantation method is preferably set higher than that in the first impurity element addition treatment so that an impurity passes through the first protective film 213. Moreover, the dosage of P elements in the first ion implantation method is preferably lower than that in the first impurity element addition treatment to form the low-resistance regions 208a functioning as LDD regions.

Implantation by a second ion implantation method is performed under the following conditions: P elements are used; the dosage is higher than or equal to $1\times10^{15}$ atoms/cm$^2$ and lower than or equal to $1\times10^{17}$ atoms/cm$^2$; and the accelerating voltage is higher than or equal to 50 kV and lower than or equal to 100 kV. Note that the second impurity element addition treatment is performed twice in this embodiment; however, one embodiment of the present invention is not limited thereto. For example, the second impurity element addition treatment may be performed once or three or more times.

By the second impurity element addition treatment, an impurity element imparting n-type conductivity is added to the low-resistance regions 208a at the concentration of greater than or equal to $1\times10^{18}$ atoms/cm$^3$ and less than or equal to $5\times10^{19}$ atoms/cm$^3$, and an impurity element imparting n-type conductivity is added to the source region 208s and the drain region 208d at the concentration of greater than or equal to $1\times10^{19}$ atoms/cm$^3$ and less than or equal to $5\times10^{21}$ atoms/cm$^3$.

[Third Impurity Element Addition Treatment]

Figure 19C:
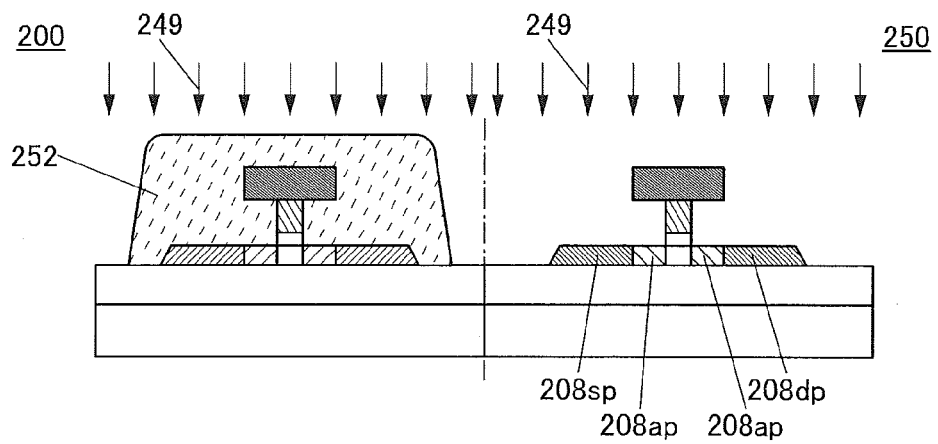

Next, a protective film 252 is formed in a region where the transistor 200 is to be formed, and subsequently an impurity element 249 is added to the semiconductor film 208 using the protective film 252 as a mask (see FIG. 19C).

For the protective film 252, a resist or the like may be used.

As the impurity element 249, an impurity element imparting p-type conductivity to the semiconductor film 208 is used.

In this embodiment, the impurity element 249 is implanted into the semiconductor film 208 by an ion doping method. In the ion doping method, diborane ($B_2H_6$) is used.

When third impurity element addition treatment is performed, the first protective film 213 serves as a mask, and thus low-resistance regions 208ap, a source region 208sp, and a drain region 208dp are formed in the semiconductor film 208 of the transistor 250. Note that the low-resistance regions 208ap differs from the source region 208sp and the drain region 208dp in the concentration of an impurity element imparting p-type conductivity. Because of the first protective film 213, the low-resistance regions 208ap have a lower concentration of an impurity element than the concentration of the source region 208sp and the drain region 208dp.

Note that the concentration of an impurity element imparting p-type conductivity that is added to the low-resistance regions 208ap, the source region 208sp, and the drain region 208dp is greater than or equal to $2\times10^2$ atoms/cm$^3$ and less than or equal to $2\times10^{21}$ atoms/cm$^3$. With the concentration, an impurity element imparting p-type conductivity becomes more dominant than an impurity element imparting n-type conductivity in the semiconductor film 208. That is, in the transistor 250, an impurity element imparting n-type conductivity is added to the semiconductor film 208, and then an impurity element imparting n-type conductivity is added, so that the polarity is reversed from an n-type to a p-type.

[Step of Removing Protective Film]

Figure 19D:
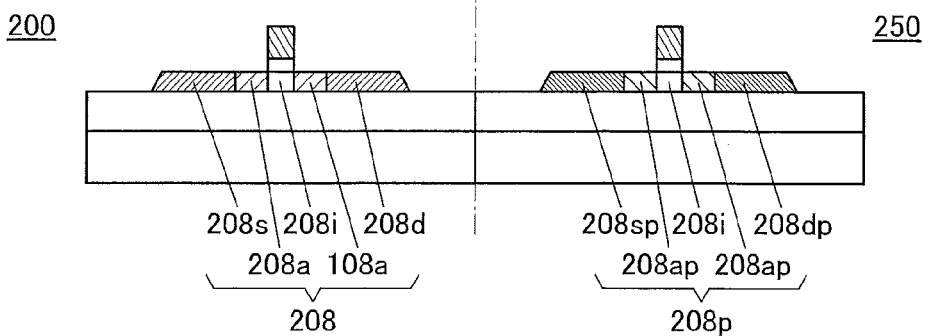

Next, the protective film 252 and the first protective film 213 are removed (see FIG. 19D).

The protective film 252 and the first protective film 213 can be removed by a wet etching method and/or a dry etching method. In this embodiment, the protective film 252 is removed by a wet etching method, and the first protective film 213 is removed by a dry etching method.

Note that the protective film 252 and the first protective film 213 are removed, and the semiconductor film 208 including the low-resistance regions 208a, the source region 208s, the drain region 208d, and the channel region 208i is formed in the transistor 200 as illustrated in FIG. 19D. Moreover, a semiconductor film 208p including the low-resistance regions 208ap, the source region 208sp, the drain region 208dp, and the channel region 208i is formed in the transistor 250.

[Step of Forming Insulating Film]

Figure 20A:
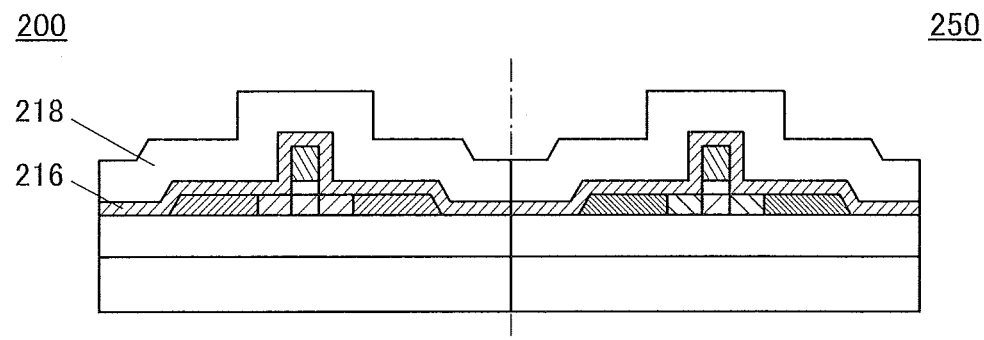
FIGS. 20A to 20C are cross-sectional views illustrating a method for manufacturing a semiconductor device.

Next, the insulating film 216 and the insulating film 218 are formed over the insulating film 204, the semiconductor film 208, and the semiconductor film 208p (see FIG. 20A).

The insulating film 216 and the insulating film 218 each serve as a protective film.

In this embodiment, as the insulating film 216, a 100-nm-thick silicon nitride film is formed with a plasma CVD apparatus. In this embodiment, as the insulating film 218, a 300-nm-thick silicon oxynitride film is formed with a plasma CVD apparatus.

Note that heat treatment is preferably performed after the insulating film 216 is formed or after the insulating film 218 is formed. An impurity element added to the semiconductor film 208 can be activated by the heat treatment. For example, activation is performed by a thermal annealing method in a nitrogen atmosphere in which the oxygen concentration is lower than or equal to 1 ppm, preferably lower than or equal to 0.1 ppm at higher than or equal to 400° C. and lower than 700° C. (preferably higher than or equal to 500° C. and lower than or equal to 600° C.). Furthermore, a step of hydrogenating the semiconductor film 208 may be performed at higher than or equal to 300° C. and lower than or equal to 450° C. in an atmosphere containing hydrogen at greater than or equal to 3% and less than or equal to 100% for longer than or equal to 1 and shorter than or equal to 12 hours. This step is performed for the purpose of termination of dangling bonds of a silicon film by thermally excited hydrogen. As another method of hydrogenation, plasma hydrogenation (using hydrogen excited by plasma) may be performed.

[Formation of Openings]

Figure 20B:
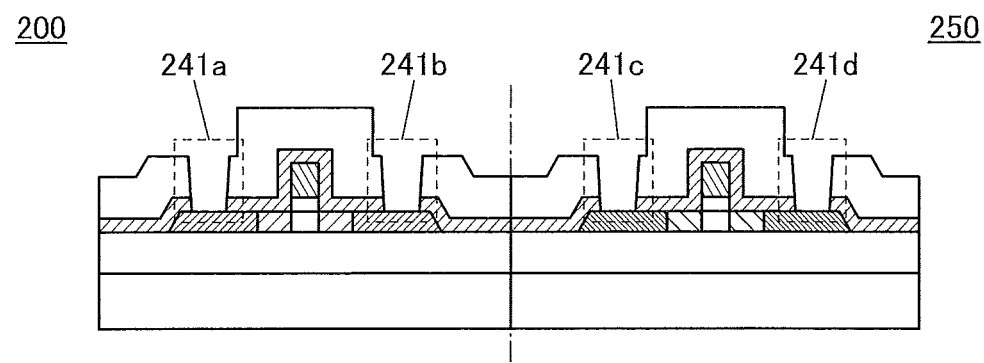

Next, a mask is formed by lithography in a desired position over the insulating film 218, and then the insulating films 218 and 216 are partly etched, so that the opening 241a reaching the source region 208s, the opening 241b reaching the drain region 208d, an opening 241c reaching the source region 208sp, and an opening 241d reaching the drain region 208dp are formed (see FIG. 20B).

To etch the insulating films 218 and 216, a wet etching method and/or a dry etching method can be used. In this embodiment, the insulating films 218 and 216 are processed by a dry etching method.

Figure 20C:
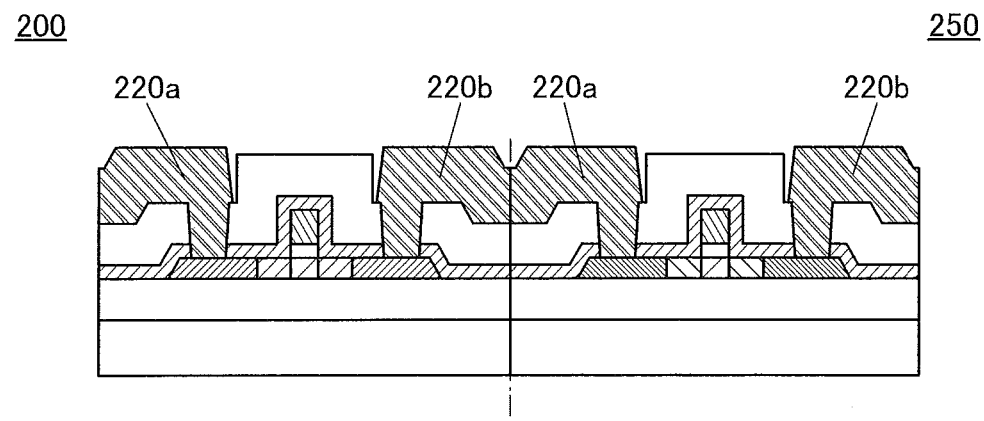

Next, a conductive film is formed over the insulating film 218 to cover the openings 241a, 241b, 241c, and 241d and processed into desired shapes, so that the conductive films 220a and 220b are formed (see FIG. 20C).

In this embodiment, for the conductive films 220a and 220b, a stack including a 50-nm-thick tungsten film and a 400-nm-thick copper film is formed with a sputtering apparatus.

To process the conductive film to be the conductive films 220a and 220b, a wet etching method and/or a dry etching method can be used. In this embodiment, in the processing of the conductive film into the conductive films 220a and 220b, the copper film is etched by a wet etching method and then the tungsten film is etched by a dry etching method.

Through the above process, the n-channel transistor 200 illustrated in FIGS. 16A to 16C and the p-channel transistor 250 formed over the same substrate where the n-channel the transistor 200 is formed can be fabricated.

Note that the films included in the transistors 200 and 250 (the insulating film, the conductive film, the semiconductor film, and the like) can be formed by, other than the above methods, a sputtering method, a chemical vapor deposition (CVD) method, a vacuum evaporation method, a pulsed laser deposition (PLD) method, or an ALD method. Alternatively, a coating method or a printing method can be used. Although the sputtering method and a plasma-enhanced chemical vapor deposition (PECVD) method are typical examples of the film formation method, a thermal CVD method may be used. As an example of a thermal CVD method, a metal organic chemical vapor deposition (MOCVD) method can be given.

Deposition by a thermal CVD method may be performed in such a manner that the pressure in a chamber is set to an atmospheric pressure or a reduced pressure, and a source gas and an oxidizer are supplied to the chamber at a time and react with each other in the vicinity of the substrate or over the substrate. Thus, no plasma is generated in the deposition; therefore, a thermal CVD method has an advantage that no defect due to plasma damage is caused.

In the case where a hafnium oxide film is formed with a deposition apparatus employing an ALD method, two kinds of gases are used, namely, ozone ($O_3$) as an oxidizer and a source gas that is obtained by vaporizing liquid containing a solvent and a hafnium precursor (hafnium alkoxide or hafnium amide such as tetrakis(dimethylamide)hafnium (TDMAH, $Hf[N(CH_3)_2]_4$) or tetrakis(ethylmethylamide) hafnium).

In the case where an aluminum oxide film is formed with a deposition apparatus employing an ALD method, two kinds of gases are used, namely, $H_2O$ as an oxidizer and a source gas that is obtained by vaporizing liquid containing a solvent and an aluminum precursor (e.g., trimethylaluminum (TMA, $Al(CH_3)_3$)). Examples of another material include tris(dimethylamide)aluminum, triisobutylaluminum, and aluminum tris(2,2,6,6-tetramethyl-3,5-heptanedionate).

In the case where a silicon oxide film is formed with a deposition apparatus employing an ALD method, hexachlorodisilane is adsorbed on a surface on which a film is to be formed, and radicals of an oxidizing gas ($O_2$ or dinitrogen monoxide) are supplied to react with the adsorbate.

In the case where a tungsten film is formed with a deposition apparatus employing an ALD method, a $WF_6$ gas and a $B_2H_6$ gas are sequentially introduced to form an initial tungsten film, and then, a $WF_6$ gas and an $H_2$ gas are used to form a tungsten film. Note that an $SiH_4$ gas may be used instead of a $B_2H_6$ gas.

<2-3. Components of Semiconductor Device>

Next, details of the components of the semiconductor device in FIGS. 16A to 16C are described.

[Substrate]

As the substrate 202, a variety of substrates can be used without particular limitation. Examples of the substrate include a semiconductor substrate (e.g., a single-crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper containing a fibrous material, and a base material film. As examples of the glass substrate, a barium borosilicate glass substrate, an aluminoborosilicate glass substrate, and a soda lime glass substrate can be given. Examples of materials of the flexible substrate, the attachment film, the base film, and the like are plastics typified by polyethylene terephthalate (PET), polyethylene naphthalate (PEN), and polyether sulfone (PES). Another example is a synthetic resin such as acrylic. Furthermore, polypropylene, polyester, polyvinyl fluoride, and polyvinyl chloride can be given as examples. Other examples are polyamide, polyimide, aramid, epoxy, an inorganic vapor deposition film, and paper. In particular, a transistor formed using a semiconductor substrate, a single-crystal substrate, an SOI substrate, or the like can have little variation in characteristics, size, shape, or the like, high current capability, and a small size. A circuit using such transistors can achieve lower power consumption of the circuit or higher integration of the circuit.

Alternatively, a flexible substrate may be used as the substrate 202, and the transistor may be formed directly on the flexible substrate. Alternatively, a separation layer may be provided between the substrate 202 and the transistor. The separation layer can be used when part or the whole of a semiconductor device formed over the separation layer is separated from the substrate 202 and transferred to another substrate. In such a case, the transistor can be transferred to even a substrate having low heat resistance or a flexible substrate. For example, the above separation layer can be an organic resin film of polyimide or the like formed over the substrate or a stack including inorganic films (e.g., a tungsten film and a silicon oxide film).

Examples of a substrate to which a transistor is transferred include, in addition to the above substrates over which the transistor can be formed, a paper substrate, a cellophane substrate, an aramid film substrate, a polyimide film substrate, a stone substrate, a wood substrate, a cloth substrate (including a natural fiber (silk, cotton, or hemp), a synthetic fiber (nylon, polyurethane, or polyester), a regenerated fiber (acetate, cupra, rayon, or regenerated polyester), and the like), a leather substrate, and a rubber substrate. When such a substrate is used, a transistor with excellent characteristics or a transistor with low power consumption can be formed, a device with high durability can be manufactured, high heat resistance can be provided, or a reduction in weight or thickness can be achieved.

[First Insulating Film]

The insulating film 204 can be formed by a sputtering method, a CVD method, an evaporation method, a pulsed laser deposition (PLD) method, a printing method, a coating method, or the like as appropriate. For example, the insulating film 204 can be formed to have a single-layer structure or stacked-layer structure of an oxide insulating film and/or a nitride insulating film. The thickness of the insulating film 204 can be greater than or equal to 50 nm, greater than or equal to 100 nm and less than or equal to 3000 nm, or greater than or equal to 200 nm and less than or equal to 1000 nm.

For example, the insulating film 204 can be formed to have a single-layer structure or stacked-layer structure of silicon oxide, silicon oxynitride, silicon nitride oxide, silicon nitride, aluminum oxide, hafnium oxide, or the like. In this embodiment, the insulating film 204 has a stacked-layer structure of a silicon nitride film and a silicon oxynitride film. As described above, the insulating film 204 may have a stacked-layer structure.

[Semiconductor Film]

The semiconductor film 208 includes a silicon film. The silicon film has a crystalline structure. As the semiconductor film 208, in particular, a low-temperature polycrystalline silicon film is preferably formed.

[Second Insulating Film]

The insulating film 210 functions as a gate insulating film of the transistor 200. The insulating film 210 can be formed to have a single-layer structure or a stacked-layer structure of an oxide insulating film or a nitride insulating film, for example. For example, silicon oxide, silicon oxynitride, silicon nitride oxide, or silicon nitride may be used for the insulating film 210.

The thickness of the insulating film 210 can be greater than or equal to 5 nm and less than or equal to 400 nm, greater than or equal to 5 nm and less than or equal to 300 nm, or greater than or equal to 10 nm and less than or equal to 250 nm.

The insulating film 210 may be formed using a high-k material such as hafnium silicate ($HfSiO_x$), hafnium silicate to which nitrogen is added ($HfSiO_xN$), hafnium aluminate to which nitrogen is added ($HfAl_xO_yN_z$), or hafnium oxide. The use of such a high-k material enables a reduction in gate leakage current of a transistor.

The insulating film 210 may be formed by a CVD method using an organosilane gas. As the organosilane gas, any of the following silicon-containing compound can be used: tetraethoxysilane (TEOS) (chemical formula: $Si(OC_2H_5)_4$); tetramethylsilane (TMS) (chemical formula: $Si(CH_3)_4$); tetramethylcyclotetrasiloxane (TMCTS); octamethylcyclotetrasiloxane (OMCTS); hexamethyldisilazane (HMDS); triethoxysilane ($SiH(OC_2H_5)_3$); trisdimethylaminosilane ($SiH(N(CH_3)_2)_3$); or the like. The insulating film 210 having high coverage can be formed by a CVD method using an organosilane gas.

[Third Insulating Film]

The insulating film 216 serves as a protective film. As the insulating film 216, for example, a nitride insulating film or an oxide insulating film can be used. The nitride insulating film can be formed using silicon nitride, silicon nitride oxide, silicon nitride fluoride, silicon fluoronitride, or the like. The oxide insulating film can be formed using silicon oxide, silicon oxynitride, aluminum oxide, hafnium oxide, or the like.

[Fourth Insulating Film]

As the insulating film 218, a nitride insulating film or an oxide insulating film can be used, for example. The materials described above for the insulating film 216 can be used for the insulating film 218.

Furthermore, the insulating film 218 preferably functions as a barrier film against hydrogen, water, and the like from the outside.

The thickness of the insulating film 218 can be greater than or equal to 30 nm and less than or equal to 500 nm, or greater than or equal to 100 nm and less than or equal to 400 nm.

[Conductive Film]

The conductive films 212, 220a, and 220b can be formed by a sputtering method, a vacuum evaporation method, a pulsed laser deposition (PLD) method, a thermal CVD method, or the like. The conductive films 212, 220a, and 220b can be formed using, for example, a metal element selected from aluminum, chromium, copper, tantalum, titanium, molybdenum, nickel, iron, cobalt, and tungsten, an alloy containing the metal element as a component, or an alloy containing any of the metal elements in combination. Furthermore, one or more metal elements selected from manganese or zirconium may be used. In addition, the conductive films 212, 220a, and 220b may have a single-layer structure or a stacked-layer structure of two or more layers. For example, the following structure may be used: a single-layer structure of an aluminum film containing silicon; a single-layer structure of a copper film containing manganese; a two-layer structure in which a titanium film is stacked over an aluminum film; a two-layer structure in which a titanium film is stacked over a titanium nitride film; a two-layer structure in which a tungsten film is stacked over a titanium nitride film; a two-layer structure in which a tungsten film is stacked over a tantalum nitride film or a tungsten nitride film; a two-layer structure in which a copper film is stacked over a copper film containing manganese; a two-layer structure in which a copper film is stacked over a titanium film; a three-layer structure in which a titanium film, an aluminum film, and a titanium film are stacked in this order, or a three-layer structure in which a copper film containing manganese, a copper film, and a copper film containing manganese are stacked in this order. Alternatively, an alloy film or a nitride film in which aluminum and one or more elements selected from titanium, tantalum, tungsten, molybdenum, chromium, neodymium, and scandium are combined may be used.

It is particularly suitable to use a material containing copper for the conductive films 212, 220a, and 220b. The use of a material containing copper for the conductive films 212, 220a, and 220b can reduce the resistance. A signal delay or the like can be suppressed even in the case of using a large-sized substrate as the substrate 202, for example.

The conductive films 212, 220a, and 220b can also be formed using a light-transmitting conductive material such as indium tin oxide (ITO), indium oxide containing tungsten oxide, indium zinc oxide containing tungsten oxide, indium oxide containing titanium oxide, indium tin oxide containing titanium oxide, indium zinc oxide, or indium tin oxide containing silicon (also referred to as an In—Sn—Si oxide or ITSO). A stacked-layer structure formed using the above light-transmitting conductive material and the above metal element can also be employed.

The thickness of the conductive films 212, 220a, and 220b can be greater than or equal to 30 nm and less than or equal to 500 nm, or greater than or equal to 100 nm and less than or equal to 400 nm.

The conductive films 212, 220a, and 220b may be formed using a nanoimprint apparatus without using a deposition apparatus or a light exposure apparatus.

[First Protective Film]

The first protective film 213 serves as what is called a hard mask. The first protective film 213 can be formed by a sputtering method, a vacuum evaporation method, a pulsed laser deposition (PLD) method, a thermal CVD method, or the like. The first protective film 213 is preferably formed with an inorganic insulating material. When the first protective film 213 is formed using an inorganic material, the insulating film 210 and the conductive film 212 can be favorably processed. For the first protective film 213, for example, the materials for the above-described conductive film, and the first to fourth insulating films may be used. It is preferable that one or more of a titanium film, a titanium nitride film, a tungsten film, a tungsten nitride film, a molybdenum film, a molybdenum nitride film, a copper film, a silicon oxide film, a silicon oxynitride film, a silicon nitride oxide film, and a silicon nitride film be used for the first protective film 213. Alternatively, the first protective film 213 can be a stack including the materials for the above-described conductive film and the first to fourth insulating films.

[Second Protective Film]

The second protective film 240 is preferably formed using an organic material. This is because when the second protective film 240 is formed using an organic material, it can be easily processed into a desired shape. For the second protective film 240, for example, a photosensitive organic resin or the like may be used. Typically, a resist or the like can be given as an example. Note that either of positive and negative resists can be used as the resist.

<2-4. Structural Example 2 of Semiconductor Device>

Next, a structure of a semiconductor device, which is different from that of the semiconductor device illustrated in FIGS. 16A to 16C, is described with reference to FIGS. 21A to 21C.

Figure 21A:
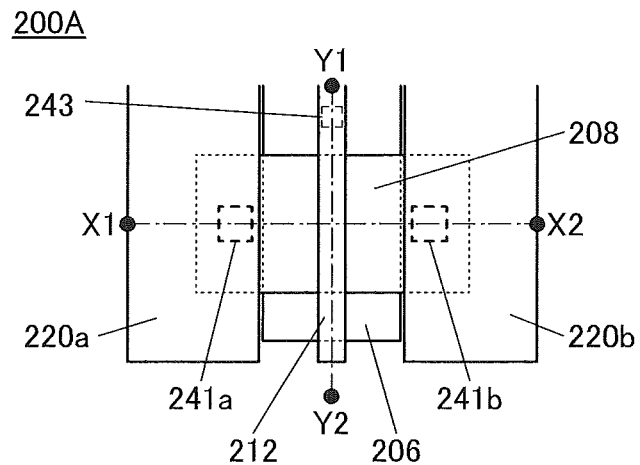
FIGS. 21A to 21C are a top view and cross-sectional views of a semiconductor device.

FIG. 21A is a top view of a transistor 200A. FIG. 21B is a cross-sectional view taken along dashed-dotted line X1-X2 in FIG. 21A. FIG. 21C is a cross-sectional view taken along dashed-dotted line Y1-Y2 in FIG. 21A.

Figure 21B:
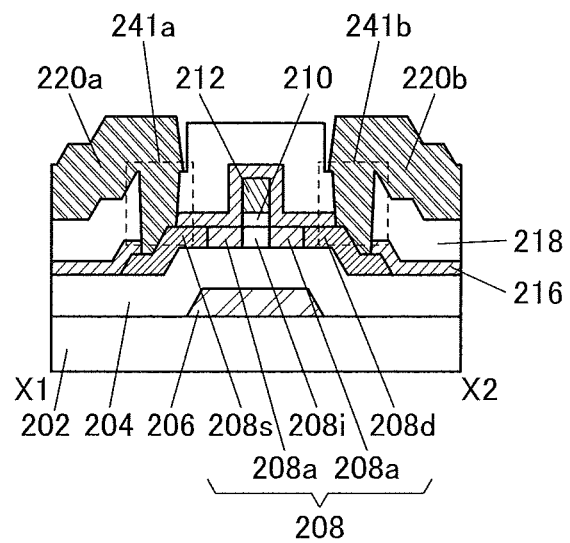
Figure 21C:
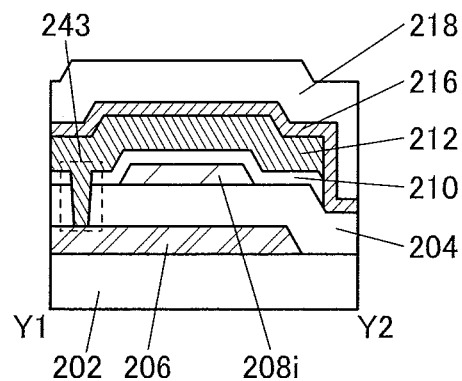

The transistor 200A illustrated in FIGS. 21A to 21C includes a conductive film 206 over the substrate 202, the insulating film 204 over the conductive film 206, the semiconductor film 208 over the insulating film 204, the insulating film 210 over the semiconductor film 208, and the conductive film 212 that partly overlaps with the semiconductor film 208 and is over the insulating film 210. Furthermore, the insulating film 216 and the insulating film 218 are provided over the insulating film 204, the semiconductor film 208, and the conductive film 212.

The semiconductor film 208 includes a silicon film. The silicon film has a crystalline structure. For example, an amorphous silicon film is irradiated with a laser beam to be a polycrystalline silicon film, and the polycrystalline silicon film can be used as the semiconductor film 208.

The semiconductor film 208 includes the channel region 208i overlapping with the conductive film 212, the source region 208s in contact with the insulating film 216, and the drain region 208d in contact with the insulating film 216. Furthermore, the semiconductor film 208 includes the low-resistance regions 208a between the channel region 208i and the source region 208s and between the channel region 208i and the drain region 208d.

Note that the low-resistance regions 208a function as LDD regions. Moreover, an impurity element imparting n-type conductivity to the semiconductor film 208 such as phosphorus (P) and arsenic (As) is added to the low-resistance regions 208a, the source region 208s, and the drain region 208d.

As illustrated in FIG. 21B, the width of each of the low-resistance regions 208a in the channel length (L) direction is greater than the channel length of the channel region 208i. Alternatively, the width of the low-resistance regions 208a may be the same as the channel length of the channel region 208i.

With the structure, when the transistor has a small channel length (L), e.g., less than 1.5 µm, degradation due to carriers accelerated by a voltage applied to the drain region 208d (also referred to as hot-carrier degradation) can be favorably suppressed since the width of each of the low-resistance regions 208a is greater than the channel length. Thus, a highly reliable semiconductor device can be provided.

In one embodiment of the present invention, the low-resistance regions 208a, the source region 208s, and the drain region 208d can be formed in a self-aligned manner.

The transistor 200A includes the conductive film 206 and an opening 243 in addition to the components of the transistor 200 described above.

Note that the opening 243 is provided in the insulating films 204 and 210. The conductive film 206 is electrically connected to the conductive film 212 through the opening 243. Thus, the same potential is applied to the conductive film 206 and the conductive film 212. Note that different potentials may be applied to the conductive film 206 and the conductive film 212 without providing the opening 243. Alternatively, the conductive film 206 may be used as a light-blocking film without providing the opening 243. When the conductive film 206 is formed using a light-blocking material, for example, light with which the channel region 208i is irradiated from the bottom can be reduced.

In the case of the structure of the transistor 200A, the conductive film 206 functions as a first gate electrode (also referred to as a bottom-gate electrode), the conductive film 212 functions as a second gate electrode (also referred to as a top-gate electrode), the insulating film 204 functions as a first gate insulating film, and the insulating film 210 functions as a second gate insulating film.

The conductive film 206 can be formed using a material similar to the above-described materials of the conductive films 212, 220a, and 220b. It is particularly suitable to use a material containing copper for the conductive film 206 because the resistance can be reduced. It is suitable that, for example, each of the conductive films 206, 220a, and 220b has a stacked-layer structure in which a copper film is over a titanium nitride film, a tantalum nitride film, or a tungsten film. In that case, when the transistor 200A is used as a pixel transistor and/or a driving transistor of a display device, parasitic capacitance generated between the conductive films 206 and 220a and between the conductive films 206 and 220b can be reduced. Thus, the conductive films 206, 220a, and 220b can be used not only as the first gate electrode, the source electrode, and the drain electrode of the transistor 200A, but also as power source supply wirings, signal supply wirings, connection wirings, or the like of the display device.

In this manner, unlike the transistor 200 described above, the transistor 200A in FIGS. 21A to 21C has a structure in which a conductive film functioning as a gate electrode is provided over and under the semiconductor film 208. As in the transistor 200A, a semiconductor device of one embodiment of the present invention may have a plurality of gate electrodes.

As illustrated in FIG. 21C, the semiconductor film 208 faces the conductive film 206 functioning as a first gate electrode and the conductive film 212 functioning as a second gate electrode and is positioned between the two conductive films functioning as the gate electrodes.

Furthermore, the length of the conductive film 212 in the channel width direction is larger than the length of the semiconductor film 208 in the channel width direction. In the channel width direction, the whole semiconductor film 208 is covered with the conductive film 212 with the insulating film 210 placed therebetween. Since the conductive film 212 is connected to the conductive film 206 through the opening 243 provided in the insulating films 204 and 210, a side surface of the semiconductor film 208 in the channel width direction faces the conductive film 212 with the insulating film 210 placed therebetween.

In other words, in the channel width direction of the transistor 200A, the conductive films 206 and 212 are connected to each other through the opening 243 provided in the insulating films 204 and 210, and the conductive films 206 and 212 surround the semiconductor film 208 with the insulating films 204 and 210 placed therebetween.

Such a structure enables the semiconductor film 208 included in the transistor 200A to be electrically surrounded by electric fields of the conductive film 206 functioning as a first gate electrode and the conductive film 212 functioning as a second gate electrode. A device structure of a transistor, like that of the transistor 200A, in which electric fields of a first gate electrode and a second gate electrode electrically surround an semiconductor film in which a channel region is formed can be referred to as a surrounded channel (S-channel) structure.

Since the transistor 200A has the S-channel structure, an electric field for inducing a channel can be effectively applied to the semiconductor film 208 by the conductive film 206 or the conductive film 212; thus, the current drive capability of the transistor 200A can be improved and high on-state current characteristics can be obtained. As a result of the high on-state current, it is possible to reduce the size of the transistor 200A. Furthermore, since the transistor 200A has a structure in which the semiconductor film 208 is surrounded by the conductive film 206 and the conductive film 212, the mechanical strength of the transistor 200A can be increased.

When seen in the channel width direction of the transistor 200A, an opening different from the opening 243 may be formed on the side of the semiconductor film 208 on which the opening 243 is not formed.

When a transistor has a pair of gate electrodes between which a semiconductor film is positioned as in the transistor 200A, one of the gate electrodes may be supplied with a signal A, and the other gate electrode may be supplied with a fixed potential $V_b$. Alternatively, one of the gate electrodes may be supplied with the signal A, and the other gate electrode may be supplied with a signal B. Alternatively, one of the gate electrodes may be supplied with a fixed potential $V_a$, and the other gate electrode may be supplied with the fixed potential $V_b$.

The signal A is, for example, a signal for controlling the on/off state. The signal A may be a digital signal with two kinds of potentials, a potential $V_1$ and a potential $V_2$ ($V_1 > V_2$). For example, the potential $V_1$ can be a high power supply potential, and the potential $V_2$ can be a low power supply potential. The signal A may be an analog signal.

The fixed potential $V_b$ is, for example, a potential for controlling a threshold voltage V of the transistor. The fixed potential $V_b$ may be the potential $V_1$ or the potential $V_2$. In that case, a potential generator circuit for generating the fixed potential $V_b$ is not necessary, which is preferable. The fixed potential $V_b$ may be different from the potential $V_1$ or the potential $V_2$. When the fixed potential $V_b$ is low, the threshold voltage $V_{thA}$ can be high in some cases. As a result, the drain current flowing when the gate-source voltage $V_{gs}$ is 0 V can be reduced, and leakage current in a circuit including the transistor can be reduced in some cases. The fixed potential $V_b$ may be, for example, lower than the low power supply potential. Meanwhile, a high fixed potential $V_b$ can lower the threshold voltage $V_{thA}$ in some cases. As a result, the drain current flowing when the gate-source voltage $V_{gs}$ is a high power supply potential and the operating speed of the circuit including the transistor can be increased in some cases. The fixed potential $V_b$ may be, for example, higher than the low power supply potential.

The signal B is, for example, a signal for controlling the on/off state. The signal B may be a digital signal with two kinds of potentials, a potential $V_3$ and a potential $V_4$ ($V_3 > V_4$). For example, the potential $V_3$ can be a high power supply potential, and the potential $V_4$ can be a low power supply potential. The signal B may be an analog signal.

When both the signal A and the signal B are digital signals, the signal B may have the same digital value as the signal A. In this case, it may be possible to increase the on-state current of the transistor and the operating speed of the circuit including the transistor. Here, the potential $V_1$ and the potential $V_2$ of the signal A may be different from the potential $V_3$ and the potential $V_4$ of the signal B. For example, if a gate insulating film for the gate to which the signal B is input is thicker than a gate insulating film for the gate to which the signal A is input, the potential amplitude of the signal B ($V_3 - V_4$) may be larger than the potential amplitude of the signal A ($V_1 - V_2$). In this manner, the influence of the signal A and that of the signal B on the on/off state of the transistor can be substantially the same in some cases.

When both the signal A and the signal B are digital signals, the signal B may have a digital value different from that of the signal A. In this case, the signal A and the signal B can separately control the transistor, and thus, higher performance can be achieved. The transistor that is, for example, an n-channel transistor can function by itself as a NAND circuit, a NOR circuit, or the like in the following case: the transistor is turned on only when the signal A has the potential $V_1$ and the signal B has the potential $V_3$, or the transistor is turned off only when the signal A has the potential $V_2$ and the signal B has the potential $V_4$. The signal B may be a signal for controlling the threshold voltage $V_{thA}$. For example, the potential of the signal B in a period in which the circuit including the transistor operates may be different from the potential of the signal B in a period in which the circuit does not operate. The potential of the signal B may vary depending on the operation mode of the circuit.

In this case, the potential of the signal B is not changed as frequently as the potential of the signal A in some cases.

When both the signal A and the signal B are analog signals, the signal B may be an analog signal having the same potential as the signal A, an analog signal whose potential is a constant times the potential of the signal A, an analog signal whose potential is higher or lower than the potential of the signal A by a constant, or the like. In this case, it may be possible to increase the on-state current of the transistor and the operating speed of the circuit including the transistor. The signal B may be an analog signal different from the signal A. In this case, the signal A and the signal B can separately control the transistor, and thus, higher performance can be achieved.

The signal A may be a digital signal, and the signal B may be an analog signal. Alternatively, the signal A may be an analog signal, and the signal B may be a digital signal.

When both of the gate electrodes of the transistor are supplied with the fixed potentials, the transistor can function as an element equivalent to a resistor in some cases. For example, in the case where the transistor is an n-channel transistor, the effective resistance of the transistor can be sometimes low (high) when the fixed potential $V_a$ or the fixed potential $V_b$ is high (low). When both the fixed potential $V_a$ and the fixed potential $V_b$ are high (low), the effective resistance can be lower (higher) than that of a transistor with only one gate in some cases.

Except for the above-mentioned points, the transistor 200A has a structure and an effect similar to those of the transistor 200 described above.

<2-5. Structural Example 3 of Semiconductor Device>

Next, modification examples of the transistor 200 illustrated in FIGS. 16A to 16C and the transistor 200A illustrated in FIGS. 21A to 21C are described with reference to FIGS. 22A and 22B.

Figure 22A:
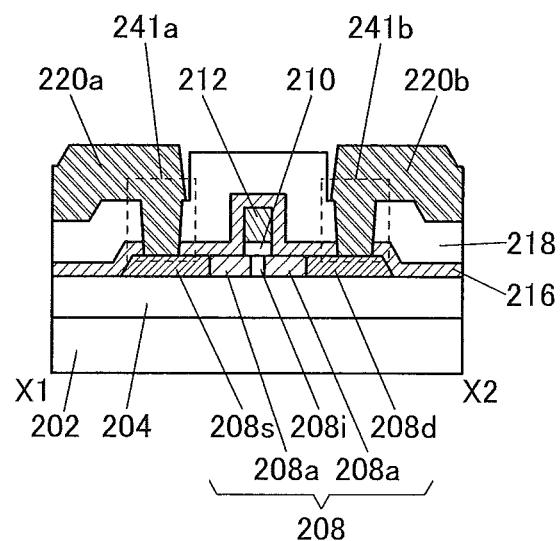
FIGS. 22A and 22B are cross-sectional views each illustrating a semiconductor device.
Figure 22B:
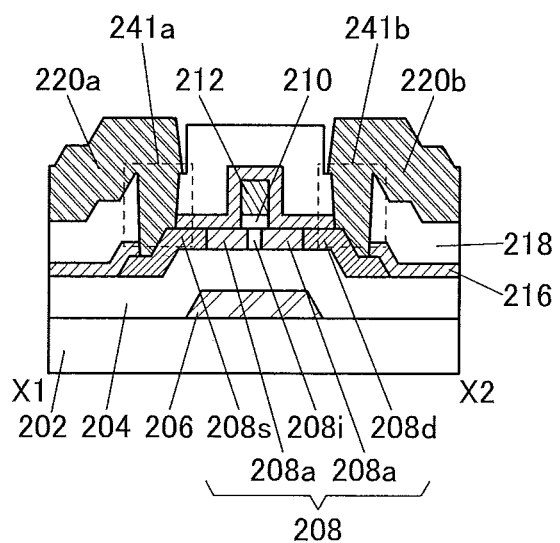

FIG. 22A is a cross-sectional view of a modification example of the transistor 200 in the channel length (L) direction, and FIG. 22B is a cross-sectional view of a modification example of the transistor 200A in the channel length (L) direction. Note that a top view and a cross-sectional view in the channel width (W) direction of the transistor illustrated in FIG. 22A are similar to the top view in FIG. 16A and the cross-sectional view in FIG. 16C, respectively; thus, they are not described here. Note that a top view and a cross-sectional view in the channel width (W) direction of the transistor illustrated in FIG. 22B are similar to the top view in FIG. 21A and the cross-sectional view in FIG. 21C, respectively; thus, they are not described here.

The transistors illustrated in FIGS. 22A and 22B are different from the above-described transistors 200 and 200A in the length, in the channel length (L) direction, of the low-resistance regions 208a included in the semiconductor film 208. Specifically, in the transistors illustrated in FIGS. 22A and 22B, the low-resistance regions 208a are formed also below the conductive film 212. In other words, portions of the low-resistance regions 208a overlap with the conductive film 212 functioning as a gate electrode.

With the structure, regions of the low-resistance regions 208a that overlap with the conductive film 212 function as what is called overlap regions (also referred to as Lov regions). Note that the Lov region overlaps with the conductive film 212 functioning as the gate electrode and has lower resistance than the channel region 208i. With the Lov region, no high-resistance region is formed between the channel region 208i and the source region 208s or between the channel region 208i and the drain region 208d; accordingly, the on-state current of the transistor can be increased.

The low-resistance regions 208a illustrated in FIGS. 22A and 22B can be formed, for example, by adding an impurity element, and then performing heat treatment to diffuse the impurity element to the channel region 208i in a lateral direction.

Note that the structure described in this embodiment can be implemented by being combined as appropriate with any other structure described in the other embodiments.

Embodiment 3

In this embodiment, the composition and structure of an oxide semiconductor that can be used in one embodiment of the present invention are described with reference to FIGS. 23A to 23C, FIG. 24, FIGS. 25A and 25B, FIGS. 26A to 26E, FIGS. 27A to 27E, FIGS. 28A to 28D, FIGS. 29A and 29B, and FIG. 30.

<3-1. Composition of Oxide Semiconductor>

Composition of an oxide semiconductor is described below.

An oxide semiconductor preferably contains at least indium or zinc. In particular, indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, or the like may be contained.

Here, the case where an oxide semiconductor contains indium, an element M, and zinc is considered. The element M is aluminum, gallium, yttrium, tin, or the like. Alternatively, the element M can be boron, silicon, titanium, iron, nickel, germanium, zirconium, molybdenum, lanthanum, cerium, neodymium, hafnium, tantalum, tungsten, magnesium, or the like. Note that two or more of the above elements may be used in combination as the element M.

First, preferred ranges of the atomic ratio of indium, the element M, and zinc contained in an oxide semiconductor according to the present invention are described with reference to FIGS. 23A to 23C. Note that the proportion of oxygen atoms is not shown. The terms of the atomic ratio of indium, the element M, and zinc contained in the oxide semiconductor are denoted by [In], [M], and [Zn], respectively.

Figure 23A:
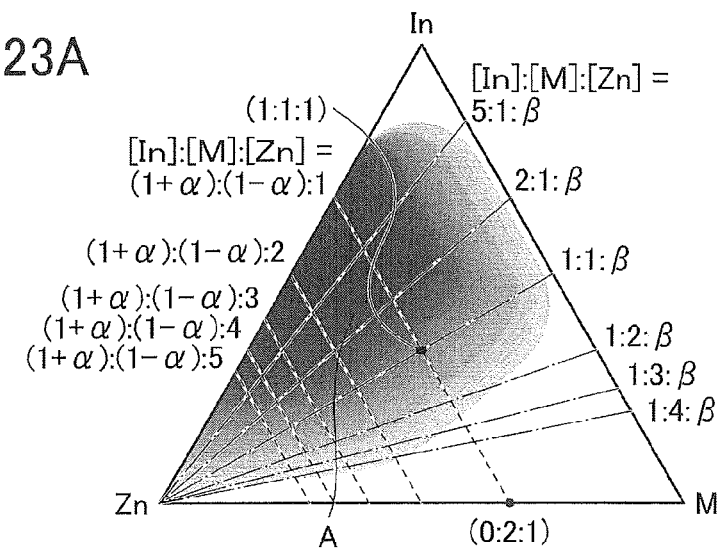
FIGS. 23A to 23C each show the range of the atomic ratio of an oxide semiconductor.
Figure 23B:
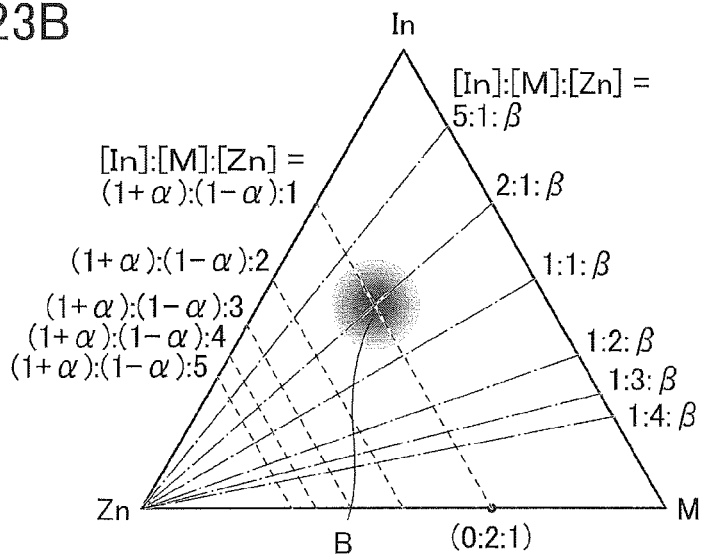
Figure 23C:
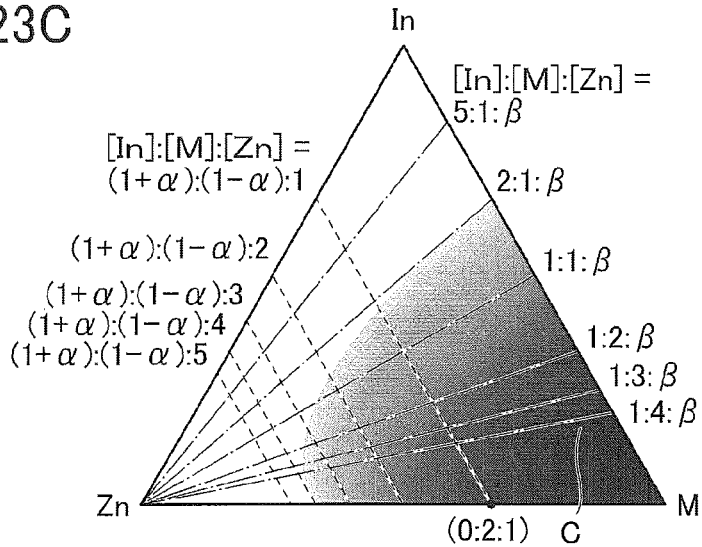

In FIGS. 23A to 23C, broken lines indicate a line where the atomic ratio [In]:[M]:[Zn] is $(1+\alpha):(1-\alpha):1$, where $-1 \le \alpha \le 1$, a line where the atomic ratio [In]:[M]:[Zn] is $(1+\alpha):(1-\alpha):2$, a line where the atomic ratio [In]:[M]:[Zn] is $(1+\alpha):(1-\alpha):3$, a line where the atomic ratio [In]:[M]:[Zn] is $(1+\alpha):(1-\alpha):4$, and a line where the atomic ratio [In]:[M]:[Zn] is $(1+\alpha):(1-\alpha):5$.

Dashed-dotted lines indicate a line where the atomic ratio [In]:[M]:[Zn] is $1:1:\beta$, where $\beta \ge 0$, a line where the atomic ratio [In]:[M]:[Zn] is $1:2:\beta$, a line where the atomic ratio [In]:[M]:[Zn] is $1:3:\beta$, a line where the atomic ratio [In]:[M]:[Zn] is $1:4:\beta$, a line where the atomic ratio [In]:[M]:[Zn] is $2:1:\beta$, and a line where the atomic ratio [In]:[M]:[Zn] is $5:1:\beta$.

The oxide semiconductor shown in FIGS. 23A to 23C with an atomic ratio of [In]:[M]:[Zn]=0:2:1 or an atomic ratio that is in the neighborhood is likely to have a spinel crystal structure.

FIGS. 23A and 23B show examples of the preferred ranges of the atomic ratio of indium, the element M, and zinc contained in an oxide semiconductor in one embodiment of the present invention.

Figure 24:
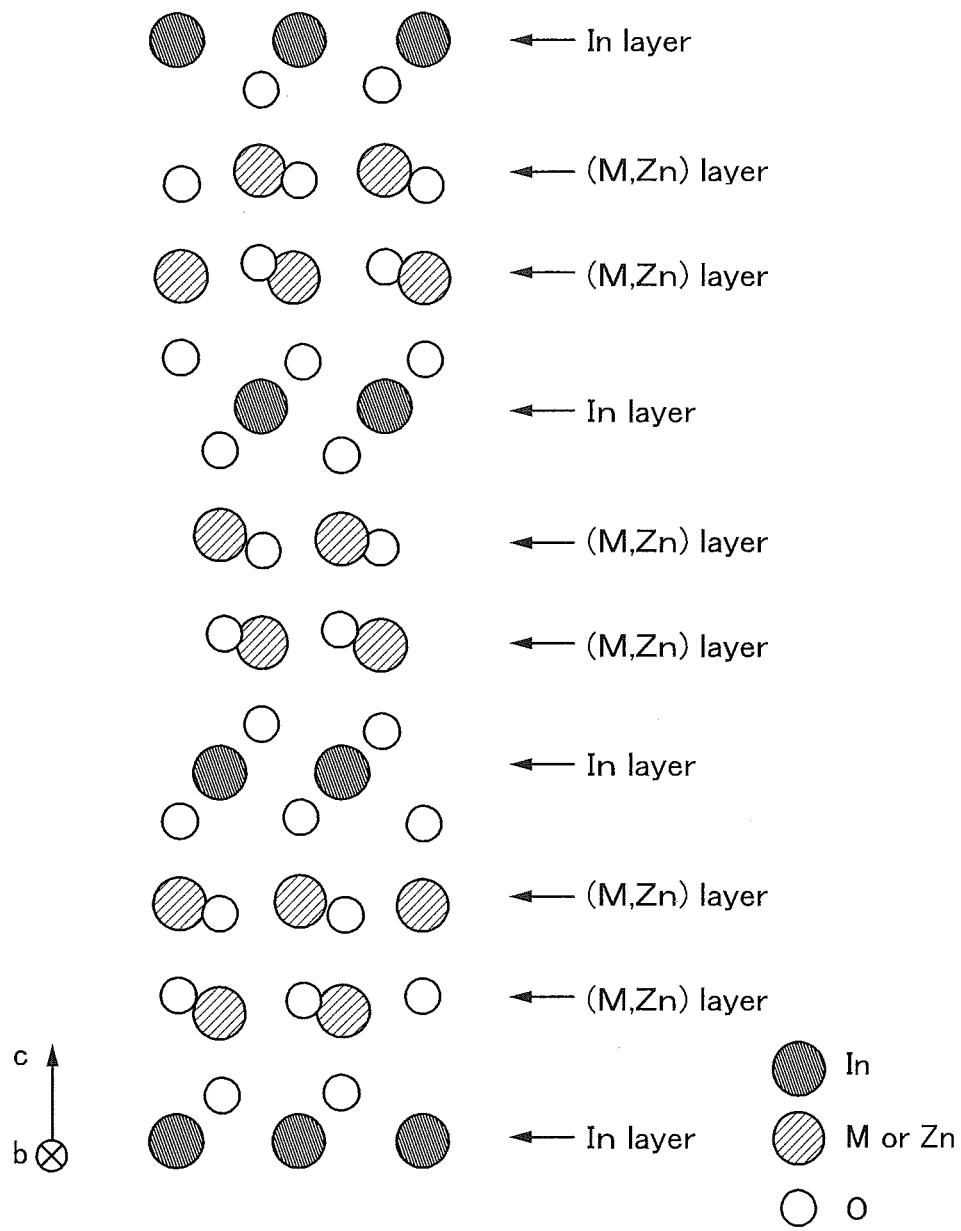
FIG. 24 illustrates a crystal of $InMZnO_4$.

FIG. 24 shows an example of the crystal structure of InMZnO$_4$ whose atomic ratio [In]:[M]:[Zn] is 1:1:1. The crystal structure shown in FIG. 24 is InMZnO$_4$ observed from a direction parallel to a b-axis. Note that a metal element in a layer that contains M, Zn, and oxygen (hereinafter, this layer is referred to as an "(M,Zn) layer") in FIG. 24 represents the element M or zinc. In that case, the proportion of the element M is the same as the proportion of zinc. The element M and zinc can be replaced with each other, and their arrangement is random.

InMZnO$_4$ has a layered crystal structure (also referred to as a layered structure) and includes one layer that contains indium and oxygen (hereinafter referred to as an In layer) for every two (M,Zn) layers that contain the element M, zinc, and oxygen, as shown in FIG. 24.

Indium and the element M can be replaced with each other. Thus, when the element M in the (M,Zn) layer is replaced with indium, the layer can also be referred to as an (In,M,Zn) layer. In that case, a layered structure that contains one In layer for every two (In,M,Zn) layers is obtained.

An oxide semiconductor whose atomic ratio [In]:[M]:[Zn] is 1:1:2 has a layered structure that contains one In layer for every three (M,Zn) layers. In other words, if [Zn] is higher than [In] and [M], the proportion of the (M,Zn) layer to the In layer becomes higher when the oxide semiconductor is crystallized.

Note that in the case where the number of (M,Zn) layers for every In layer is not an integer in the oxide semiconductor, the oxide semiconductor might have plural kinds of layered structures where the number of (M,Zn) layers for every In layer is an integer. For example, in the case of [In]:[M]:[Zn]=1:1:1.5, the oxide semiconductor might have the following layered structures: a layered structure of one In layer for every two (M,Zn) layers and a layered structure of one In layer for every three (M,Zn) layers.

For example, in the case where the oxide semiconductor is formed with a sputtering apparatus, a film having an atomic ratio deviated from the atomic ratio of a target is formed. In particular, [Zn] in the film might be smaller than [Zn] in the target depending on the substrate temperature in deposition.

A plurality of phases (e.g., two phases or three phases) exist in the oxide semiconductor in some cases. For example, with an atomic ratio [In]:[M]:[Zn] that is close to 0:2:1, two phases of a spinel crystal structure and a layered crystal structure are likely to exist. In addition, with an atomic ratio [In]:[M]:[Zn] that is close to 1:0:0, two phases of a bixbyite crystal structure and a layered crystal structure are likely to exist. In the case where a plurality of phases exist in the oxide semiconductor, a grain boundary might be formed between different crystal structures.

In addition, the oxide semiconductor containing indium in a higher proportion can have high carrier mobility (electron mobility). This is because in an oxide semiconductor containing indium, the element M, and zinc, the s orbital of heavy metal mainly contributes to carrier transfer, and when the indium content in the oxide semiconductor is increased, overlaps of the s orbitals of indium atoms are increased; Thus, an oxide semiconductor having a high content of indium has higher carrier mobility than an oxide semiconductor having a low content of indium.

In contrast, when the indium content and the zinc content in an oxide semiconductor become lower, carrier mobility becomes lower. Thus, with an atomic ratio of [In]:[M]:[Zn]=0:1:0 and the vicinity thereof (e.g., a region C in FIG. 23C), insulation performance becomes better.

Accordingly, an oxide semiconductor in one embodiment of the present invention preferably has an atomic ratio represented by a region A in FIG. 23A. With the atomic ratio, a layered structure with high carrier mobility and a few grain boundaries is easily obtained.

A region B in FIG. 23B represents an atomic ratio of [In]:[M]:[Zn]=4:2:3 or 4:2:4.1 and the vicinity thereof. The vicinity includes an atomic ratio of [In]:[M]:[Zn]=5:3:4. An oxide semiconductor with an atomic ratio represented by the region B is an excellent oxide semiconductor that has particularly high crystallinity and high carrier mobility.

Note that a condition where an oxide semiconductor forms a layered structure is not uniquely determined by an atomic ratio. There is a difference in the degree of difficulty in forming a layered structure among atomic ratios. Even with the same atomic ratio, whether a layered structure is formed or not depends on a formation condition. Thus, the illustrated regions each represent an atomic ratio with which an oxide semiconductor has a layered structure, and boundaries of the regions A to C are not clear.

<3-2. Structure in which Oxide Semiconductor is Used for Transistor>

Next, a structure in which the oxide semiconductor is used for a transistor is described.

Note that when the oxide semiconductor is used for a transistor, carrier scattering or the like at a grain boundary can be reduced; thus, the transistor can have high field-effect mobility. In addition, the transistor can have high reliability.

An oxide semiconductor with low carrier density is preferably used for a channel region of the transistor. For example, an oxide semiconductor whose carrier density is lower than $8\times10^{11}$ cm$^{-3}$, preferably lower than $1\times10^{11}$ cm$^{-3}$, more preferably lower than $1\times10^{10}$ cm$^{-3}$, and greater than or equal to $1\times10^{-9}$ cm$^{-3}$ is used.

A highly purified intrinsic or substantially highly purified intrinsic oxide semiconductor has few carrier generation sources and thus can have a low carrier density. The highly purified intrinsic or substantially highly purified intrinsic oxide semiconductor has a low density of defect states and accordingly has a low density of trap states in some cases.

Charge trapped by the trap states in the oxide semiconductor takes a long time to be released and may behave like fixed charge. Thus, a transistor whose channel region is formed in an oxide semiconductor having a high density of trap states has unstable electrical characteristics in some cases.

In order to obtain stable electrical characteristics of the transistor, it is effective to reduce the concentration of impurities in the oxide semiconductor. In addition, in order to reduce the concentration of impurities in the oxide semiconductor, the concentration of impurities in a film that is adjacent to the oxide semiconductor is preferably reduced. Examples of impurities include hydrogen, nitrogen, alkali metal, alkaline earth metal, iron, nickel, and silicon.

Here, the influence of impurities in the oxide semiconductor is described.

When silicon or carbon that is one of Group 14 elements is contained in the oxide semiconductor, defect states are formed. Thus, the concentration of silicon or carbon in the oxide semiconductor and around an interface with the oxide semiconductor (measured by secondary ion mass spectrometry (SIMS)) is set lower than or equal to $2\times10^{18}$ atoms/cm$^3$, and preferably lower than or equal to $2\times10^{17}$ atoms/cm$^3$.

When the oxide semiconductor contains alkali metal or alkaline earth metal, defect states are formed and carriers are generated, in some cases. Thus, a transistor including an oxide semiconductor that contains alkali metal or alkaline earth metal is likely to be normally-on. Therefore, it is preferable to reduce the concentration of alkali metal or alkaline earth metal in the oxide semiconductor. Specifically, the concentration of alkali metal or alkaline earth metal in the oxide semiconductor measured by SIMS is set lower than or equal to $1\times10^{18}$ atoms/cm$^3$, and preferably lower than or equal to $2\times10^{16}$ atoms/cm$^3$.

When the oxide semiconductor contains nitrogen, the oxide semiconductor easily becomes n-type by generation of electrons serving as carriers and an increase of carrier density. Thus, a transistor whose semiconductor includes an oxide semiconductor that contains nitrogen is likely to be normally-on. For this reason, nitrogen in the oxide semiconductor is preferably reduced as much as possible; for example, the concentration of nitrogen in the oxide semiconductor, which is measured by SIMS, can be lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in an oxide semiconductor reacts with oxygen bonded to a metal atom to be water, and thus causes an oxygen vacancy, in some cases. Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, a transistor including an oxide semiconductor that contains hydrogen is likely to be normally-on. Accordingly, it is preferable that hydrogen in the oxide semiconductor be reduced as much as possible. Specifically, the hydrogen concentration of the oxide semiconductor measured by SIMS is set lower than $1\times10^{20}$ atoms/cm$^3$, preferably lower than $1\times10^{19}$ atoms/cm$^3$, further preferably lower than $5\times10^{18}$ atoms/cm$^3$, and still further preferably lower than $1\times10^{18}$ atoms/cm$^3$.

When an oxide semiconductor with sufficiently reduced impurity concentration is used for a channel formation region in a transistor, the transistor can have stable electrical characteristics.

The energy gap of the oxide semiconductor film is preferably 2 eV or more, 2.5 eV or more, or 3 eV or more.

The thickness of the oxide semiconductor film is greater than or equal to 3 nm and less than or equal to 200 nm, preferably greater than or equal to 3 nm and less than or equal to 100 nm, further preferably greater than or equal to 3 nm and less than or equal to 60 nm.

When the oxide semiconductor film is an In-M-Zn oxide, as the atomic ratio of metal elements in a sputtering target used for formation of the In-M-Zn oxide, In:M:Zn=1:1:0.5, In:M:Zn=1:1:1, In:M:Zn=1:1:1.2, In:M:Zn=2:1:1.5, In:M:Zn=2:1:2.3, In:M:Zn=2:1:3, In:M:Zn=3:1:2, In:M:Zn=4:2:4.1, In:M:Zn=5:1:7, or the like is preferable.

Note that the atomic ratios of metal elements in the formed oxide semiconductor films may each vary from the above atomic ratio of metal elements in the sputtering target within a range of approximately ±40%. For example, when a sputtering target with an atomic ratio of In:Ga:Zn=4:2:4.1 is used, the atomic ratio of In to Ga and Zn in the oxide semiconductor film may be approximately 4:2:3. In the case where a sputtering target whose atomic ratio of In to Ga and Zn is 5:1:7 is used, the atomic ratio of In to Ga and Zn in the formed oxide semiconductor film may be approximately 5:1:6.

<3-3. Stacked-Layer Structure of Oxide Semiconductor>

Next, a stacked-layer structure of an oxide semiconductor is described.

Here, as a stacked-layer structure of an oxide semiconductor, the case where the oxide semiconductor has a two-layer structure or a three-layer structure is described. A band diagram of insulators that are in contact with a stacked-layer structure of an oxide semiconductor S1, an oxide semiconductor S2, and an oxide semiconductor S3 and a band diagram of insulators that are in contact with a stacked-layer structure of the oxide semiconductor S2 and the oxide semiconductor S3 are described with reference to FIGS. 25A and 25B.

Figure 25A:
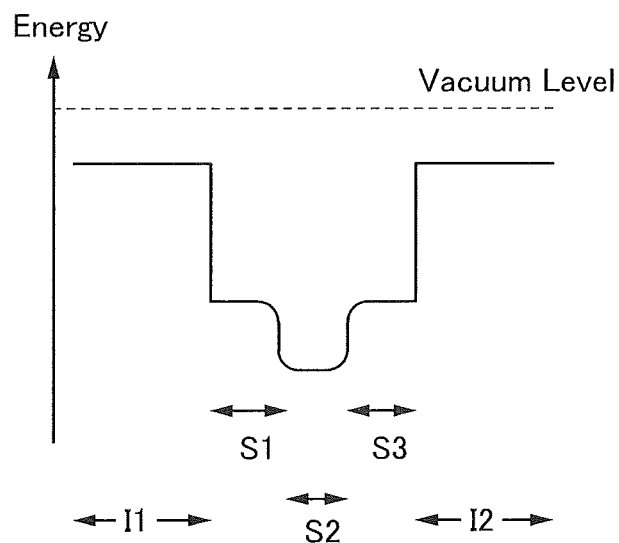
FIGS. 25A and 25B are each a band diagram of a stacked-layer structure of oxide semiconductors.
Figure 25B:
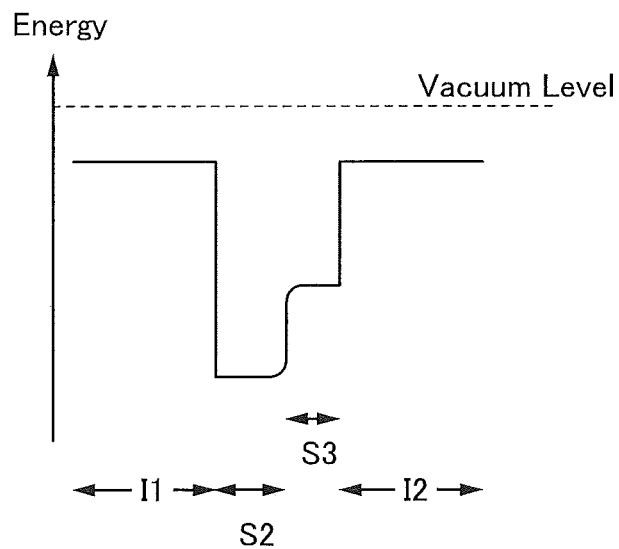

FIG. 25A is an example of a band diagram of a stacked-layer structure including an insulator I1, the oxide semiconductor S1, the oxide semiconductor S2, the oxide semiconductor S3, and an insulator I2 in a film thickness direction. FIG. 25B is an example of a band diagram of a stacked-layer structure including the insulator I1, the oxide semiconductor S2, the oxide semiconductor S3, and the insulator I2 in a film thickness direction. Note that for easy understanding, the band diagrams show the energy level of the conduction band minimum (Ec) of each of the insulator I1, the oxide semiconductor S1, the oxide semiconductor S2, the oxide semiconductor S3, and the insulator I2.

The energy level of the conduction band minimum of each of the oxide semiconductors S1 and S3 is closer to the vacuum level than that of the oxide semiconductor S2. Typically, a difference in energy level between the conduction band minimum of the oxide semiconductor S2 and the conduction band minimum of each of the oxide semiconductors S1 and S3 is preferably greater than or equal to 0.15 eV or greater than or equal to 0.5 eV, and less than or equal to 2 eV or less than or equal to 1 eV. That is, the electron affinity of the oxide semiconductor S2 is higher than the electron affinity of each of the oxide semiconductors S1 and S3, and the difference between the electron affinity of each of the oxide semiconductors S1 and S3 and the electron affinity of the oxide semiconductor S2 is greater than or equal to 0.15 eV or greater than or equal to 0.5 eV, and less than or equal to 2 eV or less than or equal to 1 eV.

As shown in FIGS. 25A and 25B, the energy level of the conduction band minimum of each of the oxide semiconductors S1 to S3 is gradually varied. In other words, the energy level of the conduction band minimum is continuously varied or continuously connected. In order to obtain such a band diagram, the density of defect states in a mixed layer formed at an interface between the oxide semiconductors S1 and S2 or an interface between the oxide semiconductors S2 and S3 is preferably made low.

Specifically, when the oxide semiconductors S1 and S2 or the oxide semiconductors S2 and S3 contain the same element (as a main component) in addition to oxygen, a mixed layer with a low density of defect states can be formed. For example, in the case where the oxide semiconductor S2 is an In—Ga—Zn oxide semiconductor, it is preferable to use an In—Ga—Zn oxide semiconductor, a Ga—Zn oxide semiconductor, gallium oxide, or the like as each of the oxide semiconductors S1 and S3.

At this time, the oxide semiconductor S2 serves as a main carrier path. Since the density of defect states at the interface between the oxide semiconductors S1 and S2 and the interface between the oxide semiconductors S2 and S3 can be made low, the influence of interface scattering on carrier conduction is small, and high on-state current can be obtained.

When an electron is trapped in a trap state, the trapped electron behaves like fixed charge; thus, the threshold voltage of the transistor is shifted in a positive direction. The oxide semiconductors S1 and S3 can make the trap state apart from the oxide semiconductor S2. This structure can prevent the positive shift of the threshold voltage of the transistor.

A material whose conductivity is sufficiently lower than that of the oxide semiconductor S2 is used for the oxide semiconductors S1 and S3. In that case, the oxide semiconductor S2, the interface between the oxide semiconductors S1 and S2, and the interface between the oxide semiconductors S2 and S3 mainly function as a channel region. For example, an oxide semiconductor with high insulation performance and the atomic ratio represented by the region C in FIG. 23C can be used as the oxide semiconductors S1 and S3. Note that the region C in FIG. 23C represents the atomic ratio of [In]:[M]:[Zn]=0:1:0 and the vicinity thereof.

In the case where an oxide semiconductor with the atomic ratio represented by the region A is used as the oxide semiconductor S2, it is particularly preferable to use an oxide semiconductor with an atomic ratio [M]/[In] that is greater than or equal to 1, preferably greater than or equal to 2 as each of the oxide semiconductors S1 and S3. In addition, it is suitable to use an oxide semiconductor with an atomic ratio [M]/([Zn]+[In]) that is greater than or equal to 1, which has sufficiently high insulation performance, as the oxide semiconductor S3.

<3-4. Structure of Oxide Semiconductor>

Next, a structure of an oxide semiconductor is described.

An oxide semiconductor is classified into a single-crystal oxide semiconductor and a non-single-crystal oxide semiconductor. Examples of the non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of the crystalline oxide semiconductor include a single-crystal oxide semiconductor, a CAAC-OS, a polycrystalline oxide semiconductor, and an nc-OS.

An amorphous structure is generally thought to be isotropic and have no non-uniform structure, to be metastable and have no fixed atomic arrangement, to have a flexible bond angle, and to have a short-range order but have no long-range order, for example.

In other words, a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that includes a void. Because of its instability, an a-like OS has physical properties similar to those of an amorphous oxide semiconductor.

[CAAC-OS]

First, a CAAC-OS is described.

A CAAC-OS is one of oxide semiconductors and has a plurality of c-axis aligned crystal parts (also referred to as pellets).

Analysis of a CAAC-OS by X-ray diffraction (XRD) is described. For example, when the structure of a CAAC-OS including an InGaZnO$_4$ crystal, which is classified into the space group R-3m, is analyzed by an out-of-plane method, a peak appears at a diffraction angle (2θ) of around 31° as shown in FIG. 26A. This peak is derived from the (009) plane of the InGaZnO$_4$ crystal, which indicates that crystals in the CAAC-OS have c-axis alignment and that the c-axes are aligned in the direction substantially perpendicular to a surface over which the CAAC-OS is formed (also referred to as a formation surface) or a top surface of the CAAC-OS. Note that a peak sometimes appears at 2θ of around 36° in addition to the peak at 2θ of around 31°. The peak at 2θ of around 36° is attributed to a crystal structure classified into the space group Fd-3m; thus, this peak is preferably not exhibited in the CAAC-OS.

On the other hand, in structural analysis of the CAAC-OS by an in-plane method in which an X-ray is incident on the CAAC-OS in the direction parallel to the formation surface, a peak appears at 2θ of around 56°. This peak is derived from the (110) plane of the InGaZnO$_4$ crystal. When analysis (φ scan) is performed with 2θ fixed at around 56° while the sample is rotated around a normal vector to the sample surface as an axis (φ axis), as shown in FIG. 26B, a peak is not clearly observed. In contrast, in the case where single-crystal InGaZnO$_4$ is subjected to φ scan with 2θ fixed at around 56°, as shown in FIG. 26C, six peaks that are derived from crystal planes equivalent to the (110) plane are observed. Accordingly, the structural analysis using XRD shows that the directions of the a-axes and b-axes are irregularly oriented in the CAAC-OS.

Next, a CAAC-OS analyzed by electron diffraction is described. For example, when an electron beam with a probe diameter of 300 nm is incident on a CAAC-OS including an InGaZnO$_4$ crystal in the direction parallel to the formation surface of the CAAC-OS, a diffraction pattern (also referred to as a selected-area electron diffraction pattern) in FIG. 26D can be obtained. This diffraction pattern includes spots derived from the (009) plane of the InGaZnO$_4$ crystal. Thus, the results of electron diffraction also indicate that pellets included in the CAAC-OS have c-axis alignment and that the c-axes are aligned in the direction substantially perpendicular to the formation surface or the top surface of the CAAC-OS. Meanwhile, FIG. 26E shows a diffraction pattern obtained in such a manner that an electron beam with a probe diameter of 300 nm is incident on the same sample in the direction perpendicular to the sample surface. In FIG. 26E, a ring-like diffraction pattern is observed. Thus, the results of electron diffraction using an electron beam with a probe diameter of 300 nm also indicate that the a-axes and b-axes of the pellets included in the CAAC-OS do not have regular alignment. The first ring in FIG. 26E is considered to be derived from the (010) plane, the (100) plane, and the like of the InGaZnO$_4$ crystal. The second ring in FIG. 26E is considered to be derived from the (110) plane and the like.

In a combined analysis image (also referred to as a high-resolution transmission electron microscope (TEM) image) of a bright-field image and a diffraction pattern of a CAAC-OS, which is obtained using a TEM, a plurality of pellets can be observed. However, even in the high-resolution TEM image, a boundary between pellets, that is, a grain boundary is not clearly observed in some cases. Thus, in the CAAC-OS, a reduction in electron mobility due to the grain boundary is less likely to occur.

Figure 27A:
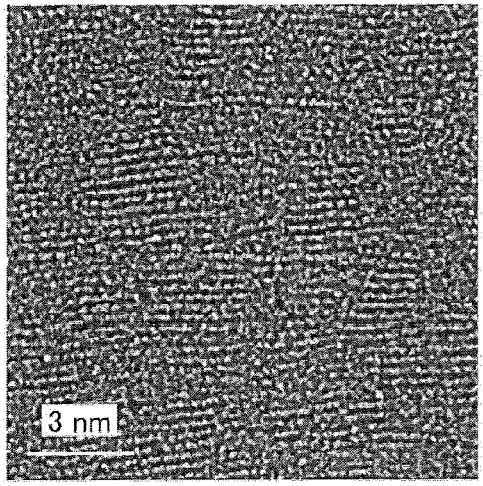
FIGS. 27A to 27E show a cross-sectional TEM image and plan-view TEM images of a CAAC-OS and images obtained through analysis thereof.

FIG. 27A shows a high-resolution TEM image of a cross section of the CAAC-OS that is observed in the direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 27A shows pellets in which metal atoms are arranged in a layered manner. FIG. 27A proves that the size of a pellet is greater than or equal to 1 nm or greater than or equal to 3 nm. Thus, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS and is parallel to the formation surface or the top surface of the CAAC-OS.

Figure 27B:
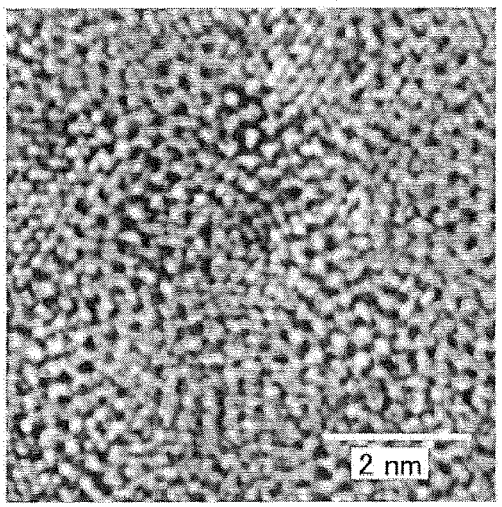
Figure 27C:
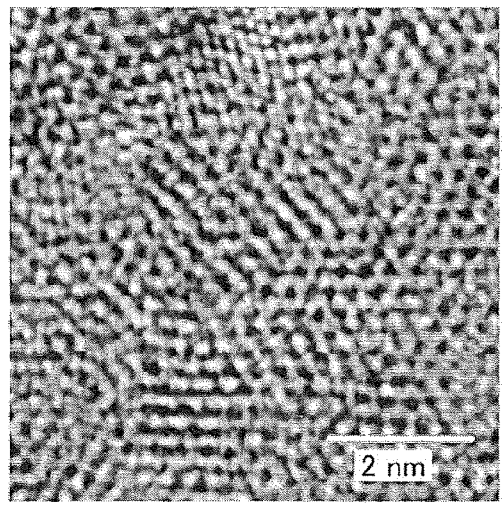
Figure 27D:
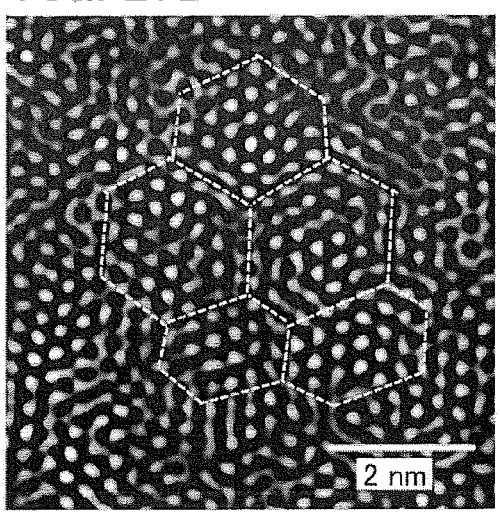
Figure 27E:
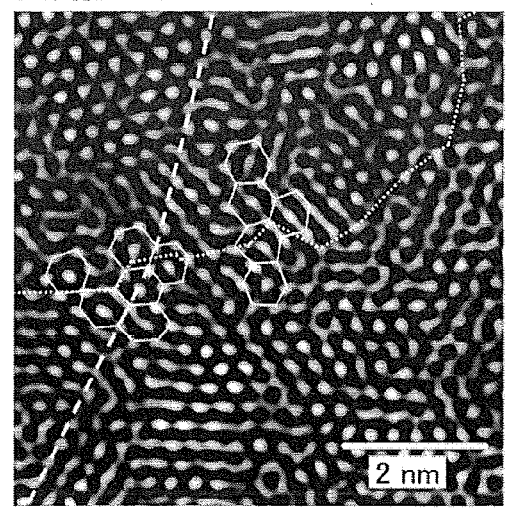

FIGS. 27B and 27C show Cs-corrected high-resolution TEM images of a plane of the CAAC-OS observed in the direction substantially perpendicular to the sample surface. FIGS. 27D and 27E are images obtained by image processing of FIGS. 27B and 27C. The method of image processing is as follows. The image in FIG. 27B is subjected to fast Fourier transform (FFT) to obtain an FFT image. Then, mask processing is performed on the obtained FFT image such that part in the range of 2.8 $nm^{-1}$ to 5.0 $nm^{-1}$ from the reference point is left. After the mask processing, the FFT image is subjected to inverse fast Fourier transform (IFFT) to obtain a processed image. The image obtained in this manner is referred to as an FFT filtering image. The FFT filtering image is a Cs-corrected high-resolution TEM image from which a periodic component is extracted and shows a lattice arrangement.

In FIG. 27D, a portion in which the lattice arrangement is broken is shown by dashed lines. A region surrounded by dashed lines corresponds to one pellet. The portion denoted by the dashed lines is a junction of pellets. The dashed lines draw a hexagon, which means that the pellet has a hexagonal shape. Note that the shape of the pellet is not always a regular hexagon but is a non-regular hexagon in many cases.

In FIG. 27E, a dotted line denotes a portion between a region where a lattice arrangement is well aligned and another region where a lattice arrangement is well aligned. A clear crystal grain boundary cannot be observed even in the vicinity of the dotted line. When a lattice point in the vicinity of the dotted line is regarded as a center and surrounding lattice points are joined, a distorted hexagon, a distorted pentagon, and/or a distorted heptagon can be formed, for example. That is, a lattice arrangement is distorted so that formation of a crystal grain boundary is inhibited. This is probably because the CAAC-OS can tolerate distortion owing to a low density of the atomic arrangement in an a-b plane direction, the interatomic bond distance changed by substitution of a metal element, and the like.

As described above, the CAAC-OS has c-axis alignment, its pellets (nanocrystals) are connected in the a-b plane direction, and its crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has few impurities and defects (e.g., oxygen vacancies).

Note that an impurity means an element other than the main components of an oxide semiconductor, such as hydrogen, carbon, silicon, or a transition metal element. For example, an element (e.g., silicon) having stronger bonding force to oxygen than a metal element constituting a part of an oxide semiconductor extracts oxygen from the oxide semiconductor, which results in a disordered atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

[nc-OS]

Next, an nc-OS is described.

Analysis of an nc-OS by XRD is described. When the structure of an nc-OS is analyzed by an out-of-plane method, a peak indicating orientation does not appear. That is, a crystal of an nc-OS does not have orientation.

Figure 28A:
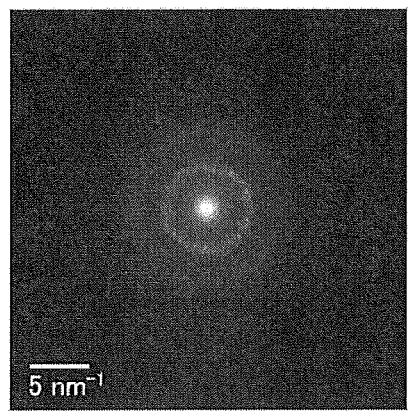
FIGS. 28A to 28D show electron diffraction patterns and a cross-sectional TEM image of an nc-OS.
Figure 28B:
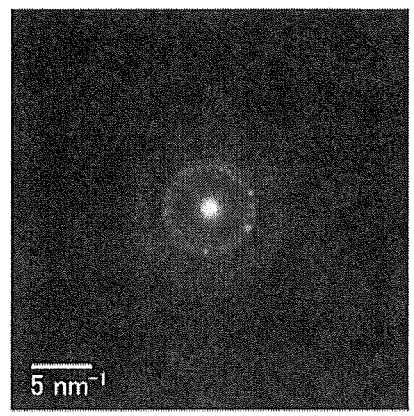

For example, when an electron beam with a probe diameter of 50 nm is incident on a 34-nm-thick region of a thinned nc-OS including an $InGaZnO_4$ crystal in the direction parallel to the formation surface, a ring-like diffraction pattern (nanobeam electron diffraction pattern) shown in FIG. 28A is observed. FIG. 28B shows a diffraction pattern (nanobeam electron diffraction pattern) obtained when an electron beam with a probe diameter of 1 nm is incident on the same sample. In FIG. 28B, a plurality of spots are observed in a ring-like region. Thus, ordering in an nc-OS is not observed with an electron beam with a probe diameter of 50 nm but is observed with an electron beam with a probe diameter of 1 nm.

Figure 28C:
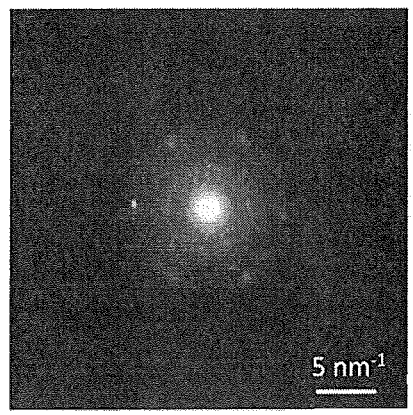

When an electron beam with a probe diameter of 1 nm is incident on a region with a thickness less than 10 nm, an electron diffraction pattern in which spots are arranged in an approximately hexagonal shape as shown in FIG. 28C is observed in some cases. This means that an nc-OS has a well-ordered region, that is, a crystal, in the thickness range of less than 10 nm. Note that an electron diffraction pattern having regularity is not observed in some regions because crystals are aligned in various directions.

Figure 28D:
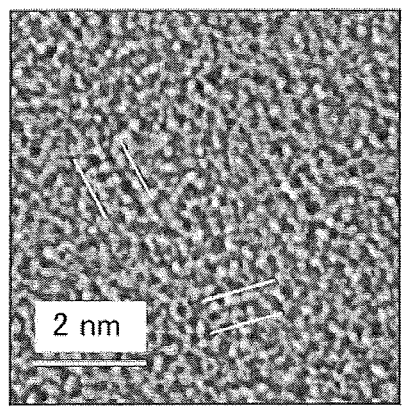

FIG. 28D shows a Cs-corrected high-resolution TEM image of a cross section of an nc-OS observed in the direction substantially parallel to the formation surface. In the high-resolution TEM image, the nc-OS has a region in which a crystal part is observed as indicated by additional lines and a region in which a crystal part is not clearly observed. In most cases, the size of a crystal part included in the nc-OS is greater than or equal to 1 nm and less than or equal to 10 nm, specifically greater than or equal to 1 nm and less than or equal to 3 nm. Note that an oxide semiconductor including a crystal part whose size is greater than 10 nm and less than or equal to 100 nm may be referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Thus, a crystal part of the nc-OS may be referred to as a pellet in the following description.

As described above, in the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not observed. Accordingly, in some cases, the nc-OS cannot be distinguished from an a-like OS or an amorphous oxide semiconductor, depending on an analysis method.

Since there is no regularity of crystal orientation between the pellets (nanocrystals), the nc-OS can also be referred to as an oxide semiconductor including random aligned nanocrystals (RANC) or an oxide semiconductor including non-aligned nanocrystals (NANC).

The nc-OS is an oxide semiconductor that has higher regularity than an amorphous oxide semiconductor. Thus, the nc-OS has a lower density of defect states than the a-like OS and the amorphous oxide semiconductor. Note that there is no regularity of crystal orientation between different pellets in the nc-OS. Therefore, the nc-OS has a higher density of defect states than the CAAC-OS.

[A-Like OS]

An a-like OS has a structure between the structure of an nc-OS and the structure of an amorphous oxide semiconductor.

FIGS. 29A and 29B show high-resolution cross-sectional TEM images of an a-like OS. The high-resolution cross-sectional TEM image of the a-like OS in FIG. 29A is taken at the start of the electron irradiation. The high-resolution cross-sectional TEM image of the a-like OS in FIG. 29B is taken after the irradiation with electrons (e$^-$) at $4.3 \times 10^8$ e$^-$/nm$^2$. FIGS. 29A and 29B show that striped bright regions extending vertically are observed in the a-like OS from the start of the electron irradiation. It can be also found that the shape of the bright region changes after the electron irradiation. Note that the bright region is presumably a void or a low-density region.

The a-like OS has an unstable structure because it includes a void. To verify that an a-like OS has an unstable structure as compared with a CAAC-OS and an nc-OS, a change in structure caused by electron irradiation is described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

It is known that a unit cell of an InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion in which the spacing between lattice fringes is greater than or equal to 0.28 nm and less than or equal to 0.30 nm is regarded as a crystal part of InGaZnO$_4$ in the following description. Each lattice fringe corresponds to the a-b plane of the InGaZnO$_4$ crystal.

Figure 30:
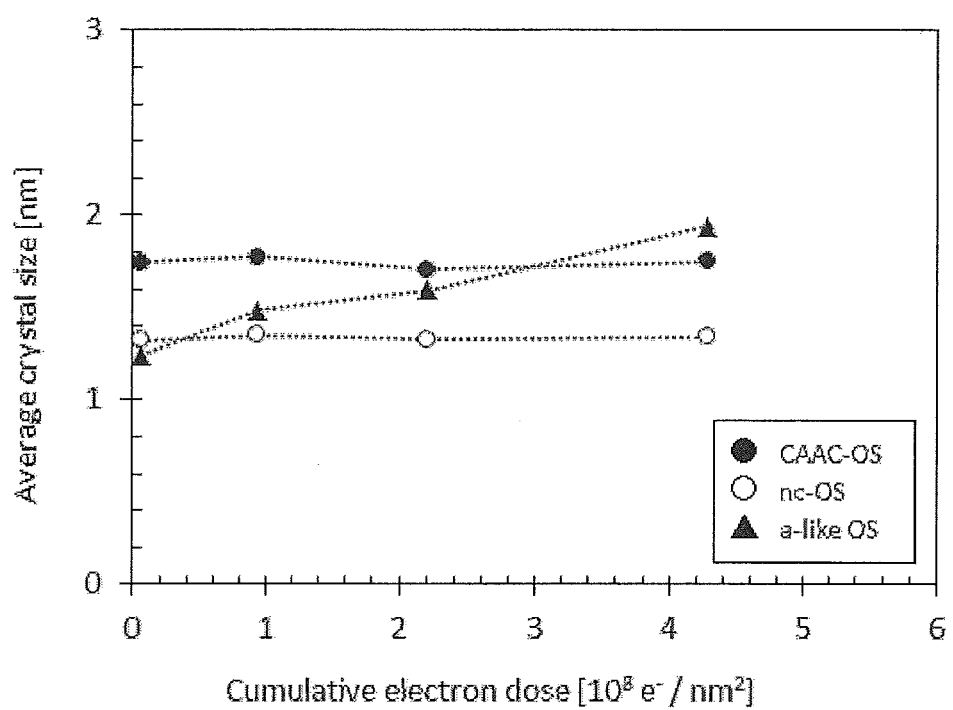
FIG. 30 shows a change in crystal part of an In—Ga—Zn oxide induced by electron irradiation.

FIG. 30 shows a change in the average size of crystal parts (at 22 points to 30 points) in each sample. Note that the crystal part size corresponds to the length of a lattice fringe. FIG. 30 indicates that the crystal part size in the a-like OS increases with an increase in the cumulative electron dose in obtaining TEM images, for example. As shown in FIG. 30, a crystal part with a size of approximately 1.2 nm (also referred to as an initial nucleus) at the start of TEM observation grows to a size of approximately 1.9 nm at a cumulative electron (e$^-$) dose of $4.2 \times 10^8$ e$^-$/nm$^2$. In contrast, the crystal part sizes in the nc-OS and the CAAC-OS show few changes from the start of electron irradiation to a cumulative electron dose of $4.2 \times 10^8$ e$^-$/nm$^2$. As shown in FIG. 30, the crystal part sizes in the nc-OS and the CAAC-OS are approximately 1.3 nm and approximately 1.8 nm, respectively, regardless of the cumulative electron dose. For the electron beam irradiation and TEM observation, a Hitachi H-9000NAR transmission electron microscope was used. The conditions of the electron beam irradiation were as follows: the accelerating voltage was 300 kV; the current density was $6.7 \times 10^5$ e$^-$/(nm$^2$·s); and the diameter of an irradiation region was 230 nm.

In this manner, growth of the crystal part in the a-like OS may be induced by electron irradiation. In contrast, in the nc-OS and the CAAC-OS, growth of the crystal part is hardly induced by electron irradiation. That is, the a-like OS has an unstable structure as compared with the nc-OS and the CAAC-OS.

The a-like OS has a lower density than the nc-OS and the CAAC-OS because it includes a void. Specifically, the density of the a-like OS is higher than or equal to 78.6% and lower than 92.3% of the density of the single-crystal oxide semiconductor having the same composition. The density of the nc-OS and the density of the CAAC-OS are each higher than or equal to 92.3% and lower than 100% of the density of the single-crystal oxide semiconductor having the same composition. It is difficult to deposit an oxide semiconductor having a density lower than 78% of the density of the single-crystal oxide semiconductor.

For example, in the case of an oxide semiconductor whose atomic ratio of In to Ga and Zn is 1:1:1, the density of single-crystal InGaZnO$_4$ with a rhombohedral crystal structure is 6.357 g/cm$^3$. Accordingly, in the case of the oxide semiconductor whose atomic ratio of In to Ga and Zn is 1:1:1, the density of the a-like OS is higher than or equal to 5.0 g/cm$^3$ and lower than 5.9 g/cm$^3$, for example. In the case of the oxide semiconductor whose atomic ratio of In to Ga and Zn is 1:1:1, the density of the nc-OS and the density of the CAAC-OS are each higher than or equal to 5.9 g/cm$^3$ and lower than 6.3 g/cm$^3$, for example.

In the case where an oxide semiconductor having a certain composition does not exist in a single-crystal state, single-crystal oxide semiconductors with different compositions are combined at an adequate ratio, which makes it possible to calculate a density equivalent to that of a single-crystal oxide semiconductor with the desired composition. The density of a single-crystal oxide semiconductor having the desired composition may be calculated using a weighted average with respect to the combination ratio of the single-crystal oxide semiconductors with different compositions. Note that it is preferable to use as few kinds of single-crystal oxide semiconductors as possible to calculate the density.

As described above, oxide semiconductors have various structures and various properties. Note that an oxide semiconductor may be a stacked film including two or more of an amorphous oxide semiconductor, an a-like OS, an nc-OS, and a CAAC-OS, for example.

The structures described in this embodiment can be combined as appropriate with any of the structures described in the other embodiments.

Embodiment 4

In this embodiment, an example of a display device that includes the transistor described in the above embodiments is described below with reference to FIG. 31, FIG. 32, FIG. 33, FIG. 34, FIG. 35, FIG. 36, FIGS. 37A to 37C, FIGS. 38A to 38C, FIGS. 39A to 39C, FIGS. 40A to 40C, and FIGS. 41A to 41D.

Figure 31:
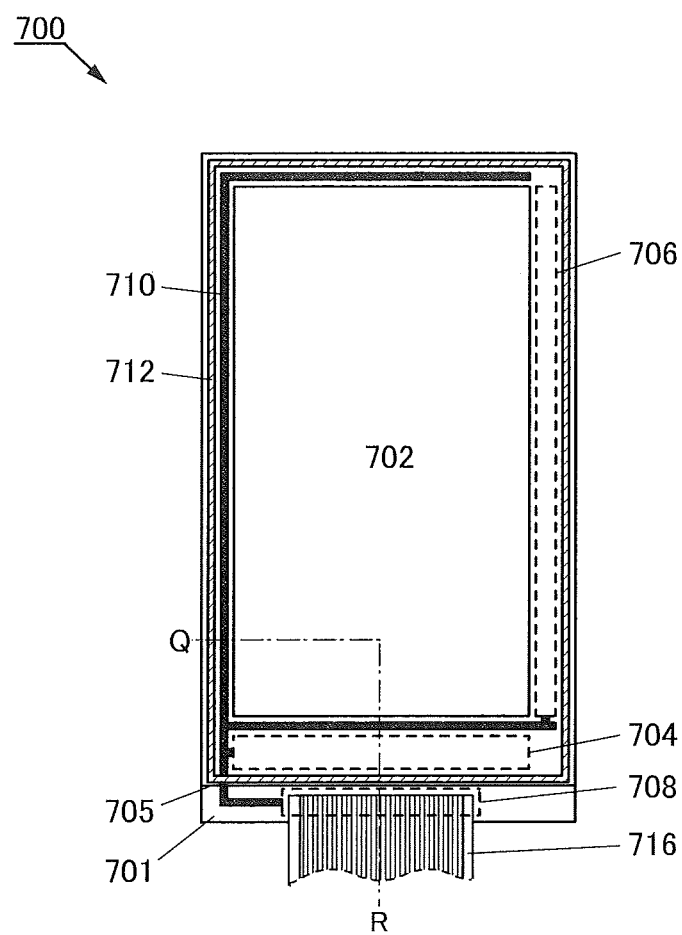
FIG. 31 is a top view illustrating one embodiment of a display device.

FIG. 31 is a top view illustrating an example of a display device. A display device 700 in FIG. 31 includes a pixel portion 702 provided over a first substrate 701, a source driver circuit portion 704 and a gate driver circuit portion 706 that are provided over the first substrate 701, a sealant 712 provided to surround the pixel portion 702, the source driver circuit portion 704, and the gate driver circuit portion 706, and a second substrate 705 provided to face the first substrate 701. The first substrate 701 and the second substrate 705 are sealed with the sealant 712. That is, the pixel portion 702, the source driver circuit portion 704, and the gate driver circuit portion 706 are enclosed by the first substrate 701, the sealant 712, and the second substrate 705. Although not illustrated in FIG. 31, a display element is provided between the first substrate 701 and the second substrate 705.

In the display device 700, a flexible printed circuit (FPC) terminal portion 708 that is electrically connected to the pixel portion 702, the source driver circuit portion 704, and the gate driver circuit portion 706 is provided in a region different from the region that is over the first substrate 701 and surrounded by the sealant 712. Furthermore, an FPC 716 is connected to the FPC terminal portion 708, and a variety of signals and the like are supplied from the FPC 716 to the pixel portion 702, the source driver circuit portion 704, and the gate driver circuit portion 706. Furthermore, a signal line 710 is connected to the pixel portion 702, the source driver circuit portion 704, the gate driver circuit portion 706, and the FPC terminal portion 708. Through the signal line 710, a variety of signals and the like are supplied from the FPC 716 to the pixel portion 702, the source driver circuit portion 704, the gate driver circuit portion 706, and the FPC terminal portion 708.

A plurality of gate driver circuit portions 706 may be provided in the display device 700. The structure of the display device 700 is not limited to the example shown here, in which the source driver circuit portion 704 and the gate driver circuit portion 706 as well as the pixel portion 702 are formed over the first substrate 701. For example, only the gate driver circuit portion 706 may be formed over the first substrate 701, or only the source driver circuit portion 704 may be formed over the first substrate 701. In this case, a substrate over which a source driver circuit, a gate driver circuit, or the like is formed (e.g., a driver circuit board formed using a single-crystal semiconductor film or a polycrystalline semiconductor film) may be formed on the first substrate 701. Note that there is no particular limitation on the method for connecting the separately prepared driver circuit board, and a chip on glass (COG) method, a wire bonding method, or the like can be used.

The pixel portion 702, the source driver circuit portion 704, and the gate driver circuit portion 706 included in the display device 700 include a plurality of transistors. As the plurality of transistors, any of the transistors that are semiconductor devices of embodiments of the present invention can be used.

The display device 700 can include a variety of elements. As examples of the elements, electroluminescent (EL) element (e.g., an EL element containing organic and inorganic materials, an organic EL element, an inorganic EL element, or an LED), a light-emitting transistor element (a transistor that emits light depending on current), an electron emitter, a liquid crystal element, an electronic ink display, an electrophoretic element, an electrowetting element, a plasma display panel (PDP), a micro electro mechanical systems (MEMS) display (e.g., a grating light valve (GLV), a digital micromirror device (DMD), a digital micro shutter (DMS) element, or an interferometric modulator display (IMOD) element), and a piezoelectric ceramic display can be given.

An example of a display device including an EL element is an EL display. Examples of a display device including an electron emitter include a field emission display (FED) and an SED-type flat panel display (SED: surface-conduction electron-emitter display). An example of a display device including a liquid crystal element is a liquid crystal display (a transmissive liquid crystal display, a transflective liquid crystal display, a reflective liquid crystal display, a direct-view liquid crystal display, or a projection liquid crystal display). An example of a display device including an electronic ink display or an electrophoretic element is electronic paper. In a transflective liquid crystal display or a reflective liquid crystal display, some or all of pixel electrodes may function as reflective electrodes. For example, some or all of pixel electrodes may contain aluminum, silver, or the like. In this case, a memory circuit such as an SRAM can be provided under the reflective electrodes, leading to lower power consumption.

As a display system of the display device 700, a progressive system, an interlace system, or the like can be employed. Furthermore, color elements controlled in pixels at the time of color display are not limited to three colors: R, G, and B (R, G, and B correspond to red, green, and blue, respectively). For example, four pixels of an R pixel, a G pixel, a B pixel, and a W (white) pixel may be used. Alternatively, a color element may be composed of two colors of R, G, and B as in PenTile layout. The two colors may differ between color elements. Alternatively, one or more colors of yellow, cyan, magenta, and the like may be added to RGB. Note that the size of a display region may differ between dots of color elements. One embodiment of the disclosed invention is not limited to a color display device; the disclosed invention can also be applied to a monochrome display device.

A coloring layer (also referred to as a color filter) may be used to obtain a full-color display device in which white light (W) is used for a backlight (e.g., an organic EL element, an inorganic EL element, an LED, or a fluorescent lamp). For example, a red (R) coloring layer, a green (G) coloring layer, a blue (B) coloring layer, and a yellow (Y) coloring layer can be combined as appropriate. With the use of the coloring layer, high color reproducibility can be obtained as compared with the case without the coloring layer. Here, by providing a region with a coloring layer and a region without a coloring layer, white light in the region without the coloring layer may be directly utilized for display. By partly providing the region without a coloring layer, a decrease in the luminance of a bright image due to the coloring layer can be suppressed, and approximately 20% to 30% of power consumption can be reduced in some cases. In the case where full-color display is performed using a self-luminous element such as an organic EL element or an inorganic EL element, elements may emit light in their respective colors R, G, B, Y, and W. By using a self-luminous element, power consumption may be further reduced as compared with the case of using a coloring layer.

As a coloring system, any of the following systems may be used: the above-described color filter system in which part of white light is converted into red light, green light, and blue light through color filters; a three-color system in which red light, green light, and blue light are used; and a color conversion system or a quantum dot system in which part of blue light is converted into red light or green light.

Figure 32:
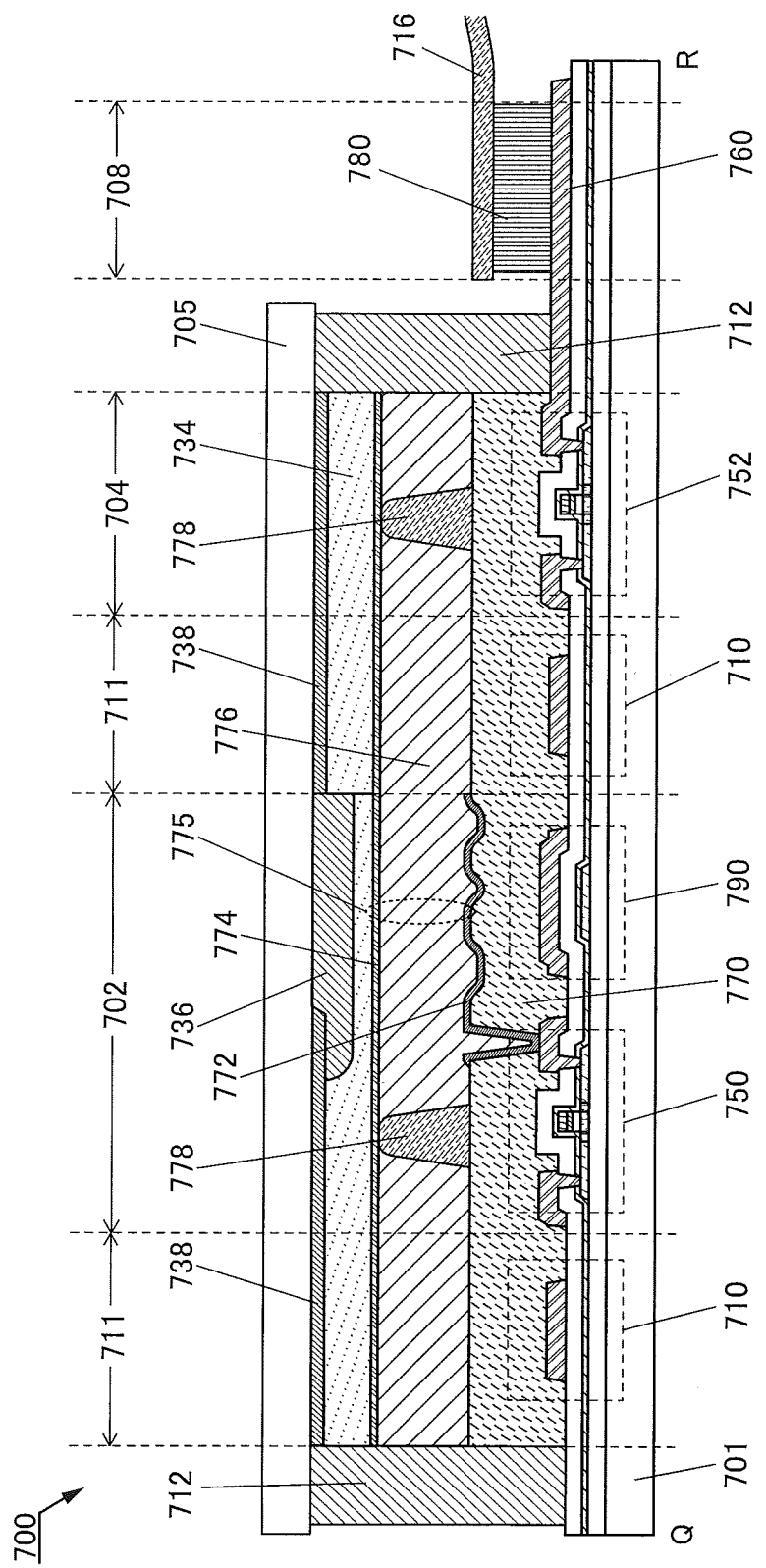
FIG. 32 is a cross-sectional view illustrating one embodiment of a display device.
Figure 33:
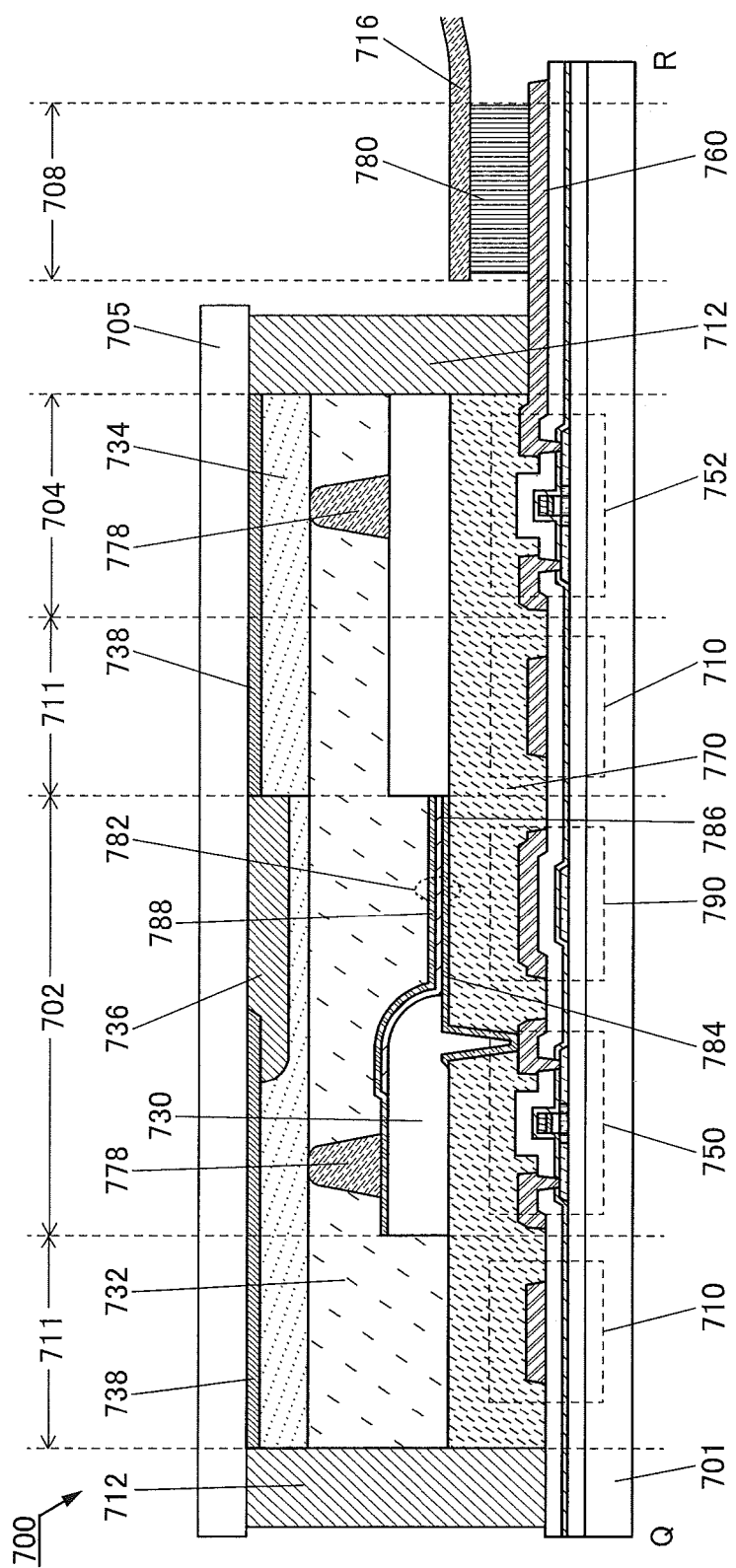
FIG. 33 is a cross-sectional view illustrating one embodiment of a display device.

In this embodiment, a structure including a liquid crystal element as a display element and a structure including an EL element as a display element are described with reference to FIG. 32 and FIG. 33. FIG. 32 is a cross-sectional view taken along dashed-dotted line Q-R in FIG. 31 and illustrates the structure including a liquid crystal element as a display element. FIG. 33 is a cross-sectional view taken along dashed-dotted line Q-R in FIG. 31 and illustrates the structure including an EL element as a display element.

Portions common to FIG. 32 and FIG. 33 are described first, and then, different portions are described.

<4-1. Portions Common to Display Devices>

The display device 700 in FIG. 32 and FIG. 33 includes a lead wiring portion 711, the pixel portion 702, the source driver circuit portion 704, and the FPC terminal portion 708. The lead wiring portion 711 includes the signal line 710. The pixel portion 702 includes a transistor 750 and a capacitor 790. The source driver circuit portion 704 includes a transistor 752.

The transistor 750 and the transistor 752 each have a structure similar to that of the transistor 100 described above. Note that the transistor 750 and the transistor 752 may each have the structure of any of the other transistors described in the above embodiments.

The transistor used in this embodiment includes an oxide semiconductor film that is highly purified and in which formation of an oxygen vacancy is suppressed. The transistor can have low off-state current. Accordingly, an electrical signal such as an image signal can be held for a long time, and a long writing interval can be set in an on state. Accordingly, the frequency of refresh operation can be reduced, which suppresses power consumption.

In addition, the transistor used in this embodiment can have relatively high field-effect mobility and thus is capable of high-speed operation. For example, in a liquid crystal display device that includes such a transistor capable of high-speed operation, a switching transistor in a pixel portion and a driver transistor in a driver circuit portion can be formed over one substrate. That is, no additional semiconductor device formed using a silicon wafer or the like is needed as a driver circuit; therefore, the number of components of the semiconductor device can be reduced. In addition, by using the transistor capable of high-speed operation in the pixel portion, a high-quality image can be provided.

The capacitor 790 includes a lower electrode and an upper electrode. The lower electrode is formed through a step of processing the same oxide semiconductor film as the oxide semiconductor film included in the transistor 750. The upper electrode is formed through a step of processing the same conductive film as a conductive film functioning as a source electrode or a drain electrode of the transistor 750. Between the lower electrode and the upper electrode, an insulating film formed through a step of forming the same insulating film as a third insulating film and a fourth insulating film included in the transistor 750 is provided. That is, the capacitor 790 has a stacked-layer structure in which the insulating films functioning as a dielectric are positioned between the pair of electrodes.

In FIG. 32 and FIG. 33, a planarization insulating film 770 is provided over the transistor 750, the transistor 752, and the capacitor 790.

The planarization insulating film 770 can be formed using a heat-resistant organic material such as a polyimide resin, an acrylic resin, a polyimide amide resin, a benzocyclobutene resin, a polyamide resin, or an epoxy resin. Note that the planarization insulating film 770 may be formed by stacking a plurality of insulating films formed using any of these materials. A structure without the planarization insulating film 770 may also be employed.

Although FIG. 32 and FIG. 33 each illustrate an example in which the transistor 750 included in the pixel portion 702 and the transistor 752 included in the source driver circuit portion 704 have the same structure, one embodiment of the present invention is not limited thereto. For example, the pixel portion 702 and the source driver circuit portion 704 may include different transistors.

In the case where the pixel portion 702 and the source driver circuit portion 704 include different transistors, any of the staggered transistors described in Embodiment 1 and an inverted staggered transistor may be used in combination. Specifically, a structure in which a staggered transistor is used in the pixel portion 702 and an inverted staggered transistor is used in the source driver circuit portion 704, or a structure in which an inverted staggered transistor is used in the pixel portion 702 and a staggered transistor is used in the source driver circuit portion 704 may be employed. Note that the term "source driver circuit portion 704" can be replaced by the term "gate driver circuit portion".

FIGS. 37A to 37C, FIGS. 38A to 38C, FIGS. 39A to 39C, FIGS. 40A to 40C, and FIGS. 41A to 41D illustrate examples of an inverted staggered transistor that can be used in the pixel portion 702 or the source driver circuit portion 704.

Figure 37A:
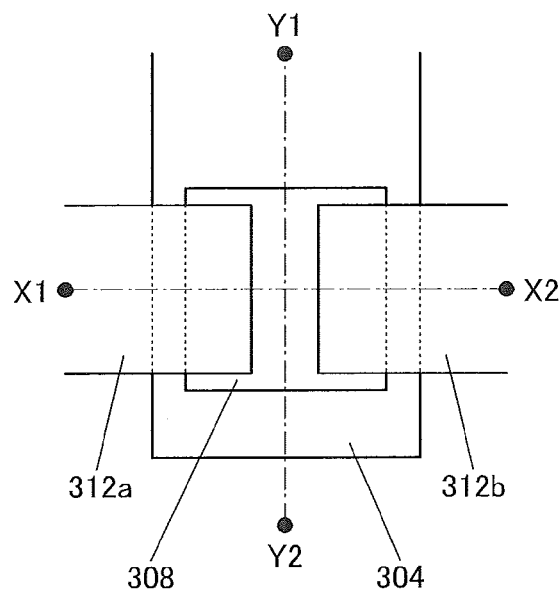
FIGS. 37A to 37C are a top view and cross-sectional views illustrating one embodiment of a semiconductor device.
Figure 37B:
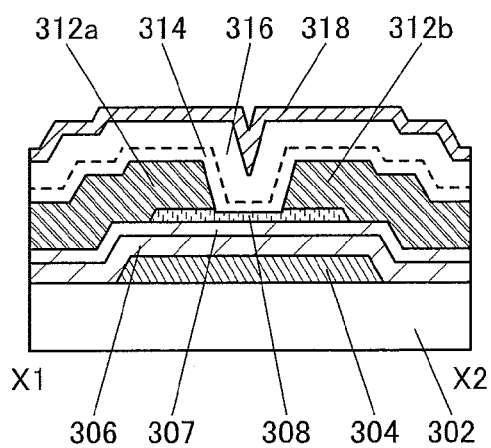
Figure 37C:
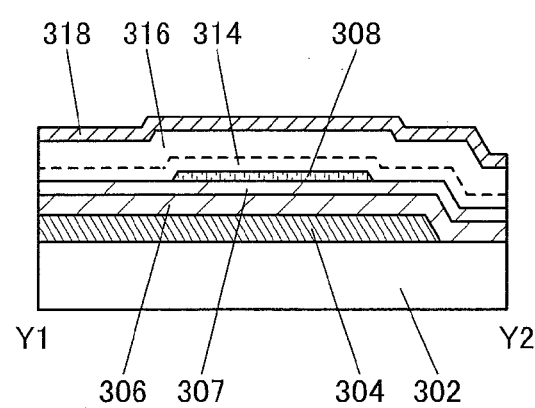

FIG. 37A is a top view of a transistor 300A. FIG. 37B is a cross-sectional view taken along dashed-dotted line X1-X2 in FIG. 37A. FIG. 37C is a cross-sectional view taken along dashed-dotted line Y1-Y2 in FIG. 37A. Note that in FIG. 37A, some components of the transistor 300A (e.g., an insulating film functioning as a gate insulating film) are not illustrated to avoid complexity. The direction of dashed-dotted line X1-X2 may be referred to as a channel length direction, and the direction of dashed-dotted line Y1-Y2 may be referred to as a channel width direction. As in FIG. 37A, some components are not illustrated in some cases in top views of transistors described below.

The transistor 300A includes a conductive film 304 functioning as a gate electrode over a substrate 302, an insulating film 306 over the substrate 302 and the conductive film 304, an insulating film 307 over the insulating film 306, an oxide semiconductor film 308 over the insulating film 307, a conductive film 312a functioning as a source electrode electrically connected to the oxide semiconductor film 308, and a conductive film 312b functioning as a drain electrode electrically connected to the oxide semiconductor film 308. Over the transistor 300A, specifically, over the conductive films 312a and 312b and the oxide semiconductor film 308, an insulating film 314, an insulating film 316, and an insulating film 318 are provided. The insulating films 314, 316, and 318 function as a protective insulating film for the transistor 300A.

Figure 38A:
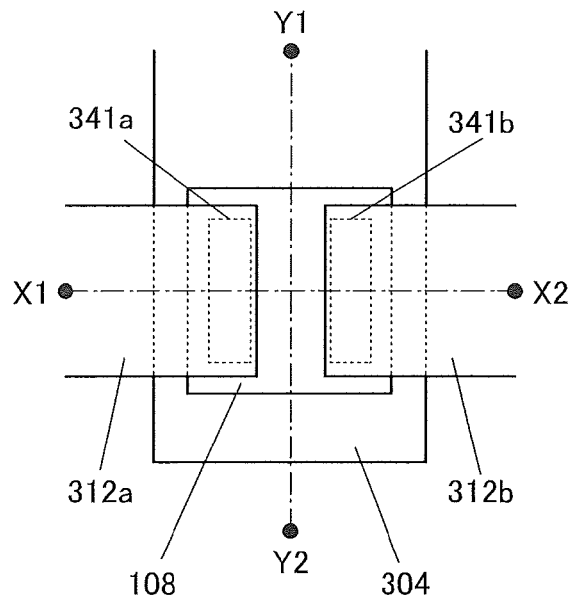
FIGS. 38A to 38C are a top view and cross-sectional views illustrating one embodiment of a semiconductor device.
Figure 38B:
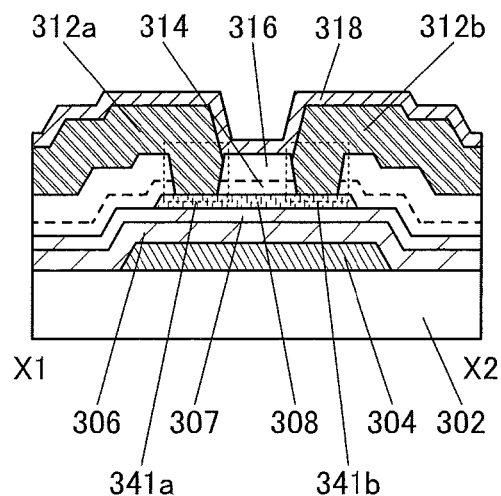
Figure 38C:
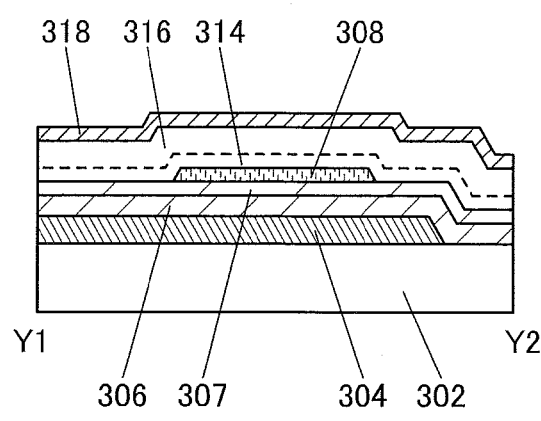

FIG. 38A is a top view of a transistor 300B. FIG. 38B is a cross-sectional view taken along dashed-dotted line X1-X2 in FIG. 38A. FIG. 38C is a cross-sectional view taken along dashed-dotted line Y1-Y2 in FIG. 38A.

The transistor 300B includes the conductive film 304 functioning as a gate electrode over the substrate 302, the insulating film 306 over the substrate 302 and the conductive film 304, the insulating film 307 over the insulating film 306, the oxide semiconductor film 308 over the insulating film 307, the insulating film 314 over the oxide semiconductor film 308, the insulating film 316 over the insulating film 314, the conductive film 312a functioning as a source electrode, and the conductive film 312b functioning as a drain electrode. The conductive film 312a is electrically connected to the oxide semiconductor film 308 through an opening 341a provided in the insulating films 314 and 316. The conductive film 312b is electrically connected to the oxide semiconductor film 308 through an opening 341b provided in the insulating films 314 and 316. Over the transistor 300B, specifically, over the conductive films 312a and 312b and the insulating film 316, the insulating film 318 is provided.

The insulating films 314 and 316 function as a protective insulating film for the oxide semiconductor film 308. The insulating film 318 functions as a protective insulating film for the transistor 300B.

The transistor 300A has a channel-etched structure, whereas the transistor 300B in FIGS. 38A to 38C has a channel-protective structure.

Figure 39A:
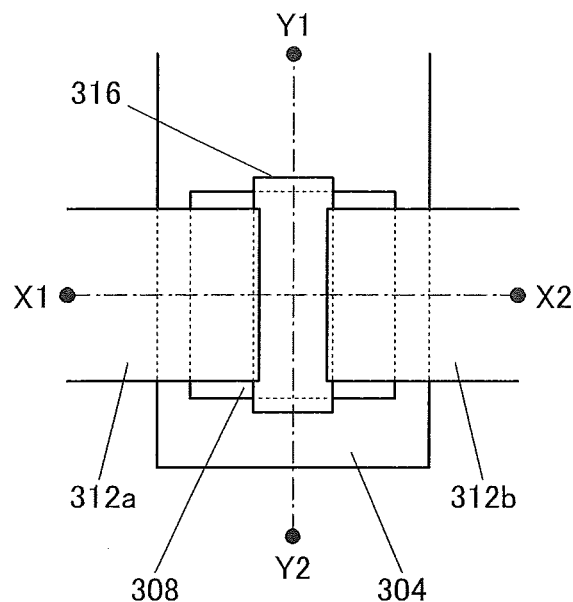
FIGS. 39A to 39C are a top view and cross-sectional views illustrating one embodiment of a semiconductor device.
Figure 39B:
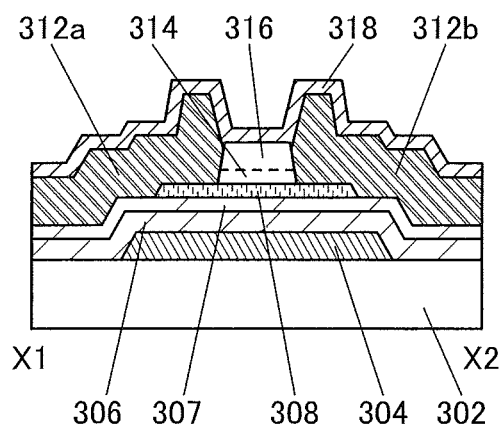
Figure 39C:
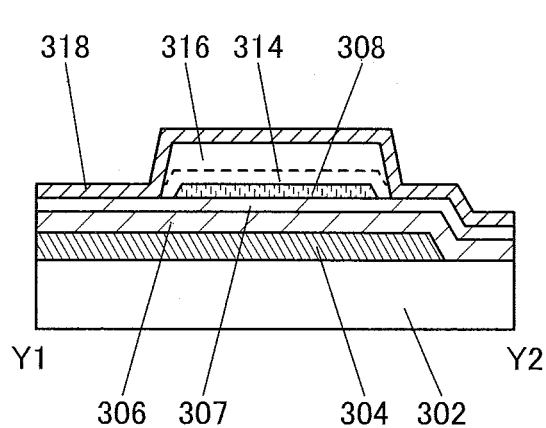

FIG. 39A is a top view of a transistor 300C. FIG. 39B is a cross-sectional view taken along dashed-dotted line X1-X2 in FIG. 39A. FIG. 39C is a cross-sectional view taken along dashed-dotted line Y1-Y2 in FIG. 39A.

The transistor 300C is different from the transistor 300B in FIGS. 38A to 38C in the shapes of the insulating films 314 and 316. Specifically, the insulating films 314 and 316 of the transistor 300C have island shapes and are provided over a channel region of the oxide semiconductor film 308. Other components are similar to those of the transistor 300B.

Figure 40A:
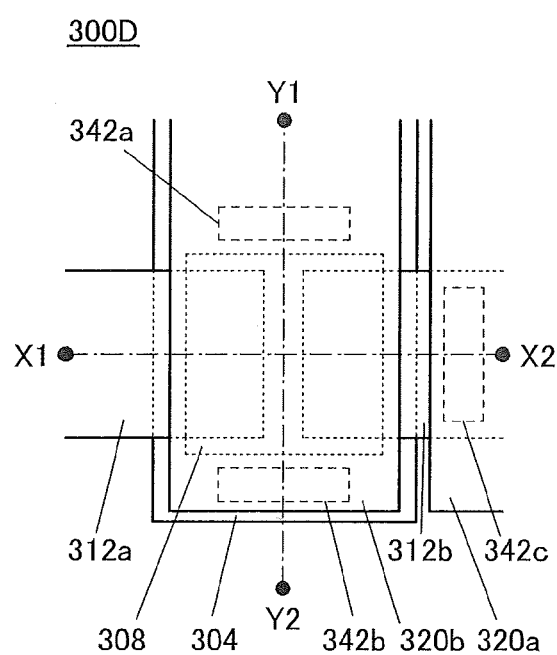
FIGS. 40A to 40C are a top view and cross-sectional views illustrating one embodiment of a semiconductor device.
Figure 40B:
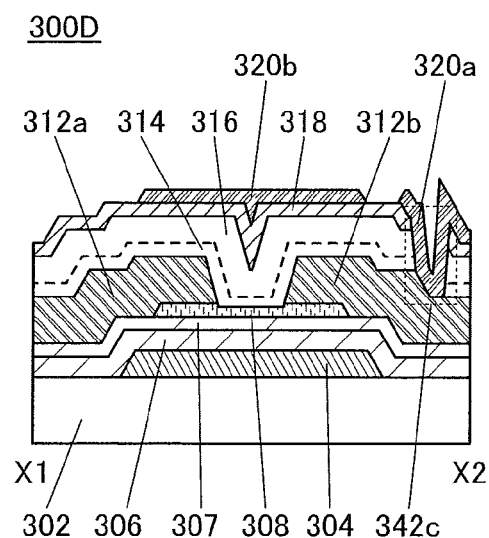
Figure 40C:
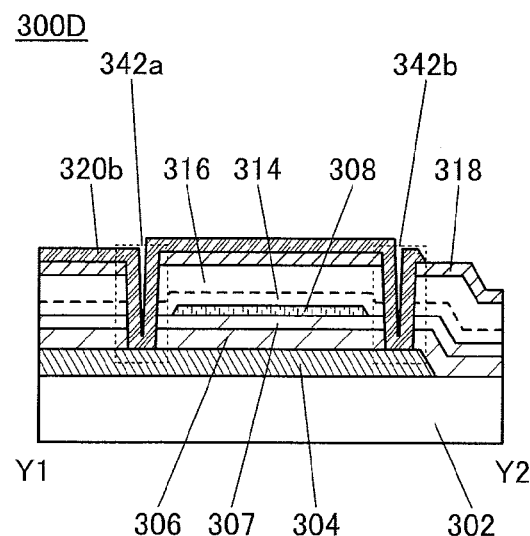

FIG. 40A is a top view of a transistor 300D. FIG. 40B is a cross-sectional view taken along dashed-dotted line X1-X2 in FIG. 40A. FIG. 40C is a cross-sectional view taken along dashed-dotted line Y1-Y2 in FIG. 40A.

The transistor 300D includes the conductive film 304 functioning as a first gate electrode over the substrate 302, the insulating film 306 over the substrate 302 and the conductive film 304, the insulating film 307 over the insulating film 306, the oxide semiconductor film 308 over the insulating film 307, the insulating film 314 over the oxide semiconductor film 308, the insulating film 316 over the insulating film 314, the conductive film 312a functioning as a source electrode, the conductive film 312b functioning as a drain electrode, the insulating film 318 over the conductive films 312a and 312b and the insulating film 316, and a conductive film 320a and a conductive film 320b over the insulating film 318. The conductive films 312a and 312b are electrically connected to the oxide semiconductor film 308.

In the transistor 300D, the insulating films 314, 316, and 318 function as a second gate insulating film of the transistor 300D. Furthermore, the conductive film 320a in the transistor 300D functions as a pixel electrode used for the display device. The conductive film 320a is connected to the conductive film 312b through an opening 342c provided in the insulating films 314, 316, and 318. In the transistor 300D, the conductive film 320b functions as a second gate electrode (also referred to as a back gate electrode).

As illustrated in FIG. 40C, the conductive film 320b is connected to the conductive film 304, which functions as the first gate electrode, in an opening 342a and an opening 342b provided in the insulating films 306, 307, 314, 316, and 318. Thus, the same potential is applied to the conductive film 320b and the conductive film 304.

The structure of the transistor 300D is not limited to that described above, in which the openings 342a and 342b are provided so that the conductive film 320b is connected to the conductive film 304. For example, a structure in which only one of the openings 342a and 342b is provided so that the conductive film 320b is connected to the conductive film 304, or a structure in which the openings 342a and 342b are not provided and the conductive film 320b and the conductive film 304 are not connected to each other may be employed. Note that in the case where the conductive film 320b is not connected to the conductive film 304, it is possible to apply different potentials to the conductive film 320b and the conductive film 304.

Note that the transistor 300D has the above-described s-channel structure.

The oxide semiconductor film 308 included in the transistor 300A in FIGS. 37A to 37C may have a stacked-layer structure. FIGS. 41A to 41D illustrate examples of such a case.

Figure 41A:
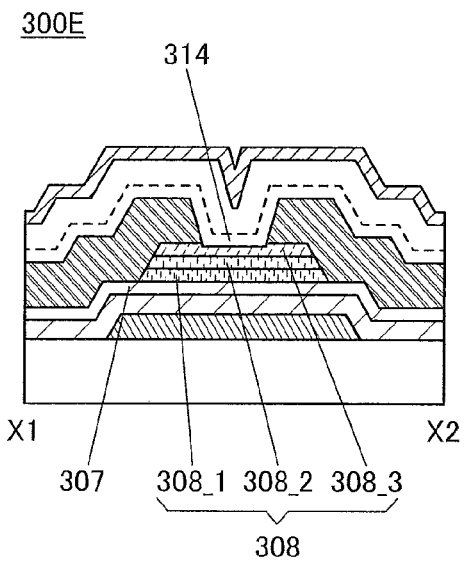
FIGS. 41A to 41D are cross-sectional views illustrating embodiments of a semiconductor device.
Figure 41B:
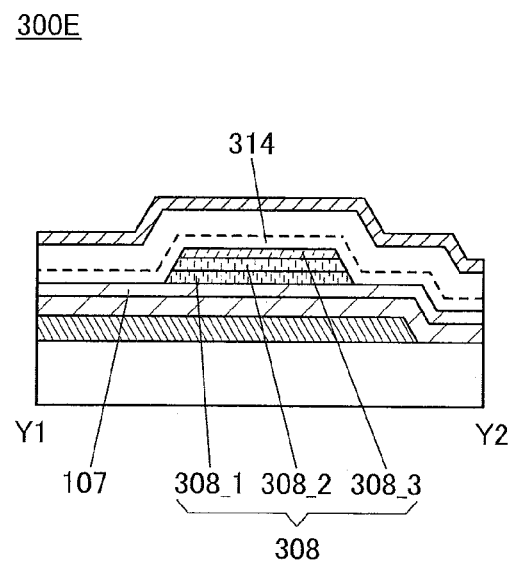
Figure 41C:
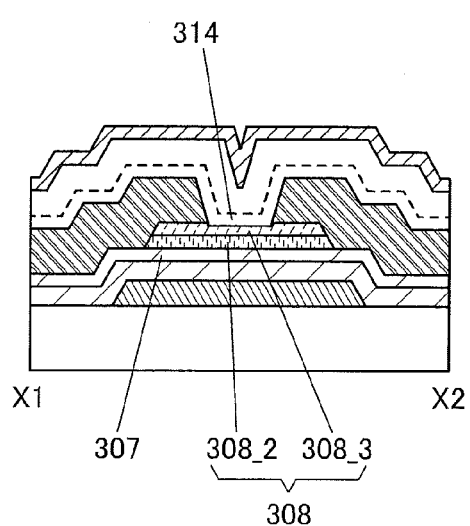
Figure 41D:
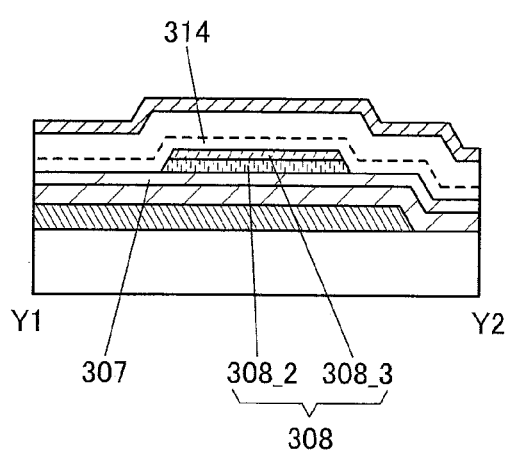

FIGS. 41A and 41B are cross-sectional views of a transistor 300E and FIGS. 41C and 41D are cross-sectional views of a transistor 300F. The top views of the transistors 300E and 300F are similar to that of the transistor 300A illustrated in FIG. 37A.

The oxide semiconductor film 308 of the transistor 300E illustrated in FIGS. 41A and 41B includes an oxide semiconductor film 308_1, an oxide semiconductor film 308_2, and an oxide semiconductor film 308_3. The oxide semiconductor film 308 of the transistor 300F illustrated in FIGS. 41C and 41D includes the oxide semiconductor film 308_2 and the oxide semiconductor film 308_3.

Note that the conductive film 304, the insulating film 306, the insulating film 307, the oxide semiconductor film 308, the conductive film 312a, the conductive film 312b, the insulating film 314, the insulating film 316, the insulating film 318, and the conductive films 320a and 320b can be formed using the materials and formation methods of the conductive film 112, the insulating film 116, the insulating film 110, the oxide semiconductor film 108, the conductive film 120a, the conductive film 120b, the insulating film 104, the insulating film 118, the insulating film 116, and the conductive film 112, respectively, described in Embodiment 1.

The structures of the transistors 300A to 300F can be freely combined with each other.

With reference to FIG. 31 to FIG. 33 again, the display device is described. The signal line 710 is formed through the same process as the conductive films functioning as source electrodes and drain electrodes of the transistors 750 and 752. Note that the signal line 710 may be formed using a conductive film that is formed through a process different from the process of forming the source electrodes and the drain electrodes of the transistors 750 and 752. For example, an oxide semiconductor film formed through the same process as an oxide semiconductor film functioning as a gate electrode may be used. In the case where the signal line 710 is formed using a material containing a copper element, signal delay or the like due to wiring resistance is reduced, which enables display on a large screen.

The FPC terminal portion 708 includes a connection electrode 760, an anisotropic conductive film 780, and the FPC 716. Note that the connection electrode 760 is formed through the same process as the conductive films functioning as source electrodes and drain electrodes of the transistors 750 and 752. The connection electrode 760 is electrically connected to a terminal included in the FPC 716 through the anisotropic conductive film 780.

For example, glass substrates can be used as the first substrate 701 and the second substrate 705. As the first substrate 701 and the second substrate 705, flexible substrates may also be used. An example of the flexible substrate is a plastic substrate.

A structure 778 is provided between the first substrate 701 and the second substrate 705. The structure 778 is a columnar spacer obtained by selective etching of an insulating film and is provided to control the distance (cell gap) between the first substrate 701 and the second substrate 705. Alternatively, a spherical spacer may also be used as the structure 778.

A light-blocking film 738 functioning as a black matrix, a coloring film 736 functioning as a color filter, and an insulating film 734 in contact with the light-blocking film 738 and the coloring film 736 are provided on the second substrate 705 side.

<4-2. Structure Example of Display Device Including Liquid Crystal Element>

The display device 700 in FIG. 32 includes a liquid crystal element 775. The liquid crystal element 775 includes a conductive film 772, a conductive film 774, and a liquid crystal layer 776. The conductive film 774 is provided on the second substrate 705 side and functions as a counter electrode. The display device 700 in FIG. 32 can display an image in such a manner that transmission or non-transmission of light is controlled by the alignment state in the liquid crystal layer 776 that is changed depending on the voltage applied between the conductive film 772 and the conductive film 774.

The conductive film 772 is connected to the conductive film functioning as the source electrode or the drain electrode of the transistor 750. The conductive film 772 is formed over the planarization insulating film 770 and functions as a pixel electrode, that is, one electrode of the display element. The conductive film 772 functions as a reflective electrode. The display device 700 in FIG. 32 is what is called a reflective color liquid crystal display device that displays an image by utilizing external light that is reflected by the conductive film 772 and then extracted through the coloring film 736.

A conductive film that transmits visible light or a conductive film that reflects visible light can be used as the conductive film 772. For example, a material containing an element selected from indium (In), zinc (Zn), and tin (Sn) may be used for the conductive film that transmits visible light. For example, a material containing aluminum or silver may be used for the conductive film that reflects visible light. In this embodiment, a conductive film that reflects visible light is used as the conductive film 772.

Note that projections and depressions are provided in part of the planarization insulating film 770 in the pixel portion 702 of the display device 700 in FIG. 32. For example, the projections and depressions can be formed in the following manner: the planarization insulating film 770 is formed using a resin film, and projections and depressions are formed on the surface of the resin film. The conductive film 772 functioning as a reflective electrode is formed along the projections and depressions. Accordingly, external light that is incident on the conductive film 772 can be diffusely reflected by the surface of the conductive film 772, whereby visibility can be improved.

Note that the display device 700 is not limited to the example in FIG. 32, which illustrates a reflective color liquid crystal display device, and may be a transmissive color liquid crystal display device in which a conductive film that transmits visible light is used as the conductive film 772. In a transmissive color liquid crystal display device, projections and depressions are not necessarily provided on the planarization insulating film 770.

Figure 34:
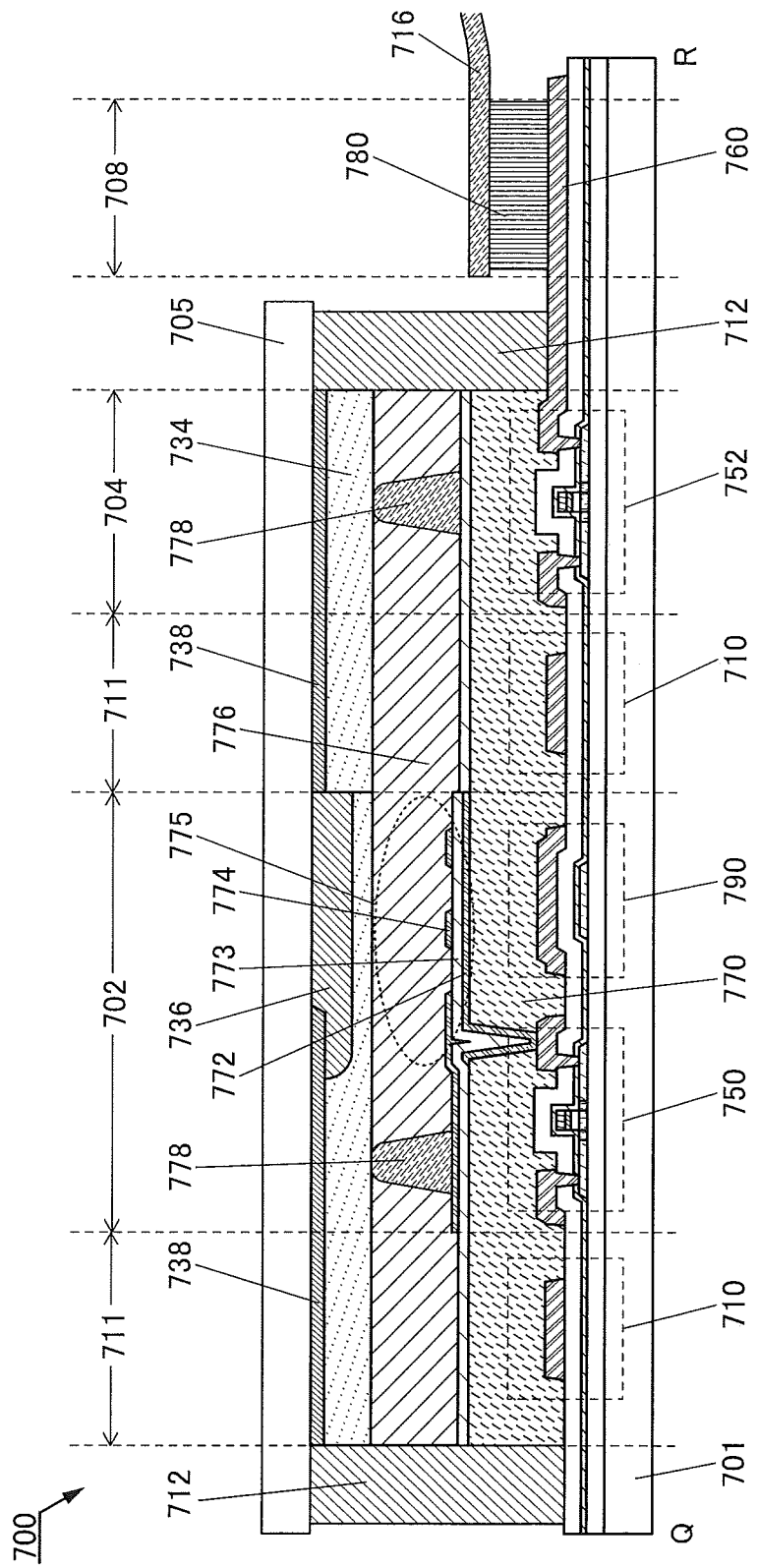
FIG. 34 is a cross-sectional view illustrating one embodiment of a display device.

FIG. 34 illustrates an example of a transmissive color liquid crystal display device. FIG. 34 is a cross-sectional view of a structure in which a liquid crystal element is used as the display element, taken along dashed-dotted line Q-R in FIG. 31. The display device 700 illustrated in FIG. 34 is an example of employing a horizontal electric field mode (e.g., an FFS mode) as a driving mode of the liquid crystal element. In the structure illustrated in FIG. 34, an insulating film 773 is provided over the conductive film 772 functioning as a pixel electrode, and the conductive film 774 is provided over the insulating film 773. In such a structure, the conductive film 774 functions as a common electrode, and an electric field generated between the conductive film 772 and the conductive film 774 through the insulating film 773 can control the alignment state in the liquid crystal layer 776.

Although not illustrated in FIG. 32 and FIG. 34, the conductive film 772 and/or the conductive film 774 may be provided with an alignment film on a side in contact with the liquid crystal layer 776. Although not illustrated in FIG. 32 and FIG. 34, an optical member (optical substrate) or the like, such as a polarizing member, a retardation member, or an anti-reflection member, may be provided as appropriate. For example, circular polarization may be obtained by using a polarizing substrate and a retardation substrate. In addition, a backlight, a sidelight, or the like may be used as a light source.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. These liquid crystal materials exhibit a cholesteric phase, a smectic phase, a cubic phase, a chiral nematic phase, an isotropic phase, or the like depending on conditions.

In the case where a horizontal electric field mode is employed, a liquid crystal exhibiting a blue phase for which an alignment film is unnecessary may be used. The blue phase is one of liquid crystal phases, which is generated just before a cholesteric phase changes into an isotropic phase when the temperature of a cholesteric liquid crystal is increased. Since the blue phase appears only in a narrow temperature range, a liquid crystal composition in which several weight percent or more of a chiral material is mixed is used for the liquid crystal layer in order to improve the temperature range. The liquid crystal composition containing a liquid crystal exhibiting a blue phase and a chiral material has a short response time and optical isotropy, which eliminates the need for an alignment process. An alignment film does not need to be provided, and thus, rubbing treatment is not necessary; accordingly, electrostatic discharge damage caused by the rubbing treatment can be prevented, and defects and damage of a liquid crystal display device in the manufacturing process can be reduced. Moreover, the liquid crystal material that exhibits a blue phase has small viewing angle dependence.

In the case where a liquid crystal element is used as a display element, a twisted nematic (TN) mode, an in-plane switching (IPS) mode, a fringe field switching (FFS) mode, an axially symmetric aligned micro-cell (ASM) mode, an optical compensated birefringence (OCB) mode, a ferroelectric liquid crystal (FLC) mode, an anti-ferroelectric liquid crystal (AFLC) mode, or the like can be used.

Furthermore, a normally black liquid crystal display device such as a vertical alignment (VA) mode transmissive liquid crystal display device may also be used. There are some examples of a vertical alignment mode; for example, a multi-domain vertical alignment (MVA) mode, a patterned vertical alignment (PVA) mode, and an ASV mode, or the like can be employed.

<4-3. Display Device Including Light-Emitting Element>

The display device 700 illustrated in FIG. 33 includes a light-emitting element 782. The light-emitting element 782 includes a conductive film 784, an EL layer 786, and a conductive film 788. The display device 700 illustrated in FIG. 33 can display an image by utilizing light emission from the EL layer 786 of the light-emitting element 782.

Note that the EL layer 786 contains an organic compound or an inorganic compound such as a quantum dot.

Examples of materials that can be used for an organic compound include a fluorescent material and a phosphorescent material. Examples of materials that can be used for a quantum dot include a colloidal quantum dot material, an alloyed quantum dot material, a core-shell quantum dot material, and a core quantum dot material. A material containing elements belonging to Groups 12 and 16, elements belonging to Groups 13 and 15, or elements belonging to Groups 14 and 16, may be used. Alternatively, a quantum dot material containing an element such as cadmium (Cd), selenium (Se), zinc (Zn), sulfur (S), phosphorus (P), indium (In), tellurium (Te), lead (Pb), gallium (Ga), arsenic (As), or aluminum (Al) may be used.

The conductive film 784 is connected to a conductive film functioning as a source electrode or a drain electrode of the transistor 750. The conductive film 784 is formed over the planarization insulating film 770 and functions as a pixel electrode, that is, one electrode of the display element. A conductive film that transmits visible light or a conductive film that reflects visible light can be used as the conductive film 784. For example, a material containing an element selected from indium (In), zinc (Zn), and tin (Sn) may be used for the conductive film that transmits visible light. For example, a material containing aluminum or silver may be used for the conductive film that reflects visible light.

In the display device 700 in FIG. 33, an insulating film 730 is provided over the planarization insulating film 770 and the conductive film 784. The insulating film 730 covers part of the conductive film 784. Note that the light-emitting element 782 has a top-emission structure. Thus, the conductive film 788 has a light-transmitting property and transmits light emitted from the EL layer 786. Although the top-emission structure is described as an example in this embodiment, the structure is not limited thereto. For example, a bottom-emission structure in which light is emitted to the conductive film 784 side or a dual-emission structure in which light is emitted to both the conductive film 784 side and the conductive film 788 side may also be employed.

The coloring film 736 is provided to overlap with the light-emitting element 782, and the light-blocking film 738 is provided in the lead wiring portion 711 and the source driver circuit portion 704 to overlap with the insulating film 730. The coloring film 736 and the light-blocking film 738 are covered with the insulating film 734. A space between the light-emitting element 782 and the insulating film 734 is filled with a sealing film 732. The structure of the display device 700 is not limited to the example in FIG. 33, in which the coloring film 736 is provided. For example, a structure without the coloring film 736 may also be employed in the case where the EL layer 786 is formed by separate coloring.

<4-4. Structure Example of Display Device Provided with Input/Output Device>

An input/output device may be provided in the display device 700 illustrated in FIG. 33 and FIG. 34. As an example of the input/output device, a touch panel or the like can be given.

Figure 35:
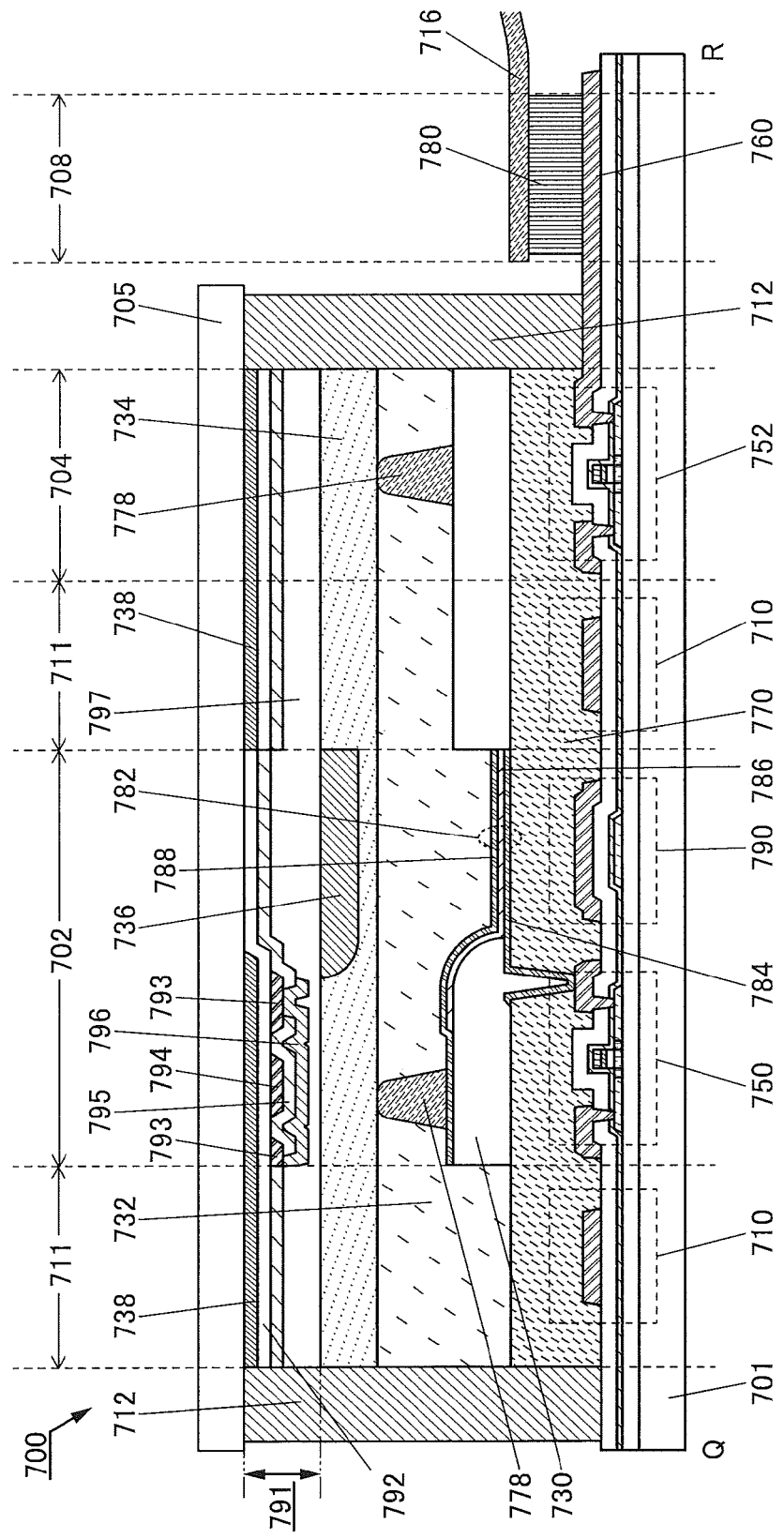
FIG. 35 is a cross-sectional view illustrating one embodiment of a display device.
Figure 36:
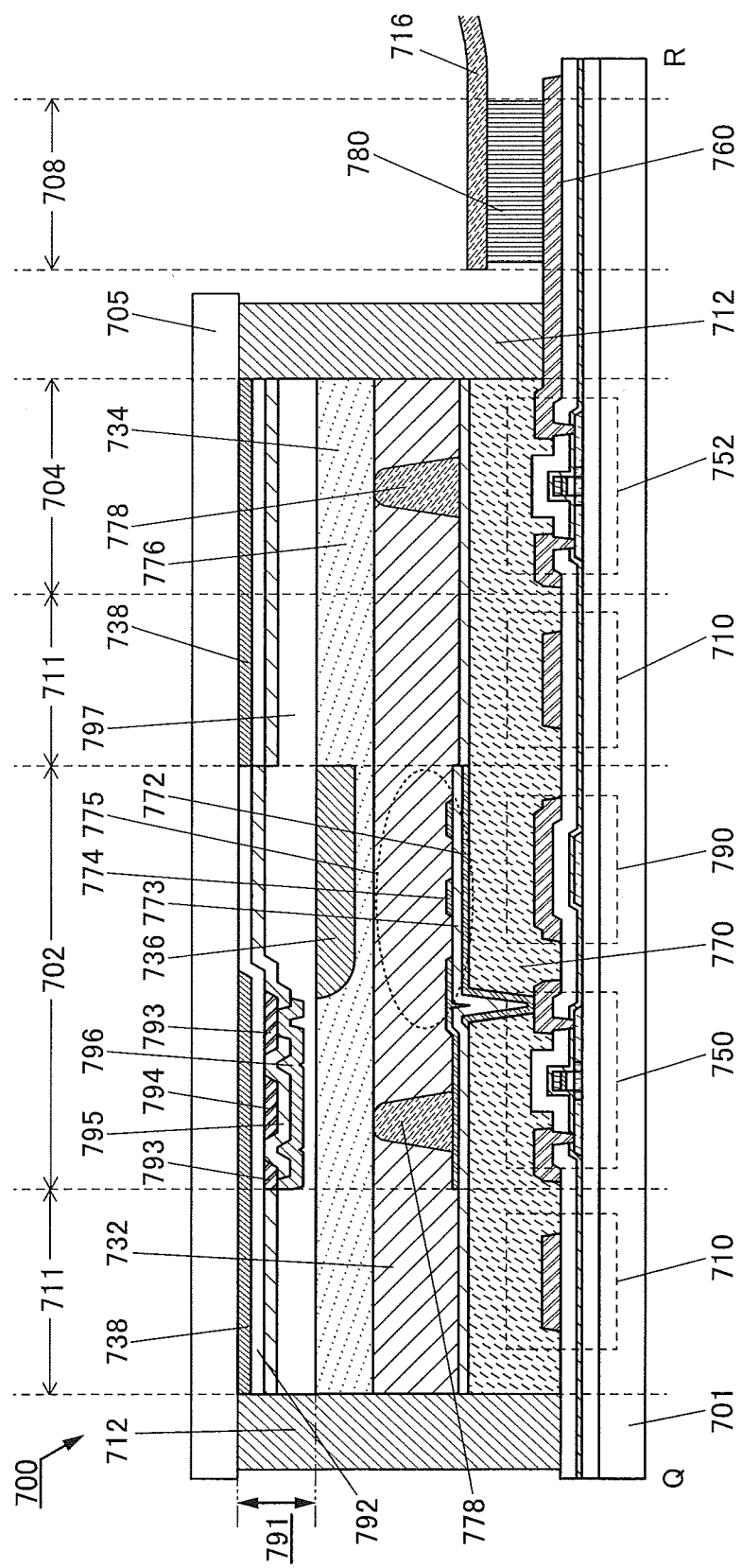
FIG. 36 is a cross-sectional view illustrating one embodiment of a display device.

FIG. 35 and FIG. 36 illustrate structures in which the display device 700 in FIG. 33 and FIG. 34 includes a touch panel 791.

FIG. 35 is a cross-sectional view of the structure in which the touch panel 791 is provided in the display device 700 illustrated in FIG. 33, and FIG. 36 is a cross-sectional view of the structure in which the touch panel 791 is provided in the display device 700 illustrated in FIG. 34.

First, the touch panel 791 illustrated in FIG. 35 and FIG. 36 is described below.

The touch panel 791 illustrated in FIG. 35 and FIG. 36 is what is called an in-sell touch panel provided between the second substrate 705 and the coloring film 736. The touch panel 791 is formed on the second substrate 705 side before the coloring film 736 is formed.

Note that the touch panel 791 includes the light-blocking film 738, an insulating film 792, an electrode 793, an electrode 794, an insulating film 795, an electrode 796, and an insulating film 797. Changes in the mutual capacitance in the electrodes 793 and 794 can be detected when an object such as a finger or a stylus approaches, for example.

A portion in which the electrode 793 intersects with the electrode 794 is illustrated in the upper portion of the transistor 750 illustrated in FIG. 35 and FIG. 36. The electrode 796 is electrically connected to the two electrodes 793 between which the electrode 794 is sandwiched through openings provided in the insulating film 795. Note that a structure in which a region where the electrode 796 is provided is provided in the pixel portion 702 is illustrated in FIG. 35 and FIG. 36 as an example; however, one embodiment of the present invention is not limited thereto. For example, the region where the electrode 796 is provided may be provided in the source driver circuit portion 704.

The electrode 793 and the electrode 794 are provided in a region overlapping with the light-blocking film 738. As illustrated in FIG. 35, it is preferable that the electrode 793 do not overlap with the light-emitting element 782. As illustrated in FIG. 36, it is preferable that the electrode 793 do not overlap with the liquid crystal element 775. In other words, the electrode 793 has an opening in a region overlapping with the light-emitting element 782 and the liquid crystal element 775. That is, the electrode 793 has a mesh shape. With such a structure, the electrode 793 does not block light emitted from the light-emitting element 782, or alternatively the electrode 793 does not block light transmitted through the liquid crystal element 775. Thus, since luminance is hardly reduced even when the touch panel 791 is provided, a display device with high visibility and low power consumption can be obtained. Note that the electrode 794 can have a structure similar to that of the electrode 793.

In the case where the electrode 793 and the electrode 794 do not overlap with the light-emitting element 782, a metal material having low transmittance with respect to visible light can be used for the electrode 793 and the electrode 794. In the case where the electrode 793 and the electrode 794 do not overlap with the liquid crystal element 775, a metal material having low transmittance with respect to visible light can be used for the electrode 793 and the electrode 794.

Thus, as compared with the case of using an oxide material whose transmittance of visible light is high, resistance of the electrodes 793 and 794 can be reduced, whereby sensitivity of the sensor of the touch panel can be increased.

For example, a conductive nanowire may be used for the electrodes 793, 794, and 796. The nanowire may have a mean diameter of greater than or equal to 1 nm and less than or equal to 100 nm, preferably greater than or equal to 5 nm and less than or equal to 50 nm, further preferably greater than or equal to 5 nm and less than or equal to 25 nm. As the nanowire, a carbon nanotube or a metal nanowire such as an Ag nanowire, a Cu nanowire, or an Al nanowire may be used. For example, in the case where an Ag nanowire is used for any one of or all of electrodes 664, 665, and 667, the transmittance of visible light can be greater than or equal to 89% and the sheet resistance can be greater than or equal to 40 Ω/square and less than or equal to 100 Ω/square.

Although the structure of the in-cell touch panel is illustrated in FIG. 35 and FIG. 36, one embodiment of the present invention is not limited thereto. For example, a touch panel formed over the display device 700, what is called an on-cell touch panel, or a touch panel attached to the display device 700, what is called an out-cell touch panel may be used.

In this manner, the display device of one embodiment of the present invention can be combined with various types of touch panels.

The structures described in this embodiment can be combined as appropriate with any of the structures described in the other embodiments.

Embodiment 5

In this embodiment, a display device including a semiconductor device of one embodiment of the present invention is described with reference to FIGS. 42A to 42C.
<5. Circuit Configuration of Display Device>

A display device illustrated in FIG. 42A includes a region including pixels of display elements (hereinafter referred to as a pixel portion 502), a circuit portion that is provided outside the pixel portion 502 and includes a circuit for driving the pixels (hereinafter, the circuit portion is referred to as a driver circuit portion 504), circuits having a function of protecting elements (hereinafter, the circuits are referred to as protection circuits 506), and a terminal portion 507. Note that the protection circuits 506 are not necessarily provided.

Part or the whole of the driver circuit portion 504 is preferably formed over a substrate over which the pixel portion 502 is formed. Thus, the number of components and the number of terminals can be reduced. When part or the whole of the driver circuit portion 504 is not formed over the substrate over which the pixel portion 502 is formed, the part or the whole of the driver circuit portion 504 can be mounted by COG or tape automated bonding (TAB).

The pixel portion 502 includes a plurality of circuits for driving display elements arranged in X (X is a natural number of 2 or more) rows and Y (Y is a natural number of 2 or more) columns (hereinafter, the circuits are referred to as pixel circuits 501). The driver circuit portion 504 includes driver circuits such as a circuit for supplying a signal (scan signal) to select a pixel (hereinafter, the circuit is referred to as a gate driver 504a) and a circuit for supplying a signal (data signal) to drive a display element in a pixel (hereinafter, the circuit is referred to as a source driver 504b).

The gate driver 504a includes a shift register or the like. The gate driver 504a receives a signal for driving the shift register through the terminal portion 507 and outputs a signal. For example, the gate driver 504a receives a start pulse signal, a clock signal, or the like and outputs a pulse signal. The gate driver 504a has a function of controlling the potentials of wirings supplied with scan signals (hereinafter referred to as scan lines GL_1 to GL_X). Note that a plurality of gate drivers 504a may be provided to control the scan lines GL_1 to GL_X separately. Alternatively, the gate driver 504a has a function of supplying an initialization signal. Without being limited thereto, another signal can be supplied from the gate driver 504a.

The source driver 504b includes a shift register or the like. The source driver 504b receives a signal (image signal) from which a data signal is generated, as well as a signal for driving the shift register, through the terminal portion 507. The source driver 504b has a function of generating a data signal to be written to the pixel circuit 501 from the image signal. In addition, the source driver 504b has a function of controlling output of a data signal in response to a pulse signal produced by input of a start pulse signal, a clock signal, or the like. Furthermore, the source driver 504b has a function of controlling the potentials of wirings supplied with data signals (hereinafter referred to as data lines DL_1 to DL_Y). Alternatively, the source driver 504b has a function of supplying an initialization signal. Without being limited thereto, another signal can be supplied from the source driver 504b.

The source driver 504b includes a plurality of analog switches, for example. The source driver 504b can output, as data signals, time-divided image signals obtained by sequentially turning on the plurality of analog switches. The source driver 504b may include a shift register or the like.

A pulse signal and a data signal are input to each of the plurality of pixel circuits 501 through one of the plurality of scan lines GL supplied with scan signals and one of the plurality of data lines DL supplied with data signals, respectively. Writing and holding of the data signal in each of the plurality of pixel circuits 501 are controlled by the gate driver 504a. For example, to the pixel circuit 501 in the m-th row and the n-th column (m is a natural number of X or less, and n is a natural number of Y or less), a pulse signal is input from the gate driver 504a through the scan line GL_m, and a data signal is input from the source driver 504b through the data line DL_n in accordance with the potential of the scan line GL_m.

Figure 42A:
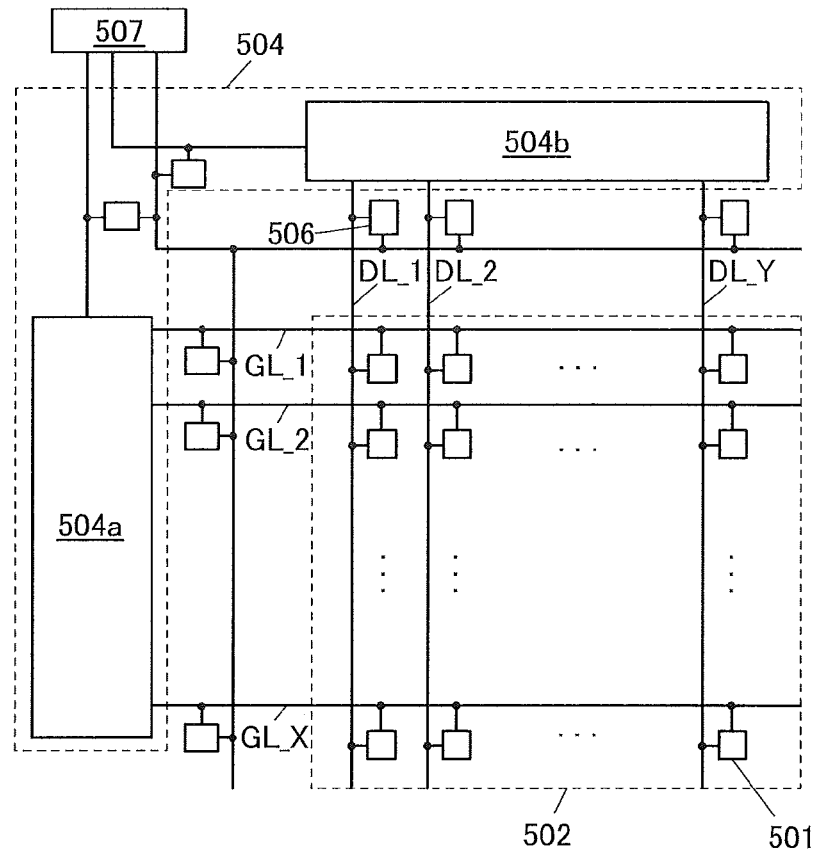
FIGS. 42A to 42C are a block diagram and circuit diagrams illustrating a display device.

The protection circuit 506 in FIG. 42A is connected to, for example, the scan line GL between the gate driver 504a and the pixel circuit 501. Alternatively, the protection circuit 506 is connected to the data line DL between the source driver 504b and the pixel circuit 501. Alternatively, the protection circuit 506 can be connected to a wiring between the gate driver 504a and the terminal portion 507. Alternatively, the protection circuit 506 can be connected to a wiring between the source driver 504b and the terminal portion 507. Note that the terminal portion 507 refers to a portion having terminals for inputting power, control signals, and image signals from external circuits to the display device.

The protection circuit 506 electrically connects a wiring connected to the protection circuit to another wiring when a potential out of a certain range is supplied to the wiring connected to the protection circuit.

As illustrated in FIG. 42A, the protection circuits 506 provided for the pixel portion 502 and the driver circuit portion 504 can improve the resistance of the display device to overcurrent generated by electrostatic discharge (ESD) or the like. Note that the configuration of the protection circuits 506 is not limited thereto; for example, the protection circuit 506 can be connected to the gate driver 504a or the source driver 504b. Alternatively, the protection circuit 506 can be connected to the terminal portion 507.

One embodiment of the present invention is not limited to the example in FIG. 42A, in which the driver circuit portion 504 includes the gate driver 504a and the source driver 504b. For example, only the gate driver 504a may be formed, and a separately prepared substrate over which a source driver circuit is formed (e.g., a driver circuit board formed using a single-crystal semiconductor film or a polycrystalline semiconductor film) may be mounted.

Figure 42B:
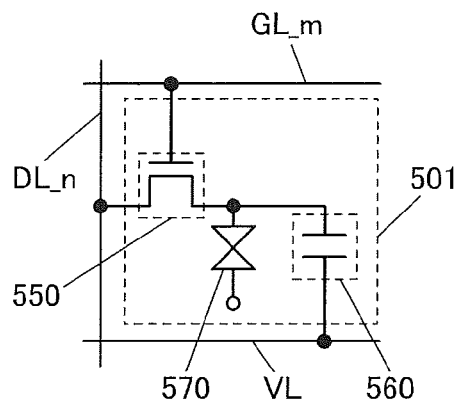

Each of the plurality of pixel circuits 501 in FIG. 42A can have the configuration illustrated in FIG. 42B, for example.

The pixel circuit 501 in FIG. 42B includes a liquid crystal element 570, a transistor 550, and a capacitor 560. As the transistor 550, the transistor described in the above embodiment can be used.

The potential of one of a pair of electrodes of the liquid crystal element 570 is set as appropriate in accordance with the specifications of the pixel circuit 501. The alignment state of the liquid crystal element 570 depends on data written thereto. A common potential may be supplied to the one of the pair of electrodes of the liquid crystal element 570 included in each of the plurality of pixel circuits 501. The potential supplied to the one of the pair of electrodes of the liquid crystal element 570 in the pixel circuit 501 may differ between rows.

Examples of a method for driving the display device including the liquid crystal element 570 include a TN mode, an STN mode, a VA mode, an axially symmetric aligned micro-cell (ASM) mode, an optically compensated birefringence (OCB) mode, a ferroelectric liquid crystal (FLC) mode, an anti-ferroelectric liquid crystal (AFLC) mode, an MVA mode, a patterned vertical alignment (PVA) mode, an IPS mode, an FFS mode, and a transverse bend alignment (TBA) mode. Other examples of the method for driving the display device include an electrically controlled birefringence (ECB) mode, a polymer-dispersed liquid crystal (PDLC) mode, a polymer network liquid crystal (PNLC) mode, and a guest-host mode. Without being limited thereto, various liquid crystal elements and driving methods can be used.

In the pixel circuit 501 in the m-th row and the n-th column, one of a source electrode and a drain electrode of the transistor 550 is electrically connected to the data line DL_n, and the other of the source electrode and the drain electrode of the transistor 550 is electrically connected to the other of the pair of electrodes of the liquid crystal element 570. A gate electrode of the transistor 550 is electrically connected to the scan line GL_m. The transistor 550 is configured to be turned on or off to control whether a data signal is written.

One of a pair of electrodes of the capacitor 560 is electrically connected to a wiring through which a potential is supplied (hereinafter referred to as a potential supply line VL), and the other of the pair of electrodes of the capacitor 560 is electrically connected to the other of the pair of electrodes of the liquid crystal element 570. The potential of the potential supply line VL is set as appropriate in accordance with the specifications of the pixel circuit 501. The capacitor 560 functions as a storage capacitor for storing written data.

For example, in the display device including the pixel circuits 501 in FIG. 42B, the gate driver 504a in FIG. 42A sequentially selects the pixel circuits 501 row by row to turn on the transistors 550, and data signals are written.

When the transistor 550 is turned off, the pixel circuit 501 to which the data has been written is brought into a holding state. This operation is sequentially performed row by row; thus, an image can be displayed.

Figure 42C:
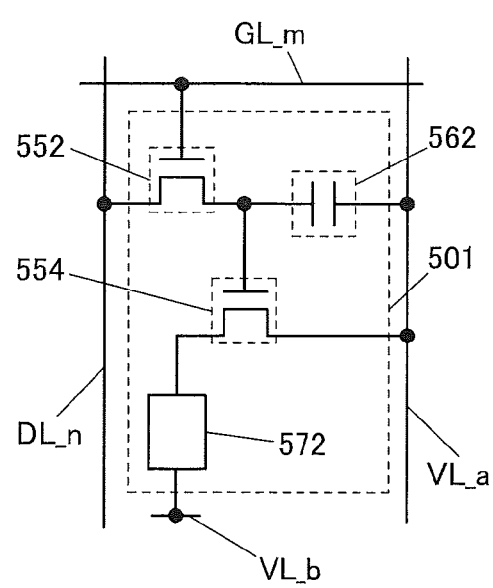

Alternatively, each of the plurality of pixel circuits 501 in FIG. 42A can have the configuration illustrated in FIG. 42C, for example.

The pixel circuit 501 in FIG. 42C includes transistors 552 and 554, a capacitor 562, and a light-emitting element 572. The transistor described in the above embodiment can be used as the transistor 552 and/or the transistor 554.

One of a source electrode and a drain electrode of the transistor 552 is electrically connected to a wiring through which a data signal is supplied (hereinafter referred to as a data line DL_n). A gate electrode of the transistor 552 is electrically connected to a wiring through which a gate signal is supplied (hereinafter referred to as a scan line GL_m).

The transistor 552 is configured to be turned on or off to control whether a data signal is written.

One of a pair of electrodes of the capacitor 562 is electrically connected to a wiring through which a potential is supplied (hereinafter referred to as a potential supply line VL_a), and the other of the pair of electrodes of the capacitor 562 is electrically connected to the other of the source electrode and the drain electrode of the transistor 552.

The capacitor 562 functions as a storage capacitor for storing written data.

One of a source electrode and a drain electrode of the transistor 554 is electrically connected to the potential supply line VL_a. A gate electrode of the transistor 554 is electrically connected to the other of the source electrode and the drain electrode of the transistor 552.

One of an anode and a cathode of the light-emitting element 572 is electrically connected to a potential supply line VL_b, and the other of the anode and the cathode of the light-emitting element 572 is electrically connected to the other of the source electrode and the drain electrode of the transistor 554.

As the light-emitting element 572, an organic electroluminescent element (also referred to as an organic EL element) can be used, for example. Note that the light-emitting element 572 is not limited thereto and may be an inorganic EL element including an inorganic material.

A high power supply potential VDD is supplied to one of the potential supply line VL_a and the potential supply line VL_b, and a low power supply potential $V_{SS}$ is supplied to the other of the potential supply line VL_a and the potential supply line VL_b.

In the display device including the pixel circuits 501 in FIG. 42C, the gate driver 504a in FIG. 42A sequentially selects the pixel circuits 501 row by row to turn on the transistors 552, and data signals are written.

When the transistor 552 is turned off, the pixel circuit 501 to which the data has been written is brought into a holding state. Furthermore, the amount of current flowing between the source electrode and the drain electrode of the transistor 554 is controlled in accordance with the potential of the written data signal. The light-emitting element 572 emits light with a luminance corresponding to the amount of flowing current. This operation is sequentially performed row by row; thus, an image can be displayed.

The structures described in this embodiment can be combined as appropriate with any of the structures described in the other embodiments.

Embodiment 6

In this embodiment, circuit configuration examples to which the transistors described in the above embodiments can be applied are described with reference to FIGS. 43A to 43C, FIGS. 44A to 44C, FIGS. 45A and 45B, and FIGS. 46A and 46B.

Note that in the following description in this embodiment, the transistor including an oxide semiconductor described in the above embodiment is referred to as an OS transistor.

<6. Configuration Example of Inverter Circuit>

Figure 43A:
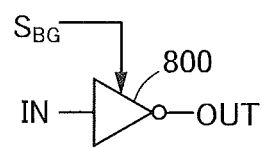
FIGS. 43A to 43C are circuit diagrams and a timing chart illustrating one embodiment of the present invention.

FIG. 43A is a circuit diagram of an inverter that can be used for a shift register, a buffer, or the like included in the driver circuit. An inverter 800 outputs a signal whose logic is inverted from the logic of a signal supplied to an input terminal IN to an output terminal OUT. The inverter 800 includes a plurality of OS transistors. A signal $S_{BG}$ can switch electrical characteristics of the OS transistors.

Figure 43B:
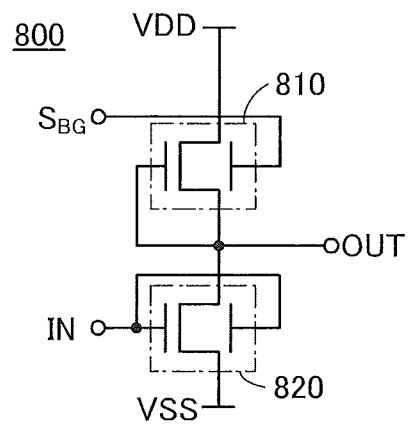

FIG. 43B illustrates an example of the inverter 800. The inverter 800 includes an OS transistor 810 and an OS transistor 820. The inverter 800 can be formed using only n-channel transistors; thus, the inverter 800 can be formed at lower cost than an inverter formed using a complementary metal oxide semiconductor (i.e., a CMOS inverter).

Note that the inverter 800 including the OS transistors can be provided over a CMOS circuit including Si transistors. Since the inverter 800 can be provided so as to overlap with the CMOS circuit, no additional area is required for the inverter 800, and thus, an increase in the circuit area can be suppressed.

Each of the OS transistors 810 and 820 includes a first gate functioning as a front gate, a second gate functioning as a back gate, a first terminal functioning as one of a source and a drain, and a second terminal functioning as the other of the source and the drain.

The first gate of the OS transistor 810 is connected to its second terminal. The second gate of the OS transistor 810 is connected to a wiring that supplies the signal $S_{BG}$. The first terminal of the OS transistor 810 is connected to a wiring that supplies a voltage VDD. The second terminal of the OS transistor 810 is connected to the output terminal OUT.

The first gate of the OS transistor 820 is connected to the input terminal IN. The second gate of the OS transistor 820 is connected to the input terminal IN. The first terminal of the OS transistor 820 is connected to the output terminal OUT. The second terminal of the OS transistor 820 is connected to a wiring that supplies a voltage $V_{SS}$.

Figure 43C:
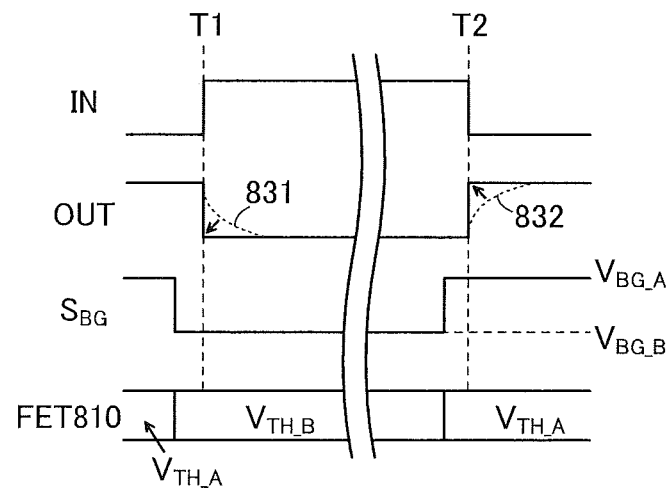

FIG. 43C is a timing chart illustrating the operation of the inverter 800. The timing chart in FIG. 43C illustrates changes of a signal waveform of the input terminal IN, a signal waveform of the output terminal OUT, a signal waveform of the signal $S_{BG}$, and the threshold voltage of the OS transistor 810.

The signal $S_{BG}$ can be supplied to the second gate of the OS transistor 810 to control the threshold voltage of the OS transistor 810.

The signal $S_{BG}$ includes a voltage $V_{BG\_A}$ for shifting the threshold voltage in the negative direction and a voltage $V_{BG\_B}$ for shifting the threshold voltage in the positive direction. The threshold voltage of the OS transistor 810 can be shifted in the negative direction to be a threshold voltage $V_{TH\_A}$ when the voltage $V_{BG\_A}$ is applied to the second gate. The threshold voltage of the OS transistor 810 can be shifted in the positive direction to be a threshold voltage $V_{TH\_A}$ when the voltage $V_{BG\_B}$ is applied to the second gate.

Figure 44A:
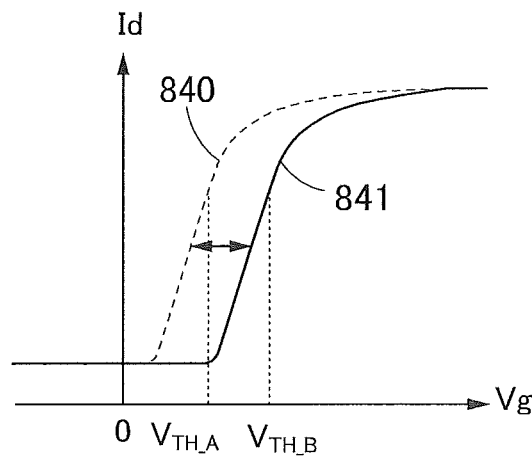
FIGS. 44A to 44C are a graph and circuit diagrams illustrating one embodiment of the present invention.

To visualize the above description, FIG. 44A shows an $I_d$-$I_g$ curve, which is one of the electrical characteristics of a transistor.

When a high voltage such as the voltage $V_{BG\_A}$ is applied to the second gate, the electrical characteristics of the OS transistor 810 can be shifted to match a curve shown by a dashed line 840 in FIG. 44A. When a low voltage such as the voltage $V_{BG\_B}$ is applied to the second gate, the electrical characteristics of the OS transistor 810 can be shifted to match a curve shown by a solid line 841 in FIG. 44A. As shown in FIG. 44A, switching the signal $S_{BG}$ between the voltage $V_{BG\_A}$ and the voltage $V_{BG\_B}$ enables the threshold voltage of the OS transistor 810 to be shifted in the positive direction or the negative direction.

Figure 44B:
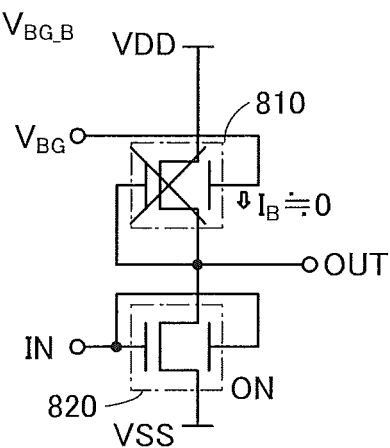

The shift of the threshold voltage in the positive direction toward the threshold voltage $V_{TH\_B}$ can make current less likely to flow in the OS transistor 810. FIG. 44B visualizes the state.

As illustrated in FIG. 44B, a current $I_B$ that flows in the OS transistor 810 can be extremely low. Thus, when a signal supplied to the input terminal IN is at a high level and the OS transistor 820 is on (ON), the voltage of the output terminal OUT can drop sharply.

Since a state in which current is less likely to flow in the OS transistor 810 as illustrated in FIG. 44B can be obtained, a signal waveform 831 of the output terminal in the timing chart in FIG. 43C can be made steep. Shoot-through current between the wiring that supplies the voltage VDD and the wiring that supplies the voltage $V_{SS}$ can be low, leading to low-power operation.

Figure 44C:
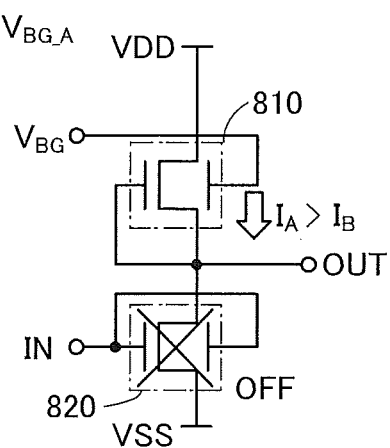

The shift of the threshold voltage in the negative direction toward the threshold voltage $V_{TH\_A}$ can make current flow easily in the OS transistor 810. FIG. 44C visualizes the state. As illustrated in FIG. 44C, a current $I_A$ flowing at this time can be higher than at least the current $I_B$. Thus, when a signal supplied to the input terminal IN is at a low level and the OS transistor 820 is off (OFF), the voltage of the output terminal OUT can be increased sharply. Since a state in which current is likely to flow in the OS transistor 810 as illustrated in FIG. 44C can be obtained, a signal waveform 832 of the output terminal in the timing chart in FIG. 43C can be made steep.

Note that the threshold voltage of the OS transistor 810 is preferably controlled by the signal $S_{BG}$ before the state of the OS transistor 820 is switched, i.e., before time T1 or time T2. For example, as in FIG. 43C, it is preferable that the threshold voltage of the OS transistor 810 be switched from the threshold voltage $V_{TH\_A}$ to the threshold voltage $V_{TH\_B}$ before time T1 at which the level of the signal supplied to the input terminal IN is switched to a high level. Moreover, as in FIG. 43C, it is preferable that the threshold voltage of the OS transistor 810 be switched from the threshold voltage $V_{TH\_B}$ to the threshold voltage $V_{TH\_A}$ before time T2 at which the level of the signal supplied to the input terminal IN is switched to a low level.

Figure 45A:
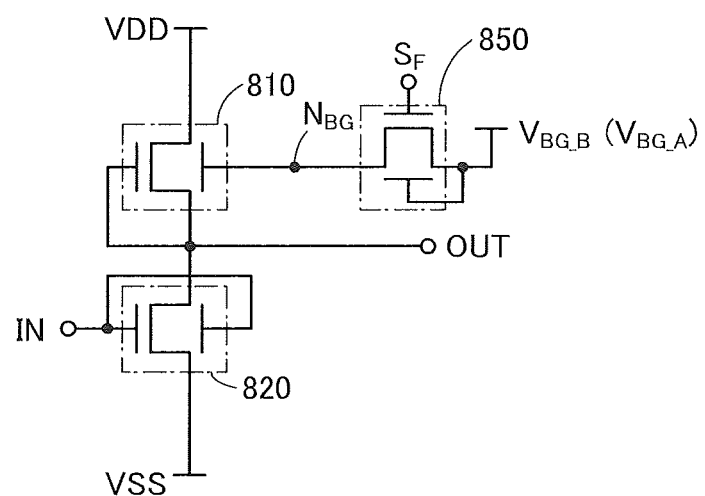
FIGS. 45A and 45B are a circuit diagram and a timing chart illustrating one embodiment of the present invention.

Although the timing chart in FIG. 43C illustrates the structure in which the level of the signal $S_{BG}$ is switched in accordance with the signal supplied to the input terminal IN, a different structure may be employed in which voltage for controlling the threshold voltage is held by the second gate of the OS transistor 810 in a floating state, for example. FIG. 45A illustrates an example of such a circuit configuration.

The circuit configuration in FIG. 45A is the same as that in FIG. 43B, except that an OS transistor 850 is added. A first terminal of the OS transistor 850 is connected to the second gate of the OS transistor 810. A second terminal of the OS transistor 850 is connected to a wiring that supplies the voltage $V_{BG\_B}$ (or the voltage $V_{BG\_A}$). A first gate of the OS transistor 850 is connected to a wiring that supplies a signal $S_F$. A second gate of the OS transistor 850 is connected to the wiring that supplies the voltage $V_{BG\_B}$ (or the voltage $V_{BG\_A}$).

Figure 45B:
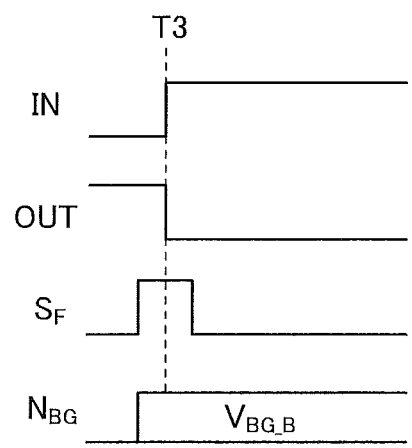

The operation with the circuit configuration in FIG. 45A is described with reference to a timing chart in FIG. 45B.

The voltage for controlling the threshold voltage of the OS transistor 810 is supplied to the second gate of the OS transistor 810 before time T3 at which the level of the signal supplied to the input terminal IN is switched to a high level. The signal $S_F$ is set to a high level and the OS transistor 850 is turned on, so that the voltage $V_{BG\_B}$ for controlling the threshold voltage is supplied to a node $N_{BG}$.

The OS transistor 850 is turned off after the voltage of the node $N_{BG}$ becomes $V_{BG\_B}$. Since the off-state current of the OS transistor 850 is extremely low, the voltage $V_{BG\_B}$ held by the node $N_{BG}$ can be retained while the OS transistor 850 remains off. Thus, the number of times the voltage $V_{BG\_B}$ is supplied to the second gate of the OS transistor 850 can be reduced and accordingly, the power consumption for rewriting the voltage $V_{BG\_B}$ a can be reduced.

Figure 46A:
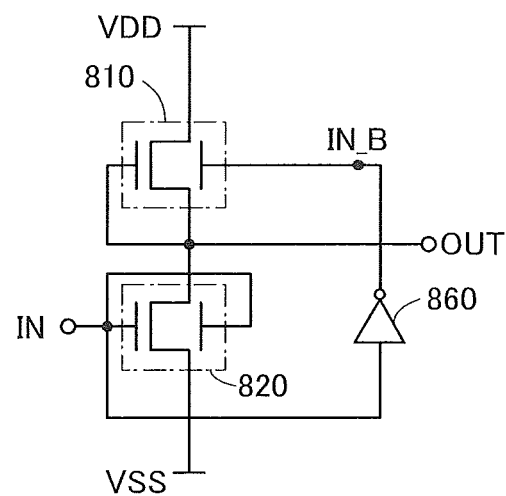
FIGS. 46A and 46B are a circuit diagram and a timing chart illustrating one embodiment of the present invention.

Although FIG. 43B and FIG. 45A each illustrate the case where the voltage is supplied to the second gate of the OS transistor 810 by control from the outside, a different structure may be employed in which voltage for controlling the threshold voltage is generated on the basis of the signal supplied to the input terminal IN and supplied to the second gate of the OS transistor 810, for example. FIG. 46A illustrates an example of such a circuit configuration.

The circuit configuration in FIG. 46A is the same as that in FIG. 43B, except that a CMOS inverter 860 is provided between the input terminal IN and the second gate of the OS transistor 810. An input terminal of the CMOS inverter 860 is connected to the input terminal IN. An output terminal of the CMOS inverter 860 is connected to the second gate of the OS transistor 810.

The operation with the circuit configuration in FIG. 46A is described with reference to a timing chart in FIG. 46B. The timing chart in FIG. 46B illustrates changes of a signal waveform of the input terminal IN, a signal waveform of the output terminal OUT, an output waveform IN_B of the CMOS inverter 860, and a threshold voltage of the OS transistor 810.

The output waveform IN_B that corresponds to a signal whose logic is inverted from the logic of the signal supplied to the input terminal IN can be used as a signal that controls the threshold voltage of the OS transistor 810. Thus, the threshold voltage of the OS transistor 810 can be controlled as described with reference to FIGS. 44A to 44C. For example, the signal supplied to the input terminal IN is at a high level and the OS transistor 820 is turned on at time T4 in FIG. 46B. At this time, the output waveform IN_B is at a low level. Accordingly, current can be made less likely to flow in the OS transistor 810; thus, the voltage of the output terminal OUT can be sharply decreased.

Figure 46B:
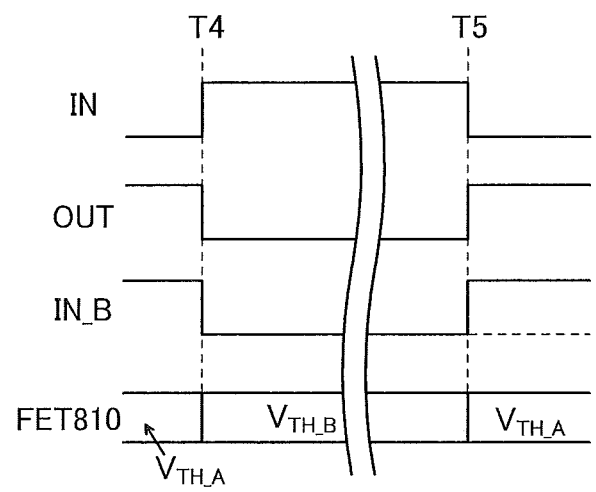

Moreover, the signal supplied to the input terminal IN is at a low level and the OS transistor 820 is turned off at time T5 in FIG. 46B. At this time, the output waveform IN_B is at a high level. Accordingly, current can easily flow in the OS transistor 810; thus, a rise in the voltage of the output terminal OUT can be made steep.

As described above, in the configuration of the inverter including the OS transistor in this embodiment, the voltage of the back gate is switched in accordance with the logic of the signal supplied to the input terminal IN. In such a configuration, the threshold voltage of the OS transistor can be controlled. The control of the threshold voltage of the OS transistor by the signal supplied to the input terminal IN can cause a steep change in the voltage of the output terminal OUT. Moreover, shoot-through current between the wirings that supply power supply voltages can be reduced. Thus, power consumption can be reduced.

The structures described in this embodiment can be combined as appropriate with any of the structures described in the other embodiments.

Embodiment 7

In this embodiment, examples of a semiconductor device in which the transistor including an oxide semiconductor (OS transistor) described in any of the above embodiments is used in a plurality of circuits are described with reference to FIGS. 47A to 47E, FIGS. 48A and 48B, FIGS. 49A and 49B, and FIGS. 50A to 50C.

<7. Circuit Configuration Example of Semiconductor Device>

Figure 47A:
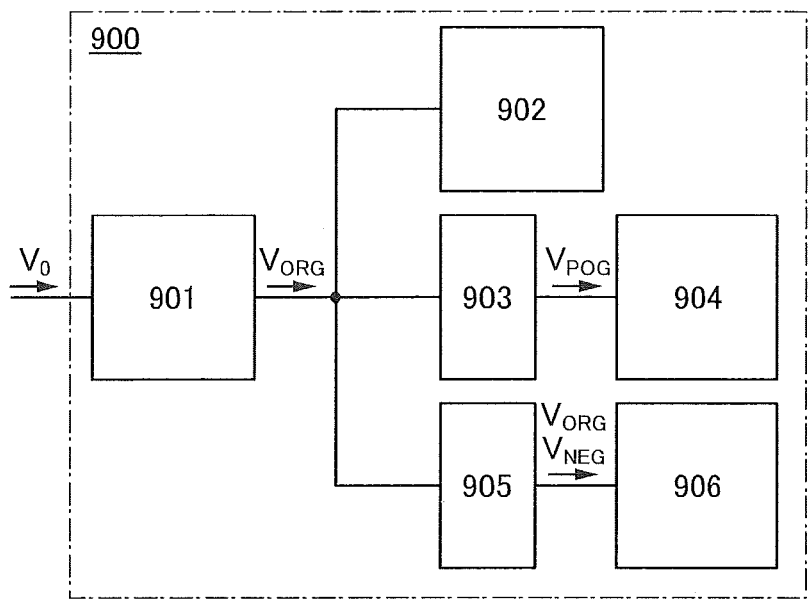
FIGS. 47A to 47E are a block diagram, circuit diagrams, and waveform charts illustrating one embodiment of the present invention.

FIG. 47A is a block diagram of a semiconductor device 900. The semiconductor device 900 includes a power supply circuit 901, a circuit 902, a voltage generation circuit 903, a circuit 904, a voltage generation circuit 905, and a circuit 906.

The power supply circuit 901 is a circuit that generates a voltage $V_{ORG}$ used as a reference. The voltage $V_{ORG}$ is not necessarily one voltage and can be a plurality of voltages. The voltage $V_{ORG}$ can be generated on the basis of a voltage $V_0$ supplied from the outside of the semiconductor device 900. The semiconductor device 900 can generate the voltage $V_{ORG}$ on the basis of one power supply voltage supplied from the outside. Thus, the semiconductor device 900 can operate without supply of a plurality of power supply voltages from the outside.

The circuits 902, 904, and 906 operate with different power supply voltages. For example, the power supply voltage of the circuit 902 is a voltage based on the voltage $V_{ORG}$ and the voltage $V_{SS}$ ($V_{ORG} > V_{SS}$), the power supply voltage of the circuit 904 is a voltage based on a voltage $V_{POG}$ and the voltage $V_{SS}$ ($V_{POG} > V_{ORG}$), and the power supply voltages of the circuit 906 are voltages based on the voltage $V_{ORG}$, the voltage $V_{SS}$, and a voltage $V_{NEG}$ ($V_{ORG} > V_{SS} > V_{NEG}$). When the voltage $V_{SS}$ is equal to a ground potential (GND), the kinds of voltages generated by the power supply circuit 901 can be reduced.

The voltage generation circuit 903 is a circuit that generates the voltage $V_{POG}$. The voltage generation circuit 903 can generate the voltage $V_{POG}$ on the basis of the voltage $V_{ORG}$ supplied from the power supply circuit 901. Thus, the semiconductor device 900 including the circuit 904 can operate on the basis of one power supply voltage supplied from the outside.

The voltage generation circuit 905 is a circuit that generates the voltage $V_{NEG}$. The voltage generation circuit 905 can generate the voltage $V_{NEG}$ on the basis of the voltage $V_{ORG}$ supplied from the power supply circuit 901. Thus, the semiconductor device 900 including the circuit 906 can operate on the basis of one power supply voltage supplied from the outside.

Figure 47B:
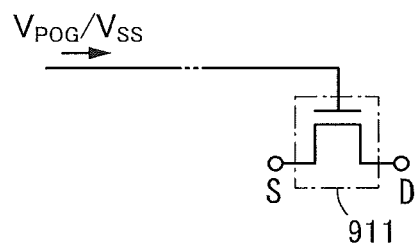
Figure 47D:
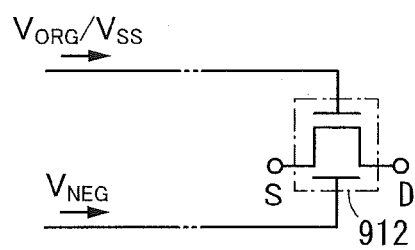
Figure 47C:
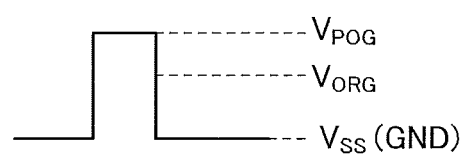

FIG. 47B illustrates an example of the circuit 904 that operates with the voltage $V_{POG}$ and FIG. 47C illustrates an example of a waveform of a signal for operating the circuit 904.

FIG. 47B illustrates a transistor 911. A signal supplied to a gate of the transistor 911 is generated on the basis of, for example, the voltage $V_{POG}$ and the voltage $V_{SS}$. The signal is generated on the basis of the voltage $V_{POG}$ to turn on the transistor 911 and on the basis of the voltage $V_{SS}$ to turn off the transistor 911. As illustrated in FIG. 47C, the voltage $V_{POG}$ is higher than the voltage $V_{ORG}$. Thus, a source (S) and a drain (D) of the transistor 911 can be electrically connected to each other without fail. As a result, the frequency of malfunction of the circuit 904 can be reduced.

Figure 47E:
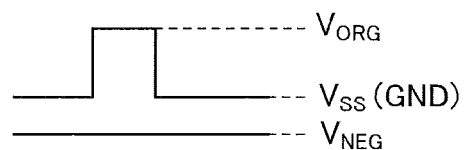

FIG. 47D illustrates an example of the circuit 906 that operates with the voltage $V_{NEG}$ and FIG. 47E illustrates an example of a waveform of a signal for operating the circuit 906.

FIG. 47D illustrates a transistor 912 having a back gate. A signal supplied to a gate of the transistor 912 is generated on the basis of, for example, the voltage $V_{ORG}$ and the voltage $V_{SS}$. The signal is generated on the basis of the voltage $V_{ORG}$ to turn on the transistor 912 and on the basis of the voltage $V_{SS}$ to turn off the transistor 912. A signal supplied to the back gate of the transistor 912 is generated on the basis of the voltage $V_{NEG}$. As illustrated in FIG. 47E, the voltage $V_{NEG}$ is lower than the voltage $V_{SS}$(GND). Thus, the threshold voltage of the transistor 912 can be controlled to shift in the positive direction. Thus, the transistor 912 can be turned off without fail and a current flowing between a source (S) and a drain (D) can be reduced. As a result, the frequency of malfunction of the circuit 906 can be reduced and power consumption thereof can be reduced.

The voltage $V_{NEG}$ may be directly supplied to the back gate of the transistor 912. Alternatively, a signal supplied to the gate of the transistor 912 may be generated on the basis of the voltage $V_{ORG}$ and the voltage $V_{NEG}$ and the generated signal may also be supplied to the back gate of the transistor 912.

Figure 48A:
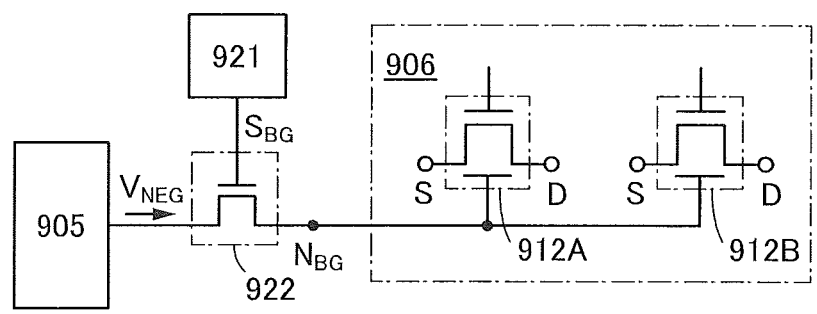
FIGS. 48A and 48B are a circuit diagram and a timing chart illustrating one embodiment of the present invention.
Figure 48B:
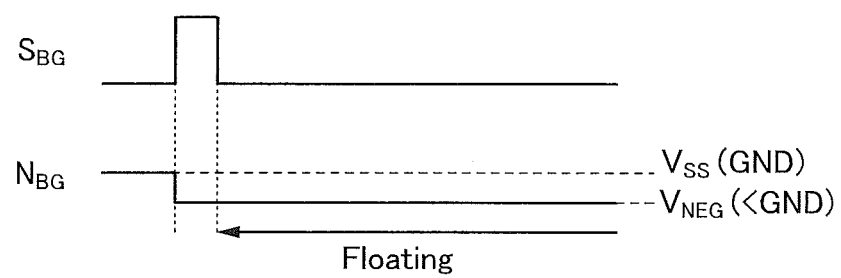

FIGS. 48A and 48B illustrate a modification example of FIGS. 47D and 47E.

In a circuit diagram illustrated in FIG. 48A, a transistor 922 whose on/off state can be controlled by a control circuit 921 is provided between the voltage generation circuit 905 and the circuit 906. The transistor 922 is an n-channel OS transistor. The control signal $S_{BG}$ output from the control circuit 921 is a signal for controlling the on/off state of the transistor 922. Transistors 912A and 912B included in the circuit 906 are OS transistors like the transistor 922.

A timing chart in FIG. 48B shows changes in a potential of the control signal $S_{BG}$ and a potential of a node $N_{BG}$. The potential of the node $N_{BG}$ indicates the states of potentials of back gates of the transistors 912A and 912B. When the control signal $S_{BG}$ is at a high level, the transistor 922 is turned on and the voltage of the node $N_{BG}$ becomes the voltage $V_{NEG}$. Then, when the control signal $S_{BG}$ is at a low level, the node $N_{BG}$ is brought into an electrically floating state. Since the transistor 922 is an OS transistor, its off-state current is small. Accordingly, even when the node $N_{BG}$ is in an electrically floating state, the voltage $V_{NEG}$ that has been supplied can be held.

Figure 49A:
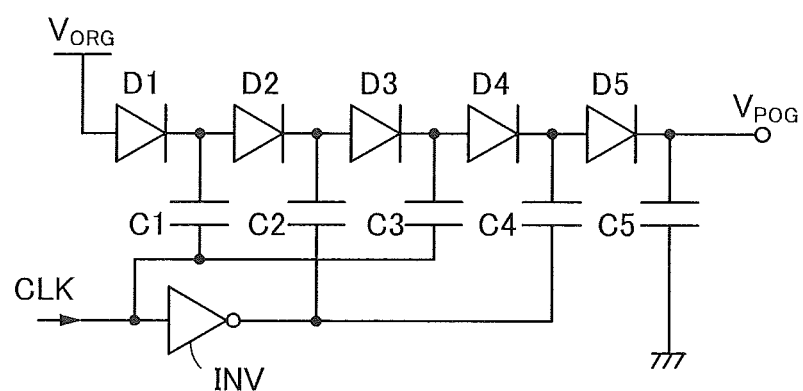
FIGS. 49A and 49B are circuit diagrams each illustrating one embodiment of the present invention.

FIG. 49A illustrates an example of a circuit configuration applicable to the above-described voltage generation circuit 903. The voltage generation circuit 903 illustrated in FIG. 49A is a five-stage charge pump including diodes D1 to D5, capacitors C1 to C5, and an inverter INV. A clock signal CLK is supplied to the capacitors C1 to C5 directly or through the inverter INV. When a power supply voltage of the inverter INV is a voltage applied on the basis of the voltage $V_{ORG}$ and the voltage $V_{SS}$, the voltage $V_{POG}$, which has been increased to a positive voltage having a positively quintupled value of the voltage $V_{ORG}$ by application of the clock signal CLK, can be obtained. Note that the forward voltage of the diodes D1 to D5 is 0 V. The number of stages of the charge pump can be changed to obtain a desired voltage $V_{POG}$.

Figure 49B:
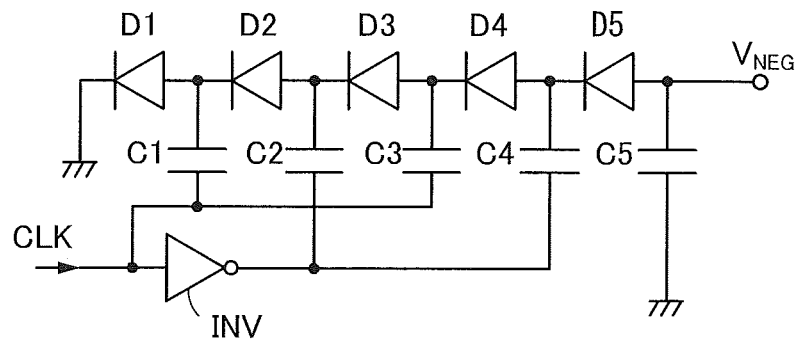

FIG. 49B illustrates an example of a circuit configuration applicable to the above-described voltage generation circuit 905. The voltage generation circuit 905 illustrated in FIG. 49B is a four-stage charge pump including the diodes D1 to D5, the capacitors C1 to C55, and the inverter INV. The clock signal CLK is supplied to the capacitors C1 to C5 directly or through the inverter INV. When a power supply voltage of the inverter INV is a voltage applied on the basis of the voltage $V_{ORG}$ and the voltage $V_{SS}$, the voltage $V_{NEG}$, which has been reduced from GND (i.e., the voltage $V_{SS}$) to a negative voltage having a negatively quadrupled value of the voltage $V_{ORG}$ by application of the clock signal CLK, can be obtained. Note that the forward voltage of the diodes D1 to D5 is 0 V. The number of stages of the charge pump can be changed to obtain a desired voltage $V_{NEG}$.

Figure 50A:
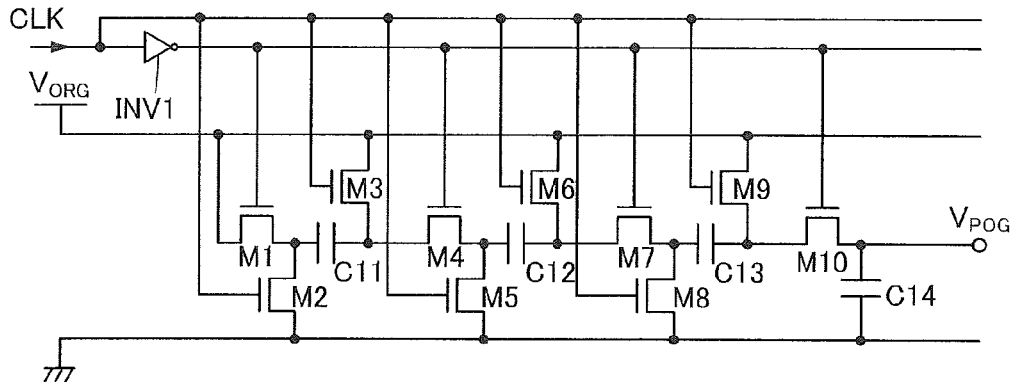
FIGS. 50A to 50C are circuit diagrams each illustrating one embodiment of the present invention.
Figure 50B:
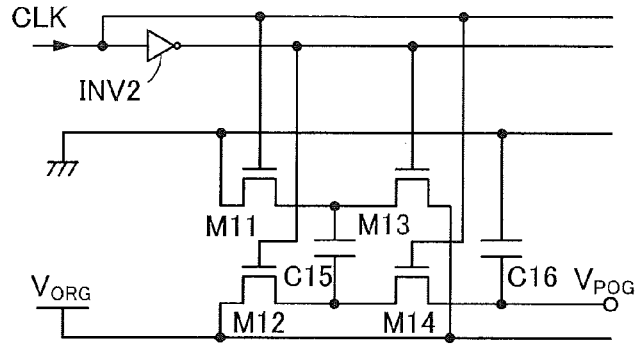
Figure 50C:
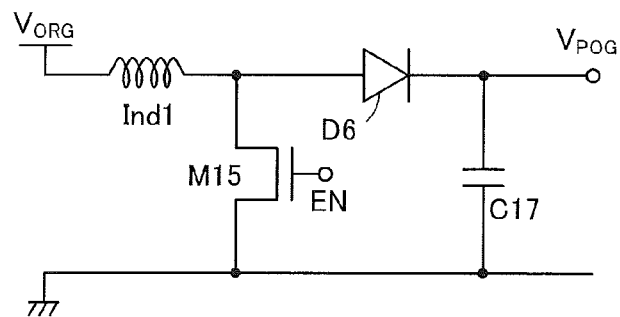

The circuit configuration of the voltage generation circuit 903 is not limited to the configuration in the circuit diagram illustrated in FIG. 49A. Modification examples of the voltage generation circuit 903 are illustrated in FIGS. 50A to 50C. Note that further modification examples of the voltage generation circuit 903 can be realized by changing voltages supplied to wirings or arrangement of elements in voltage generation circuits 903A to 903C illustrated in FIGS. 50A to 50C.

The voltage generation circuit 903A illustrated in FIG. 50A includes transistors M1 to M10, capacitors C11 to C14, and an inverter $INV_1$. The clock signal CLK is supplied to gates of the transistors M1 to M10 directly or through the inverter INV. By application of the clock signal CLK, the voltage $V_{POG}$, which has been increased to a positive voltage having a positively quadrupled value of the voltage $V_{ORG}$, can be obtained. The number of stages can be changed to obtain a desired voltage $V_{POG}$. In the voltage generation circuit 903A in FIG. 50A, off-state current of each of the transistors M1 to M10 can be small when the transistors M1 to M10 are OS transistors, and leakage of charge held in the capacitors C11 to C14 can be suppressed. Accordingly, the voltage $V_{ORG}$ can be efficiently increased to the voltage $V_{POG}$.

The voltage generation circuit 903B illustrated in FIG. 50B includes transistors M11 to M14, capacitors C15 and C16, and an inverter $INV_2$. The clock signal CLK is supplied to gates of the transistors M11 to M14 directly or through the inverter $INV_2$. By application of the clock signal CLK, the voltage $V_{POG}$, which has been increased to a positive voltage having a positively doubled value of the voltage $V_{ORG}$, can be obtained. In the voltage generation circuit 903B in FIG. 50B, off-state current of each of the transistors M11 to M14 can be small when the transistors M11 to M14 are OS transistors, and leakage of charge held in the capacitors C15 and C16 can be suppressed. Accordingly, the voltage $V_{ORG}$ can be efficiently increased to the voltage $V_{POG}$.

A voltage generation circuit 903C illustrated in FIG. 50C includes an inductor Ind1, a transistor M15, a diode D6, and a capacitor C17. The on/off state of the transistor M15 is controlled by a control signal EN. Owing to the control signal EN, the voltage $V_{POG}$ increased from the voltage $V_{ORG}$ can be obtained. Since the voltage generation circuit 903C in FIG. 50C increases the voltage using the inductor Ind1, the voltage can be efficiently increased.

As described above, in any of the structures of this embodiment, a voltage required for circuits included in a semiconductor device can be internally generated. Thus, in the semiconductor device, the number of power supply voltages supplied from the outside can be reduced.

The structures and the like described in this embodiment can be combined as appropriate with any of the structures described in the other embodiments.

Embodiment 8

In this embodiment, a display module and electronic devices, each of which includes a semiconductor device of one embodiment of the present invention, are described with reference to FIG. 51, FIGS. 52A to 52E, FIGS. 53A to 53G, and FIGS. 54A and 54B.

<8-1. Display Module>

Figure 51:
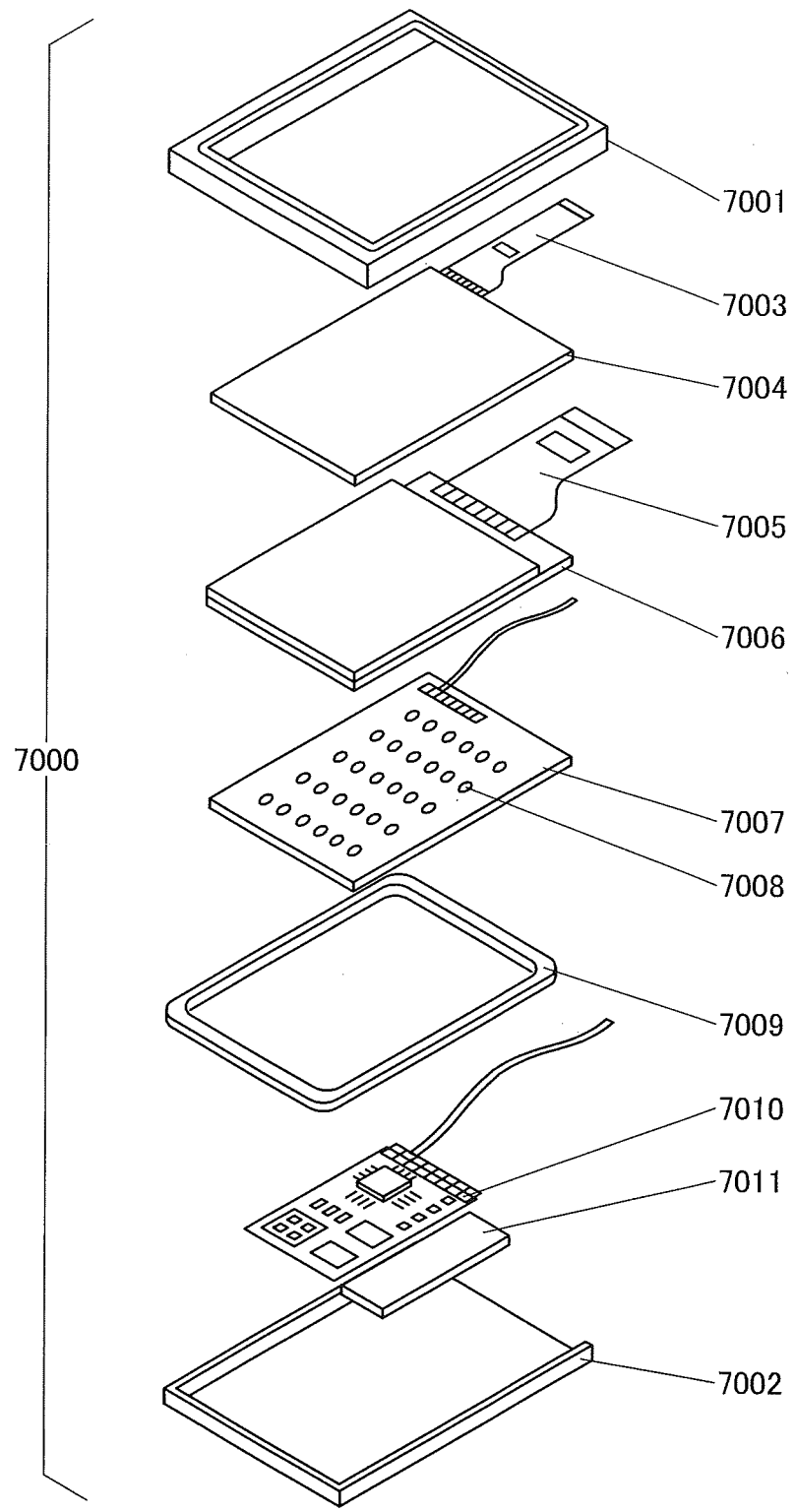
FIG. 51 illustrates a display module.

In a display module 7000 illustrated in FIG. 51, a touch panel 7004 connected to an FPC 7003, a display panel 7006 connected to an FPC 7005, a backlight 7007, a frame 7009, a printed board 7010, and a battery 7011 are provided between an upper cover 7001 and a lower cover 7002.

The semiconductor device of one embodiment of the present invention can be used for the display panel 7006, for example.

The shapes and sizes of the upper cover 7001 and the lower cover 7002 can be changed as appropriate in accordance with the sizes of the touch panel 7004 and the display panel 7006.

The touch panel 7004 can be a resistive touch panel or a capacitive touch panel and overlap with the display panel 7006. Alternatively, a counter substrate (sealing substrate) of the display panel 7006 can have a touch panel function. Alternatively, a photosensor may be provided in each pixel of the display panel 7006 to form an optical touch panel.

The backlight 7007 includes a light source 7008. One embodiment of the present invention is not limited to the structure in FIG. 51, in which the light source 7008 is provided over the backlight 7007. For example, a structure in which the light source 7008 is provided at an end portion of the backlight 7007 and a light diffusion plate is further provided may be employed. Note that the backlight 7007 need not be provided in the case where a self-luminous light-emitting element such as an organic EL element is used or in the case where a reflective panel or the like is employed.

The frame 7009 protects the display panel 7006 and functions as an electromagnetic shield for blocking electromagnetic waves generated by the operation of the printed board 7010. The frame 7009 may also function as a radiator plate.

The printed board 7010 includes a power supply circuit and a signal processing circuit for outputting a video signal and a clock signal. As a power source for supplying power to the power supply circuit, an external commercial power source or the separate battery 7011 may be used. The battery 7011 can be omitted in the case where a commercial power source is used.

The display module 7000 may be additionally provided with a member such as a polarizing plate, a retardation plate, or a prism sheet.

<8-2. Electronic Device 1>

Next, FIGS. 52A to 52E illustrate examples of electronic devices.

Figure 52A:
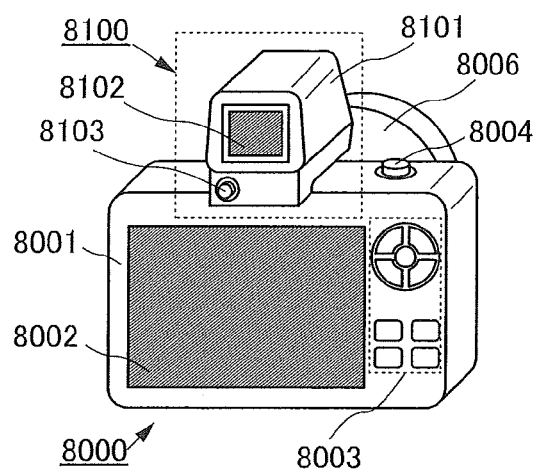
FIGS. 52A to 52E illustrate electronic devices.

FIG. 52A is an external view of a camera 8000 to which a finder 8100 is attached.

The camera 8000 includes a housing 8001, a display portion 8002, an operation button 8003, a shutter button 8004, and the like. Furthermore, an attachable lens 8006 is attached to the camera 8000.

Although the lens 8006 of the camera 8000 here is detachable from the housing 8001 for replacement, the lens 8006 may be included in the housing 8001.

Images can be taken with the camera 8000 at the press of the shutter button 8004. In addition, images can be taken at the touch of the display portion 8002 that serves as a touch panel.

The housing 8001 of the camera 8000 includes a mount including an electrode, so that the finder 8100, a stroboscope, or the like can be connected to the housing 8001.

The finder 8100 includes a housing 8101, a display portion 8102, a button 8103, and the like.

The housing 8101 includes a mount for engagement with the mount of the camera 8000 so that the finder 8100 can be connected to the camera 8000. The mount includes an electrode, and an image or the like received from the camera 8000 through the electrode can be displayed on the display portion 8102.

The button 8103 serves as a power button. The on/off state of the display portion 8102 can be turned on and off with the button 8103.

A display device of one embodiment of the present invention can be used in the display portion 8002 of the camera 8000 and the display portion 8102 of the finder 8100.

Although the camera 8000 and the finder 8100 are separate and detachable electronic devices in FIG. 52A, the housing 8001 of the camera 8000 may include a finder having a display device.

Figure 52B:
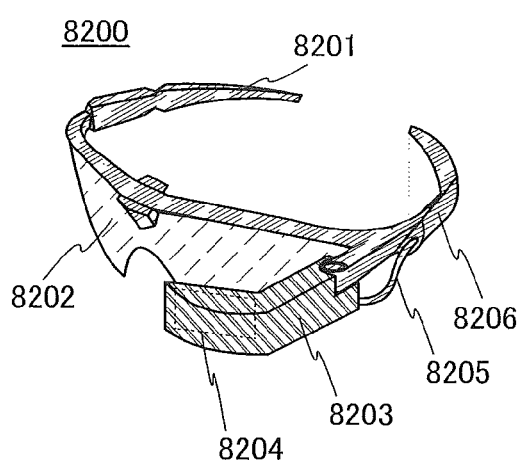

FIG. 52B is an external view of a head-mounted display 8200.

The head-mounted display 8200 includes a mounting portion 8201, a lens 8202, a main body 8203, a display portion 8204, a cable 8205, and the like. The mounting portion 8201 includes a battery 8206.

Power is supplied from the battery 8206 to the main body 8203 through the cable 8205. The main body 8203 includes a wireless receiver or the like to receive video data, such as image data, and display it on the display portion 8204. The movement of the eyeball and the eyelid of a user is captured by a camera in the main body 8203 and then coordinates of the points the user looks at are calculated using the captured data to utilize the eye of the user as an input means.

The mounting portion 8201 may include a plurality of electrodes so as to be in contact with the user. The main body 8203 may be configured to sense current flowing through the electrodes with the movement of the user's eyeball to recognize the direction of his or her eyes. The main body 8203 may be configured to sense current flowing through the electrodes to monitor the user's pulse. The mounting portion 8201 may include sensors, such as a temperature sensor, a pressure sensor, or an acceleration sensor so that the user's biological information can be displayed on the display portion 8204. The main body 8203 may be configured to sense the movement of the user's head or the like to move an image displayed on the display portion 8204 in synchronization with the movement of the user's head or the like.

The display device of one embodiment of the present invention can be used in the display portion 8204.

Figure 52C:
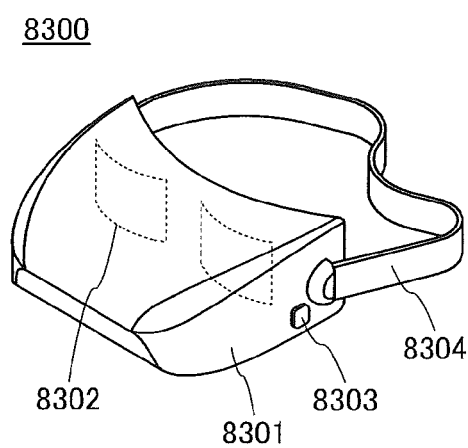
Figure 52D:
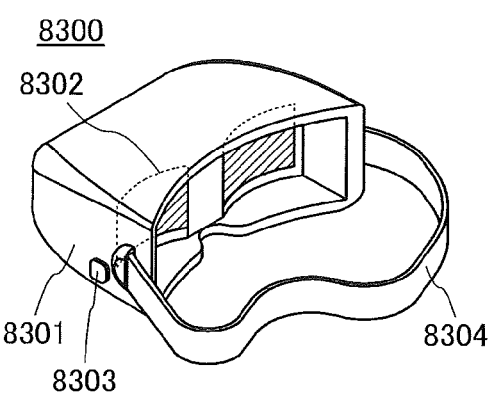
Figure 52E:
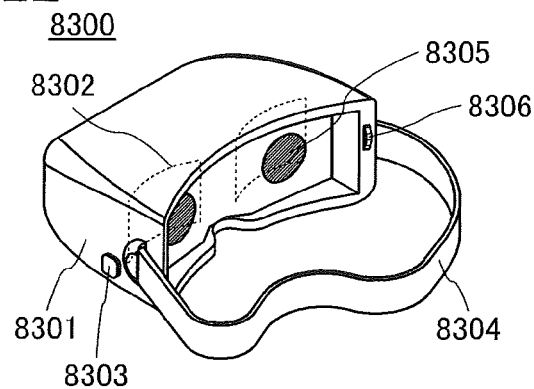

FIGS. 52C to 52E are external views of a head-mounted display 8300.

The head-mounted display 8300 includes a housing 8301, two display portions 8302, an operation button 8303, and an object for fixing, such as a band, 8304.

The head-mounted display 8300 has the functions of the above-described head-mounted display 8200 and further includes two display portions.

With the two display portions 8302, the user can see one display portion with one eye and the other display portion with the other eye. Thus, a high-resolution image can be displayed even when a three-dimensional display using parallax or the like is performed. The display portion 8302 is curved around an arc with the user's eye as an approximate center. Thus, distances between the user's eye and display surfaces of the display portion become equal; thus, the user can see a more natural image. Even when the luminance or chromaticity of light from the display portion is changed depending on the angle at which the user see it, since the user's eye is positioned in a normal direction of the display surface of the display portion, the influence of the change can be substantially ignorable and thus a more realistic image can be displayed.

The operation button 8303 serves as a power button or the like. A button other than the operation button 8303 may be included.

As illustrated in FIG. 52E, lenses 8305 may be provided between the display portion 8302 and the user's eyes. With the lenses 8305, the user can see magnified images on the display portion 8302; thus, the sense of reality is further increased. In this case, as illustrated in FIG. 52E, a dial 8306 for adjusting the position of the lenses may be included to adjust visibility.

The display device of one embodiment of the present invention can be used in the display portion 8302. The display device including the semiconductor device of one embodiment of the present invention has an extremely high resolution; thus, even when an image is magnified using the lenses 8305 as illustrated in FIG. 52E, the user does not perceive pixels, and thus a more realistic image can be displayed.

<8-3. Electronic Device 2>

Next, FIGS. 53A to 53G illustrate examples of electronic devices that are different from those illustrated in FIGS. 52A to 52E.

Electronic devices illustrated in FIGS. 53A to 53G include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 9008, and the like.

The electronic devices in FIGS. 53A to 53G have a variety of functions such as a function of displaying a variety of information (e.g., a still image, a moving image, and a text image) on the display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading out a program or data stored in a recording medium and displaying it on the display portion. Note that functions of the electronic devices in FIGS. 53A to 53G are not limited thereto, and the electronic devices can have a variety of functions. Although not illustrated in FIGS. 53A to 53G, the electronic devices may each have a plurality of display portions. Furthermore, the electronic devices may each be provided with a camera and the like to have a function of taking a still image, a function of taking a moving image, a function of storing the taken image in a memory medium (an external memory medium or a memory medium incorporated in the camera), a function of displaying the taken image on the display portion, or the like.

The electronic devices in FIGS. 53A to 53G are described in detail below.

Figure 53A:
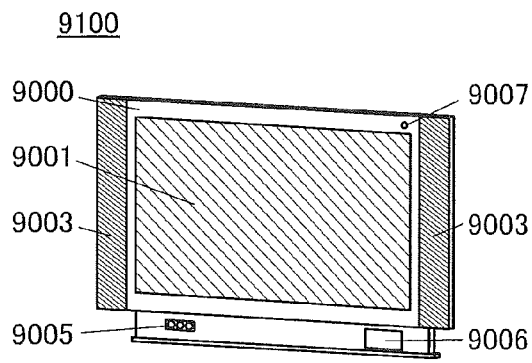
FIGS. 53A to 53G illustrate electronic devices.

FIG. 53A is a perspective view illustrating a television device 9100. The television device 9100 can include the display portion 9001 having a large screen size of, for example, 50 inches or more, or 100 inches or more.

Figure 53D:
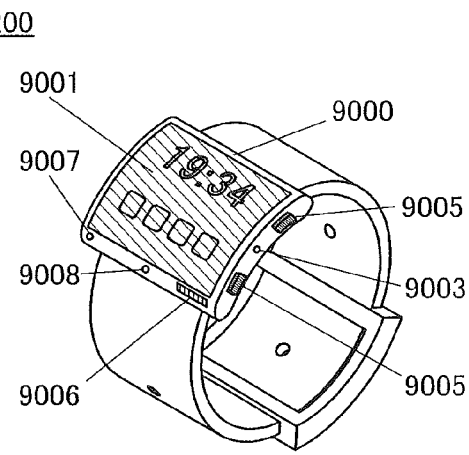
Figure 53B:
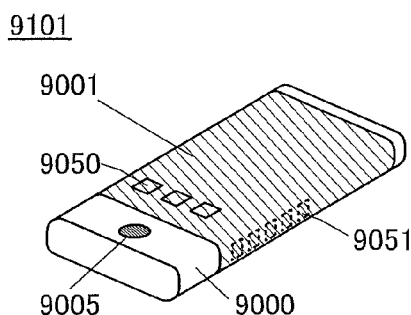

FIG. 53B is a perspective view of a portable information terminal 9101. The portable information terminal 9101 functions as, for example, one or more of a telephone set, a notebook, and an information browsing system. Specifically, the portable information terminal 9101 can be used as a smartphone. Note that the portable information terminal 9101 may include a speaker, a connection terminal, a sensor, or the like. The portable information terminal 9101 can display text and image information on its plurality of surfaces. For example, three operation buttons 9050 (also referred to as operation icons or simply as icons) can be displayed on one surface of the display portion 9001. Furthermore, information 9051 indicated by dashed rectangles can be displayed on another surface of the display portion 9001. Examples of the information 9051 include display indicating reception of an e-mail, a social networking service (SNS) message, or a telephone call, the title and sender of an e-mail or an SNS message, date, time, remaining battery, and reception strength of an antenna. Alternatively, the operation buttons 9050 or the like may be displayed in place of the information 9051.

Figure 53E:
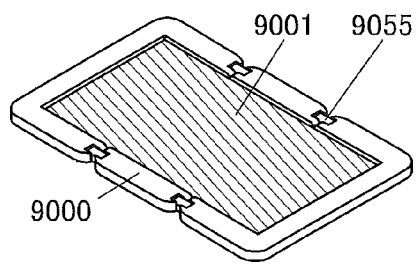
Figure 53C:
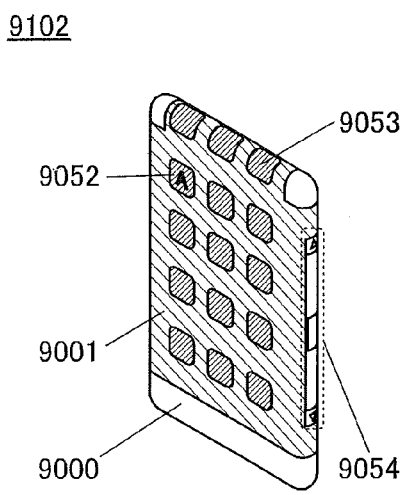

FIG. 53C is a perspective view of a portable information terminal 9102. The portable information terminal 9102 has a function of displaying information on three or more surfaces of the display portion 9001. Here, information 9052, information 9053, and information 9054 are displayed on different surfaces. For example, a user of the portable information terminal 9102 can see the display (here, the information 9053) on the portable information terminal 9102 put in a breast pocket of his/her clothes. Specifically, a caller's phone number, name, or the like of an incoming call is displayed in a position that can be seen from above the portable information terminal 9102. The user can see the display without taking out the portable information terminal 9102 from the pocket and decide whether to answer the call.

FIG. 53D is a perspective view of a watch-type portable information terminal 9200. The portable information terminal 9200 is capable of executing a variety of applications such as mobile phone calls, e-mailing, reading and editing texts, music reproduction, Internet communication, and a computer game. The display surface of the display portion 9001 is curved, and display can be performed on the curved display surface. The portable information terminal 9200 can employ near field communication conformable to a communication standard. For example, hands-free calling can be achieved by mutual communication between the portable information terminal 9200 and a headset capable of wireless communication. Moreover, the portable information terminal 9200 includes the connection terminal 9006 and can perform direct data communication with another information terminal via a connector. Charging through the connection terminal 9006 is also possible. Note that the charging operation may be performed by wireless power feeding without using the connection terminal 9006.

Figure 53F:
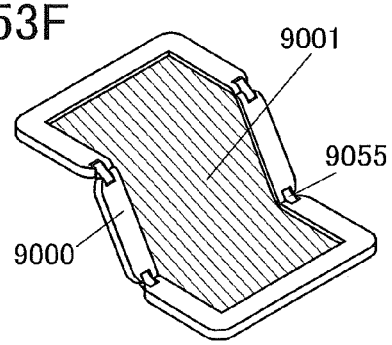
Figure 53G:
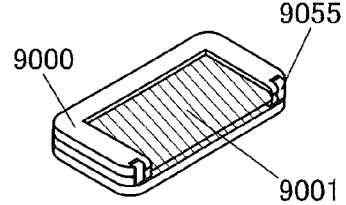

FIGS. 53E, 53F, and 53G are perspective views of a foldable portable information terminal 9201 that is opened, that is shifted from the opened state to the folded state or from the folded state to the opened state, and that is folded, respectively. The portable information terminal 9201 is highly portable when folded. When the portable information terminal 9201 is opened, a seamless large display region is highly browsable. The display portion 9001 of the portable information terminal 9201 is supported by three housings 9000 joined by hinges 9055. By being folded at the hinges 9055 between the two adjacent housings 9000, the portable information terminal 9201 can be reversibly changed in shape from the opened state to the folded state. For example, the portable information terminal 9201 can be bent with a radius of curvature greater than or equal to 1 mm and less than or equal to 150 mm.

Figure 54A:
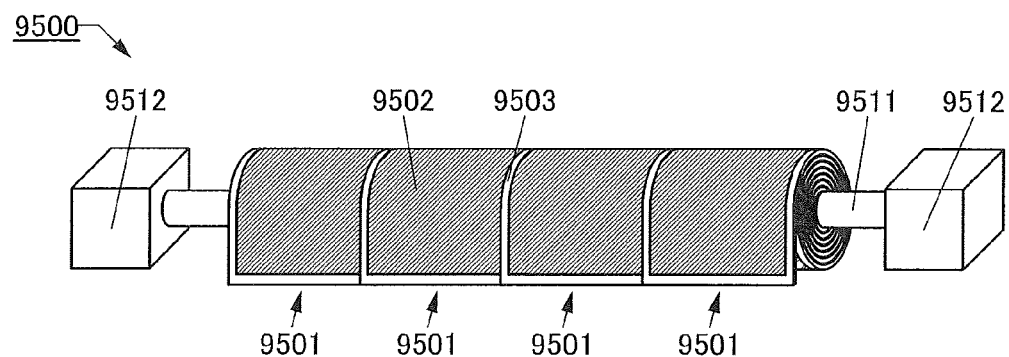
FIGS. 54A and 54B are perspective views illustrating a display device.
Figure 54B:
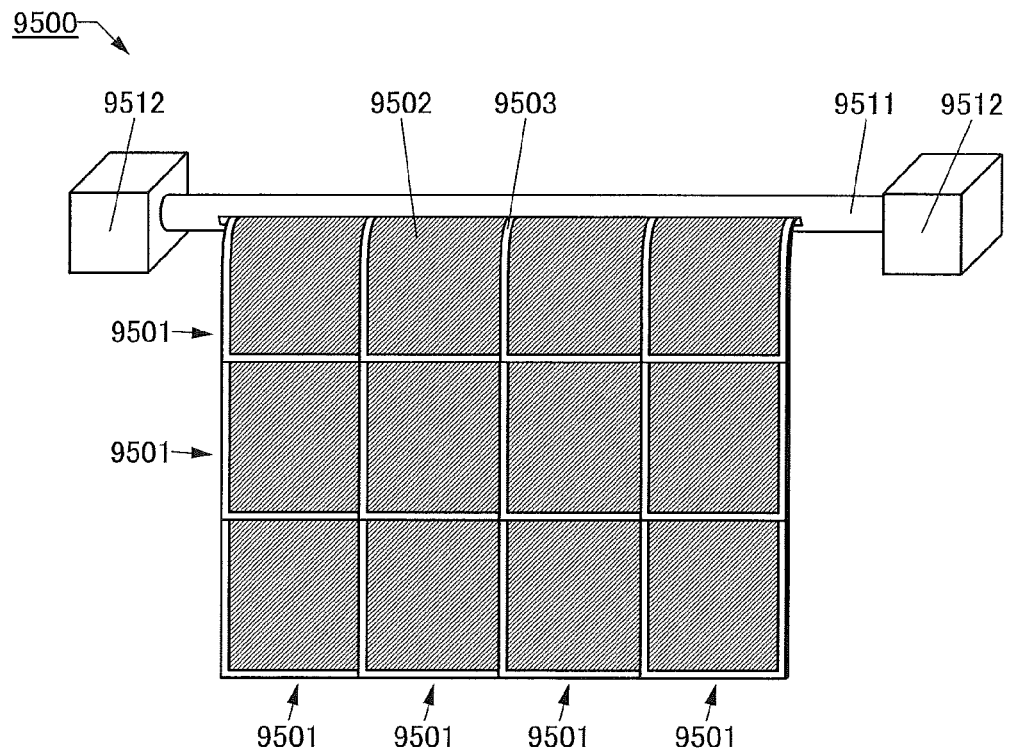

FIGS. 54A and 54B are perspective views of a display device including a plurality of display panels. Note that the plurality of display panels are wound in the perspective view in FIG. 54A and are unwound in the perspective view in FIG. 54B.

A display device 9500 illustrated in FIGS. 54A and 54B includes a plurality of display panels 9501, a hinge 9511, and a bearing 9512. The plurality of display panels 9501 each include a display region 9502 and a light-transmitting region 9503.

Each of the plurality of display panels 9501 is flexible. Two adjacent display panels 9501 are provided so as to partly overlap with each other. For example, the light-transmitting regions 9503 of the two adjacent display panels 9501 can overlap with each other. A display device having a large screen can be obtained with the plurality of display panels 9501. The display device is highly versatile because the display panels 9501 can be wound depending on its use.

Although the display regions 9502 of the adjacent display panels 9501 are separated from each other in FIGS. 54A and 54B, without limitation to this structure, the display regions 9502 of the adjacent display panels 9501 may overlap with each other without any space so that a continuous display region 9502 is obtained, for example.

Electronic devices described in this embodiment are characterized by having a display portion for displaying some sort of information. Note that the semiconductor device of one embodiment of the present invention can also be used for an electronic device that does not have a display portion.

The structures described in this embodiment can be combined as appropriate with any of the structures described in the other embodiments.

Embodiment 9

In this embodiment, a display device including a semiconductor device of one embodiment of the present invention is described with reference to FIG. 55 and FIG. 56.

<9-1. Schematic Perspective View of Display Device>

A display device of this embodiment is described with reference to FIG. 55. FIG. 55 is a schematic perspective view of a display device 510.

In the display device 510, a substrate 511 and a substrate 512 are attached to each other. In FIG. 55, the substrate 512 is denoted by a dashed line.

The display device 510 includes a display portion 514, a circuit 516, a wiring 518, and the like. FIG. 55 illustrates an example in which the display device 510 is provided with an IC 520 and an FPC 522. Thus, the structure illustrated in FIG. 55 can be referred to as a display module including the display device 510, the IC 520, and the FPC 522.

As the circuit 516, for example, a scan line driver circuit can be used.

The wiring 518 has a function of supplying a signal and power to the display portion 514 and the circuit 516. The signal and power are input to the wiring 518 from the outside through the FPC 522 or from the IC 520.

Figure 55:
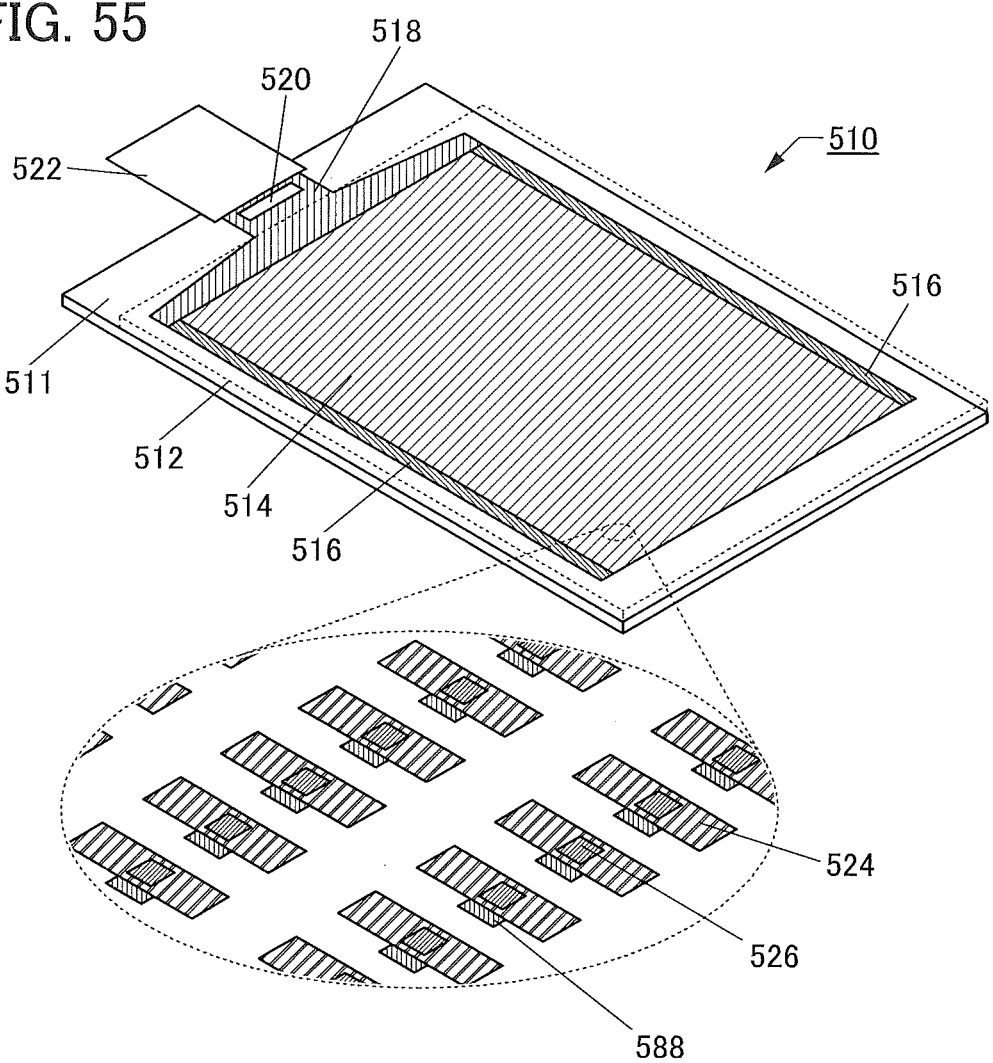
FIG. 55 is a perspective view illustrating an example of a display device.

FIG. 55 illustrates an example in which the IC 520 is provided over the substrate 511 by a chip on glass (COG) method, a chip on film (COF) method, or the like. An IC including a scan line driver circuit, a signal line driver circuit, or the like can be used as the IC 520, for example. Note that the display device 510 is not necessarily provided with the IC 520. Furthermore, the IC 520 may be provided over the FPC by a COF method or the like.

FIG. 55 illustrates an enlarged view of part of the display portion 514. Electrodes 524 included in a plurality of display elements are arranged in a matrix in the display portion 514. The electrode 524 has a function of reflecting visible light, and serves as a reflective electrode of a liquid crystal element 574, which is described later.

Furthermore, as illustrated in FIG. 55, the electrode 524 includes an opening 526. In addition, the display portion 514 includes a light-emitting element 588 that is positioned closer to the substrate 511 than the electrode 524 is. Light from the light-emitting element 588 is emitted to the substrate 512 side through the opening 526 in the electrode 524. The area of a light-emitting region in the light-emitting element 588 may be equal to that of the opening 526. One of the area of the light-emitting region in the light-emitting element 588 and the area of the opening 526 is preferably larger than the other because a margin for misalignment can be increased.

<9-2. Cross-Sectional View of Display Device>

Figure 56:
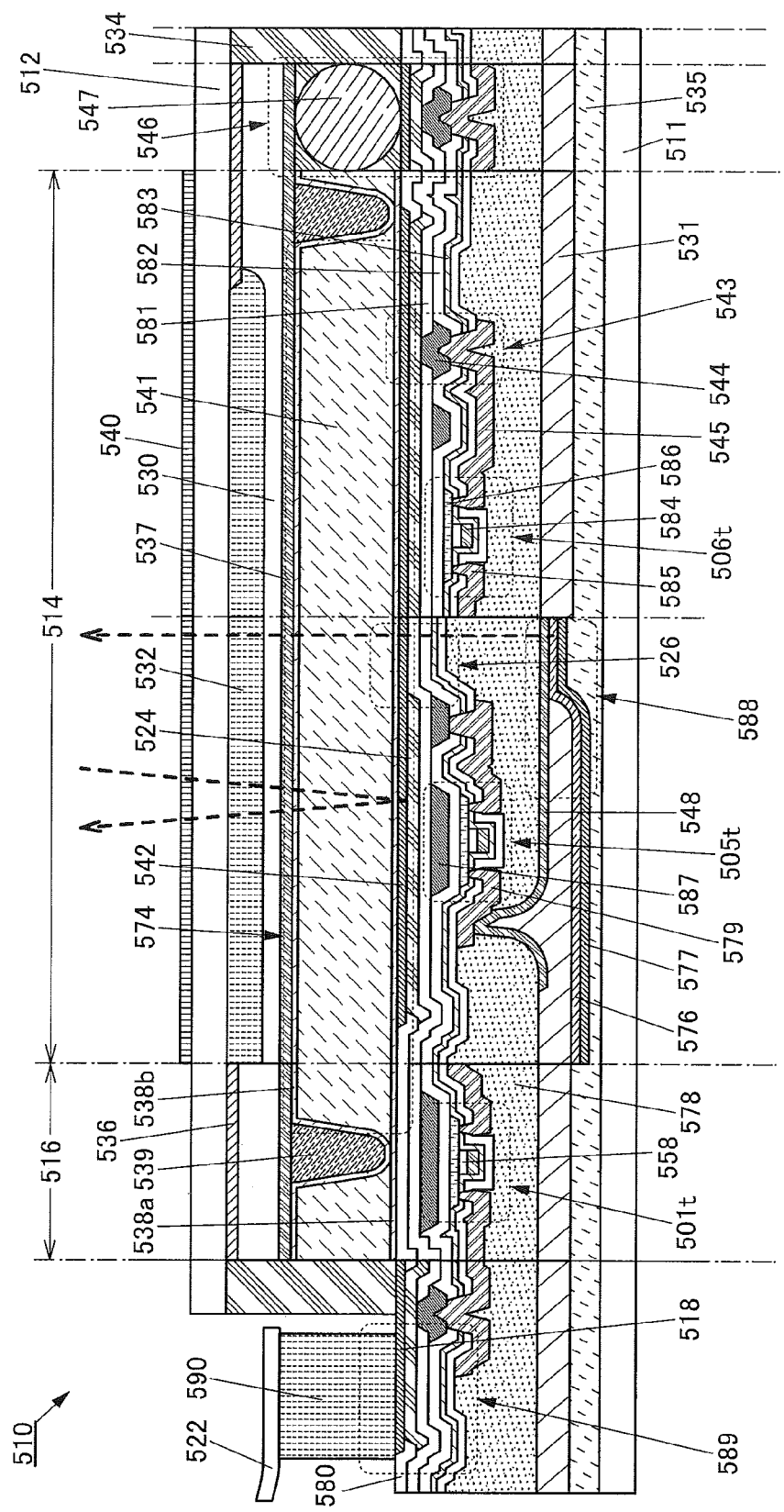
FIG. 56 is a cross-sectional view illustrating an example of a display device.

FIG. 56 illustrates an example of cross-sectional views of part of a region including the FPC 522, part of a region including the circuit 516, and part of a region including the display portion 514 of the display device 510 illustrated in FIG. 55.

The display device 510 illustrated in FIG. 56 includes a transistor $501t$, a transistor $505t$, a transistor $506t$, the liquid crystal element 574, the light-emitting element 588, an insulating layer 530, an insulating layer 531, a coloring layer 532, and the like between the substrate 511 and the substrate 512. The substrate 512 is bonded to the insulating layer 530 with a bonding layer 534. The substrate 511 is bonded to the insulating layer 531 with a bonding layer 535.

Note that the display device 510 illustrated in FIG. 56 is an example of a hybrid display. The display device 510 can perform hybrid display.

Hybrid display is a method for displaying a letter and/or an image using reflected light and self-emitted light together in one panel that complement the color tone or light intensity of each other. Alternatively, hybrid display is a method for displaying a letter and/or an image using light from a plurality of display elements in one pixel or one subpixel. Note that when a hybrid display performing hybrid display is locally observed, a pixel or a subpixel performing display using any one of the plurality of display elements and a pixel or a subpixel performing display using two or more of the plurality of display elements are included in some cases.

Note that in the present specification and the like, hybrid display satisfies any one or a plurality of the above-described descriptions.

Furthermore, a hybrid display includes a plurality of display elements in one pixel or one subpixel. Note that as an example of the plurality of display elements, a reflective element that reflects light and a self-luminous element that emits light can be given. Note that the reflective element and the self-luminous element can be controlled independently. A hybrid display has a function of displaying a letter and/or an image using one or both of reflected light and self-emitted light in a display portion.

The substrate 512 is provided with the coloring layer 532, a light-blocking layer 536, the insulating layer 530, an electrode 537 functioning as a common electrode of the liquid crystal element 574, an alignment film 538b, an insulating layer 539, and the like. A polarizing plate 540 is provided on an outer surface of the substrate 512. The insulating layer 530 may have a function of a planarization layer. The insulating layer 530 enables the electrode 537 to have an almost flat surface, resulting in a uniform alignment state of a liquid crystal layer 541. The insulating layer 539 serves as a spacer for holding a cell gap of the liquid crystal element 574. In the case where the insulating layer 539 transmits visible light, the insulating layer 539 may be positioned to overlap with a display region of the liquid crystal element 574.

The liquid crystal element 574 is a reflective liquid crystal element. The liquid crystal element 574 has a stacked-layer structure of an electrode 542 functioning as a pixel electrode, the liquid crystal layer 541, and the electrode 537. The electrode 524 that reflects visible light is provided in contact with a surface of the electrode 542 on the substrate 511 side. The electrode 524 includes the opening 526. The electrode 542 and the electrode 537 transmit visible light. An alignment film 538*a* is provided between the liquid crystal layer 541 and the electrode 542. The alignment film 538*b* is provided between the liquid crystal layer 541 and the electrode 537.

In the liquid crystal element 574, the electrode 524 has a function of reflecting visible light, and the electrode 537 has a function of transmitting visible light. Light entering from the substrate 512 side is polarized by the polarizing plate 540, transmitted through the electrode 537 and the liquid crystal layer 541, and reflected by the electrode 524. Then, the light is transmitted through the liquid crystal layer 541 and the electrode 537 again to reach the polarizing plate 540. In this case, alignment of a liquid crystal can be controlled with a voltage that is applied between the electrode 524 and the electrode 537, and thus optical modulation of light can be controlled. In other words, the intensity of light exiting through the polarizing plate 540 can be controlled. Light excluding light in a particular wavelength region is absorbed by the coloring layer 532, and thus, exiting light is red light, for example.

As illustrated in FIG. 56, the electrode 542 that transmits visible light is preferably provided in the opening 526. Accordingly, the liquid crystal layer 541 is aligned in a region overlapping with the opening 526 as well as in the other regions, in which case an alignment defect of the liquid crystal is prevented from being generated in the boundary portion of these regions and undesired light leakage can be suppressed.

In a connection portion 543, the electrode 524 is electrically connected to a conductive layer 545 included in the transistor 506*t* via a conductive layer 544. The transistor 506*t* has a function of controlling the driving of the liquid crystal element 574.

A connection portion 546 is provided in part of a region where the bonding layer 534 is provided. In the connection portion 546, a conductive layer obtained by processing the same conductive film as the electrode 542 is electrically connected to part of the electrode 537 with a connector 547. Accordingly, a signal or a potential input from the FPC 522 connected to the substrate 511 side can be supplied to the electrode 537 formed on the substrate 512 side through the connection portion 546.

As the connector 547, for example, a conductive particle can be used. As the conductive particle, a particle of an organic resin, silica, or the like coated with a metal material can be used. It is preferable to use nickel or gold as the metal material because contact resistance can be decreased. It is also preferable to use a particle coated with layers of two or more kinds of metal materials, such as a particle coated with nickel and further with gold. A material capable of elastic deformation or plastic deformation is preferably used for the connector 547.

The connector 547 is preferably provided so as to be covered with the bonding layer 534. For example, a paste or the like for forming the bonding layer 534 may be applied, and then, the connector 547 may be provided.

The light-emitting element 588 is a bottom-emission light-emitting element. The light-emitting element 588 has a stacked-layer structure in which an electrode 548 functioning as a pixel electrode, an EL layer 576, and an electrode 577 functioning as a common electrode are stacked in this order from the insulating layer 530 side. The electrode 548 is connected to a conductive layer 579 included in the transistor 505*t* through an opening provided in an insulating layer 578. The transistor 505*t* has a function of controlling the driving of the light-emitting element 588. The insulating layer 531 covers an end portion of the electrode 548. The electrode 577 includes a material that reflects visible light, and the electrode 548 includes a material that transmits visible light. Light is emitted from the light-emitting element 588 to the substrate 512 side through the insulating layer 530, the opening 526, and the like.

The liquid crystal element 574 and the light-emitting element 588 can exhibit various colors when the color of the coloring layer varies among pixels. The display device 510 can perform color display using the liquid crystal element 574. The display device 510 can perform color display using the light-emitting element 588.

The transistors 501*t*, 505*t*, and 506*t* are formed on the substrate 511 side of an insulating layer 580. These transistors can be fabricated using the same process.

Furthermore, for each of the transistors 501*t*, 505*t*, and 506*t*, any of the semiconductor devices of embodiments of the present invention which are described in Embodiment 1 and Embodiment 2 can be used. Thus, by combining a miniaturized transistor and a plurality of display elements, a display device having a high display quality can be provided.

A circuit electrically connected to the liquid crystal element 574 and a circuit electrically connected to the light-emitting element 588 are preferably formed on the same plane. In that case, the thickness of the display device can be smaller than that in the case where the two circuits are formed on different planes. Furthermore, since two transistors can be formed in the same process, a manufacturing process can be simplified as compared to the case where two transistors are formed on different planes.

The pixel electrode of the liquid crystal element 574 is positioned opposite to the pixel electrode of the light-emitting element 588 with respect to a gate insulating layer of the transistor.

The transistor 505*t* is a transistor (also referred to as a driving transistor) for controlling current flowing to the light-emitting element 588. Note that as a material used for a channel formation region in the transistor, a metal oxide is preferably used. In addition to the transistor 505*t*, a transistor (also referred to as a switching transistor or a selection transistor) for controlling whether the pixel is selected or not may be provided.

Insulating layers such as an insulating layer 581, an insulating layer 582, and an insulating layer 583 are provided on the substrate 511 side of the insulating layer 580. Part of the insulating layer 581 functions as a base insulating layer of each transistor. The insulating layer 582 functions as a gate insulating layer of the transistor. The insulating layer 583 functions as a protective insulating film of the transistor. The insulating layer 578 functions as a planarization layer. Note that the number of insulating layers covering the transistor is not limited and may be one or two or more.

A material through which impurities such as water or hydrogen do not easily diffuse is preferably used for at least one of the insulating layers that cover the transistors. This is because such an insulating layer can serve as a barrier film.

Such a structure can effectively suppress diffusion of the impurities into the transistors from the outside, and a highly reliable display device can be provided.

The transistors 501t, 505t, and 506t include a conductive layer 584 functioning as a gate, an insulating layer 558 functioning as a gate insulating layer, the conductive layer 545 and a conductive layer 585 functioning as a source and a drain, and a semiconductor layer 586. Here, a plurality of layers obtained by processing the same conductive film are shown with the same hatching pattern.

The transistors 501t and 505t include a conductive layer 587 functioning as a gate in addition to the components of the transistor 506t.

The structure in which the semiconductor layer where a channel is formed is provided between two gates is used as an example of the transistors 501t and 505t. The two gates may be connected to each other and supplied with the same signal to operate the transistors. Such transistors can have higher field-effect mobility and thus have higher on-state current than other transistors. Consequently, a circuit capable of high-speed operation can be obtained. Furthermore, the area occupied by a circuit portion can be reduced. The use of the transistor having high on-state current can reduce signal delay in wirings and can reduce display unevenness even in a display device in which the number of wirings is increased because of increase in size or definition.

Alternatively, by supplying a potential for controlling the threshold voltage to one of the two gates and a potential for driving to the other, the threshold voltage of the transistors can be controlled.

Note that the structure of the transistors included in the display device is not limited. The transistor included in the circuit 516 and the transistor included in the display portion 514 may have the same structure or different structures. A plurality of transistors included in the circuit 516 may have the same structure or a combination of two or more kinds of structures. Similarly, a plurality of transistors included in the display portion 514 may have the same structure or a combination of two or more kinds of structures.

A connection portion 589 is provided in a region of the substrate 511 that does not overlap with the substrate 512. In the connection portion 589, the wiring 518 is electrically connected to the FPC 522 via a connection layer 590. The connection portion 589 has a similar structure to the connection portion 543. On the top surface of the connection portion 589, a conductive layer obtained by processing the same conductive film as the electrode 542 is exposed. Thus, the connection portion 589 and the FPC 522 can be electrically connected to each other through the connection layer 590.

As the polarizing plate 540 provided on the outer surface of the substrate 512, a linear polarizing plate or a circularly polarizing plate can be used. An example of a circularly polarizing plate is a stack including a linear polarizing plate and a quarter-wave retardation plate. Such a structure can reduce reflection of external light. The cell gap, alignment, drive voltage, and the like of the liquid crystal element used as the liquid crystal element 574 are controlled depending on the kind of the polarizing plate so that desirable contrast is obtained.

Note that a variety of optical members can be arranged on the outer surface of the substrate 512. Examples of the optical members include a polarizing plate, a retardation plate, a light diffusion layer (e.g., a diffusion film), an anti-reflection layer, and a light-condensing film. Furthermore, an antistatic film preventing the attachment of dust, a water repellent film suppressing the attachment of stain, a hard coat film suppressing generation of a scratch caused by the use, or the like may be arranged on the outer surface of the substrate 512.

For each of the substrates 511 and 512, glass, quartz, ceramic, sapphire, an organic resin, or the like can be used. When the substrates 511 and 512 are formed using a flexible material, the flexibility of the display device can be increased.

A liquid crystal element having, for example, a vertical alignment (VA) mode can be used as the liquid crystal element 574. Examples of the vertical alignment mode include a multi-domain vertical alignment (MVA) mode, a patterned vertical alignment (PVA) mode, and an advanced super view (ASV) mode.

A liquid crystal element having a variety of modes can be used as the liquid crystal element 574. For example, a liquid crystal element using, instead of a VA mode, a twisted nematic (TN) mode, an in-plane switching (IPS) mode, a fringe field switching (FFS) mode, an axially symmetric aligned micro-cell (ASM) mode, an optically compensated birefringence (OCB) mode, a ferroelectric liquid crystal (FLC) mode, an antiferroelectric liquid crystal (AFLC) mode, or the like can be used.

The liquid crystal element controls transmission or non-transmission of light utilizing an optical modulation action of liquid crystal. The optical modulation action of liquid crystal is controlled by an electric field applied to the liquid crystal (including a horizontal electric field, a vertical electric field, and a diagonal electric field). As the liquid crystal used for the liquid crystal element, a thermotropic liquid crystal, a low-molecular liquid crystal, a high-molecular liquid crystal, a polymer dispersed liquid crystal (PDLC), a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions.

As the liquid crystal material, either of positive liquid crystal and negative liquid crystal may be used, and an appropriate liquid crystal material can be used depending on the mode or design to be used.

To control the alignment of the liquid crystal, the alignment films can be provided. In the case where a horizontal electric field mode is employed, a liquid crystal exhibiting a blue phase for which an alignment film is unnecessary may be used. The blue phase is one of liquid crystal phases, which is generated just before a cholesteric phase changes into an isotropic phase while the temperature of a cholesteric liquid crystal is increased. Since the blue phase appears only in a narrow temperature range, a liquid crystal composition in which several weight percent or more of a chiral material is mixed is used for the liquid crystal in order to improve the temperature range. The liquid crystal composition that includes liquid crystal exhibiting a blue phase and a chiral material has a short response time and optical isotropy. In addition, the liquid crystal composition that includes a liquid crystal exhibiting a blue phase and a chiral material does not need alignment treatment and has small viewing angle dependence. An alignment film does not need to be provided and rubbing treatment is thus not necessary; accordingly, electrostatic discharge damage caused by the rubbing treatment can be prevented and defects and damage of the liquid crystal display device in the manufacturing process can be reduced.

In the case where the reflective liquid crystal element is used, the polarizing plate 540 is provided on the display surface side. In addition, a light diffusion plate is preferably provided on the display surface side to improve visibility.

A front light may be provided on the outer side of the polarizing plate 540. As the front light, an edge-light front light is preferably used. A front light including a light-emitting diode (LED) is preferably used to reduce power consumption.

The structures described in this embodiment can be combined as appropriate with any of the structures described in the other embodiments.

This application is based on Japanese Patent Application serial No. d2015-201654 filed with Japan Patent Office on Oct. 12, 2015 and Japanese Patent Application serial No. 2015-201656 filed with Japan Patent Office on Oct. 12, 2015, the entire contents of which are hereby incorporated by reference.

What is claimed is:

1. A method for manufacturing a semiconductor device, comprising the steps of:
    forming a semiconductor film;
    forming an insulating film over the semiconductor film;
    forming a conductive film over the insulating film;
    forming a first protective film over the conductive film;
    forming a second protective film over the first protective film;
    processing the first protective film, the conductive film and the insulating film each using the second protective film as a mask;
    removing the second protective film after processing using the second protective film as the mask; and
    processing the conductive film and the insulating film each using the first protective film as a mask after removing the second protective film,
    wherein each area of the conductive film and the insulating film after processing using the first protective film as the mask is smaller than an area of the second protective film at the time of processing using the second protective film as the mask.

2. The method for manufacturing a semiconductor device according to claim 1, wherein the area of the conductive film is greater than or equal to 15% and less than or equal to 50% of the area of the second protective film after processing using the first protective film as the mask.

3. The method for manufacturing a semiconductor device according to claim 1,
    wherein the first protective film is formed using an inorganic material, and
    wherein the second protective film is formed using an organic material.

4. The method for manufacturing a semiconductor device according to claim 1, wherein the conductive film comprises a metal oxide film and a metal film over the metal oxide film.

5. The method for manufacturing a semiconductor device according to claim 1, wherein the semiconductor film comprises an oxide semiconductor.

6. A method for manufacturing a semiconductor device, comprising the steps of:
    forming a semiconductor film;
    forming an insulating film over the semiconductor film;
    forming a conductive film over the insulating film;
    forming a first protective film over the conductive film;
    forming a second protective film over the first protective film;
    processing the first protective film, the conductive film and the insulating film each using the second protective film as a mask;
    removing the second protective film after processing using the second protective film as the mask;
    processing the conductive film and the insulating film each using the first protective film as a mask after removing the second protective film;
    performing plasma treatment on the semiconductor film from above the first protective film after processing using the first protective film as the mask;
    removing the first protective film after the plasma treatment; and
    forming a nitride insulating film over the conductive film and the semiconductor film after removing the first protective film,
    wherein each area of the conductive film and the insulating film after processing using the first protective film as the mask is smaller than an area of the second protective film at the time of processing using the second protective film as the mask.

7. The method for manufacturing a semiconductor device according to claim 6, wherein the plasma treatment is performed under one or both of an argon atmosphere and a nitrogen atmosphere.

8. The method for manufacturing a semiconductor device according to claim 6, wherein the area of the conductive film is greater than or equal to 15% and less than or equal to 50% of the area of the second protective film after processing using the first protective film as the mask.

9. The method for manufacturing a semiconductor device according to claim 6,
    wherein the first protective film is formed using an inorganic material, and
    wherein the second protective film is formed using an organic material.

10. The method for manufacturing a semiconductor device according to claim 6, wherein the conductive film comprises a metal oxide film and a metal film over the metal oxide film.

* * * * *